United States Patent
Sirpal et al.

(10) Patent No.: US 11,137,796 B2
(45) Date of Patent: Oct. 5, 2021

(54) SMARTPAD WINDOW MANAGEMENT

(71) Applicant: Z124, George Town (KY)

(72) Inventors: Sanjiv Sirpal, Oakville (CA); Martin Gimpl, Helsinki (FI); John S. Visosky, Gormley (CA)

(73) Assignee: Z124, George Town (KY)

( * ) Notice: Subject to any disclaimer, the term of this patent is extended or adjusted under 35 U.S.C. 154(b) by 0 days.

(21) Appl. No.: 16/985,810

(22) Filed: Aug. 5, 2020

(65) Prior Publication Data
US 2021/0019104 A1    Jan. 21, 2021

Related U.S. Application Data

(63) Continuation of application No. 16/278,270, filed on Feb. 18, 2019, now Pat. No. 10,740,058, which is a
(Continued)

(51) Int. Cl.
*G06F 3/14* (2006.01)
*G06F 1/16* (2006.01)
(Continued)

(52) U.S. Cl.
CPC ...... *G06F 1/1616* (2013.01); *B29D 11/00673* (2013.01); *E05D 3/12* (2013.01);
(Continued)

(58) Field of Classification Search
None
See application file for complete search history.

(56) References Cited

U.S. PATENT DOCUMENTS

| | | | |
|---|---|---|---|
| 3,704,950 A | 12/1972 | Rosencranz | |
| 6,021,269 A | 2/2000 | Lewis | |

(Continued)

FOREIGN PATENT DOCUMENTS

| | | |
|---|---|---|
| CN | 1896946 | 1/2007 |
| CN | 101038737 | 9/2007 |

(Continued)

OTHER PUBLICATIONS

"iPad Status Bar Indicators" My-iGuru.com, May 31, 2011 [retrieved on Jan. 10, 2015], 3 pages. Retrieved from: https://web.archive.org/web/20110531064820/http://www.my-iguru.com/ipad/ipad-hints-tips/ipad-status-bar-indicators.php.
(Continued)

*Primary Examiner* — Joseph R Haley
(74) *Attorney, Agent, or Firm* — Sheridan Ross P.C.

(57) ABSTRACT

A multi-display device is adapted to be dockable or otherwise associatable with an additional device. In accordance with one exemplary embodiment, the multi-display device is dockable with a smartpad. The exemplary smartpad can include a screen, a touch sensitive display, a configurable area, a gesture capture region(s) and a camera. The smartpad can also include a port adapted to receive the device. The exemplary smartpad is able to cooperate with the device such that information displayable on the device is also displayable on the smartpad. Furthermore, any one or more of the functions on the device are extendable to the smartpad, with the smartpad capable of acting as an input/output interface or extension of the smartpad. Therefore, for example, information from one or more of the displays on the multi-screen device is displayable on the smartpad.

20 Claims, 134 Drawing Sheets

Related U.S. Application Data continuation of application No. 13/627,269, filed on Sep. 26, 2012, now Pat. No. 10,209,940.

(60) Provisional application No. 61/539,884, filed on Sep. 27, 2011.

(51) Int. Cl.

| | | |
|---|---|---|
| *G06F 3/0488* | (2013.01) | |
| *G06F 16/51* | (2019.01) | |
| *G06F 3/0483* | (2013.01) | |
| *G09G 5/14* | (2006.01) | |
| *G06F 9/451* | (2018.01) | |
| *H04N 21/47* | (2011.01) | |
| *H04N 21/431* | (2011.01) | |
| *H04N 5/232* | (2006.01) | |
| *G06F 16/54* | (2019.01) | |
| *B29D 11/00* | (2006.01) | |
| *E05D 3/12* | (2006.01) | |
| *F21V 8/00* | (2006.01) | |
| *G06F 3/01* | (2006.01) | |
| *G06F 3/041* | (2006.01) | |
| *G06F 3/044* | (2006.01) | |
| *G06F 3/0489* | (2013.01) | |
| *G06F 9/00* | (2006.01) | |
| *G06G 1/00* | (2006.01) | |
| *G06T 3/00* | (2006.01) | |
| *G06T 3/20* | (2006.01) | |
| *G06T 3/40* | (2006.01) | |
| *G09G 1/00* | (2006.01) | |
| *G09G 5/00* | (2006.01) | |
| *G09G 5/12* | (2006.01) | |
| *G09G 5/34* | (2006.01) | |
| *G09G 5/373* | (2006.01) | |
| *G09G 5/377* | (2006.01) | |
| *H04M 1/02* | (2006.01) | |
| *H04N 5/222* | (2006.01) | |
| *H04N 5/262* | (2006.01) | |
| *H04W 4/02* | (2018.01) | |
| *H04W 24/02* | (2009.01) | |
| *H04W 68/00* | (2009.01) | |
| *H04W 72/06* | (2009.01) | |
| *H04W 88/06* | (2009.01) | |
| *H05K 5/02* | (2006.01) | |
| *H05K 5/04* | (2006.01) | |
| *H05K 7/02* | (2006.01) | |
| *H05K 7/14* | (2006.01) | |
| *H05K 13/00* | (2006.01) | |
| *H05K 13/04* | (2006.01) | |
| *G06F 3/0481* | (2013.01) | |
| *G06F 3/048* | (2013.01) | |
| *G06F 9/44* | (2018.01) | |
| *H04W 48/18* | (2009.01) | |
| *H05K 5/00* | (2006.01) | |
| *G06F 3/00* | (2006.01) | |
| *G06F 3/0484* | (2013.01) | |
| *H04W 88/02* | (2009.01) | |
| *G06F 3/0482* | (2013.01) | |
| *G06F 3/0346* | (2013.01) | |
| *G06F 3/0486* | (2013.01) | |
| *G06F 3/0485* | (2013.01) | |
| *G06F 3/16* | (2006.01) | |
| *H04B 1/3827* | (2015.01) | |

(52) U.S. Cl.
CPC ......... *G02B 6/0001* (2013.01); *G06F 1/1605* (2013.01); *G06F 1/1618* (2013.01); *G06F 1/1637* (2013.01); *G06F 1/1641* (2013.01); *G06F 1/1643* (2013.01); *G06F 1/1647* (2013.01); *G06F 1/1649* (2013.01); *G06F 1/1677* (2013.01); *G06F 1/1681* (2013.01); *G06F 1/1683* (2013.01); *G06F 1/1692* (2013.01); *G06F 3/00* (2013.01); *G06F 3/01* (2013.01); *G06F 3/016* (2013.01); *G06F 3/017* (2013.01); *G06F 3/0346* (2013.01); *G06F 3/041* (2013.01); *G06F 3/044* (2013.01); *G06F 3/048* (2013.01); *G06F 3/0412* (2013.01); *G06F 3/0416* (2013.01); *G06F 3/0481* (2013.01); *G06F 3/0482* (2013.01); *G06F 3/0483* (2013.01); *G06F 3/0484* (2013.01); *G06F 3/0485* (2013.01); *G06F 3/0486* (2013.01); *G06F 3/0488* (2013.01); *G06F 3/04817* (2013.01); *G06F 3/04842* (2013.01); *G06F 3/04845* (2013.01); *G06F 3/04847* (2013.01); *G06F 3/04883* (2013.01); *G06F 3/04886* (2013.01); *G06F 3/04897* (2013.01); *G06F 3/1423* (2013.01); *G06F 3/1438* (2013.01); *G06F 3/1446* (2013.01); *G06F 3/1454* (2013.01); *G06F 3/167* (2013.01); *G06F 9/00* (2013.01); *G06F 9/44* (2013.01); *G06F 9/451* (2018.02); *G06F 16/51* (2019.01); *G06F 16/54* (2019.01); *G06G 1/00* (2013.01); *G06T 3/00* (2013.01); *G06T 3/20* (2013.01); *G06T 3/40* (2013.01); *G09G 1/00* (2013.01); *G09G 5/00* (2013.01); *G09G 5/12* (2013.01); *G09G 5/14* (2013.01); *G09G 5/34* (2013.01); *G09G 5/373* (2013.01); *G09G 5/377* (2013.01); *H04B 1/3833* (2013.01); *H04M 1/0206* (2013.01); *H04M 1/0216* (2013.01); *H04M 1/0266* (2013.01); *H04N 5/222* (2013.01); *H04N 5/232933* (2018.08); *H04N 5/2628* (2013.01); *H04N 21/4316* (2013.01); *H04N 21/47* (2013.01); *H04W 4/02* (2013.01); *H04W 24/02* (2013.01); *H04W 48/18* (2013.01); *H04W 68/00* (2013.01); *H04W 72/06* (2013.01); *H04W 88/02* (2013.01); *H04W 88/06* (2013.01); *H05K 5/0017* (2013.01); *H05K 5/0226* (2013.01); *H05K 5/04* (2013.01); *H05K 7/02* (2013.01); *H05K 7/1452* (2013.01); *H05K 13/00* (2013.01); *H05K 13/046* (2013.01); *E05Y 2900/606* (2013.01); *G06F 1/16* (2013.01); *G06F 1/1601* (2013.01); *G06F 2203/04803* (2013.01); *G09G 2300/023* (2013.01); *G09G 2330/021* (2013.01); *G09G 2354/00* (2013.01); *H04M 1/0214* (2013.01); *Y10T 16/547* (2015.01); *Y10T 29/4984* (2015.01); *Y10T 29/49826* (2015.01)

(56) References Cited

U.S. PATENT DOCUMENTS

| | | |
|---|---|---|
| 6,182,231 B1 | 1/2001 | Gilgen |
| 6,243,645 B1 | 6/2001 | Moteki et al. |
| 7,070,755 B2 | 7/2006 | Klett et al. |
| 7,136,282 B1 | 11/2006 | Rebeske |
| 7,477,205 B1 | 1/2009 | de Waal et al. |
| RE40,821 E | 7/2009 | Narayanaswamy et al. |
| 7,656,393 B2 | 2/2010 | King et al. |
| 7,765,143 B1 | 7/2010 | West |

(56) References Cited

U.S. PATENT DOCUMENTS

| | | |
|---|---|---|
| 7,777,720 B2 | 8/2010 | Kawasome |
| 7,844,301 B2 | 11/2010 | Lee et al. |
| RE42,738 E | 9/2011 | Williams |
| 8,018,398 B1 | 9/2011 | Harris |
| 8,085,216 B2 | 12/2011 | Miller |
| 8,243,198 B2 | 8/2012 | Lee et al. |
| 8,411,069 B1 | 4/2013 | Huang |
| 8,600,437 B2 | 12/2013 | Kumar |
| 8,633,867 B2 | 1/2014 | Kim et al. |
| 8,659,565 B2 | 2/2014 | Sirpal et al. |
| 8,706,275 B2 | 4/2014 | Peterson et al. |
| 8,732,373 B2 | 5/2014 | Sirpal et al. |
| 8,773,378 B2 | 7/2014 | Sirpal et al. |
| 8,856,679 B2 | 10/2014 | Sirpal et al. |
| 8,866,748 B2 | 10/2014 | Sirpal et al. |
| 8,884,841 B2 | 11/2014 | Sirpal et al. |
| 8,890,768 B2 | 11/2014 | Sirpal et al. |
| 8,907,904 B2 | 12/2014 | Sirpal et al. |
| 8,963,840 B2 | 2/2015 | Sirpal et al. |
| 8,963,853 B2 | 2/2015 | Sirpal et al. |
| 9,047,038 B2 | 6/2015 | Sirpal et al. |
| 9,092,190 B2 | 7/2015 | Sirpal et al. |
| 9,104,365 B2 | 8/2015 | Sirpal et al. |
| 9,128,582 B2 | 9/2015 | Sirpal et al. |
| 9,195,330 B2 | 11/2015 | Sirpal et al. |
| 9,213,517 B2 | 12/2015 | Sirpal et al. |
| 9,218,021 B2 | 12/2015 | Sirpal et al. |
| 9,235,374 B2 | 1/2016 | Sirpal et al. |
| 9,477,394 B2 | 10/2016 | Sirpal et al. |
| 9,811,302 B2 | 11/2017 | Jouin |
| 10,089,054 B2 | 10/2018 | Jouin |
| 10,209,940 B2 | 2/2019 | Sirpal et al. |
| 10,248,282 B2 | 4/2019 | Sirpal et al. |
| 10,740,058 B2 | 8/2020 | Sirpal et al. |
| 2001/0048482 A1 | 12/2001 | Takemoto |
| 2003/0025678 A1 | 2/2003 | Lee et al. |
| 2003/0135771 A1 | 7/2003 | Cupps et al. |
| 2003/0189594 A1 | 10/2003 | Jones |
| 2004/0150635 A1 | 8/2004 | Clapper |
| 2004/0217937 A1 | 11/2004 | Moskalik et al. |
| 2005/0090288 A1 | 4/2005 | Stohr et al. |
| 2005/0093868 A1 | 5/2005 | Hinckley |
| 2006/0033724 A1 | 2/2006 | Chaudhri et al. |
| 2006/0034042 A1 | 2/2006 | Hisano et al. |
| 2006/0183505 A1 | 8/2006 | Willrich |
| 2006/0190838 A1 | 8/2006 | Nadamoto |
| 2006/0236014 A1 | 10/2006 | Yin et al. |
| 2006/0248404 A1 | 11/2006 | Lindsay et al. |
| 2007/0016873 A1 | 1/2007 | Lindsay |
| 2007/0024524 A1 | 2/2007 | Lai |
| 2007/0079027 A1 | 4/2007 | Marriott et al. |
| 2007/0079252 A1 | 4/2007 | Ramnani |
| 2007/0097016 A1 | 5/2007 | McGowan |
| 2007/0120762 A1 | 5/2007 | O'Gorman |
| 2007/0120763 A1 | 5/2007 | De Paepe et al. |
| 2007/0123194 A1 | 5/2007 | Karaoguz et al. |
| 2007/0130399 A1 | 6/2007 | Anderson et al. |
| 2007/0139719 A1 | 6/2007 | Gotham et al. |
| 2007/0198948 A1 | 8/2007 | Toriyama |
| 2007/0216700 A1 | 9/2007 | Chen et al. |
| 2007/0242421 A1 | 10/2007 | Goschin et al. |
| 2007/0245256 A1 | 10/2007 | Boss et al. |
| 2007/0294263 A1 | 12/2007 | Punj et al. |
| 2008/0062625 A1 | 3/2008 | Batio |
| 2008/0082934 A1 | 4/2008 | Kocienda et al. |
| 2008/0122796 A1 | 5/2008 | Jobs et al. |
| 2008/0168367 A1 | 7/2008 | Chaudhri et al. |
| 2009/0061950 A1 | 3/2009 | Kamachi et al. |
| 2009/0063715 A1 | 3/2009 | de Cesare et al. |
| 2009/0094523 A1 | 4/2009 | Treder et al. |
| 2009/0163139 A1 | 6/2009 | Wright-Riley |
| 2009/0178097 A1 | 7/2009 | Kim et al. |
| 2009/0187677 A1 | 7/2009 | Hunt et al. |
| 2009/0235281 A1 | 9/2009 | Lu et al. |
| 2009/0237420 A1 | 9/2009 | Lawrenz |
| 2009/0249247 A1 | 10/2009 | Tseng et al. |
| 2009/0278806 A1 | 11/2009 | Duarte et al. |
| 2009/0284476 A1 | 11/2009 | Bull et al. |
| 2009/0303205 A1 | 12/2009 | Seibert et al. |
| 2009/0320070 A1 | 12/2009 | Inoguchi |
| 2009/0322693 A1 | 12/2009 | Sasakura |
| 2009/0327561 A1 | 12/2009 | Groesch |
| 2010/0007603 A1 | 1/2010 | Kirkup |
| 2010/0018568 A1 | 1/2010 | Nakata |
| 2010/0033403 A1 | 2/2010 | Liao |
| 2010/0037175 A1 | 2/2010 | West |
| 2010/0045705 A1 | 2/2010 | Vertegaal et al. |
| 2010/0053089 A1 | 3/2010 | Kwok et al. |
| 2010/0064244 A1 | 3/2010 | Kilpatrick et al. |
| 2010/0081475 A1 | 4/2010 | Chiang et al. |
| 2010/0085382 A1 | 4/2010 | Lundqvist et al. |
| 2010/0088634 A1 | 4/2010 | Tsuruta et al. |
| 2010/0095240 A1 | 4/2010 | Shiplacoff et al. |
| 2010/0138780 A1 | 6/2010 | Marano et al. |
| 2010/0177047 A1 | 7/2010 | Brenneman et al. |
| 2010/0182247 A1 | 7/2010 | Petschnigg et al. |
| 2010/0182248 A1 | 7/2010 | Chun |
| 2010/0188321 A1 | 7/2010 | Yen |
| 2010/0225448 A1 | 9/2010 | Arguin |
| 2010/0227642 A1 | 9/2010 | Kim et al. |
| 2010/0238788 A1 | 9/2010 | Yooke et al. |
| 2010/0245209 A1 | 9/2010 | Miller et al. |
| 2010/0245369 A1 | 9/2010 | Yoshino |
| 2010/0248788 A1 | 9/2010 | Yook et al. |
| 2010/0257014 A1 | 10/2010 | Roberts et al. |
| 2010/0299436 A1 | 11/2010 | Khalid et al. |
| 2011/0047459 A1 | 2/2011 | Van Der Westhuizen |
| 2011/0047503 A1 | 2/2011 | Allen et al. |
| 2011/0072391 A1 | 3/2011 | Hanggie et al. |
| 2011/0074692 A1 | 3/2011 | Causey et al. |
| 2011/0095965 A1 | 4/2011 | Yoneoka et al. |
| 2011/0098087 A1 | 4/2011 | Tseng |
| 2011/0099316 A1 | 4/2011 | Tseng et al. |
| 2011/0099392 A1 | 4/2011 | Conway |
| 2011/0107272 A1 | 5/2011 | Aguilar |
| 2011/0126141 A1 | 5/2011 | King et al. |
| 2011/0126148 A1 | 5/2011 | Krishnaraj et al. |
| 2011/0134097 A1 | 6/2011 | Sugamata |
| 2011/0143769 A1 | 6/2011 | Jones et al. |
| 2011/0145758 A1 | 6/2011 | Rosales et al. |
| 2011/0159929 A1 | 6/2011 | Karaoguz et al. |
| 2011/0164042 A1 | 7/2011 | Chaudhri |
| 2011/0165890 A1 | 7/2011 | Ho et al. |
| 2011/0177047 A1 | 7/2011 | Brenneman et al. |
| 2011/0187753 A1 | 8/2011 | Watanabe |
| 2011/0199293 A1 | 8/2011 | Liu et al. |
| 2011/0199392 A1 | 8/2011 | Nishikawa |
| 2011/0202449 A1 | 8/2011 | West |
| 2011/0209058 A1 | 8/2011 | Hinckley et al. |
| 2011/0210907 A1 | 9/2011 | Martin-Cocher et al. |
| 2011/0210933 A1 | 9/2011 | Forstall |
| 2011/0219317 A1 | 9/2011 | Thatcher et al. |
| 2011/0225537 A1 | 9/2011 | Wang et al. |
| 2011/0225553 A1 | 9/2011 | Abramson et al. |
| 2011/0230178 A1 | 9/2011 | Jones et al. |
| 2011/0234515 A1 | 9/2011 | Kamijima |
| 2011/0239142 A1 | 9/2011 | Steeves et al. |
| 2011/0246904 A1 | 10/2011 | Pinto et al. |
| 2011/0267291 A1 | 11/2011 | Choi et al. |
| 2012/0001829 A1 | 1/2012 | Anttila et al. |
| 2012/0032981 A1* | 2/2012 | Hackwell ............ G06F 15/0291 345/650 |
| 2012/0040719 A1 | 2/2012 | Lee et al. |
| 2012/0042102 A1 | 2/2012 | Chung et al. |
| 2012/0043937 A1 | 2/2012 | Williams |
| 2012/0054401 A1 | 3/2012 | Cheng |
| 2012/0060109 A1 | 3/2012 | Han et al. |
| 2012/0081303 A1 | 4/2012 | Cassar et al. |
| 2012/0081310 A1 | 4/2012 | Schrock |
| 2012/0084723 A1 | 4/2012 | Reeves et al. |
| 2012/0087078 A1 | 4/2012 | Medica et al. |
| 2012/0088548 A1 | 4/2012 | Yun et al. |
| 2012/0088549 A1 | 4/2012 | Yun et al. |
| 2012/0110497 A1 | 5/2012 | Gimpl et al. |

(56) References Cited

U.S. PATENT DOCUMENTS

| | | | |
|---|---|---|---|
| 2012/0131496 | A1 | 5/2012 | Goossens et al. |
| 2012/0151403 | A1 | 6/2012 | Bhogal et al. |
| 2012/0176396 | A1 | 7/2012 | Harper et al. |
| 2012/0235922 | A1 | 9/2012 | Locker et al. |
| 2012/0240056 | A1 | 9/2012 | Webber |
| 2012/0266098 | A1 | 10/2012 | Webber |
| 2012/0274656 | A1 | 11/2012 | Kang et al. |
| 2012/0282914 | A1 | 11/2012 | Alexander |
| 2013/0021262 | A1 | 1/2013 | Chen |
| 2013/0024783 | A1 | 1/2013 | Brakensiek et al. |
| 2013/0067262 | A1 | 3/2013 | Moran et al. |
| 2013/0076595 | A1 | 3/2013 | Sirpal et al. |
| 2013/0076596 | A1 | 3/2013 | de Paz et al. |
| 2013/0076637 | A1 | 3/2013 | Teltz |
| 2013/0076718 | A1 | 3/2013 | Sirpal et al. |
| 2013/0077260 | A1 | 3/2013 | Sirpal et al. |
| 2013/0080957 | A1 | 3/2013 | Sirpal et al. |
| 2013/0111369 | A1 | 5/2013 | Pasquero et al. |
| 2013/0120251 | A1 | 5/2013 | Lee et al. |
| 2013/0120267 | A1 | 5/2013 | Pasquero et al. |
| 2013/0127687 | A1 | 5/2013 | Yu |
| 2013/0159934 | A1 | 6/2013 | Kang |
| 2013/0305185 | A1 | 11/2013 | Nicol, II et al. |
| 2015/0070824 | A1 | 3/2015 | Sirpal et al. |

FOREIGN PATENT DOCUMENTS

| | | |
|---|---|---|
| CN | 101477442 | 7/2009 |
| JP | 2003-150561 | 5/2003 |
| JP | 2004-341514 | 12/2004 |
| JP | 2007-527045 | 9/2007 |
| JP | 2009-217814 | 9/2009 |
| WO | WO 2010/028406 | 3/2010 |
| WO | WO 2010/110954 | 9/2010 |

OTHER PUBLICATIONS

"iPad User Guide for iOS 4.2 Software," Apple Inc., 2010, 181 pages.

Google Image Result for Fujitsu Dual Screen Phone, published date unknown, [retrieved Apr. 18, 2011], 1 page. Retrieved from: www.google.com/imgres?imgurl=http://www.computerriver.com/images/dual-screen-phone.jpg.

Google Image Result for LG Dual Touch Screen Concept Phone by Eugene Kim, published date unknown, [retrieved Apr. 18, 2011], 1 page. Retrieved from: www.google.com/imgres?imgurl=http://fgadgets.com/wp-content/uploads/2010/08/lg-dual-touch-screen-phone-Eugene-Kim-01.jpg.

Google Image Result for Fujitsu Dual Screen Phone, published date unknown, [retrieved Apr. 18, 2011], 1 page. Retrieved from: www.google.com/imgres?imgurl=http://www.gsmdome.com/wp-content/uploads/2010/10/fujitsu-dual-screen-phone_w2cP7_54.jpg.

Google Image Result for Kyocera Echo, published date unknown, [retrieved Apr. 18, 2011], 1 page. Retrieved from: www.google.com/imgres?imgurl=http://www.hardwaresphere.com/wp-content/uploads/2011/02/kyocera-echo-dual-screen-android-phone-for-sprint-network.jpg.

Google Image Result for HTC Triple Viper, published date unknown, [retrieved Apr. 18, 2011], 1 page. Retrieved from:www.google.com/imgres?imgurl=http://www.santafemods.com/Forum/AndroidForums/htcTripleViper.png.

Google Image Result for Dual-Screen Phone, [retrieved Apr. 18, 2011], 1 page. Retrieved from: www.google.com/imgres?imgurl=http://www.netshet.org/wp-content/uploads/2011/02/Dual-Scree . . . .

Screen shots from: "Toshiba Libretto W100 demo", Aug. 19, 2010, [retrieved on Jul. 7, 2014], 10 pages. Retrieved from: www.youtube.com/watch?v=WYb6di083oE.

Screen shot from: "Samsung Galaxy Tab (T-Mobile) review—part 1 of 2," Nov. 20, 2010, [retrieved on Jul. 7, 2014], 1 page. Retrieved from: http://www.youtube.com/watch?v=PZAaFblDoOc.

"Toshiba Leading Innovation User's Manual Libretto W100," Jun. 2010, First edition, 119 pages.

Website entitled "Editor Info" Android Developers, updated Nov. 17, 2011, 6 pages, retrieved from (web.archive.org/web/20111128081741/http://developer.android.com/reference/android/view/inputmethod/EditorInfo.html).

Website entitled, "Kyocera Echo," Kyocera Communications, Inc., 2011, [retrieved on Aug. 27, 2012], 6 pages. Retrieved from: www.echobykyocera.com/.

Website entitled "Lapdock™ for MOTOROLA ATRIX," Motorola Mobility, Inc, 2011, [retrieved on Apr. 18, 2011], 1 page. Retrieved from: www.motorola.com/Consumers/US-EN/Consumer-Product-and-Services/Mobile+Ph . . . .

Website entitled "Motorola ATRIX 4G Laptop Dock Review," phoneArena.com, posted Mar. 2, 2011, [retrieved on Apr. 18, 2011], 6 pages. Retrieved from: www.phonearena.com/reviews/Motorola-ATRIX-4G-Laptop-Dock-Review_id2667.

Website entitled, "Sony Tablet," Sony Corporation, 2012, [retrieved on Aug. 27, 2012], 3 pages. Retrieved from: www.store.sony.com/webapp/wcs/stores/servlet/CategoryDisplay?catalogId=10551&storeId=10151&langId=-1&categoryId=8198552921644795521.

Wikipedia "iOS" last modified Nov. 29, 2011, 7 pages, retrieved from (web.archive.org/web/20111130025243/http://en.wikipedia.org/wiki/IOS).

Burns, C., "Motorola ATRIX 4G Laptop Dock Review," Android Community, Feb. 20, 2011, [retrieved on Apr. 18, 2011], 5 pages. Retrieved from: www.androidcommunity.com/motorola-atrix-4g-laptop-dock-review-20110220/.

Catacchio, "This smartphone has two huge screens . . . that rotate," The Next Web, Inc., Oct. 7, 2010, [retrieved on Jul. 21, 2011], 2 pages. Retrieved from: www.thenextweb.com/asia/2010/10/07/this-smartphone-has-two-huge-screens-that-rotate/.

Posted by Harman03, "Kyocera Echo Dual-screen Android Phone," posted 4 weeks from Apr. 18, 2011, [retrieved on Apr. 18, 2011], 3 pages. Retrieved from: www.unp.me/f106/kyocera-echo-dual-screen-android-phone-143800/.

Lewis, Screen shots from: "Gotomypc ipad is finally available today!," Feb. 27, 2011 [retrieved on Jul. 3, 2014], 5 pages. Retrieved from: www.youtube.com/watch?v=6gmasfJDLeU.

Stein, S., "How does the Motorola Atrix 4G Lapdock compare with a laptop?" Crave—CNET, Feb. 9, 2011 [retrieved on Apr. 18, 2011], 7 pages. Retrieved from: www.news.cnet.com/8301-17938_105-20031251-1.html.

Stern, "Toshiba Libretto W100 preview," posted Jul. 1, 2010 at www.engadget.com/2010/07/01 /toshiba-libretto-w1 00-preview/, 4 pages.

Victor, "Capturing Video from Nintendo DS," Screen Capture News, Jul. 7, 2009, 5 pages [retrieved from www.screencapturenews.com/2009/07/07/capturing-video-from-nintendo-ds].

Official Action for U.S. Appl. No. 13/247,581, dated Sep. 27, 2013 101 pages.

Notice of Allowance for U.S. Appl. No. 13/247,581, dated Nov. 4, 2013 12 pages.

Official Action for U.S. Appl. No. 13/247,606, dated Sep. 27, 2013 48 pages.

Official Action for U.S. Appl. No. 13/247,606, dated Dec. 9, 2013 36 pages.

Notice of Allowance for U.S. Appl. No. 13/247,606, dated Feb. 28, 2014 10 pages.

Official Action for U.S. Appl. No. 13/247,621, dated Apr. 3, 2013, 16 pages.

Official Action for U.S. Appl. No. 13/247,621, dated Oct. 2, 2013 19 pages.

Official Action for U.S. Appl. No. 13/247,621, dated Mar. 26, 2014 17 pages.

Official Action for U.S. Appl. No. 13/247,621, dated Jun. 18, 2015 19 pages.

Official Action for U.S. Appl. No. 13/247,621, dated Oct. 23, 2014 26 pages.

Notice of Allowance for U.S. Appl. No. 13/247,621, dated Aug. 14, 2015 13 pages.

Official Action for U.S. Appl. No. 13/247,634, dated Jun. 6, 2014 10 pages.

(56) References Cited

OTHER PUBLICATIONS

Official Action for U.S. Appl. No. 13/247,634, dated Oct. 22, 2014 11 pages.
Official Action for U.S. Appl. No. 13/247,634, dated Jan. 30, 2015 12 pages.
Notice of Allowance for U.S. Appl. No. 13/247,634, dated Mar. 19, 2015 7 pages.
Official Action for U.S. Appl. No. 13/247,647, dated Jun. 10, 2014 41 pages.
Official Action for U.S. Appl. No. 13/247,647, dated Jan. 15, 2015 49 pages.
Notice of Allowance for U.S. Appl. No. 13/247,647, dated Jul. 8, 2015 12 pages.
Official Action for U.S. Appl. No. 13/247,663, dated May 8, 2013, 22 pages.
Official Action for U.S. Appl. No. 13/247,663, dated Nov. 1, 2013 28 pages.
Notice of Allowance for U.S. Appl. No. 13/247,663, dated Jun. 6, 2014 9 pages.
Official Action for U.S. Appl. No. 14/518,784, dated Nov. 10, 2015 22 pages.
Notice of Allowance for U.S. Appl. No. 14/518,784, dated Jun. 13, 2016 13 pages.
Official Action for U.S. Appl. No. 13/247,696, dated Oct. 15, 2013 23 pages.
Official Action for U.S. Appl. No. 13/247,696, dated Dec. 19, 2013 26 pages.
Official Action for U.S. Appl. No. 13/247,696, dated Aug. 6, 2014 12 pages.
Notice of Allowance for U.S. Appl. No. 13/247,696, dated Oct. 1, 2014 9 pages.
Official Action for U.S. Appl. No. 13/247,711, dated Apr. 25, 2013, 21 pages.
Official Action for U.S. Appl. No. 13/247,711, dated Oct. 18, 2013 25 pages.
Official Action for U.S. Appl. No. 13/247,711, dated Mar. 21, 2014 26 pages.
Notice of Allowance for U.S. Appl. No. 13/247,711, dated Oct. 1, 2014 10 pages.
Official Action for U.S. Appl. No. 13/247,724, dated May 8, 2013, 26 pages.
Official Action for U.S. Appl. No. 13/247,724, dated Oct. 18, 2013 30 pages.
Official Action for U.S. Appl. No. 13/247,724, dated Dec. 26, 2013 30 pages.
Notice of Allowance for U.S. Appl. No. 13/247,724, dated Jul. 10, 2014 10 pages.
Official Action for U.S. Appl. No. 14/541,606, dated Nov. 17, 2015 16 pages.
Official Action for U.S. Appl. No. 14/541,606, dated Jun. 17, 2016 17 pages.
Official Action for U.S. Appl. No. 14/541,606, dated Nov. 16, 2016 20 pages.
Official Action for U.S. Appl. No. 15/497,842, dated Jul. 26, 2018 13 pages.
Notice of Allowance for U.S. Appl. No. 15/497,842, dated Nov. 2, 2018 10 pages.
Official Action for U.S. Appl. No. 13/247,733, dated Sep. 25, 2014 51 pages.
Notice of Allowance for U.S. Appl. No. 13/247,733, dated Apr. 24, 2015 13 pages.
Official Action for U.S. Appl. No. 13/628,432, dated Sep. 11, 2014 21 pages.
Official Action for U.S. Appl. No. 13/628,432, dated Mar. 12, 2015 15 pages.
Official Action for U.S. Appl. No. 13/628,432, dated Sep. 24, 2015 17 pages.
Official Action for U.S. Appl. No. 13/628,432, dated Apr. 1, 2016 16 pages.
Official Action for U.S. Appl. No. 13/628,432, dated Jul. 29, 2016 16 pages.
Official Action for U.S. Appl. No. 13/628,432, dated Feb. 7, 2017 17 pages.
Notice of Allowance for U.S. Appl. No. 13/628,432, dated Jun. 12, 2017 7 pages.
Official Action for U.S. Appl. No. 15/804,964, dated Dec. 28, 2017 17 pages.
Notice of Allowance for U.S. Appl. No. 15/804,964, dated May 22, 2018 7 pages.
Official Action for U.S. Appl. No. 13/627,153 dated Jul 21, 2014 12 pages.
Notice of Allowance for U.S. Appl. No. 13/627,153 dated Jan. 22, 2015 7 pages.
Official Action for U.S. Appl. No. 13/208,828, dated Oct. 29, 2013 15 pages.
Official Action for U.S. Appl. No. 13/408,828, dated Dec. 30, 2013 19 pages.
Official Action for U.S. Appl. No. 13/408,828, dated May 13, 2014 19 pages.
Notice of Allowance for U.S. Appl. No. 13/408,828, dated Jul. 9, 2014 8 pages.
Official Action for U.S. Appl. No. 13/408,839, dated Oct. 28, 2013 28 pages.
Official Action for U.S. Appl. No. 13/408,839, dated Dec. 30, 2013 19 pages.
Official Action for U.S. Appl. No. 13/408,839, dated May 14, 2014 17 pages.
Notice of Allowance for U.S. Appl. No. 13/408,839, dated Jul. 9, 2014 8 pages.
Official Action for U.S. Appl. No. 13/627,168, dated Apr. 25, 2014 23 pages.
Official Action for U.S. Appl. No. 13/627,168, dated Jun. 20, 2014 18 pages.
Official Action for U.S. Appl. No. 13/627,168, dated Mar. 27, 2015 25 pages.
Notice of Allowance for U.S. Appl. No. 13/627,168, dated Jul. 31, 2015 8 pages.
Official Action for U.S. Appl. No. 13/627,191, dated Jun. 5, 2014 21 pages.
Official Action for U.S. Appl. No. 13/627,191, dated Sep. 11, 2014 26 pages.
Official Action for U.S. Appl. No. 13/627,191, dated May 7, 2015 25 pages.
Notice of Allowance for U.S. Appl. No. 13/627,191, dated Aug. 17, 2015 8 pages.
Official Action for U.S. Appl. No. 13/627,269, dated May 15, 2014 11 pages.
Official Action for U.S. Appl. No. 13/627,269, dated Sep. 11, 2014 15 pages.
Official Action for U.S. Appl. No. 13/627,269, dated Jul. 16, 2015 15 pages.
Official Action for U.S. Appl. No. 13/627,269, dated Nov. 13, 2015 18 pages.
Official Action for U.S. Appl. No. 13/627,269, dated Apr. 19, 2016 14 pages.
Official Action for U.S. Appl. No. 13/627,269, dated Jan. 26, 2017 13 pages.
Official Action for U.S. Appl. No. 13/627,269, dated Sep. 20, 2017 13 pages.
Official Action for U.S. Appl. No. 13/627,269, dated Mar. 19, 2018 14 pages.
Notice of Allowance for U.S. Appl. No. 13/627,269, dated Sep. 26, 2018 7 pages.
Notice of Allowance for U.S. Appl. No. 13/627,269, dated Oct. 16, 2018 2 pages.
Official Action for U.S. Appl. No. 16/278,270, dated Nov. 14, 2019 5 pages.
Notice of Allowance for U.S. Appl. No. 16/278,270, dated Mar. 26, 2020 5 pages.
Official Action for U.S. Appl. No. 13/627,290, dated Jul. 21, 2014 10 pages.

(56) References Cited

OTHER PUBLICATIONS

Notice of Allowance for U.S. Appl. No. 13/627,290, dated Jan. 27, 2015 7 pages.
Official Action for U.S. Appl. No. 13/627,326, dated Oct. 1, 2013 57 pages.
Official Action for U.S. Appl. No. 13/627,326, dated Dec. 31, 2013 48 pages.
Notice of Allowance for U.S. Appl. No. 13/627,326, dated May 20, 2014 9 pages.
Notice of Allowance for U.S. Appl. No. 13/627,326, dated Jul. 9, 2014 6 pages.
Official Action for U.S. Appl. No. 13/627,352, dated Mar. 24, 2014 9 pages.
Official Action for U.S. Appl. No. 13/627,352 dated Aug. 20, 2014 11 pages.
Official Action for U.S. Appl. No. 13/627,352, dated Nov. 13, 2014 13 pages.
Official Action for U.S. Appl. No. 13/627,352, dated Feb. 13, 2015 5 pages.
Official Action for U.S. Appl. No. 13/627,390, dated Jan. 15, 2015 16 pages.
Official Action for U.S. Appl. No. 13/627,415, dated Aug. 1, 2014 17 pages.
Official Action for U.S. Appl. No. 13/627,415, dated Dec. 9, 2014 21 pages.
Official Action for U.S. Appl. No. 13/627,415, dated Mar. 26, 2015, 23 pages.
Official Action for U.S. Appl. No. 13/627,445, dated Jul. 28, 2014 12 pages.
Official Action for U.S. Appl. No. 13/627,445, dated Jan. 7, 2015 11 pages.

\* cited by examiner

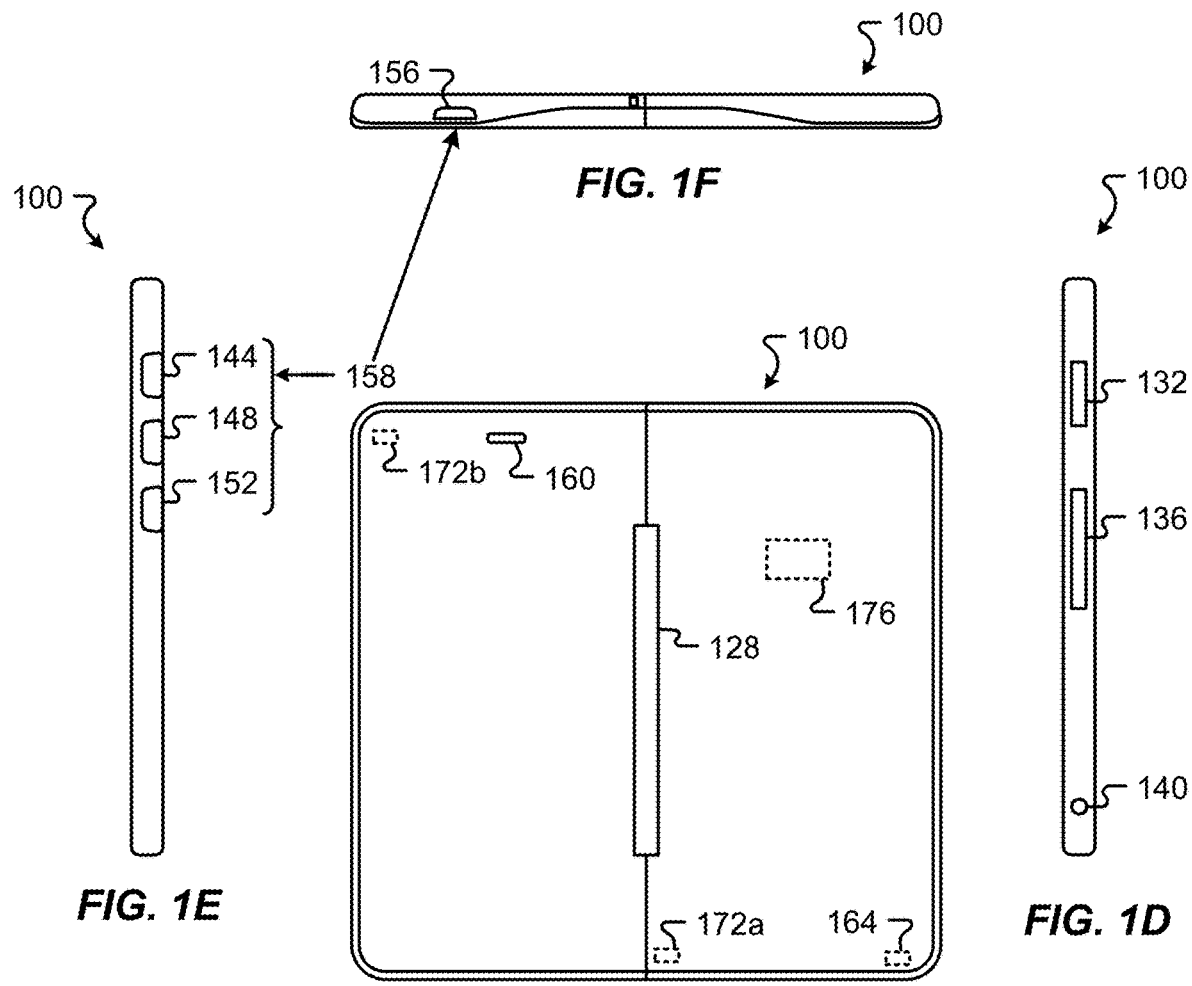
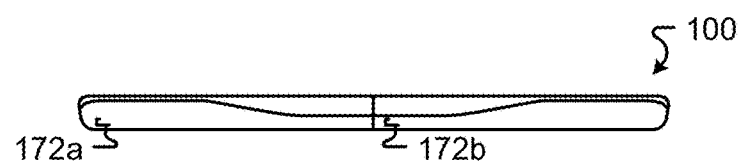

|  | PORTRAIT ||||| LANDSCAPE |||||
| --- | --- | --- | --- | --- | --- | --- | --- | --- | --- | --- |
|  | OPEN | CLOSED | EASEL | MODIFIED EASEL | PHONE | IMAGE/VIDEO | OPEN | CLOSED | EASEL | MODIFIED EASEL | PHONE | IMAGE/VIDEO |
| PORTRAIT OPEN | X | HT | HT | HT | P | I | AT | HAT | HAT | HAT | P | I |
| CLOSED | HT | X | HAT | HAT | P | I | HAT | AT | HAT | HAT | P | I |
| EASEL | HT | HT | X | X | P | I | HAT | HAT | HAT | HAT | P | I |
| PHONE | HT | X | HT | HT | X | I | HAT | HAT | HAT | HAT | X | I |
| IMAGE/VIDEO | HT | HT | HT | X | P | X | HAT | HAT | HAT | HAT | X | HAT |
| LANDSCAPE OPEN | AT | HAT | HAT | HAT | P | I | X | HT | HAT | HAT | P | I |
| CLOSED | HAT | AT | HAT | HAT | P | I | HT | X | HAT | HAT | P | I |
| EASEL | HAT | HAT | HAT | HAT | P | I | HT | HT | X | HAT | P | I |
| MODIFIED EASEL | HAT | HAT | HAT | HAT | P | I | HT | HT | HAT | X | P | I |
| IMAGE/VIDEO | HAT | HAT | HAT | HAT | HAT | AT | HT | HT | HT | HAT | P | X |
| DOCKED | | | | | | | DOCKING SIGNAL |||||

Key:
H - Hall Effect Sensor(s)
a - accelerometer(s)
T - Timer
P - communications Trigger
I – Image / Video capture Request

*FIG. 3B*

Tap

Long Press

Drag

Flick

Pinch

Spread

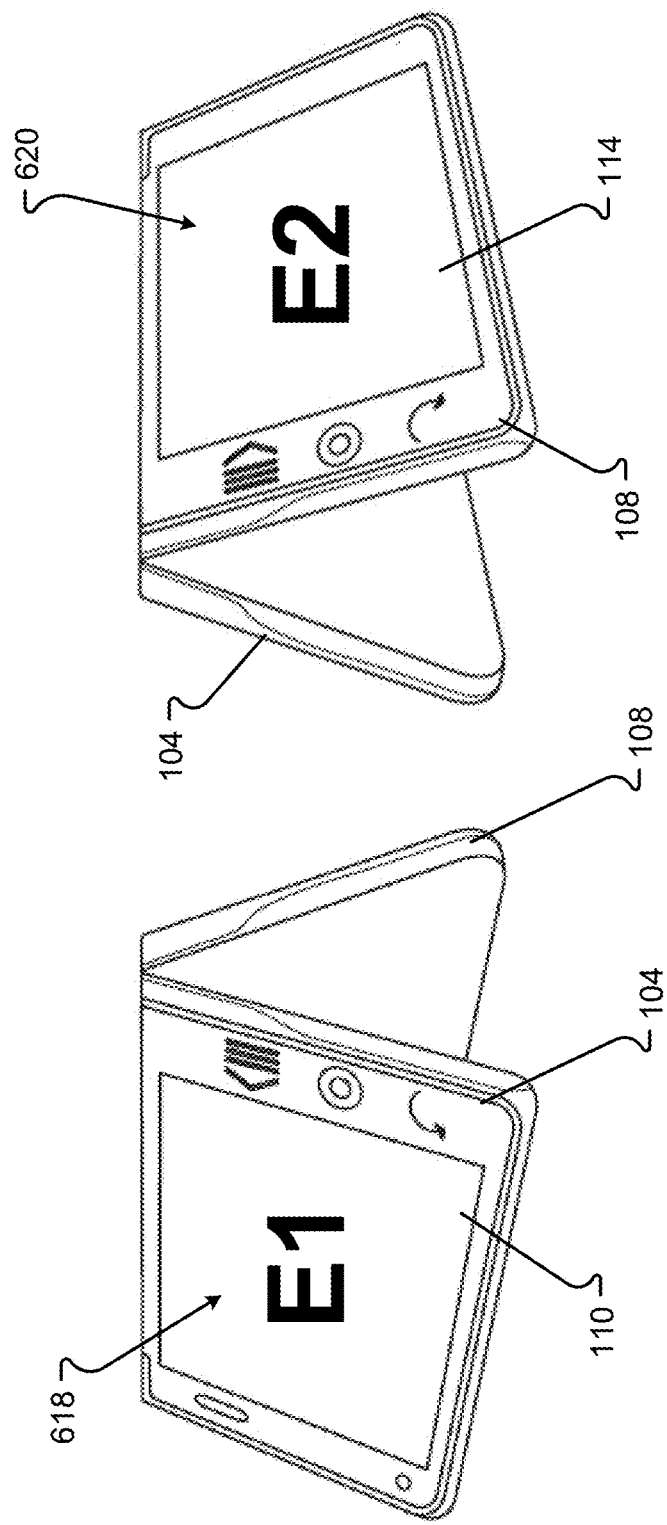

| Scenario | Phone | Smart Pad |
|---|---|---|
| Handset being charged by Smart Pad | | |
| Handset and Smart Pad Charging | | |
| Handset and Smart Pad Depleting | | |

| Battery Charging Mode | Phone | Smart Pad |
|---|---|---|
| Handset Optimize mode | | |
| Smart Pad Optimize mode | | |

| Battery level | Phone | Smart Pad |
|---|---|---|
| Near empty (warning threshold reached) | | |
| Low | | |
| Medium | | |
| Full | | |

FIG. 54

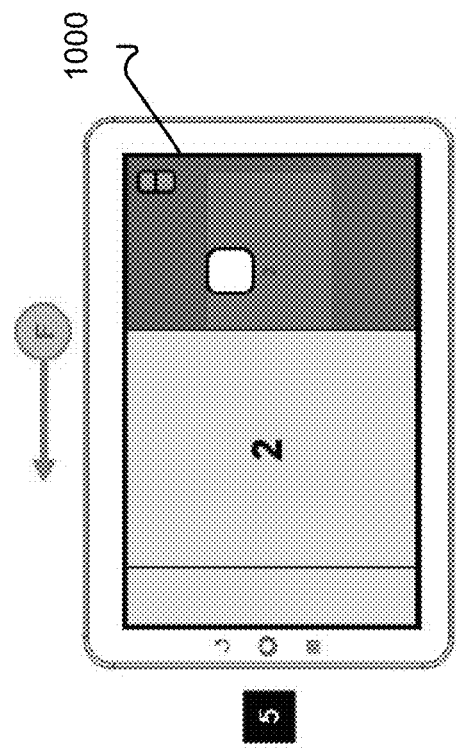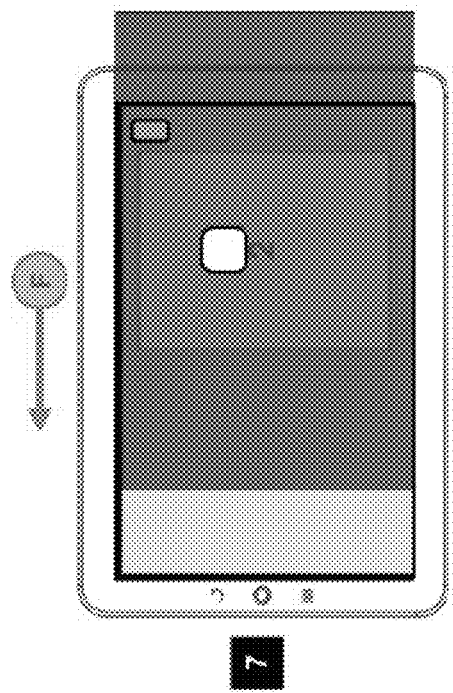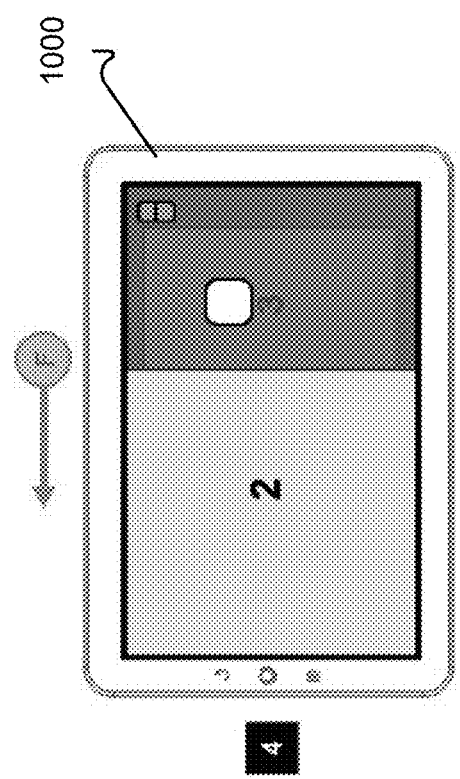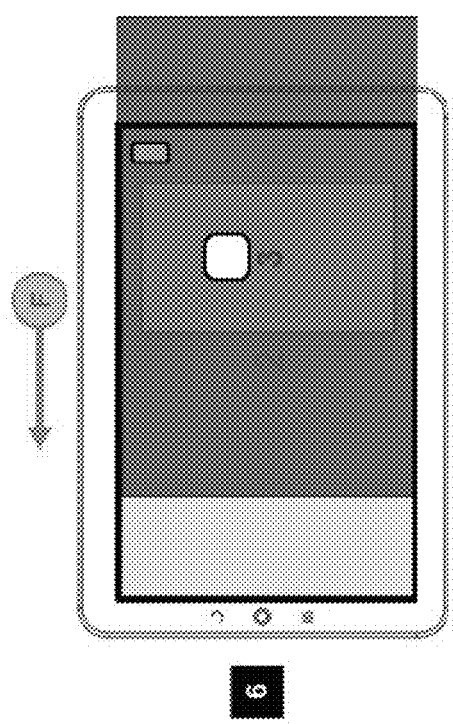
FIG. 85

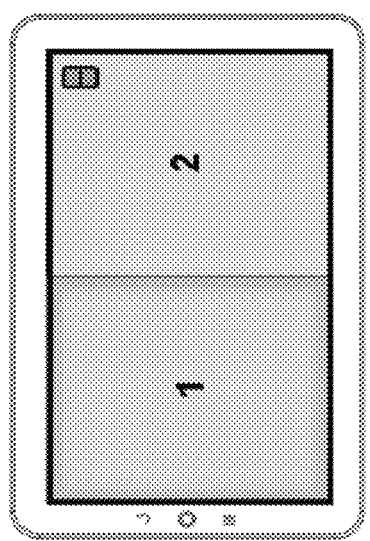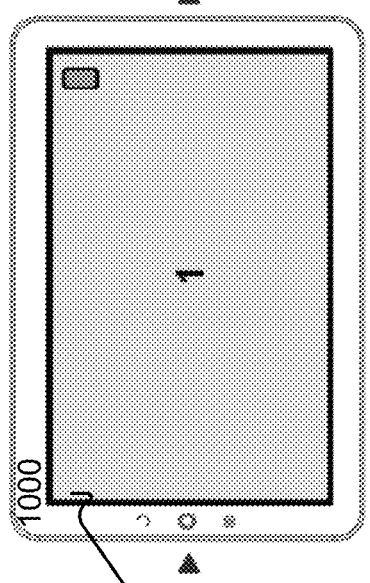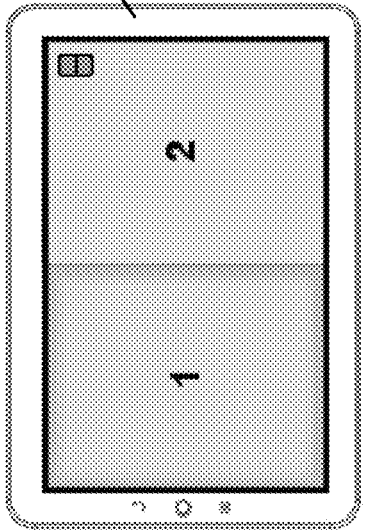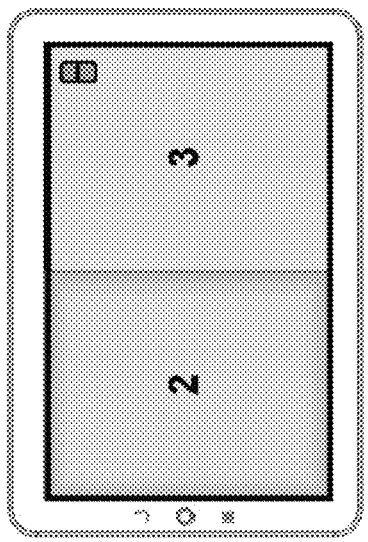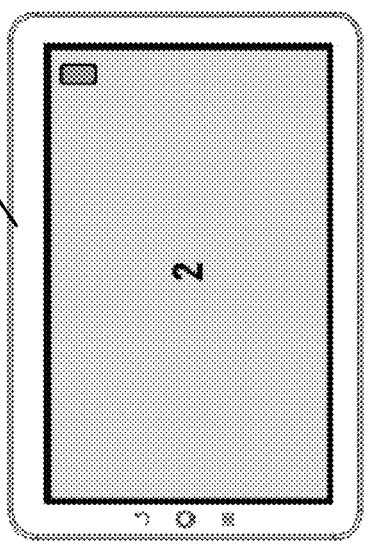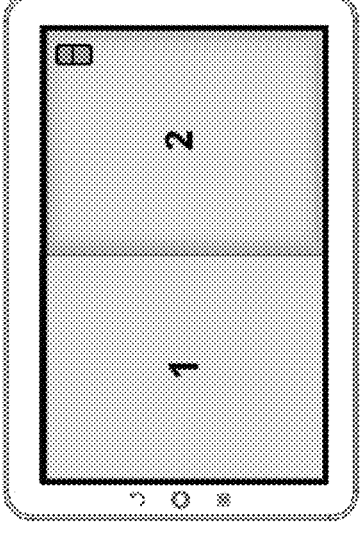
FIG. 100
FIG. 101

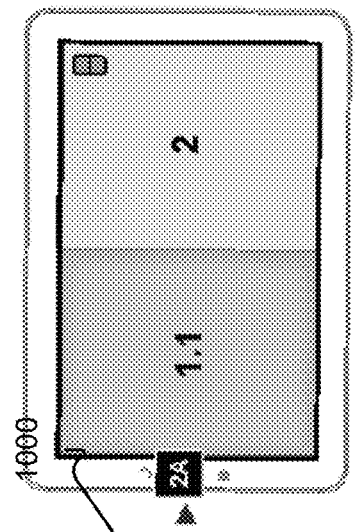
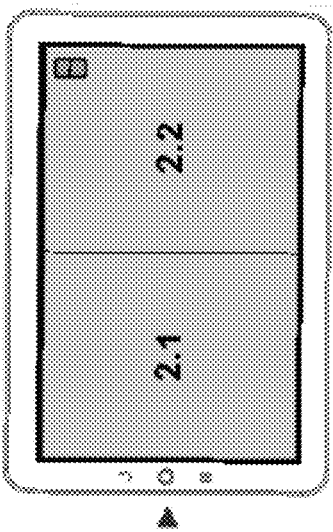
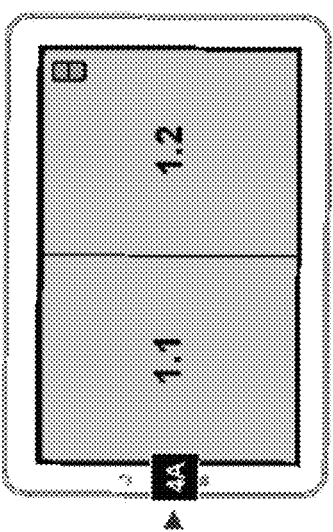
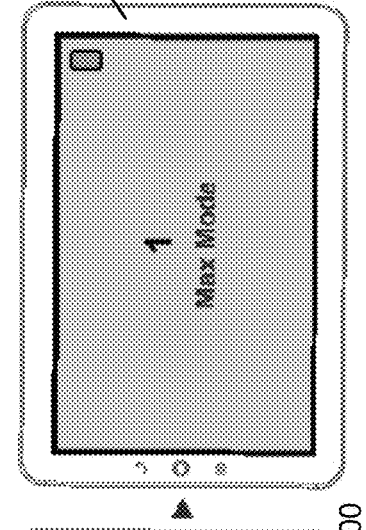
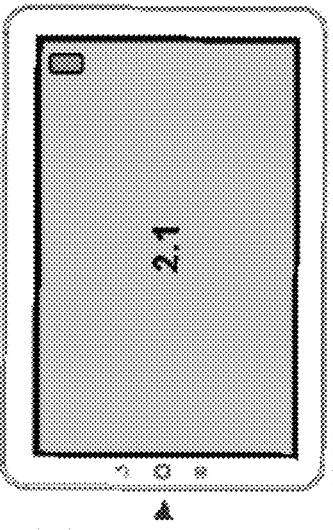
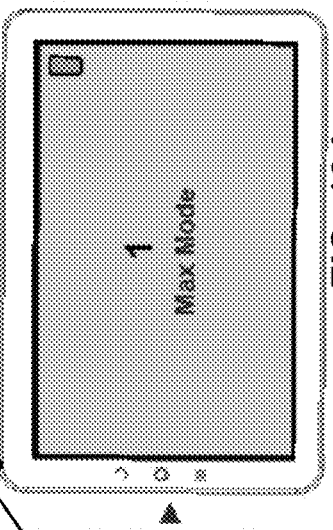
FIG. 102  FIG. 103  FIG. 104
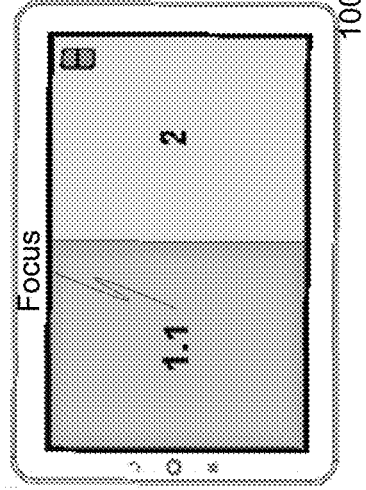
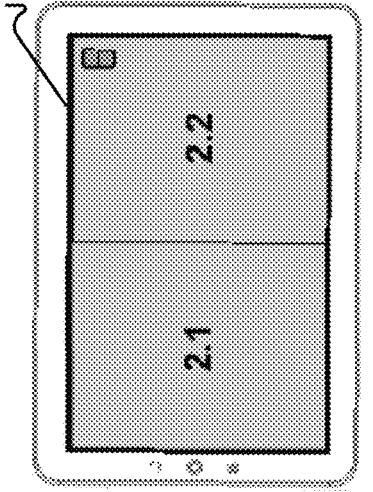
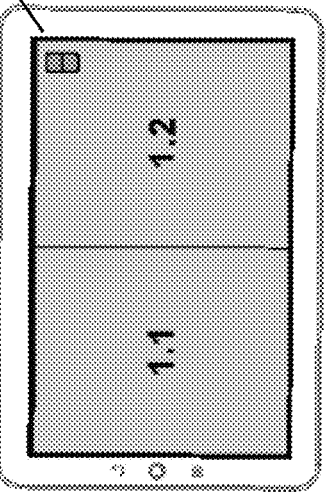

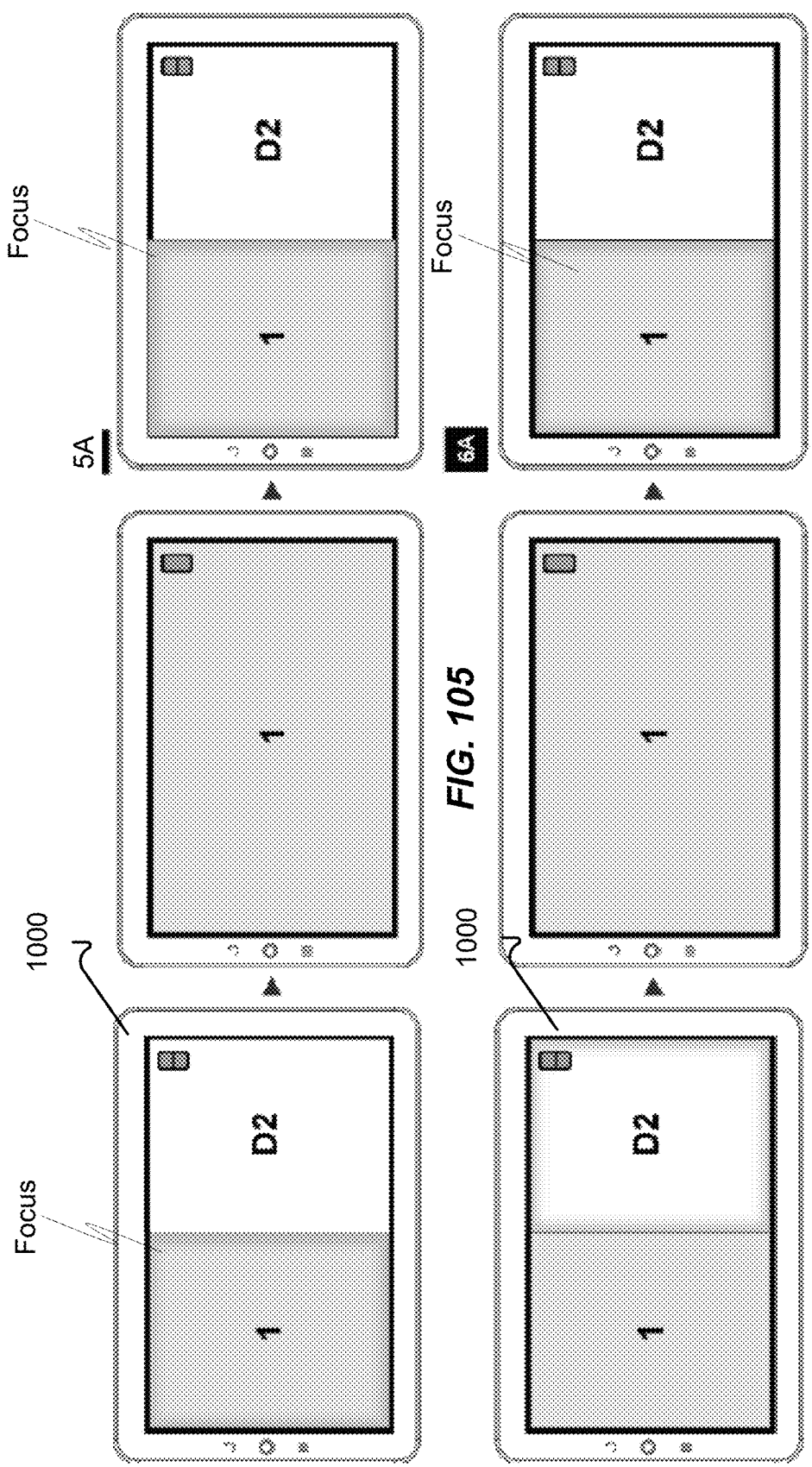

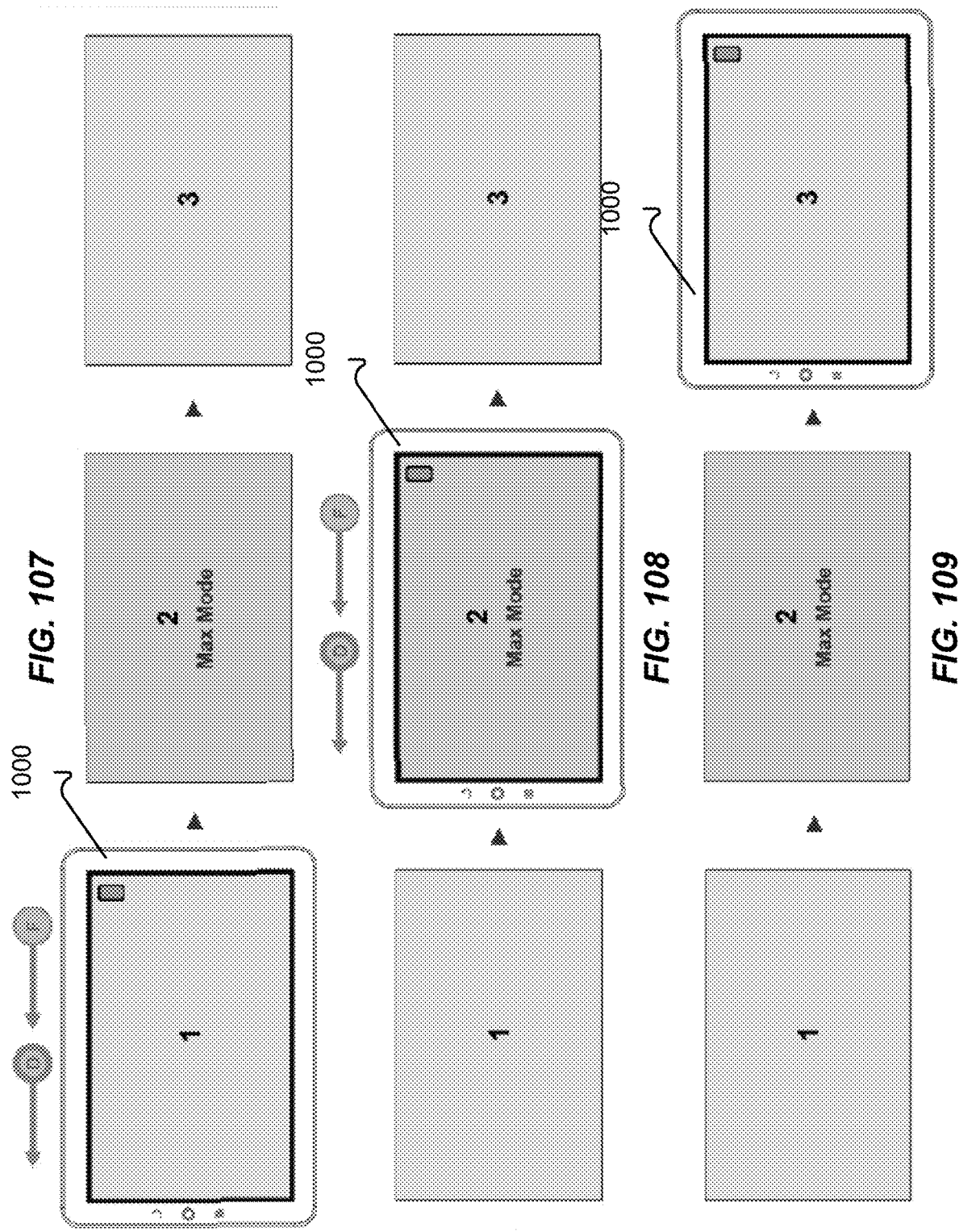

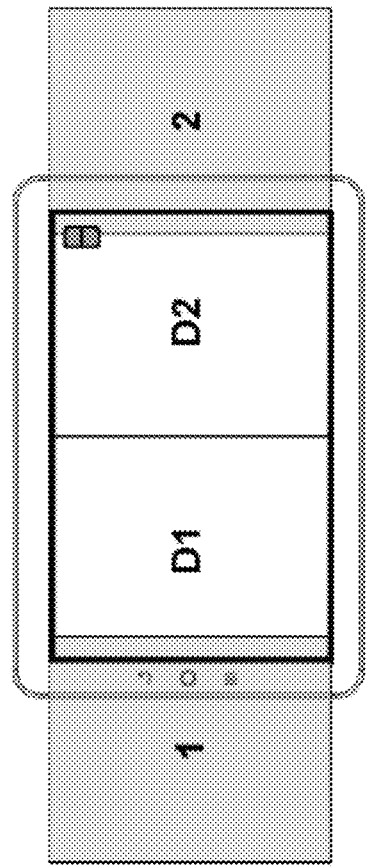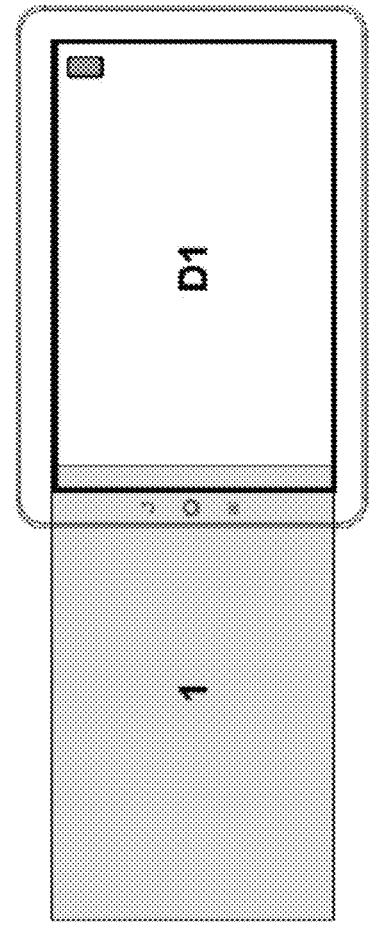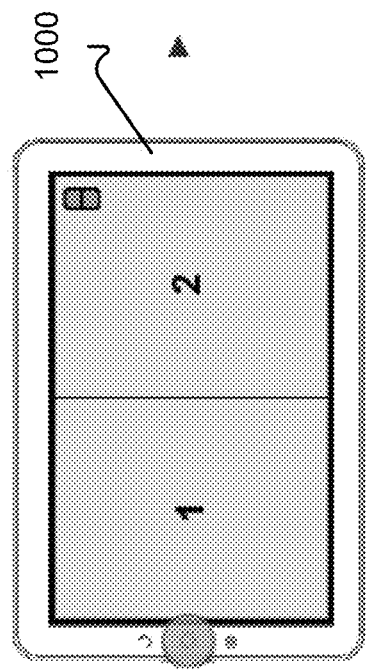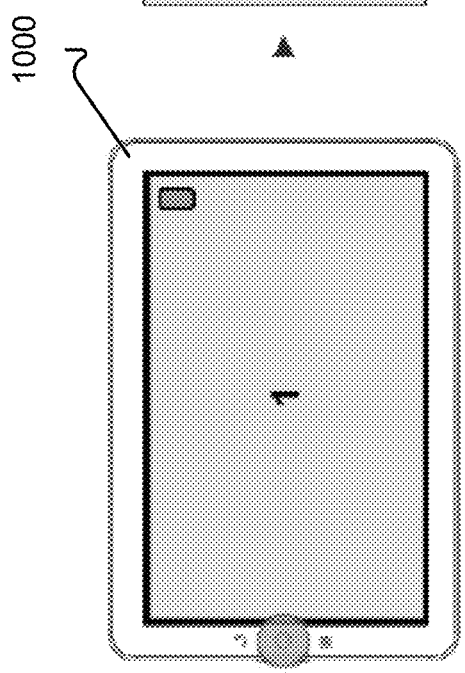
FIG. 112
FIG. 113

FIG. 126

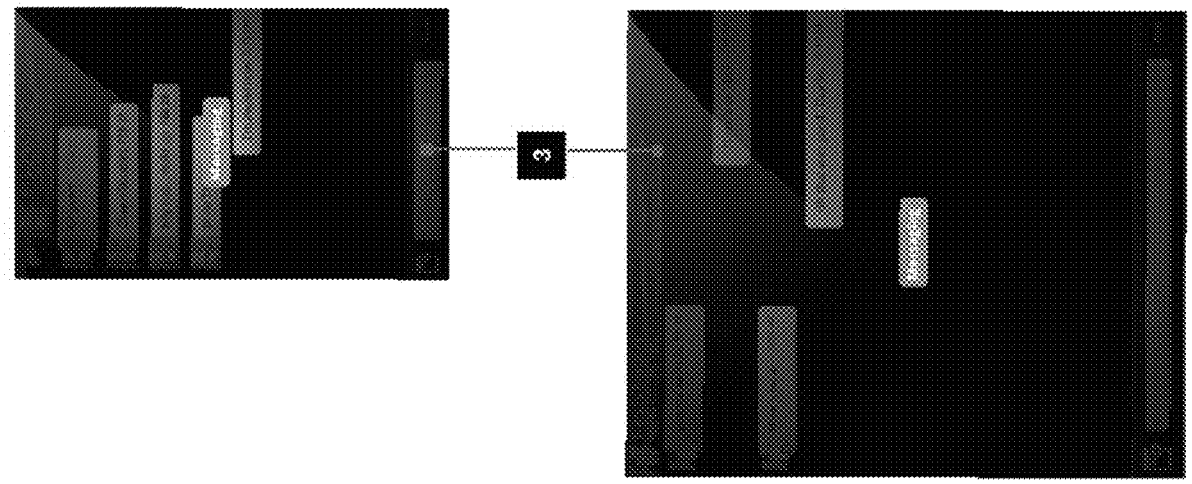
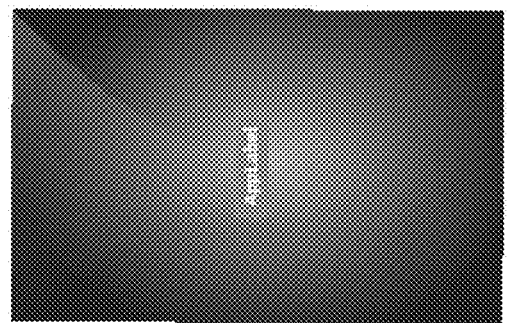
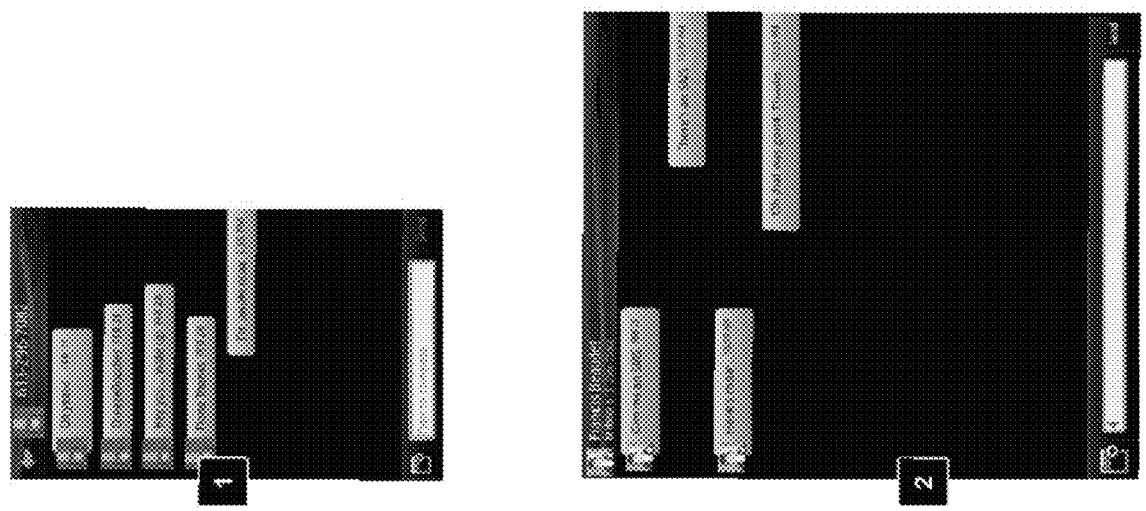
FIG. 128

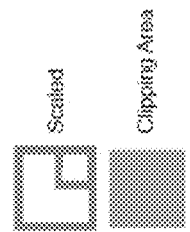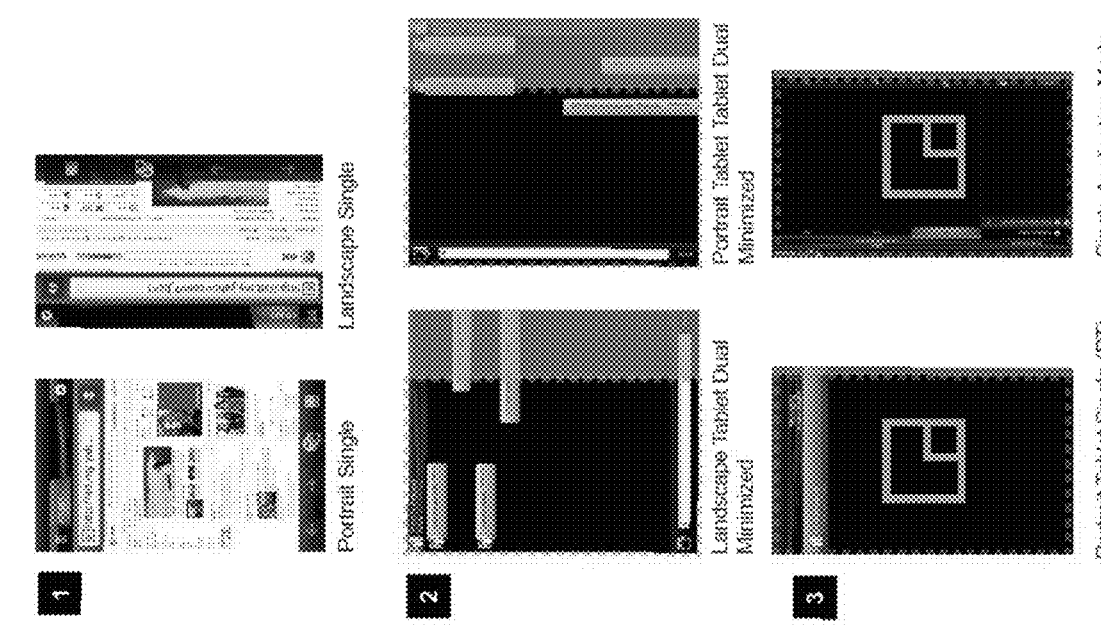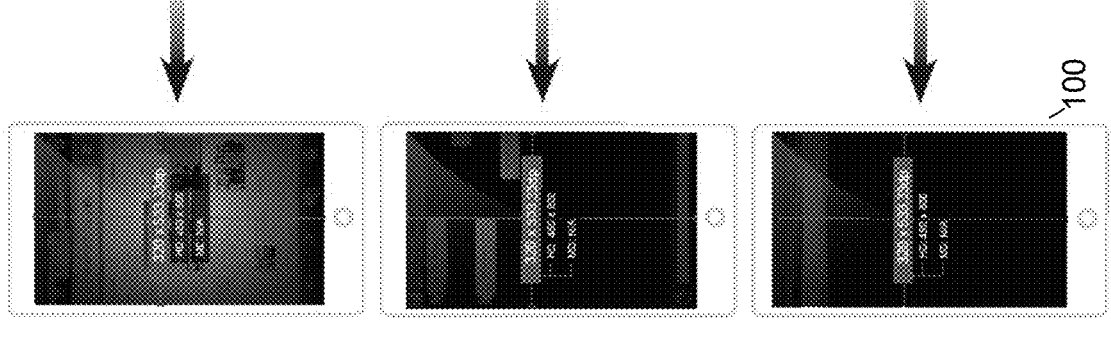
FIG. 130

SMARTPAD WINDOW MANAGEMENT

CROSS REFERENCE TO RELATED APPLICATION

The present application is a continuation of and claims priority to U.S. patent application Ser. No. 16/278,270, filed Feb. 18, 2019, now U.S. Pat. No. 10,740,058, which is a continuation of and claims priority to U.S. patent application Ser. No. 13/627,269, filed Sep. 26, 2012, now U.S. Pat. No. 10,209,940, which claims the benefits of and priority, under 35 U.S.C. § 119(e), to U.S. Provisional Application Ser. No. 61/539,884, filed Sep. 27, 2011, entitled "MOBILE DEVICE," and is related to U.S. patent application Ser. No. 13/408,828, entitled "Smartpad Screen Management," Ser. No. 13/408,839, entitled "Smartpad Screen Modes," Ser. No. 13/364,152, entitled "Desktop Application Manager: Card Dragging of Dual Screen Cards—Smartpad," Ser. No. 13/299,279, entitled "Email Client Display Transitions Between Portrait and Landscape in a Smartpad Device," and Ser. No. 13/299,284, entitled "Email Client Mode Transitions in a Smartpad Device." Each of the aforementioned documents is incorporated herein by reference in their entirety for all that they teach and for all purposes.

BACKGROUND

A substantial number of handheld computing devices, such as cellular phones, tablets, and E-Readers, make use of a touch screen display not only to deliver display information to the user but also to receive inputs from user interface commands. While touch screen displays may increase the configurability of the handheld device and provide a wide variety of user interface options, this flexibility typically comes at a price. The dual use of the touch screen to provide content and receive user commands, while flexible for the user, may obfuscate the display and cause visual clutter, thereby leading to user frustration and loss of productivity.

The small form factor of handheld computing devices requires a careful balancing between the displayed graphics and the area provided for receiving inputs. On the one hand, the small display constrains the display space, which may increase the difficulty of interpreting actions or results. On the other hand, a virtual keypad or other user interface scheme is superimposed on or positioned adjacent to an executing application, requiring the application to be squeezed into an even smaller portion of the display.

This balancing act is particularly difficult for single display touch screen devices. Single display touch screen devices are crippled by their limited screen space. When users are entering information into the device, through the single display, the ability to interpret information in the display can be severely hampered, particularly when a complex interaction between display and interface is required.

SUMMARY

There is a need for a dual multi-display handheld computing device that provides for enhanced power and/or versatility compared to conventional single display handheld computing devices. These and other needs are addressed by the various aspects, embodiments, and/or configurations of the present disclosure. Also, while the disclosure is presented in terms of exemplary embodiments, it should be appreciated that individual aspects of the disclosure can be separately claimed.

Additionally, it is desirable to have the multi-display device be dockable or otherwise associatable with an additional device. In accordance with one exemplary embodiment, the multi-display device is dockable with a smartpad. The exemplary smartpad can include a screen, a touch sensitive display, a configurable area, a gesture capture region(s) and a camera. The smartpad can also include a port adapted to receive the device. The exemplary smartpad is able to cooperate with the device such that information displayable on the device is also displayable on the smartpad. Furthermore, any one or more of the functions on the device are extendable to the smartpad, with the smartpad capable of acting as an input/output interface or extension of the smartpad. Therefore, for example, information from one or more of the displays on the multi-screen device is displayable on the smartpad.

The present disclosure can provide a number of advantages depending on the particular aspect, embodiment, and/or configuration.

For example, the smartpad could provide additional display area to assist a user with viewing content on the device.

Additionally, power sharing and management functions are available due to, for example, the larger size of the smartpad that could be used for power storage.

Furthermore, the smartpad allows functions of a communications device to be extended to a tablet-like platform and/or form factor.

Even further, the disclosure provides techniques directed toward translating or otherwise converting content for a multi-display device into content for a single screen device.

Moreover, the smartpad provides additional input areas adapted to receive input beyond that of the touchscreen.

Additional advantages are directed toward managing the display of one or more windows associated with one or more applications on a multi-display device on a single display device.

Further advantages are directed toward emulation of multi-screen content on a single screen device.

Exemplary aspects are also directed toward:

1. A smartpad comprising:
a display;
an interface adapted to receive a dual screen device, wherein content from the dual screen device is displayable on the display; and
a capacitive button that toggles between one or more application modes on the smartpad.

2. The smartpad of aspect 1, further comprising a gesture capture region.

3. The smartpad of aspect 1, further comprising one or more of a headphone jack, a power button, at least one camera, a power connector and one or more configurable areas.

4. The smartpad of aspect 1, further comprising one or more of a wired and wireless communications link between the dual screen device and the smartpad.

5. The smartpad of aspect 1, further comprising a window management module adapted to transition information displayed on the dual screen device to the display on the smartpad.

6. The smartpad of aspect 1, wherein the dual screen device docks to a receiving port in the smartpad.

7. The smartpad of aspect 1, further comprising one or more of a line in jack, a line out jack, a microphone jack and a communication port.

8. The smartpad of aspect 1, wherein the display is capable of rendering the content displayed on each of the screens on the dual screen device upon docking of the dual screen device to the smartpad.

9. The smartpad of aspect 1, further comprising:
a link between the smartpad and the dual screen device allowing the exchange of power; and
a link between the smartpad and a dock adapted for charging the smartpad, wherein the dock can further be used to charge the dual screen device, the dock including one or more of a headphone jack, a line jack, a USB connector, an AC port and a display port, all connectable to one or more of the smartpad and the dual screen device.

10. The smartpad of aspect 1, wherein the display is a touch sensitive display.

11. A method for operating a smartpad comprising:
receiving a dual screen device in an interface, wherein content from the dual screen device is displayable on a display of the smartpad upon a docking event being detected; and
toggling between one or more application modes on the smartpad based on input received from a capacitive button.

12. The method of aspect 11, further comprising detecting one or more gestures in a gesture capture region.

13. The method of aspect 11, wherein the smartpad includes one or more of a headphone jack, a power button, at least one camera, a power connector and one or more configurable areas.

14. The method of aspect 11, wherein the smartpad includes one or more of a wired and wireless communications link between the dual screen device and the smartpad.

15. The method of aspect 11, further comprising transitioning information displayed on the dual screen device to the display on the smartpad.

16. The method of aspect 11, wherein the dual screen device docks to a receiving port in the smartpad.

17. The method of aspect 11, wherein the smartpad includes one or more of a line in jack, a line out jack, a microphone jack and a communication port.

18. The method of aspect 1, wherein the display is capable of rendering the content displayed on each of the screens on the dual screen device upon docking of the dual screen device to the smartpad.

19. The method of aspect 11, further comprising exchanging power on a link between the smartpad and the dual screen device.

20. The method of aspect 11, wherein the display is a touch sensitive display.

Further exemplary aspects are directed toward:
1. A smartpad comprising:
a screen; and
a display, the display configured to display content from a docked multi-screen device, the content including one or more of a first window corresponding to a first application and a second window corresponding to second application, wherein both windows are capable of being oriented and displayed on the display based on a detected orientation of the smartpad.

2. The smartpad of aspect 1, wherein the display is a touch screen display.

3. The smartpad of aspect 1, wherein the smartpad has a portrait mode and a landscape mode.

4. The smartpad of aspect 1, wherein one or more of:
an application in focus remains in focus on the smartpad,
the display is capable of being logically divided into at least two portions,
the first application is a dual screen application, and
a virtual keyboard is displayed in a landscape mode or a portrait mode.

5. The smartpad of aspect 4, wherein a first of the logical portions displays the first window from the multi-screen device and a second of the logical portions displays the second window from the multi-screen device.

6. The smartpad of aspect 5, wherein the at least two portions are different sizes and relate to two different applications.

7. The smartpad of aspect 1, wherein the smartpad further supports a multi-application mode, the multi-application mode emulating the docked multi-screen device in mini-tablet form.

8. A method comprising:
displaying content from a docked multi-screen device, the content including one or more of a first window corresponding to a first application and a second window corresponding to second application, wherein both windows are capable of being oriented and displayed on the display based on a detected orientation of a smartpad.

9. The method of aspect 8, wherein the display is a touch screen display.

10. The method of aspect 8, wherein the smartpad has a portrait mode and a landscape mode.

11. The method of aspect 8, wherein one or more of:
an application in focus remains in focus on the smartpad,
the display is capable of being logically divided into at least two portions,
the first application is a dual screen application, and
a virtual keyboard is displayed in landscape mode or a portrait mode.

12. The method of aspect 11, wherein a first of the logical portions displays the first window from the multi-screen device and a second of the logical portions displays the second window from the multi-screen device.

13. The method of aspect 12, wherein the at least two portions are different sizes and relate to two different applications.

14. The method of aspect 8, wherein both windows occupy all or substantially all of the display.

15. The method of aspect 8, further comprising resizing one or more of the windows.

16. The method of aspect 8, further comprising redrawing one or more of the windows.

17. The method of aspect 8, further comprising determining an orientation of the smartpad and aligning an orientation of one or more of the windows with the orientation of the smartpad.

18. The method of aspect 8, wherein the smartpad further supports a multi-application mode, the multi-application mode emulating the docked multi-screen device in mini-tablet form.

19. The method of aspect 8, further comprising receiving a request to enter multi-application mode, and, in response thereto, splitting the display into at least two logical portions, a first portion for displaying the first window and a second portion for displaying the second window.

20. The method of aspect 8, further comprising detecting the pressing of a power button and performing one of the following:
waking the smartpad,
toggling a standby mode,
performing a hard reset,
powering on the smartpad,
powering off the smartpad,
displaying an on screen display, and
displaying a smartpad power menu.

Even further exemplary aspects are directed toward:

1. A smartpad comprising:
a screen; and
a display, the display configured to display content from a docked multi-screen device, the content including a virtual keyboard, wherein at least one application from the docked multi-screen device is displayed in conjunction with the virtual keyboard on the display.

2. The smartpad of aspect 1, wherein the display further displays one or more keys associated with a slider bar.

3. The smartpad of aspect 1, wherein the smartpad has a portrait mode and a landscape mode.

4. The smartpad of aspect 1, wherein one or more of:
the display is capable of being logically divided into at least two portions,
the application is a dual screen application, and
the virtual keyboard has a landscape mode and a portrait mode.

5. The smartpad of aspect 6, wherein a first of the logical portions displays a first window from the multi-screen device and a second of the logical portions displays a second window from the multi-screen device.

6. The smartpad of aspect 5, wherein the at least two portions are different sizes and relate to two different applications.

7. The smartpad of aspect 1, wherein the virtual keyboard is dynamically populated with keys based on an application in focus.

8. A method comprising:
displaying content from a docked multi-screen device on a display of a smartpad, the content including at least one virtual keyboard, wherein at least one application on the docked multi-screen device is displayed with the virtual keyboard on the display.

9. The method of aspect 8, wherein the virtual keyboard is dynamically populated with keys based on an application in focus.

10. The method of aspect 8, wherein the display further displays one or more keys associated with a slider bar.

11. The method of aspect 8, wherein one or more of:
the display is capable of being logically divided into at least two portions,
the application is a dual screen application, and
the virtual keyboard has a landscape mode and a portrait mode.

12. The method of aspect 11, wherein a first of the logical portions displays a first window from the multi-screen device and a second of the logical portions displays a second window from the multi-screen device.

13. The method of aspect 12, wherein the at least two portions are different sizes and relate to two different applications.

14. The method of aspect 8, wherein the keyboard can have a portrait or landscape orientation.

15. The method of aspect 8, further comprising resizing the application.

16. The method of aspect 8, further comprising redrawing the application.

17. The method of aspect 8, further comprising determining an orientation of the smartpad and aligning an orientation of the application with an orientation of the smartpad.

18. The method of aspect 8, wherein the smartpad further supports a multi-application mode, the multi-application mode emulating the docked multi-screen device in mini-tablet form.

19. The method of aspect 8, further comprising receiving a gesture requesting viewing of a new application, and, in response thereto, scrolling though one or more available windows corresponding to available applications.

20. The method of aspect 8, wherein the virtual keyboard and slider bar are dynamically populated with keys based on an application in focus.

Additional exemplary aspects are also directed toward:

1. A smartpad comprising:
a screen; and
a display, the display configured to display content from a docked multi-screen device, the content including a contextual keyboard, wherein at least one application from the docked multi-screen device is displayed in conjunction with the contextual keyboard on the display.

2. The smartpad of aspect 1, wherein the display further displays one or more keys associated with a slider bar.

3. The smartpad of aspect 1, wherein the contextual keyboard is chosen based on an application in focus.

4. The smartpad of aspect 1, wherein the contextual keyboard is one:
a standard keyboard;
an uppercase keyboard;
a punctuation/number keyboard;
a secondary/alternative punctuation keyboard;
a messaging keyboard;
an email keyboard;
an internet keyboard; and
a number layout.

5. The smartpad of aspect 6, wherein a first of the logical portions displays a first window from the multi-screen device and a second of the logical portions displays a second window from the multi-screen device.

6. The smartpad of aspect 5, wherein the at least two portions are different sizes and relate to two different applications.

7. The smartpad of aspect 1, wherein the contextual keyboard is dynamically populated with keys based on an application in focus.

8. A method comprising:
displaying content from a docked multi-screen device on a display of a smartpad, the content including at least one contextual keyboard, wherein at least one application on the docked multi-screen device is displayed with the contextual keyboard on the display.

9. The method of aspect 8, wherein the contextual keyboard is dynamically populated with keys based on an application in focus.

10. The method of aspect 8, wherein the display further displays one or more keys associated with a slider bar.

11. The method of aspect 8, wherein one or more of:
a standard keyboard;
an uppercase keyboard;
a punctuation/number keyboard;
a secondary/alternative punctuation keyboard;
a messaging keyboard;
an email keyboard;
an internet keyboard; and
a number layout.

12. The method of aspect 11, wherein a first of the logical portions displays a first window from the multi-screen device and a second of the logical portions displays a second window from the multi-screen device.

13. The method of aspect 12, wherein the at least two portions are different sizes and relate to two different applications.

14. The method of aspect 8, wherein the keyboard can have a portrait or landscape orientation.

15. The method of aspect 8, further comprising resizing the application.

16. The method of aspect 8, further comprising redrawing the application.

17. The method of aspect 8, further comprising determining an orientation of the smartpad and aligning an orientation of the application with an orientation of the smartpad.

18. The method of aspect 8, wherein the smartpad further supports a multi-application mode, the multi-application mode emulating the docked multi-screen device in mini-tablet form.

19. The method of aspect 8, further comprising receiving a gesture requesting viewing of a new application, and, in response thereto, scrolling though one or more available windows corresponding to available applications.

20. The method of aspect 8, wherein the contextual keyboard and a slider bar are automatically chosen based on an application in focus.

More exemplary aspects are directed toward:

1. A smartpad comprising:
  a screen; and
  a display, the display configured to display content from a multi-screen device upon a docking event occurring, the content displayed on the display based on an orientation of the smartpad, an application mode of the smartpad and focus of an application on the multi-screen device.

2. The smartpad of aspect 1, wherein the multi-screen device is in a landscape or a portrait orientation and the smartpad is in a landscape or portrait orientation.

3. The smartpad of aspect 1, wherein the smartpad is in a single application mode or a dual application mode.

4. The smartpad of aspect 1, wherein the multi-screen device is in a single application mode or a dual application mode.

5. The smartpad of aspect 1, wherein a last state of the smartpad is stored and recalled for a re-docking event.

6. The smartpad of aspect 1, wherein an application is displayed in a max mode.

7. The smartpad of aspect 1, wherein an application in an application stack is represent by a screenshot.

8. The smartpad of aspect 7, wherein the screenshot is one or more of resized and re-oriented based on the orientation.

9. The smartpad of aspect 7, wherein the screenshot is presented in a dimmed view.

10. The smartpad of aspect 7, wherein the screenshot, upon being completely revealed, triggers the activation of a corresponding application.

11. A method to operate a smartpad comprising:
  displaying content from a multi-screen device on a display of the smartpad upon a docking event occurring, the content displayed on the display based on an orientation of the smartpad, an application mode of the smartpad and focus of an application on the multi-screen device.

12. The method of aspect 11, wherein the multi-screen device is in a landscape or a portrait orientation and the smartpad is in a landscape or portrait orientation.

13. The method of aspect 11, wherein the smartpad is in a single application mode or a dual application mode.

14. The method of aspect 11, wherein the multi-screen device is in a single application mode or a dual application mode.

15. The method of aspect 11, wherein a last state of the smartpad is stored and recalled for a re-docking event.

16. The method of aspect 11, wherein an application is displayed in a max mode.

17. The method of aspect 11, wherein an application in an application stack is represent by a screenshot.

18. The method of aspect 17, wherein the screenshot is one or more of resized and re-oriented based on the orientation.

19. The method of aspect 17, wherein the screenshot is presented in a dimmed view.

20. The method of aspect 17, wherein the screenshot, upon being completely revealed, triggers the activation of a corresponding application.

Even more exemplary aspects are directed toward:

1. A smartpad comprising:
  a screen; and
  a display, the display configured to display content from a multi-screen device upon a docking event occurring, the smartpad emulating the multi-screen device in an opened state upon selection of a multi-application mode button.

2. The smartpad of aspect 1, wherein a multi-application mode displays two applications on the display simultaneously, with one of the two applications having a corresponding focus indicator.

3. The smartpad of aspect 2, wherein the focus indicator is one or more of a bar, a highlight, a border, a change in location on the display relative to the other application, a change in color relative to the other application and a change in brightness relative to the other application.

4. The smartpad of aspect 1, wherein an application can be expanded to a dual screen mode or a max mode.

5. The smartpad of aspect 2, wherein one of the applications is a desktop.

6. The smartpad of aspect 2, wherein one of the applications is a keyboard.

7. The smartpad of aspect 1, wherein a desktop is displayed after a last application in a stack has been displayed.

8. The smartpad of aspect 1, wherein back, menu and home buttons are provided.

9. The smartpad of aspect 1, wherein multiple sets of back, menu and home buttons are provided.

10. The smartpad of aspect 1, wherein the emulation is an emulation of a mini-tablet mode.

11. A method for operating a smartpad comprising:
  displaying content from a multi-screen device on a display of the smartpad upon a docking event occurring, the smartpad emulating the multi-screen device in an opened state upon selection of a multi-application mode button.

12. The method of aspect 11, wherein a multi-application mode displays two applications on the display simultaneously, with one of the two applications having a corresponding focus indicator.

13. The method of aspect 12, wherein the focus indicator is one or more of a bar, a highlight, a border, a change in location on the display relative to the other application, a change in color relative to the other application and a change in brightness relative to the other application.

14. The method of aspect 11, wherein an application can be expanded to a dual screen mode or a max mode.

15. The method of aspect 12, wherein one of the applications is a desktop.

16. The method of aspect 12, wherein one of the applications is a keyboard.

17. The method of aspect 11, wherein a desktop is displayed after a last application in a stack has been displayed.

18. The method of aspect 11, wherein back, menu and home buttons are provided.

19. The method of aspect 11, wherein multiple sets of back, menu and home buttons are provided.

20. The method of aspect 11, wherein the emulation is an emulation of a mini-tablet mode.

Exemplary aspects are also directed toward:

1. A method for controlling a display of a window on a smartpad, the smartpad displaying content from a multi-screen device on a single display comprising:

providing a windows stack, wherein at least a first window in the windows stack is in an active and displayed state on the single display, wherein at least a second window in the windows stack is in an inactive and not displayed state, and wherein the second window is stored in memory as one of an image of the second window as it appeared in one of a last active state or an image representing the second window;

presenting using on the single display the first window in the active and displayed of state;

receiving a first user input, wherein the first user input includes a signal to uncover the second window and cover the first window;

discontinuing the presentation of the first window;

presenting on the single display the second window, wherein the second window is presented in an inactive state and displayed state.

2. The method of aspect 1, wherein while displayed in the inactive state, the second window is displayed as it appeared in a last active state or an image representing the second window.

3. The method of aspect 2, further comprising:

putting the first window in an inactive and not displayed state, wherein the first window is stored in memory as one of an image of the first window as it appeared in one of a last active state when the user input including a signal to uncover the second window and cover the first window was received or an image representing the first window.

4. The method of aspect 3, further comprising:

initiating operation of a timer at a time corresponding to the presenting the second window.

5. The method of aspect 4, further comprising:

at an expiration of a predetermined time, as determined by the timer, placing the second window in an active and displayed state.

6. The method of aspect 5, wherein prior to the expiration of the predetermined time, the second window remains in the inactive and displayed state.

7. The method of aspect 3, wherein a third window in the windows stack is in an inactive and not displayed state, and wherein the third window is stored in memory as one of an image of the third window as it appeared in one of a last active state or an image representing the third window, the method further comprising:

receiving a second user input, wherein the second user input includes a signal to uncover the third window and cover the second window;

discontinuing the presentation of the second window;

presenting using the at least a first screen the third window, wherein the third window is presented in an inactive and displayed state.

8. The method of aspect 7, wherein during the presentation of the second window between at least the receipt of the first user input and the receipt of the second user input the second window remains in the inactive state and displayed state.

9. The method of aspect 1, wherein a third window in the windows stack is in an active and displayed state, the method further comprising:

presenting the third window in the active and displayed state.

10. The method of aspect 9, wherein the third window remains in the active and displayed state during the discontinuation of the presentation of the first window and the presentation of the second window.

11. A smartpad, comprising:

a first screen, wherein the first screen includes a first touch sensitive display;

memory;

a processor in communication with the first screen and the memory;

a dock adapted to receive a multi-screen device; and application programming stored in the memory and executed by the processor, wherein the application programming is operable to:

maintain at least a first set of windows, wherein the at least a first set of windows is stored in the memory, wherein the first set of windows includes a plurality of windows, wherein at least a first window in the first set of windows is in one of an active and displayed state or an inactive and displayed state, wherein at least a second window in the first set of windows is in an inactive and not displayed state, and wherein the second window is stored in memory as one of an image of the second window as it appeared in one of a last active state or an image representing the second window;

present the first window in the one of the active and displayed state or the inactive and displayed state using the first screen;

receive a first user input, wherein the first user input includes a signal to present the second window and discontinue the presentation of the first window;

in response to the first user input, discontinue the presentation of the first window and present the second window in an inactive and displayed state using the first screen.

12. The device of aspect 11, wherein the second window is presented in the form of the image stored in memory for at least a first period of time.

13. The device of aspect 11, wherein the application programming is further operable to continue to implement a timer, wherein after the expiration of the first period of time the second window is activated and is presented in an active and displayed state.

14. The device of aspect 12, wherein the plurality of windows in the first set of windows includes a third window, wherein the application programming is further operable to:

receive a second user input, wherein the second user input includes a signal to present the third window and discontinue the presentation of the second window, wherein the second user input is received while the second window is presented in the inactive and displayed state;

in response to the second user input, discontinue the presentation of the second window and present the second window in an inactive and displayed state.

15. The device of aspect 11, wherein the application programming is further operable to maintain a second set of windows, wherein the second set of windows is stored in memory, wherein the second set of windows includes a third window, wherein the third window is in an active and displayed state, and wherein the third window is presented in the active and displayed state for at least a portion of a time that the first window is displayed by the first screen and for at least a portion of a time that the second window is displayed by the first screen.

16. A non-transitory computer readable medium having stored thereon computer-executable instructions, the computer executable instructions causing a processor to execute a method for controlling a user interface of a device, the computer-executable instructions comprising:
   instructions to emulate the display of a multi-screen device on a single screen device upon completion of a docking event;
   instructions to maintain a first set of windows, wherein at least a first window is maintained in the first set of windows as an active and displayed window, and wherein at least a second window is maintained in the first set of windows as an inactive and not displayed window;
   instructions to present the first window on a first screen of the device in the active and displayed state;
   instructions to receive a first user interface event, wherein the first user interface event directs the second window to be placed in a displayed state; and
   instructions to, in response to the first user interface event directing the second window to be placed in a displayed state, place the first window in an inactive and not displayed state and to present the second window on the first screen of the device in an inactive and displayed state.

17. The computer readable medium of aspect 16, wherein in the inactive and displayed state the second window is presented as an image of the window in a last active state.

18. The computer readable medium of aspect 16, the computer executable instructions further comprising:
   instructions to maintain a second set of windows, wherein at least a third window is maintained in the second set of windows as an active and displayed window, and wherein at least a fourth window is maintained in the second set of windows as an inactive and not displayed window;
   instructions to present the third window on a second screen of the device in an active and displayed state;
   instructions to receive a second user interface event, wherein the second user interface event directs the fourth window to be placed in a displayed state;
   instructions to, in response to the second user interface event directing the fourth window to be placed in a displayed state, place the third window in an inactive and not displayed state and to present the fourth window on the second screen of the device in an inactive and displayed state.

19. The computer readable medium of aspect 18, wherein for at least a first period of time the second window is presented on the first screen of the device in the inactive and displayed state and the fourth window is presented on a second portion of the first screen of the device in the inactive and displayed state.

20. The computer readable medium of aspect 19, wherein first user interface event is received before the second user interface event, and wherein after the first period of time and for at least a second period of time the second window is presented in an active and displayed state and the fourth window is displayed in the inactive and displayed state.

Exemplary aspects are further directed toward:
1. A smartpad comprising:
   a display;
   an interface adapted to receive a dual screen device, wherein content from the dual screen device is displayable on the display; and
   a visual seam is provided between two applications when displayed on the display, the seam representing a physical seam that is present on the dual screen device.

2. The smartpad of aspect 1, wherein the seam further provides an indication of focus for an in focus application of the two applications.

3. The smartpad of aspect 1, wherein one of the two applications is a desktop.

4. The smartpad of aspect 1, wherein the smartpad is in a landscape or portrait orientation.

5. The smartpad of aspect 1, wherein toggling between a single and a dual application mode toggles which of the two applications is shown, wherein in the single application mode, one application is shown on the full display.

6. The smartpad of aspect 1, wherein toggling between a single and a dual application mode toggles which of the two applications is shown, wherein in the dual application mode, the two applications are shown on the full display with the seam.

7. The smartpad of aspect 6, wherein an indication is provided to the user indicating whether the smartpad is in the single or the dual application mode.

8. The smartpad of aspect 1, wherein upon receipt of an incoming call on the smartpad in dual application mode, an incoming call application is launched on a primary portion of the display.

9. The smartpad of aspect 1, wherein upon receipt of an incoming call on the smartpad in single application mode, an incoming call application is launched on a primary portion of the display after the smartpad switches to dual application mode.

10. The smartpad of aspect 1, wherein upon receipt of an incoming call on the smartpad in single application mode, an incoming call application is launched on a primary portion of the display after the smartpad switches to dual application mode and the seam is placed between the primary portion and a secondary portion showing a minimized second application.

11. A method for operating a smartpad comprising:
   providing a visual seam between two applications when displayed on a display of the smartpad, the seam representing a physical seam that is present on a dual screen device docked with the smartpad.

12. The method of aspect 11, wherein the seam further provides an indication of focus for an in focus application of the two applications.

13. The method of aspect 11, wherein one of the two applications is a desktop.

14. The method of aspect 11, wherein the smartpad is in a landscape or portrait orientation.

15. The method of aspect 11, wherein toggling between a single and a dual application mode toggles which of the two applications is shown, wherein in the single application mode, one application is shown on the full display.

16. The method of aspect 11, wherein toggling between a single and a dual application mode toggles which of the two applications is shown, wherein in the dual application mode, the two applications are shown on the full display with the seam.

17. The method of aspect 16, wherein an indication is provided to the user indicating whether the smartpad is in the single or the dual application mode.

18. The method of aspect 11, wherein upon receipt of an incoming call on the smartpad in dual application mode, an incoming call application is launched on a primary portion of the display.

19. The method of aspect 11, wherein upon receipt of an incoming call on the smartpad in single application mode, an incoming call application is launched on a primary portion of the display after the smartpad switches to dual application mode.

20. The method of aspect 11, wherein upon receipt of an incoming call on the smartpad in single application mode, an incoming call application is launched on a primary portion of the display after the smartpad switches to dual application mode and the seam is placed between the primary portion and a secondary portion showing a minimized second application.

Additional exemplary aspects are directed toward:

1. A smartpad comprising:
an interface adapted to receive a multi-screen device, content from the multi-screen device displayable on a display of the smartpad; and
an interaction module, the interaction module adapted to provide an indication to a user of an interaction with one or more hardware features of the one or more of the smartpad and the multi-screen device.

2. The smartpad of aspect 1, wherein the hardware features include one or more of a power button, a headphone jack, a power adapter, a memory card slot, a volume button, a mute button and a brightness button on the smartpad.

3. The smartpad of aspect 1, wherein the hardware features include one or more of a power button, a headphone jack, a power adapter, a memory card slot, a volume button, a mute button and a brightness button on the multi-screen device.

4. The smartpad of aspect 1, wherein the indication is one or more of a visual, audible and tactile indication.

5. The smartpad of aspect 1, wherein at least one of the hardware features on the multi-screen device is accessible to a user when the multi-screen device is docked with the smartpad.

6. The smartpad of aspect 1, wherein the one or more hardware features of the multi-screen device control operation of the smartpad.

7. The smartpad of aspect 1, wherein one or more o the one or more hardware features of the multi-screen device control operation are not supported by the smartpad.

8. The smartpad of aspect 1, wherein one or more o the one or more hardware features of the multi-screen device control operation are not supported by the smartpad, and one or more of a visual, audible and tactile indication is provided to a user indicating the lack of support.

9. The smartpad of aspect 1, further comprising a communications link between the smartpad and the multi-screen device.

10. The smartpad of aspect 1, wherein the indication is a graphical presentation on the display.

11. A method for operating a smartpad comprising:
providing an indication to a user of an interaction with one or more hardware features of the one or more of the smartpad and the multi-screen device while the smartpad and a multi-screen device are in a docked state, the docked state allowing content from the multi-screen device to be displayed on a display of the smartpad.

12. The method of aspect 11, wherein the hardware features include one or more of a power button, a headphone jack, a power adapter, a memory card slot, a volume button, a mute button and a brightness button on the smartpad.

13. The method of aspect 11, wherein the hardware features include one or more of a power button, a headphone jack, a power adapter, a memory card slot, a volume button, a mute button and a brightness button on the multi-screen device.

14. The method of aspect 11, wherein the indication is one or more of a visual, audible and tactile indication.

15. The method of aspect 11, wherein at least one of the hardware features on the multi-screen device is accessible to a user when the multi-screen device is docked with the smartpad.

16. The method of aspect 11, wherein the one or more hardware features of the multi-screen device control operation of the smartpad.

17. The method of aspect 11, wherein one or more o the one or more hardware features of the multi-screen device control operation are not supported by the smartpad.

18. The method of aspect 11, wherein one or more o the one or more hardware features of the multi-screen device control operation are not supported by the smartpad, and one or more of a visual, audible and tactile indication is provided to a user indicating the lack of support.

19. The method of aspect 11, further comprising establishing a communications link between the smartpad and the multi-screen device.

20. The method of aspect 11, wherein the indication is a graphical presentation on the display.

Exemplary aspects are also directed toward:

1. A smartpad comprising:
a display, the display adapted to display content from a docked multi-screen device; and
a battery measurement module, the battery measurement module adapted to control one or more of charging and power consumption of the smartpad.

2. The smartpad of aspect 1, further comprising a second battery measurement module adapted to control one or more of charging and power consumption of the smartpad.

3. The smartpad of aspect 1, wherein the battery measurement module further controls one or more of charging and power consumption of the multi-screen device.

4. The smartpad of aspect 2, wherein the battery measurement module further controls one or more of charging and power consumption of the smartpad.

5. The smartpad of aspect 1, wherein, based on a threshold, power is sent from the smartpad to the multi-screen device.

6. The smartpad of aspect 1, wherein, based on a threshold, the smartpad is charged.

7. The smartpad of aspect 1, wherein power is received from a power port.

8. The smartpad of aspect 1, wherein the battery measurement module dynamically and automatically determines which of the smartpad and multi-screen device are to receive power.

9. The smartpad of aspect 1, wherein battery power between the smartpad and the multi-screen device can be shared.

10. The smartpad of aspect 1, wherein a user preference controls one or more aspects of the battery measurement module.

11. A method for managing power comprising:
controlling one or more of charging and power consumption of a smartpad, the smartpad adapted to display content from a docked multi-screen device on a display.

12. The method of aspect 11, further comprising a second battery measurement module adapted to control one or more of charging and power consumption of the smartpad.

13. The method of aspect 11, wherein the battery measurement module further controls one or more of charging and power consumption of the multi-screen device.

14. The method of aspect 12, wherein the battery measurement module further controls one or more of charging and power consumption of the smartpad.

15. The method of aspect 11, wherein, based on a threshold, power is sent from the smartpad to the multi-screen device.

16. The method of aspect 11, wherein, based on a threshold, the smartpad is charged.

17. The method of aspect 11, wherein power is received from a power port.

18. The method of aspect 11, wherein the battery measurement module dynamically and automatically determines which of the smartpad and multi-screen device are to receive power.

19. The method of aspect 11, wherein battery power between the smartpad and the multi-screen device can be shared.

20. The method of aspect 11, wherein a user preference controls one or more aspects of the battery measurement module.

Exemplary aspects are also directed toward a further embodiment for:

1. A smartpad comprising:
a window stack, the window stack providing visibility into one or more applications other than an active application, and allowing management of the active and the one or more applications;
a screen capture, the screen capture including a representation of the one or more applications; and
a display controller, the display controller adapted to one or more of resize and reorient the screen capture upon docking of a multi-screen device to the smartpad.

2. The smartpad of aspect 1, wherein the display controller further crops or clips the screen capture.

3. The smartpad of aspect 1, wherein suspended application screen capture treatment is applied to the screen capture.

4. The smartpad of aspect 1, wherein there is a screen capture for each of the one or more applications in the window stack.

5. The smartpad of aspect 1, wherein the screen captures are edited to lessen differences in screen sizes, orientations, content and orientation.

6. The smartpad of aspect 5, wherein the editing is performed during the docking.

7. The smartpad of aspect 1, wherein the one or more applications are suspended applications capable of being reactivated and moved onto a display of the smartpad.

8. The smartpad of aspect 7, wherein the suspended applications undergo a crop and clip upon revealing on the display.

9. The smartpad of aspect 1, wherein the smartpad is in a single application mode or a dual application mode, and is in a portrait or landscape orientation.

10. The smartpad of aspect 1, wherein the multi-screen device is in a single application mode or a dual application mode, and is in a portrait or landscape orientation.

11. A method for controlling a display on a smartpad comprising:
providing visibility into one or more applications other than an active application, and allowing management of the active and the one or more applications via a window stack;
providing a representation of the one or more applications wherein the representation is a screen capture; and
one or more of resizing and reorienting the screen capture upon docking of a multi-screen device to the smartpad.

12. The method of aspect 11, wherein the display controller further crops or clips the screen capture.

13. The method of aspect 11, wherein suspended application screen capture treatment is applied to the screen capture.

14. The method of aspect 11, wherein there is a screen capture for each of the one or more applications in the window stack.

15. The smartpad of aspect 1, wherein the screen captures are edited to lessen differences in screen sizes, orientations, content and orientation.

16. The method of aspect 15, wherein the editing is performed during the docking.

17. The method of aspect 11, wherein the one or more applications are suspended applications capable of being reactivated and moved onto a display of the smartpad.

18. The method of aspect 17, wherein the suspended applications undergo a crop and clip upon revealing on the display.

19. The method of aspect 11, wherein the smartpad is in a single application mode or a dual application mode, and is in a portrait or landscape orientation.

20. The method of aspect 11, wherein the multi-screen device is in a single application mode or a dual application mode, and is in a portrait or landscape orientation.

Even further aspects are directed toward a non-transitory computer-readable information storage media having stored thereon instructions, that when executed by one or more processors, are capable of performing any of the above methods.

These and other advantages will be apparent from the disclosure.

The phrases "at least one", "one or more", and "and/or" are open-ended expressions that are both conjunctive and disjunctive in operation. For example, each of the expressions "at least one of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

The term "a" or "an" entity refers to one or more of that entity. As such, the terms "a" (or "an"), "one or more" and "at least one" can be used interchangeably herein. It is also to be noted that the terms "comprising", "including", and "having" can be used interchangeably.

The term "automatic" and variations thereof, as used herein, refers to any process or operation done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material".

The term "computer-readable medium" as used herein refers to any tangible storage and/or transmission medium that participate in providing instructions to a processor for execution. Such a medium may take many forms, including but not limited to, non-volatile media, volatile media, and transmission media. Non-volatile media includes, for example, NVRAM, or magnetic or optical disks. Volatile media includes dynamic memory, such as main memory. Common forms of computer-readable media include, for example, a floppy disk, a flexible disk, hard disk, magnetic tape, or any other magnetic medium, magneto-optical medium, a CD-ROM, any other optical medium, punch cards, paper tape, any other physical medium with patterns of holes, a RAM, a PROM, and EPROM, a FLASH-EPROM, a solid state medium like a memory card, any other memory chip or cartridge, a carrier wave as described hereinafter, or any other medium from which a computer can read. A digital file attachment to e-mail or other self-contained information archive or set of archives is considered a distribution medium equivalent to a tangible storage medium. When the computer-readable media is configured as a database, it is to be understood that the database may be any type of database, such as relational, hierarchical, object-oriented, and/or the like. Accordingly, the disclosure is considered to include a tangible storage medium or distribution medium and prior art-recognized equivalents and successor media, in which the software implementations of the present disclosure are stored.

The term "desktop" refers to a metaphor used to portray systems. A desktop is generally considered a "surface" that typically includes pictures, called icons, widgets, folders, etc. that can activate show applications, windows, cabinets, files, folders, documents, and other graphical items. The icons are generally selectable to initiate a task through user interface interaction to allow a user to execute applications or conduct other operations.

The term "screen," "touch screen," or "touchscreen" refers to a physical structure that includes one or more hardware components that provide the device with the ability to render a user interface and/or receive user input. A screen can encompass any combination of gesture capture region, a touch sensitive display, and/or a configurable area. The device can have one or more physical screens embedded in the hardware. However a screen may also include an external peripheral device that may be attached and detached from the device. In embodiments, multiple external devices may be attached to the device. Thus, in embodiments, the screen can enable the user to interact with the device by touching areas on the screen and provides information to a user through a display. The touch screen may sense user contact in a number of different ways, such as by a change in an electrical parameter (e.g., resistance or capacitance), acoustic wave variations, infrared radiation proximity detection, light variation detection, and the like. In a resistive touch screen, for example, normally separated conductive and resistive metallic layers in the screen pass an electrical current. When a user touches the screen, the two layers make contact in the contacted location, whereby a change in electrical field is noted and the coordinates of the contacted location calculated. In a capacitive touch screen, a capacitive layer stores electrical charge, which is discharged to the user upon contact with the touch screen, causing a decrease in the charge of the capacitive layer. The decrease is measured, and the contacted location coordinates determined. In a surface acoustic wave touch screen, an acoustic wave is transmitted through the screen, and the acoustic wave is disturbed by user contact. A receiving transducer detects the user contact instance and determines the contacted location coordinates.

The term "display" refers to a portion of one or more screens used to display the output of a computer to a user. A display may be a single-screen display or a multi-screen display, referred to as a composite display. A composite display can encompass the touch sensitive display of one or more screens. A single physical screen can include multiple displays that are managed as separate logical displays. Thus, different content can be displayed on the separate displays although part of the same physical screen.

The term "displayed image" refers to an image produced on the display. A typical displayed image is a window or desktop. The displayed image may occupy all or a portion of the display.

The term "display orientation" refers to the way in which a rectangular display is oriented by a user for viewing. The two most common types of display orientation are portrait and landscape. In landscape mode, the display is oriented such that the width of the display is greater than the height of the display (such as a 4:3 ratio, which is 4 units wide and 3 units tall, or a 16:9 ratio, which is 16 units wide and 9 units tall). Stated differently, the longer dimension of the display is oriented substantially horizontal in landscape mode while the shorter dimension of the display is oriented substantially vertical. In the portrait mode, by contrast, the display is oriented such that the width of the display is less than the height of the display. Stated differently, the shorter dimension of the display is oriented substantially horizontal in the portrait mode while the longer dimension of the display is oriented substantially vertical.

The term "composited display" refers to a logical structure that defines a display that can encompass one or more screens. A multi-screen display can be associated with a composite display that encompasses all the screens. The composite display can have different display characteristics based on the various orientations of the device.

The term "gesture" refers to a user action that expresses an intended idea, action, meaning, result, and/or outcome. The user action can include manipulating a device (e.g., opening or closing a device, changing a device orientation, moving a trackball or wheel, etc.), movement of a body part in relation to the device, movement of an implement or tool in relation to the device, audio inputs, etc. A gesture may be made on a device (such as on the screen) or with the device to interact with the device.

The term "module" as used herein refers to any known or later developed hardware, software, firmware, artificial intelligence, fuzzy logic, or combination of hardware and software that is capable of performing the functionality associated with that element.

The term "gesture capture" refers to a sense or otherwise a detection of an instance and/or type of user gesture. The gesture capture can occur in one or more areas of the screen, A gesture region can be on the display, where it may be referred to as a touch sensitive display or off the display where it may be referred to as a gesture capture area.

A "multi-screen application" refers to an application that is capable of multiple modes. The multi-screen application mode can include, but is not limited to, a single screen mode (where the application is displayed on a single screen) or a composite display mode (where the application is displayed on two or more screens). A multi-screen application can have different layouts optimized for the mode. Thus, the multi-screen application can have different layouts for a single screen or for a composite display that can encompass two or more screens. The different layouts may have different screen/display dimensions and/or configurations on which the user interfaces of the multi-screen applications can be rendered. The different layouts allow the application to optimize the application's user interface for the type of display, e.g., single screen or multiple screens. In single screen mode, the multi-screen application may present one window pane of information. In a composite display mode, the multi-screen application may present multiple window panes of information or may provide a larger and a richer presentation because there is more space for the display contents. The multi-screen applications may be designed to adapt dynamically to changes in the device and the mode depending on which display (single or composite) the system assigns to the multi-screen application. In alternative embodiments, the user can use a gesture to request the application transition to a different mode, and, if a display is available for the requested mode, the device can allow the application to move to that display and transition modes.

A "single-screen application" refers to an application that is capable of single screen mode. Thus, the single-screen application can produce only one window and may not be capable of different modes or different display dimensions. A single-screen application may not be capable of the several modes discussed with the multi-screen application.

The term "window" refers to a, typically rectangular, displayed image on at least part of a display that contains or provides content different from the rest of the screen. The window may obscure the desktop.

The terms "determine", "calculate" and "compute," and variations thereof, as used herein, are used interchangeably and include any type of methodology, process, mathematical operation or technique.

It shall be understood that the term "means" as used herein shall be given its broadest possible interpretation in accordance with 35 U.S.C., Section 112, Paragraph 6. Accordingly, a claim incorporating the term "means" shall cover all structures, materials, or acts set forth herein, and all of the equivalents thereof. Further, the structures, materials or acts and the equivalents thereof shall include all those described in the summary of the invention, brief description of the drawings, detailed description, abstract, and claims themselves.

The preceding is a simplified summary of the disclosure to provide an understanding of some aspects of the disclosure. This summary is neither an extensive nor exhaustive overview of the disclosure and its various aspects, embodiments, and/or configurations. It is intended neither to identify key or critical elements of the disclosure nor to delineate the scope of the disclosure but to present selected concepts of the disclosure in a simplified form as an introduction to the more detailed description presented below. As will be appreciated, other aspects, embodiments, and/or configurations of the disclosure are possible utilizing, alone or in combination, one or more of the features set forth above or described in detail below.

BRIEF DESCRIPTION OF THE DRAWINGS

FIG. 1C includes a third view of an embodiment of a multi-screen user device;

FIG. 1D includes a fourth view of an embodiment of a multi-screen user device;

FIG. 1E includes a fifth view of an embodiment of a multi-screen user device;

FIG. 1F includes a sixth view of an embodiment of a multi-screen user device;

FIG. 1G includes a seventh view of an embodiment of a multi-screen user device;

FIG. 3B is a table of an embodiment of the state model for the device based on the device's orientation and/or configuration;

FIG. 6G is a seventh representation of an embodiment of a device configuration generated in response to the device state;

FIG. 6H is a eighth representation of an embodiment of a device configuration generated in response to the device state;

FIG. 54 illustrates exemplary SP power management icons and states.

FIG. 85 illustrates exemplary window management after docking.

FIG. 88 illustrates exemplary application management.

FIG. 89 illustrates exemplary application management.

FIG. 90 illustrates exemplary application management.

FIG. 91 illustrates exemplary application management.

FIG. 92 illustrates exemplary application management.

FIG. 93 illustrates exemplary application/desktop management.

FIG. 94 illustrates an exemplary keyboard/application configuration.

FIG. 95 illustrates an exemplary stack management.

FIG. 96 illustrates exemplary seam/focus/application/display/stack management.

FIG. 97 illustrates exemplary seam/focus/application/display/stack management.

FIG. 98 illustrates exemplary seam/focus/application/display/stack management.

FIG. 99 illustrates exemplary seam/focus/application/display/stack management.

FIG. 100 illustrates exemplary seam/focus/application/display/stack management.

FIG. 101 illustrates exemplary seam/focus/application/display/stack management.

FIG. 102 illustrates exemplary seam/focus/application/display/stack management.

FIG. 103 illustrates exemplary seam/focus/application/display/stack management.

FIG. 104 illustrates exemplary seam/focus/application/display/stack management.

FIG. 105 illustrates exemplary seam/focus/application/display/stack management.

FIG. 106 illustrates exemplary seam/focus/application/display/stack management.

FIG. 107 illustrates exemplary seam/focus/application/display/stack management.

FIG. 108 illustrates exemplary seam/focus/application/display/stack management.

FIG. 109 illustrates exemplary seam/focus/application/display/stack management.

Figure 110:
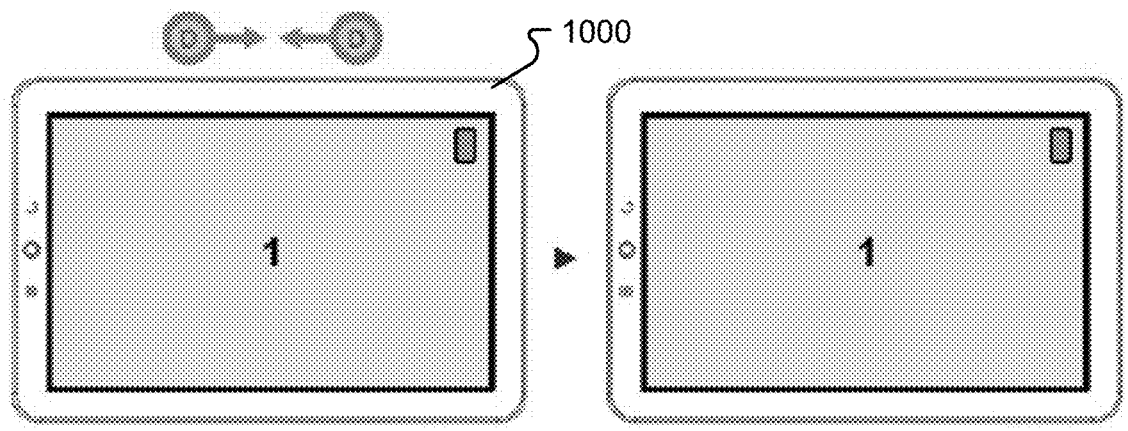

FIG. 110 illustrates exemplary seam/focus/application/display/stack management.

Figure 111:
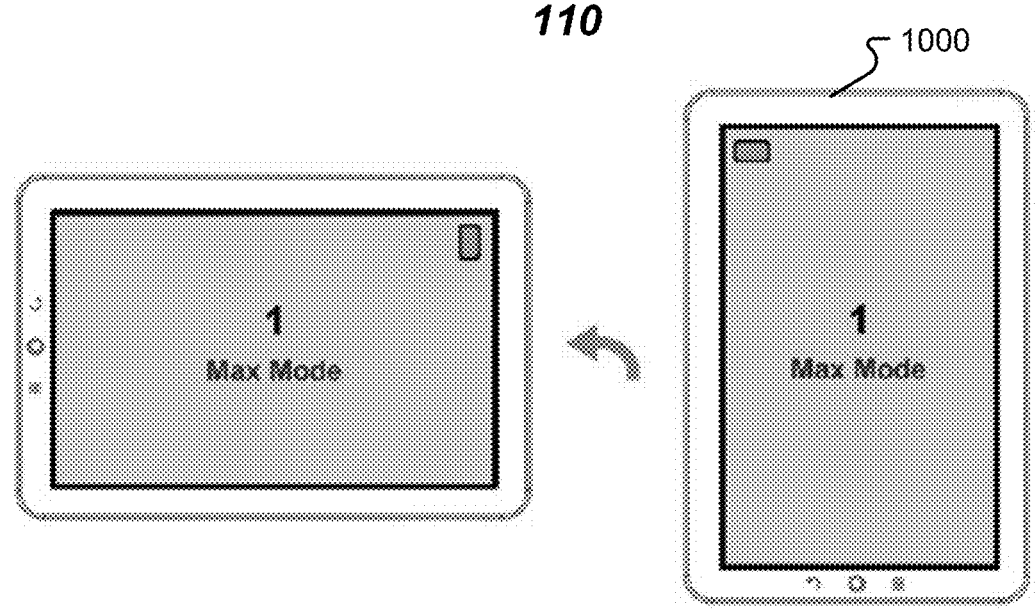

FIG. 111 illustrates exemplary seam/focus/application/display/stack management.

FIG. 112 illustrates exemplary seam/focus/application/display/stack management.

FIG. 113 illustrates exemplary seam/focus/application/display/stack management.

Figure 114:
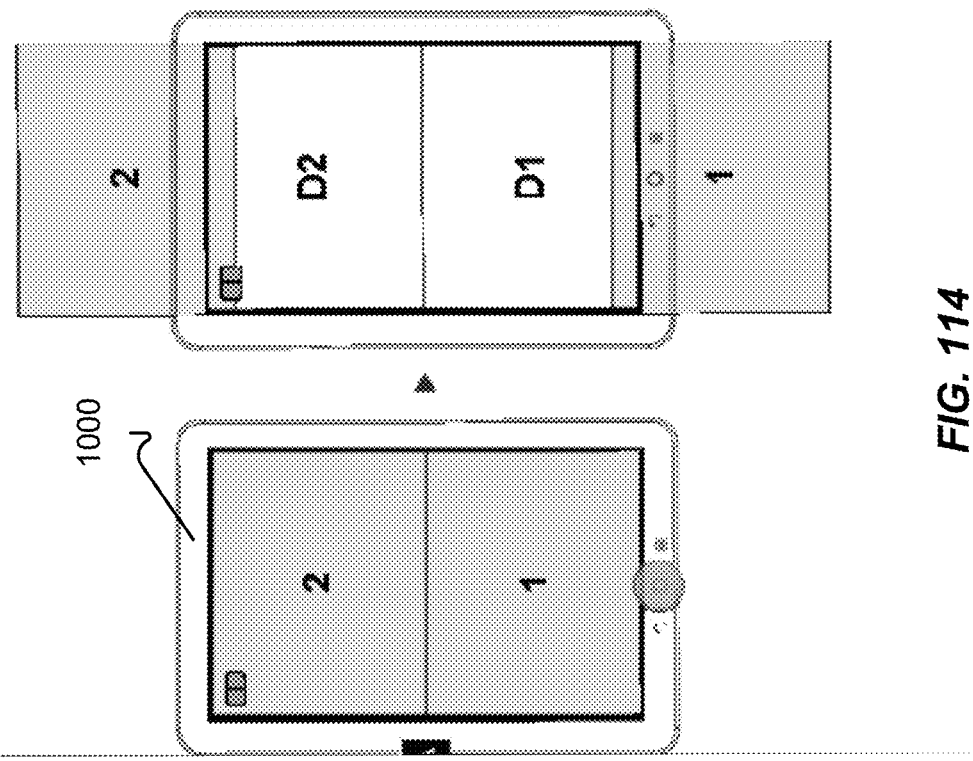

FIG. 114 illustrates exemplary seam/focus/application/display/stack management.

Figure 115:
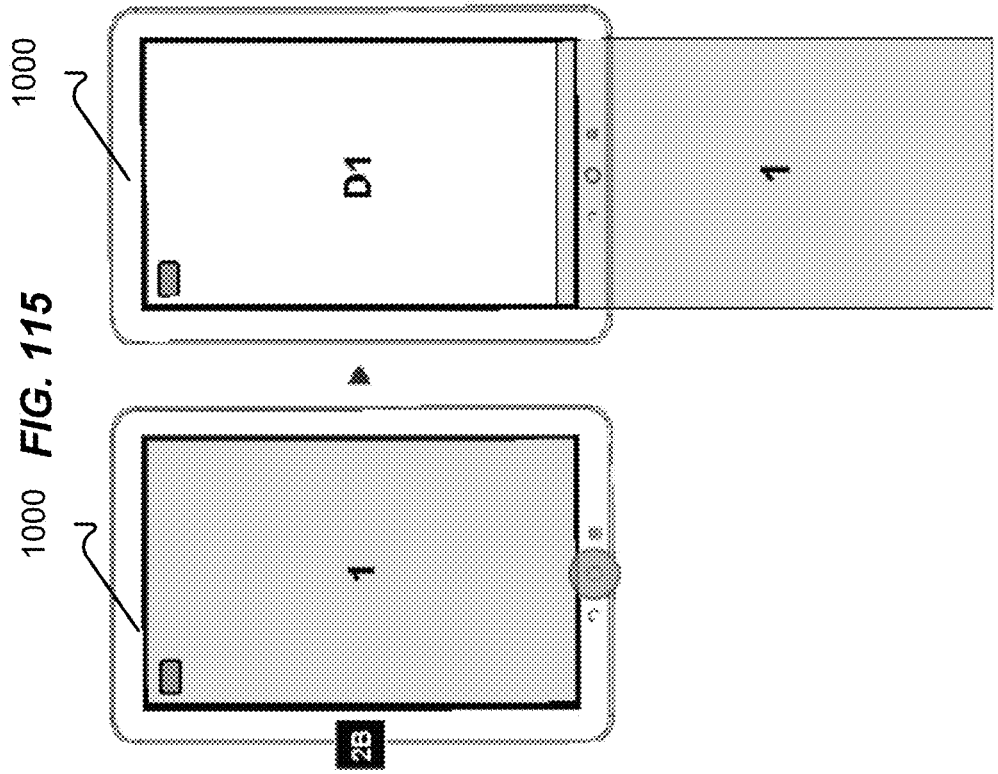

FIG. 115 illustrates exemplary seam/focus/application/display/stack management.

Figure 116:
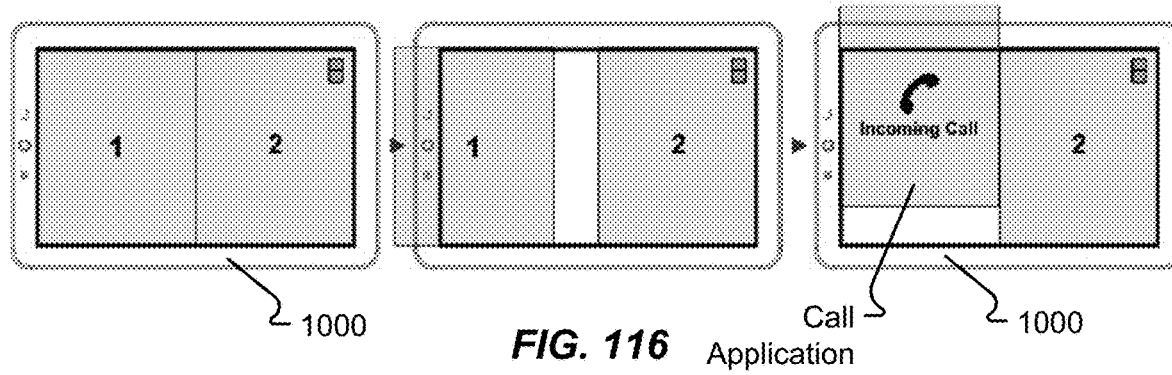

FIG. 116 illustrates an exemplary call management technique.

Figure 117:
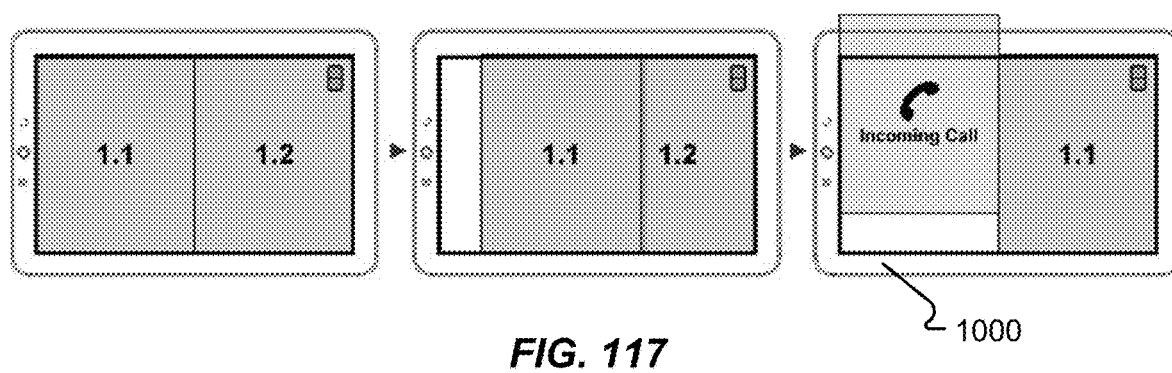

FIG. 117 illustrates an exemplary call management technique.

Figure 118:
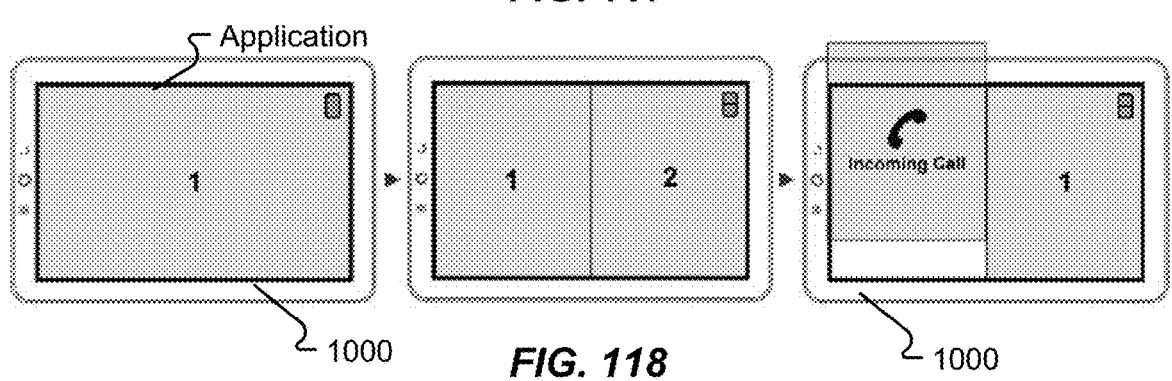

FIG. 118 illustrates an exemplary call management technique.

Figure 119:
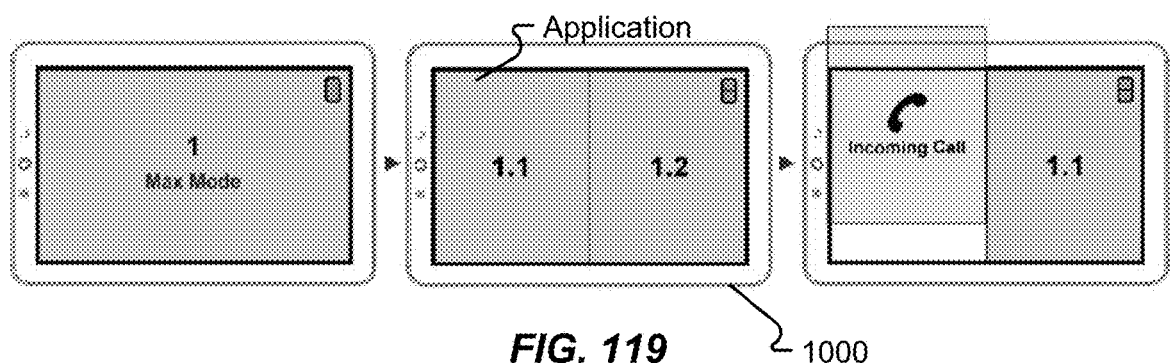

FIG. 119 illustrates an exemplary call management technique.

Figure 120:
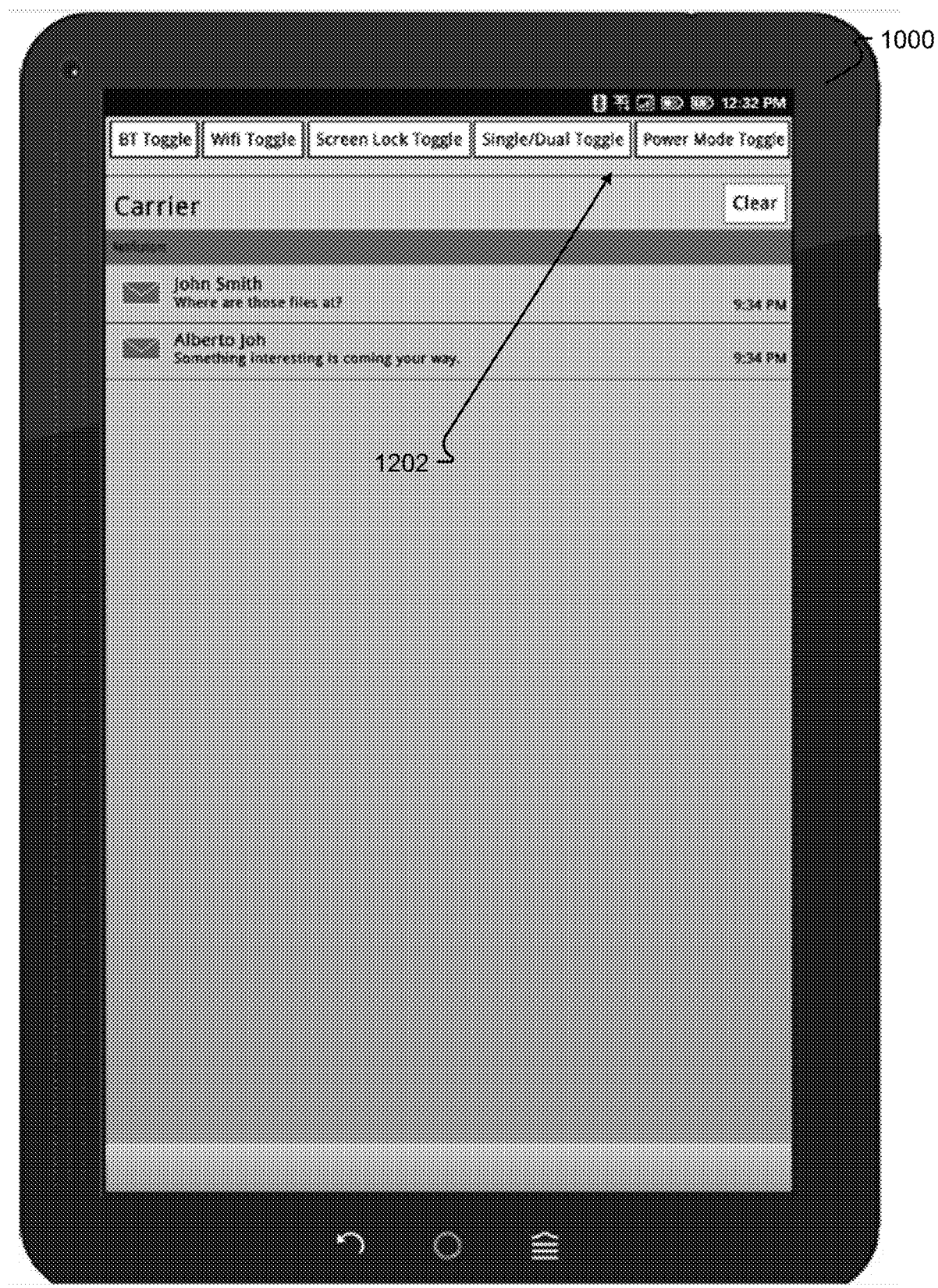

FIG. 120 illustrates an exemplary notification configuration.

Figure 121:
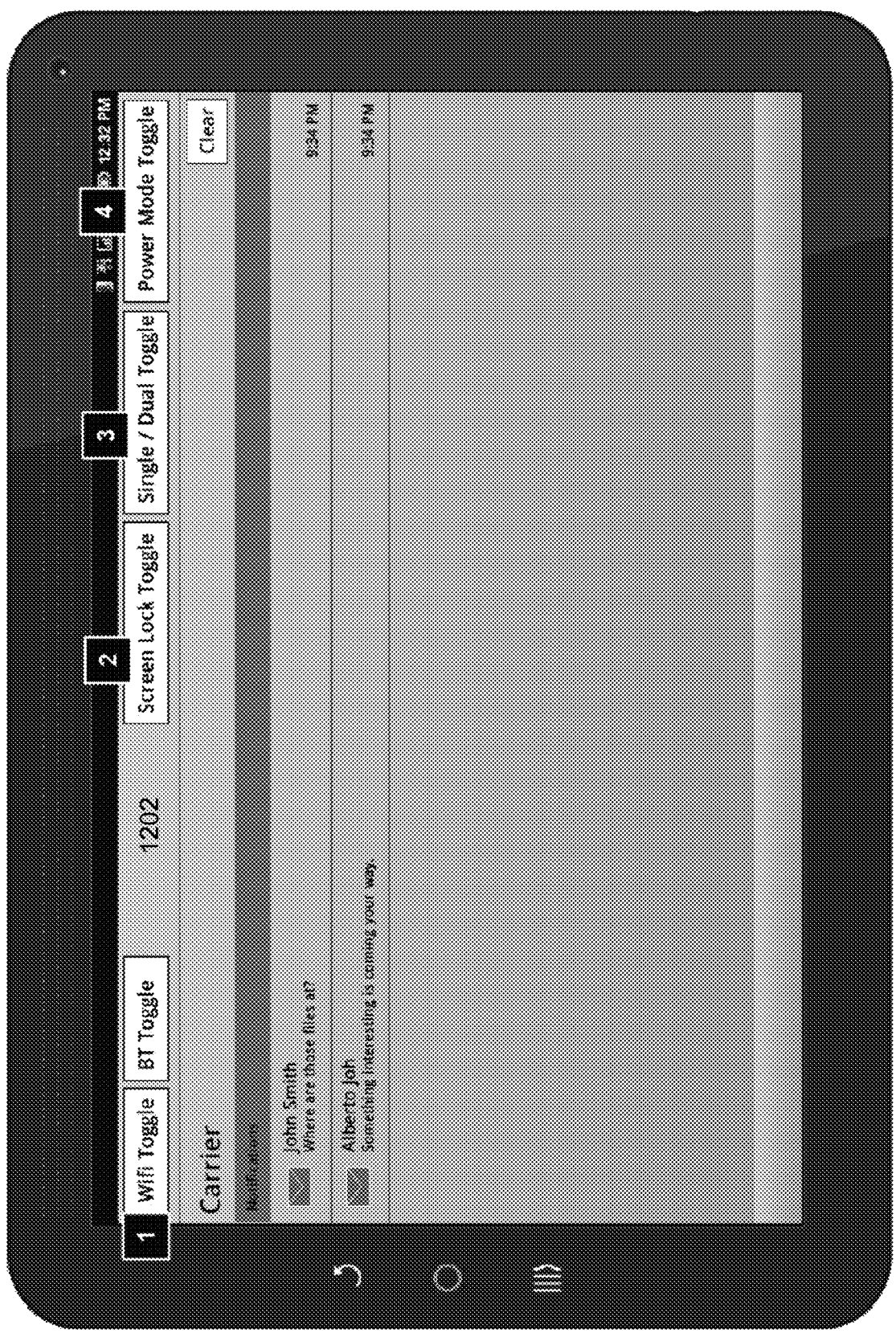

FIG. 121 illustrates another exemplary notification configuration.

Figure 122:
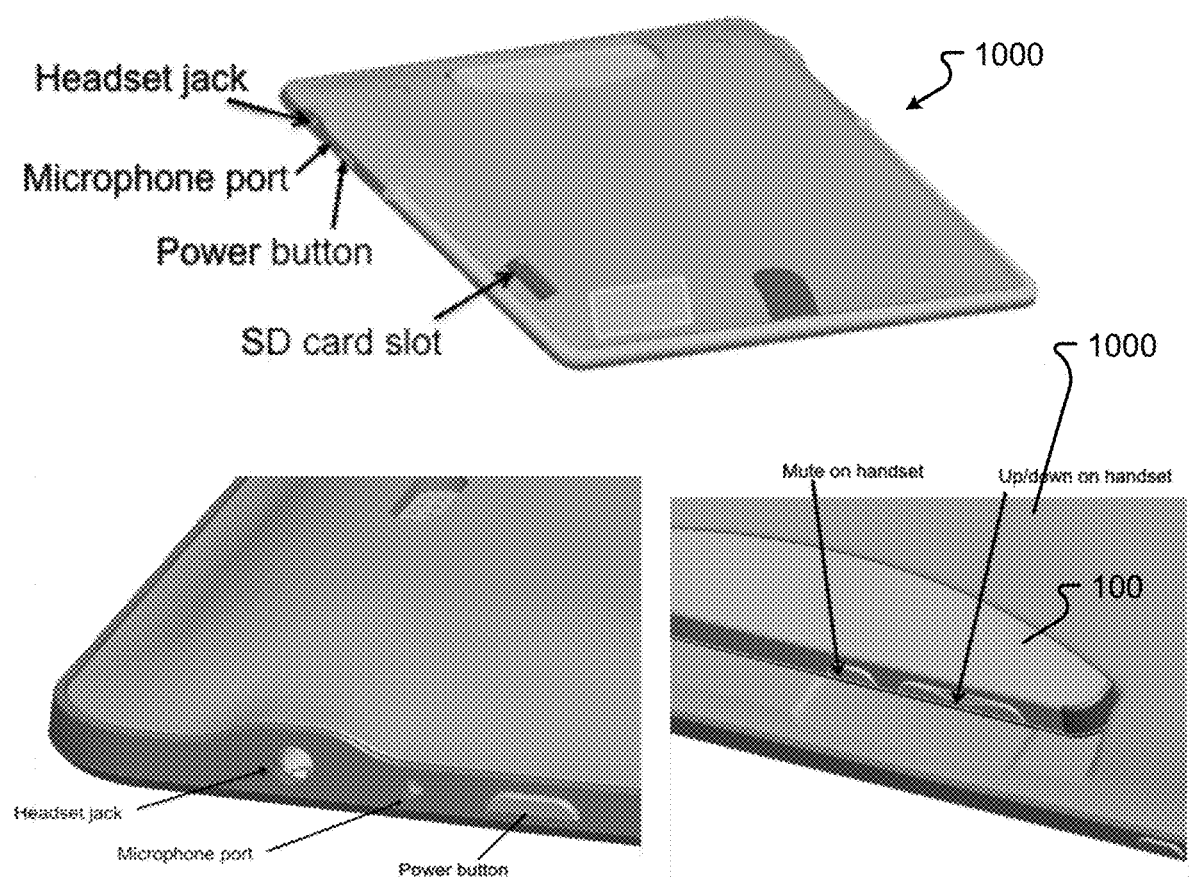

FIG. 122 illustrates an exemplary cross-device hardware button recognition configuration.

Figure 123:
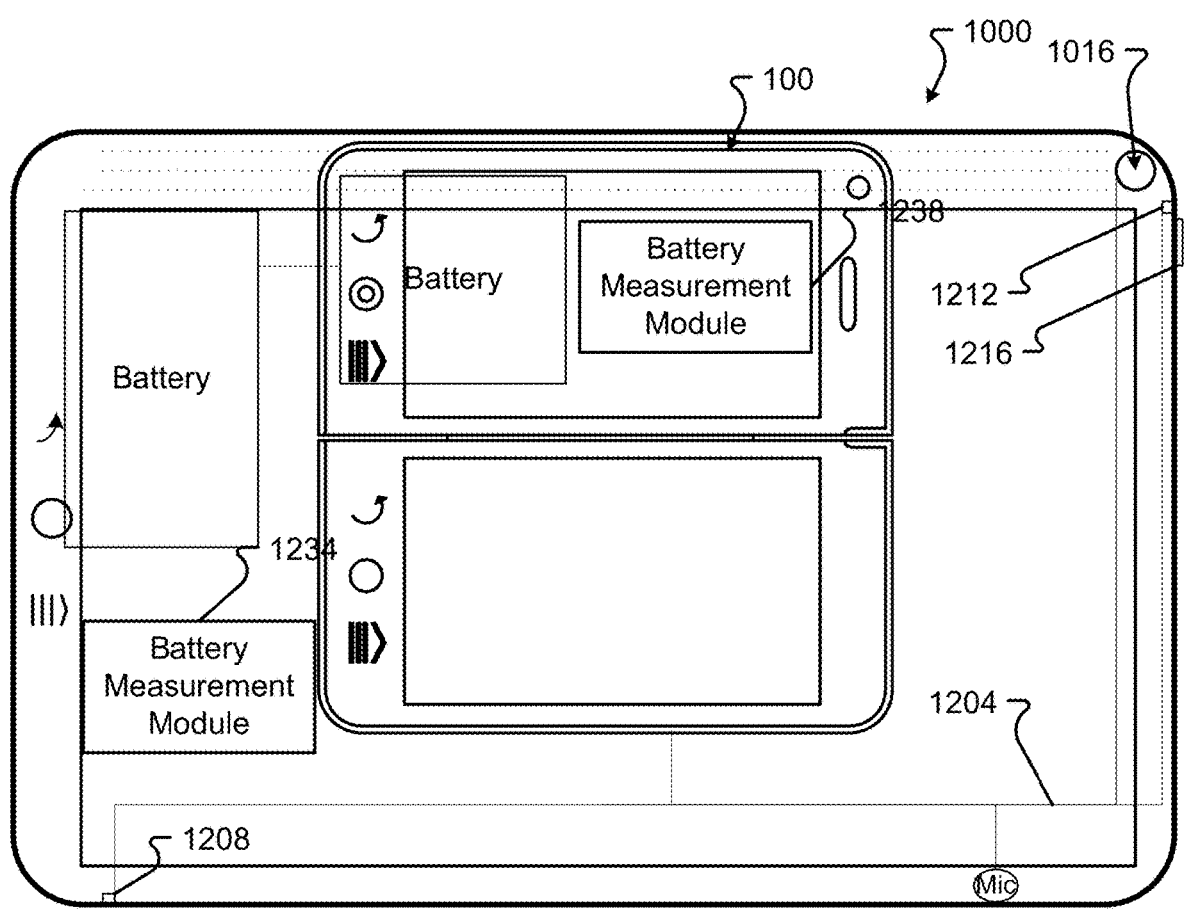

FIG. 123 illustrates an exemplary power management configuration.

Figure 124:
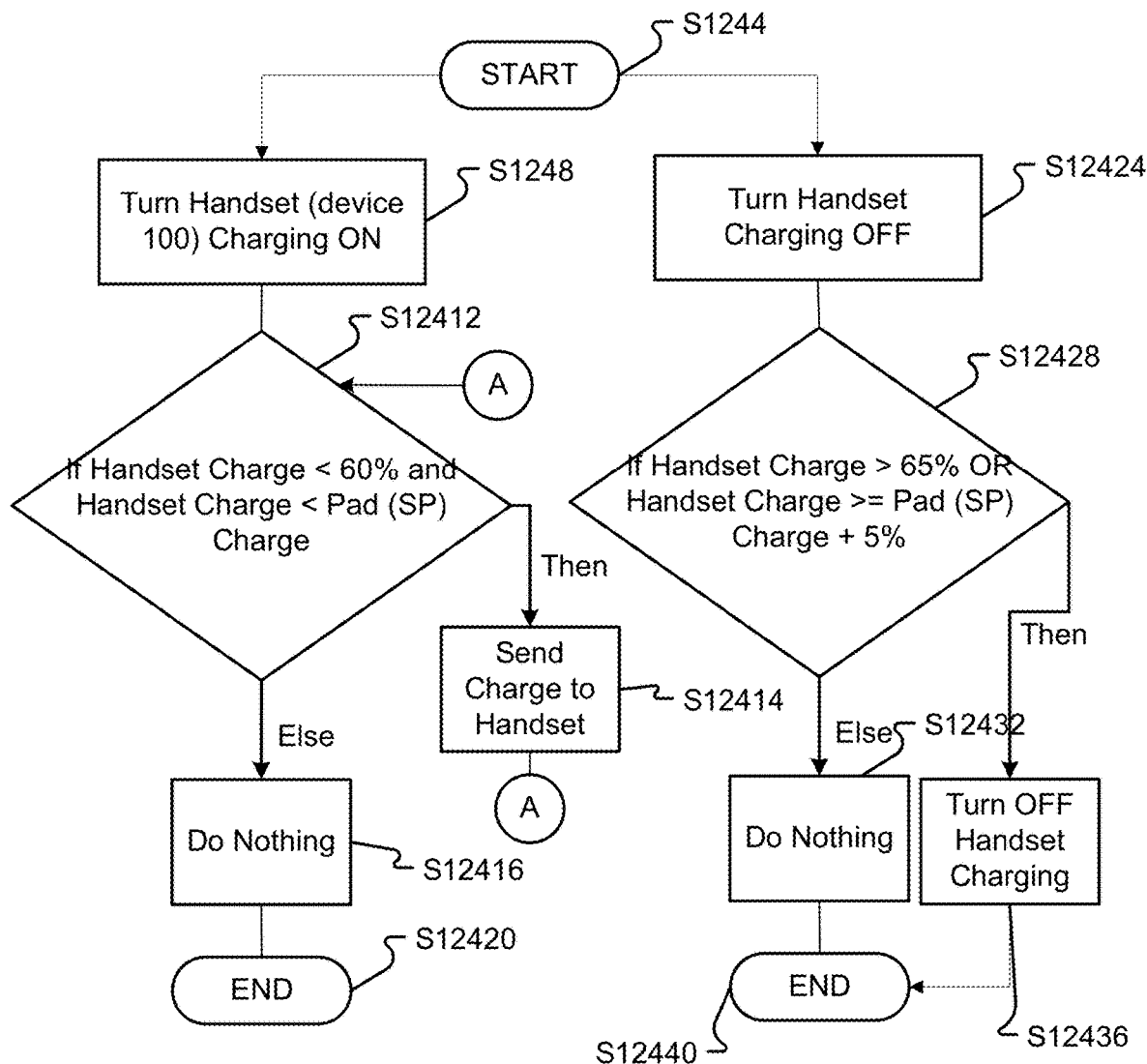

FIG. 124 illustrates an exemplary method for power management.

Figure 125:
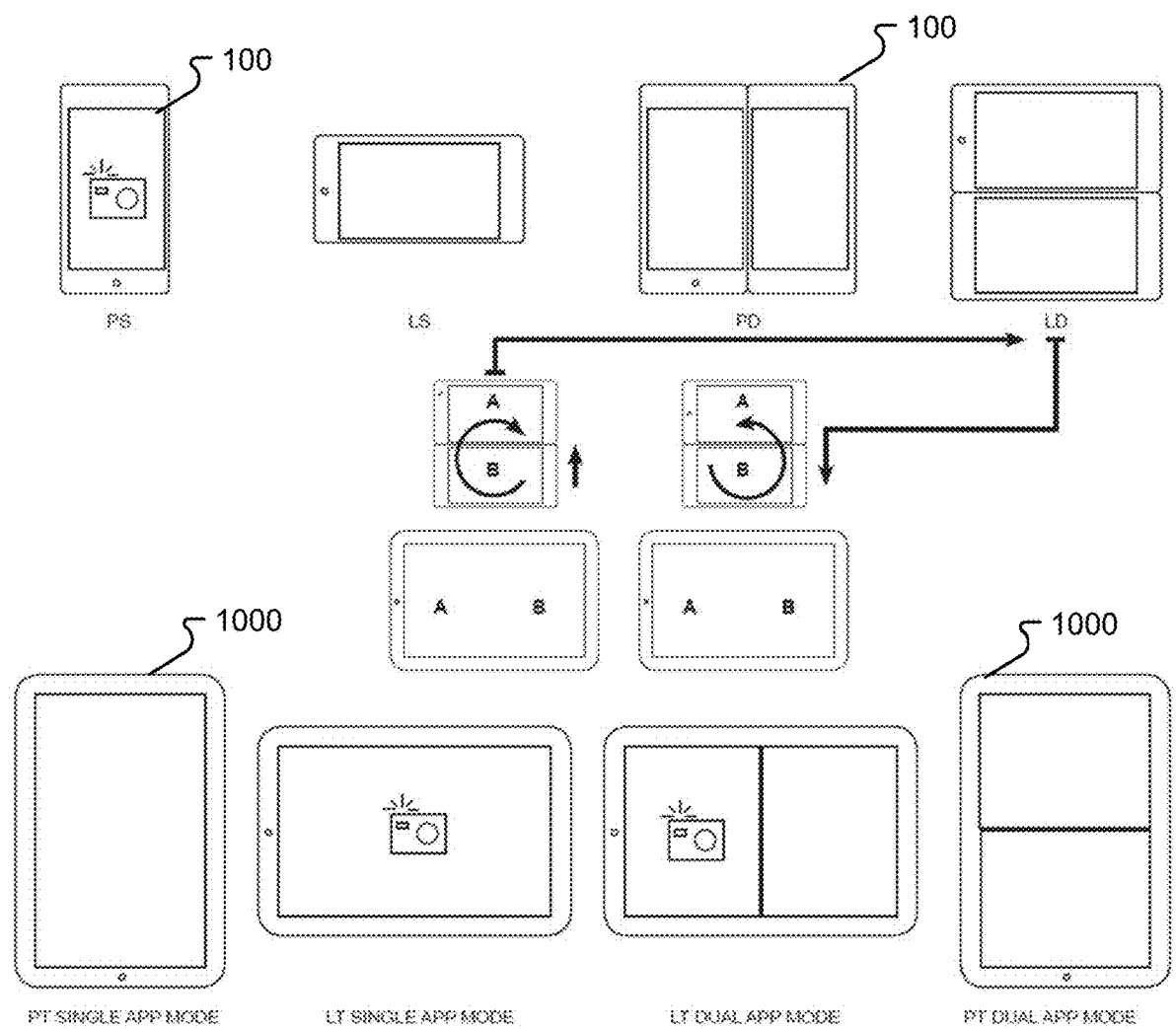

FIG. 125 illustrates an exemplary screen snapshot management technique.

Figure 126:
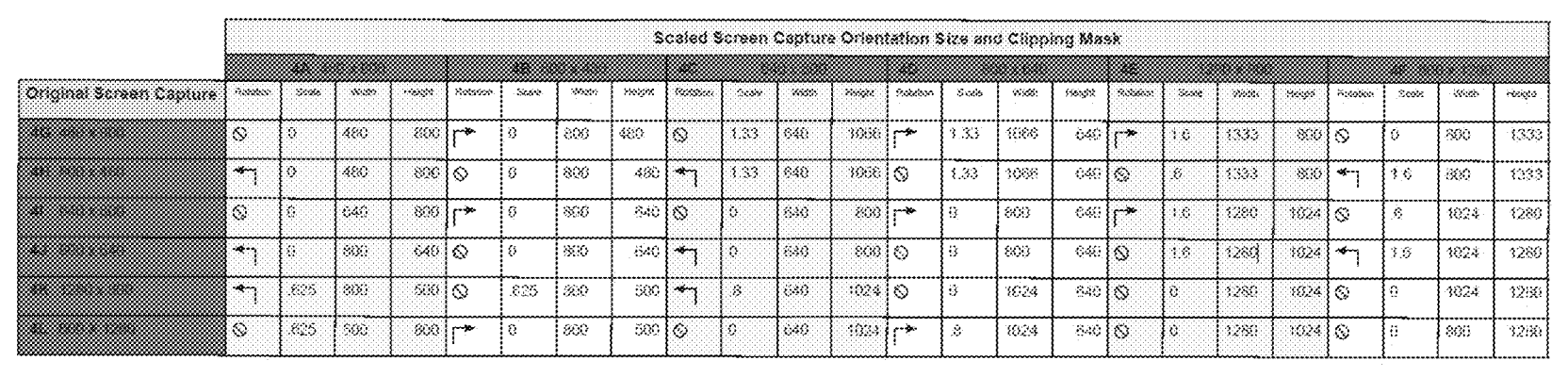

FIG. 126 illustrates an exemplary method for managing and resizing screen captures.

Figure 127:
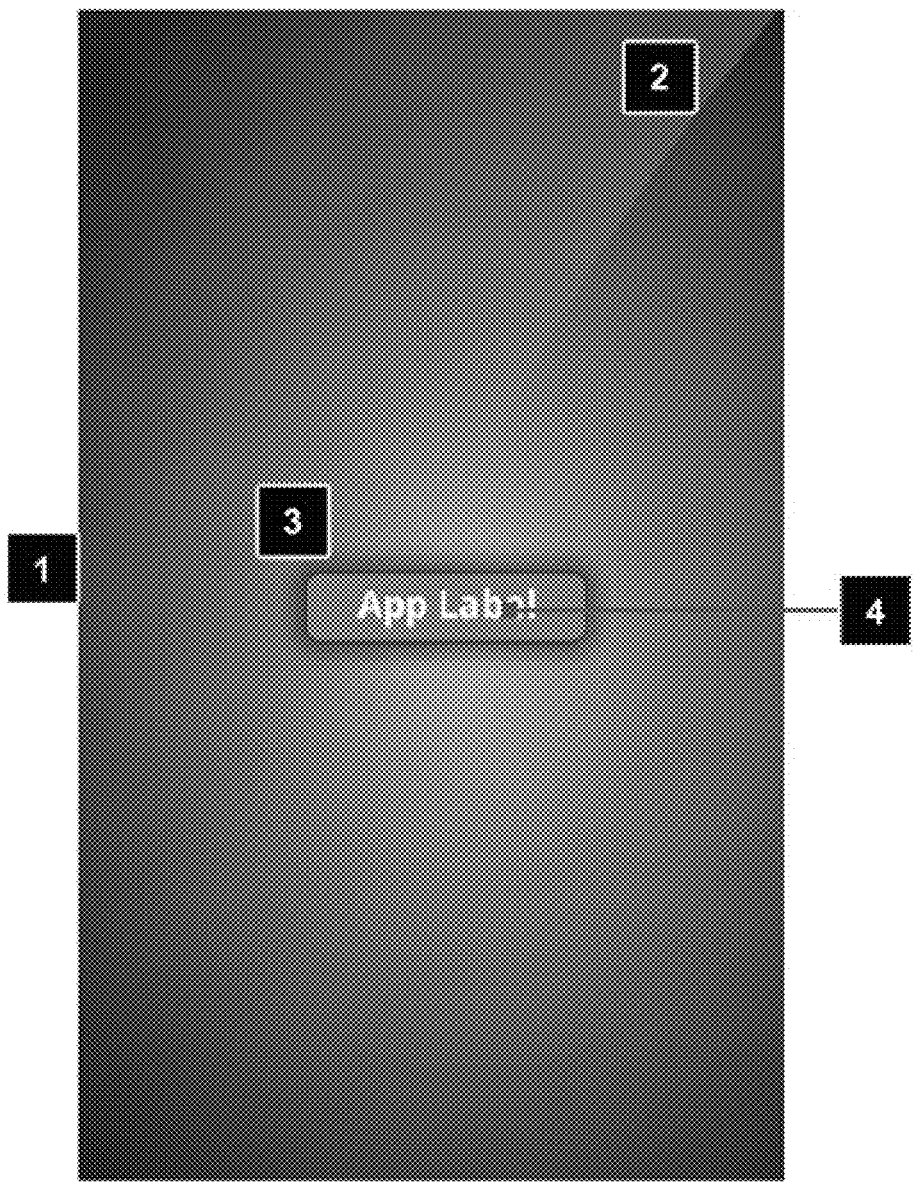

FIG. 127 illustrates an exemplary configuration for harmonizing displayed images.

FIG. 128 illustrates an exemplary composited application screen.

Figure 129:
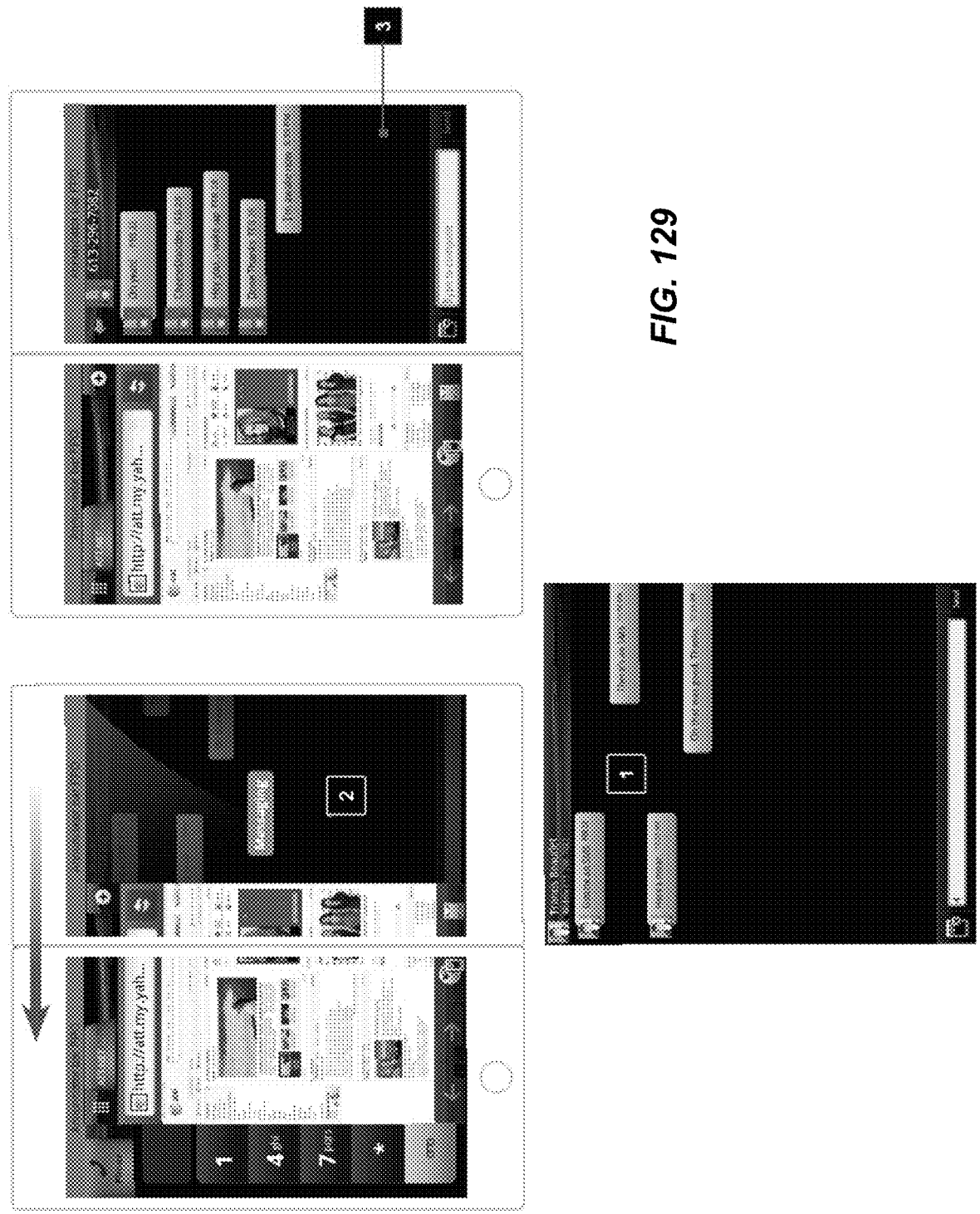

FIG. 129 illustrates an exemplary composited application screen.

FIG. 130 illustrates an exemplary technique for scaling/clipping/resizing.

Figure 131:
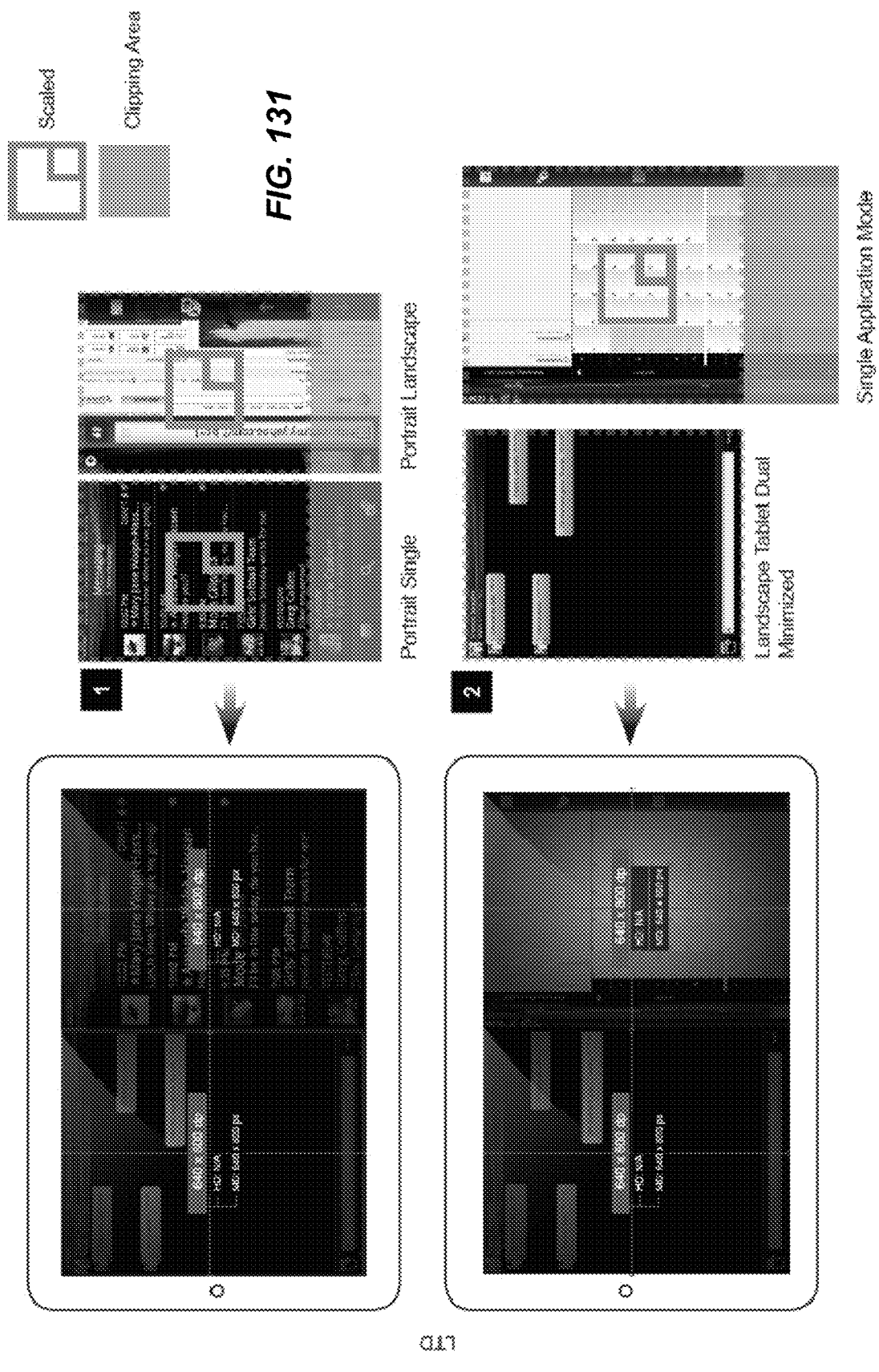

FIG. 131 illustrates an exemplary technique for scaling/clipping/resizing.

Figure 132:
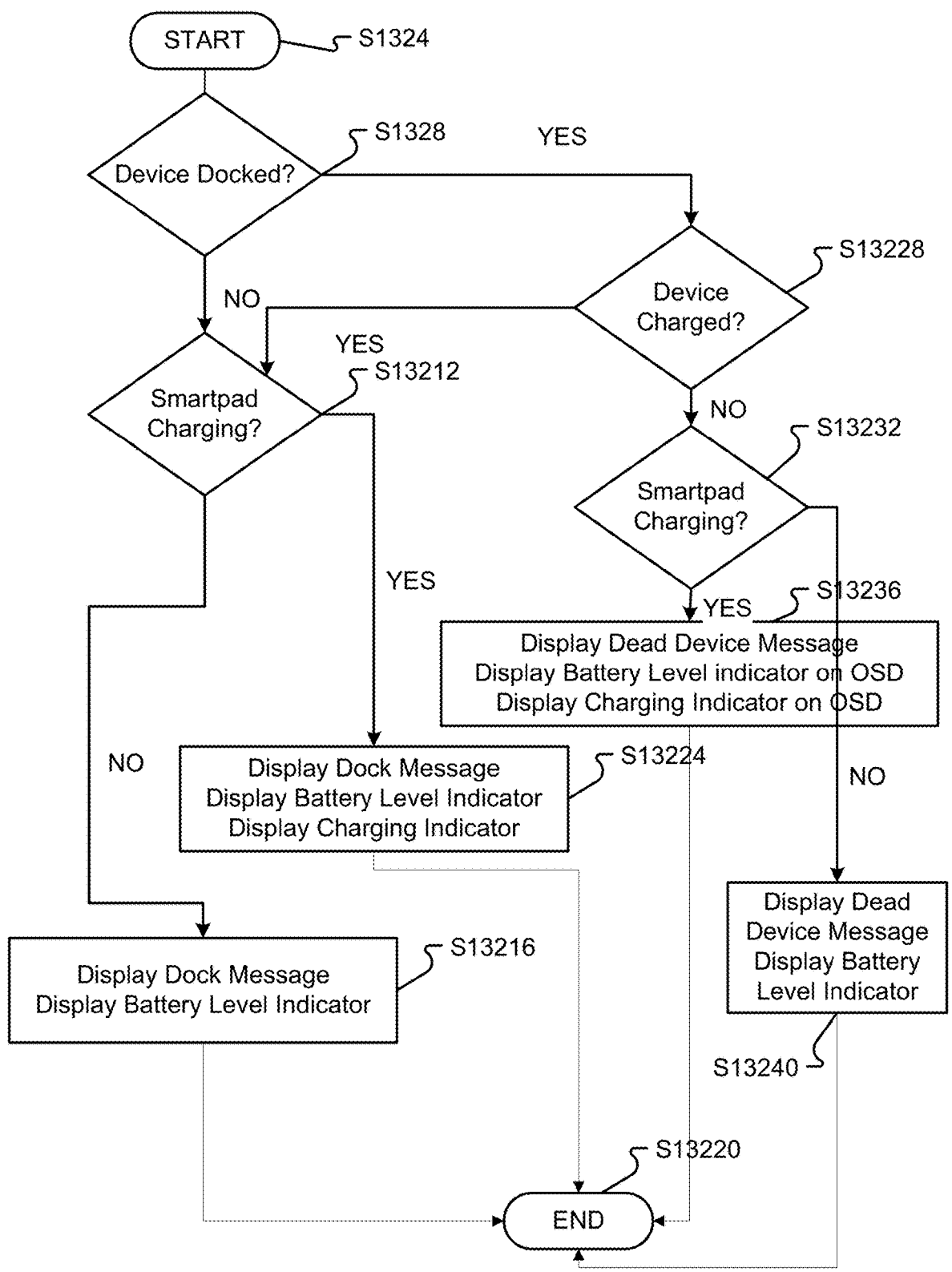

FIG. 132 illustrates an exemplary technique for power management.

Figure 133:
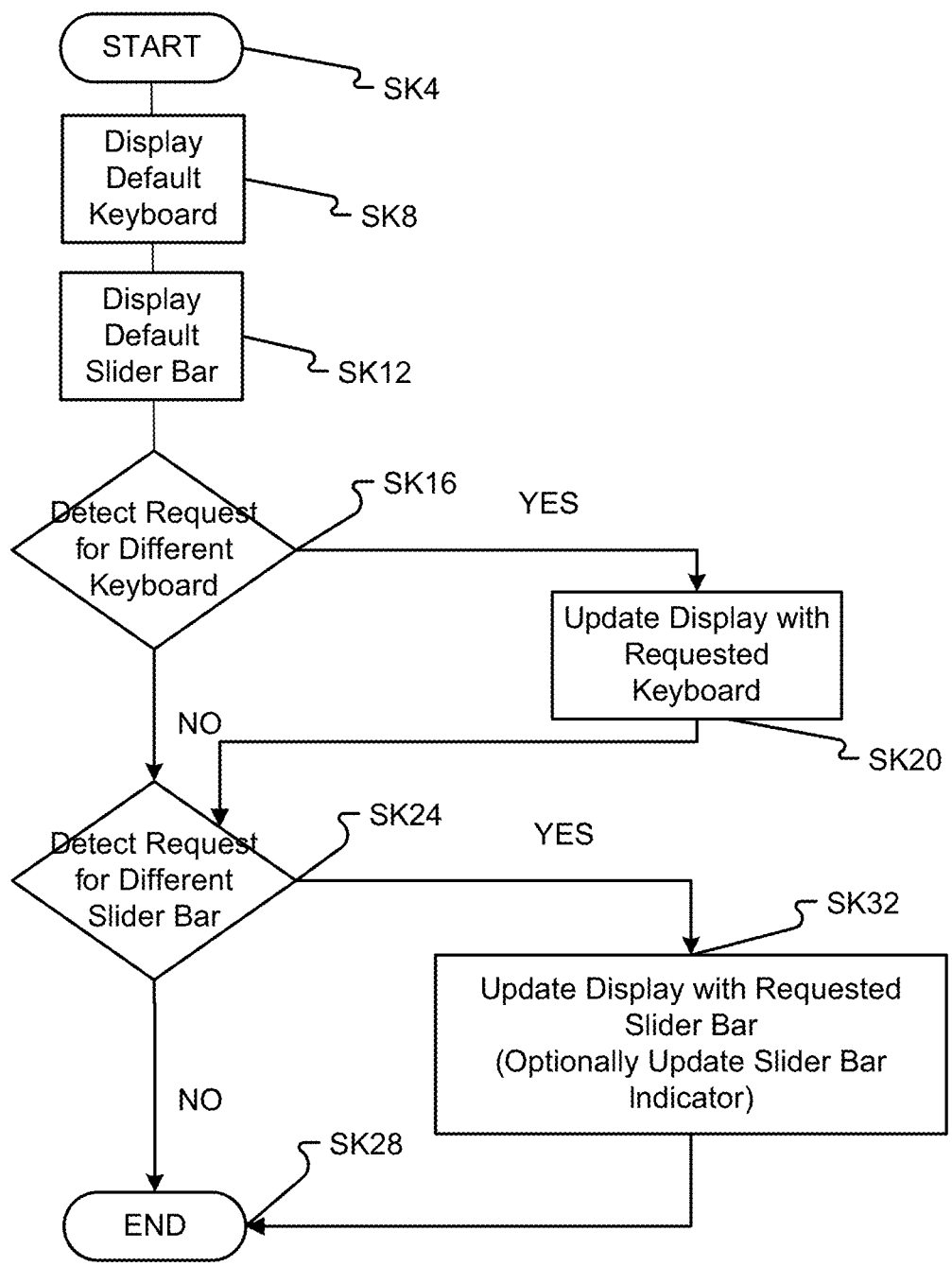

FIG. 133 illustrates an exemplary technique for managing a keyboard and slider bar.

Figure 134:
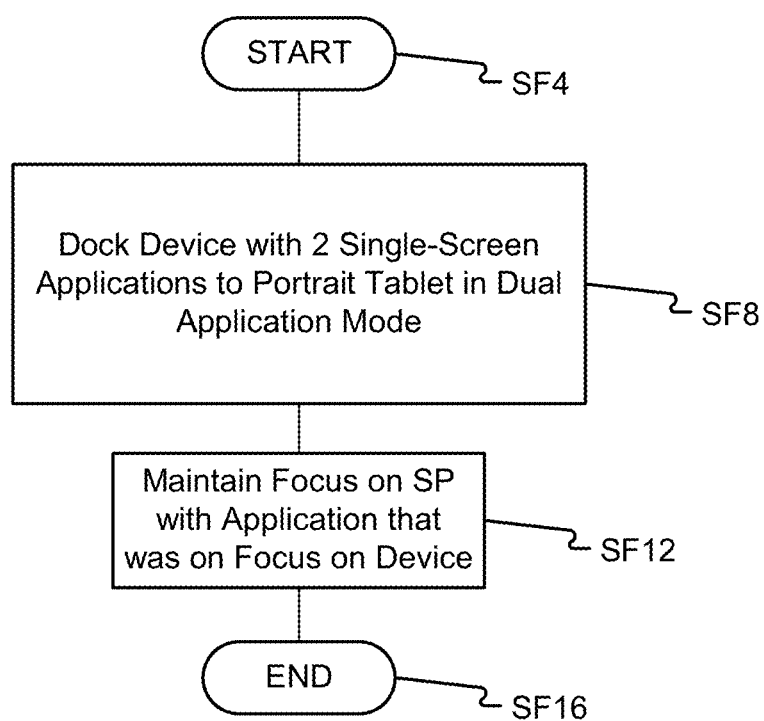

FIG. 134 illustrates an exemplary technique for managing focus.

Figure 135:
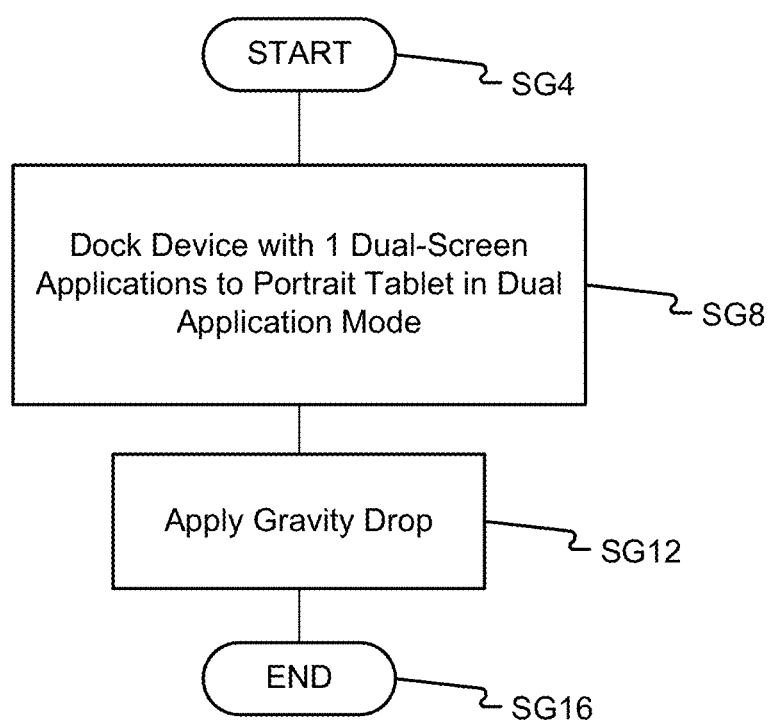

FIG. 135 illustrates an exemplary technique for managing application display.

Figure 136:
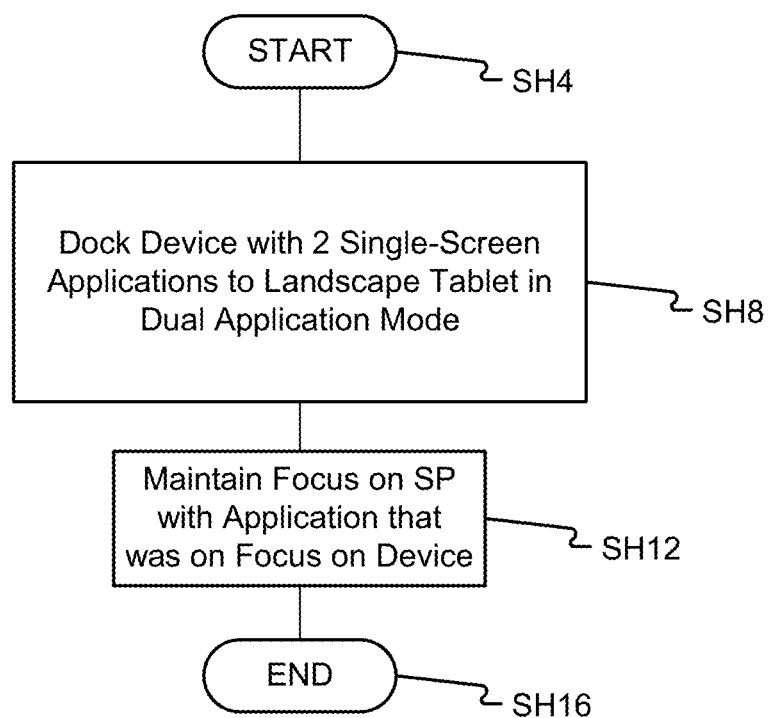

FIG. 136 illustrates an exemplary technique for managing application display.

Figure 137:
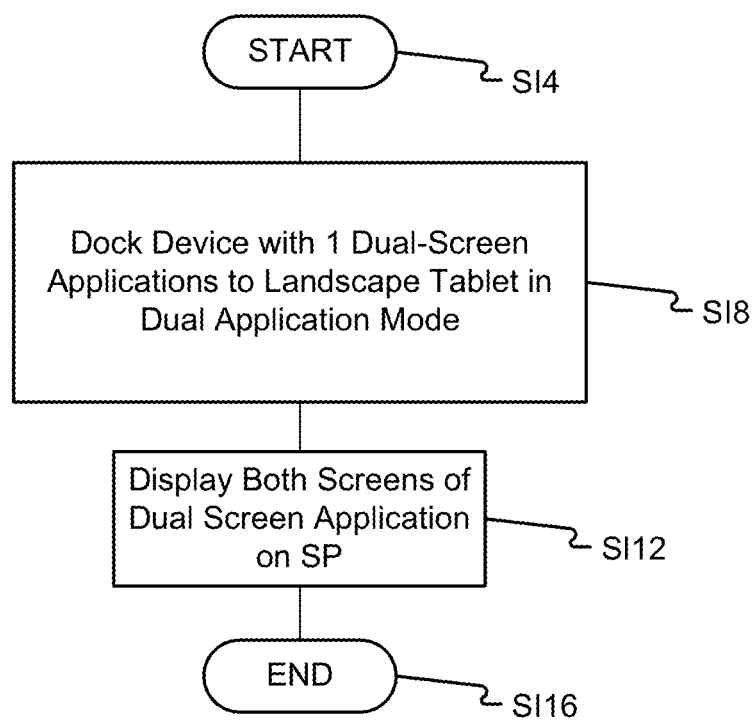

FIG. 137 illustrates an exemplary technique for managing application display.

Figure 138:
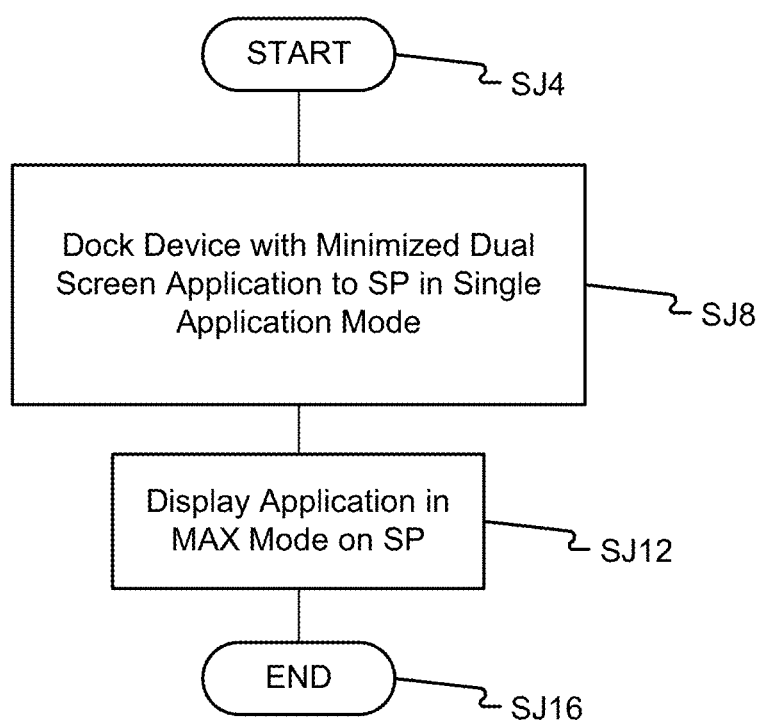

FIG. 138 illustrates an exemplary technique for managing application display.

Figure 139:
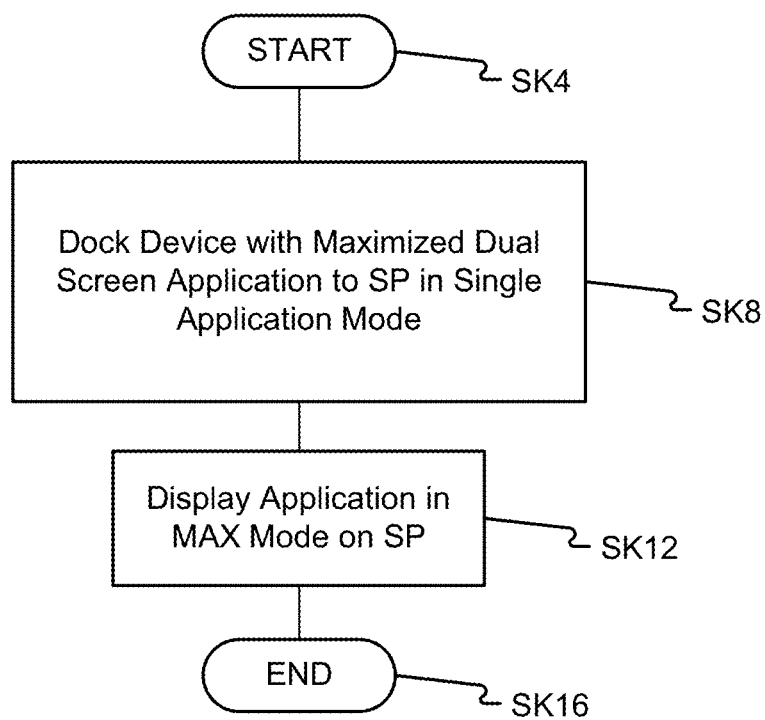

FIG. 139 illustrates an exemplary technique for managing application display.

Figure 140:
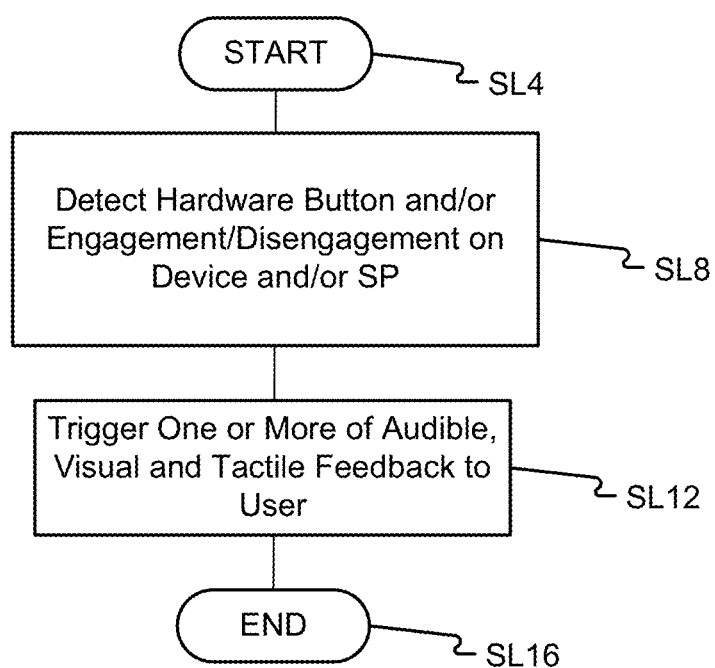

FIG. 140 illustrates an exemplary technique for providing feedback based on hardware interaction.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the second reference label.

DETAILED DESCRIPTION

Presented herein are embodiments of a device. The device can be a communications device, such as a cellular telephone, or other smart device. The device can include two screens that are oriented to provide several unique display configurations. Further, the device can receive user input in unique ways. The overall design and functionality of the device provides for an enhanced user experience making the device more useful and more efficient.

Mechanical Features:

FIGS. 1A-1J illustrate a device 100 in accordance with embodiments of the present disclosure. As described in greater detail below, device 100 can be positioned in a number of different ways each of which provides different functionality to a user. The device 100 is a multi-screen device that includes a primary screen 104 and a secondary screen 108, both of which are touch sensitive. In embodiments, the entire front surface of screens 104 and 108 may be touch sensitive and capable of receiving input by a user touching the front surface of the screens 104 and 108. Primary screen 104 includes touch sensitive display 110, which, in addition to being touch sensitive, also displays information to a user. Secondary screen 108 includes touch sensitive display 114, which also displays information to a user. In other embodiments, screens 104 and 108 may include more than one display area.

Primary screen 104 also includes a configurable area 112 that has been configured for specific inputs when the user touches portions of the configurable area 112. Secondary screen 108 also includes a configurable area 116 that has been configured for specific inputs. Areas 112a and 116a have been configured to receive a "back" input indicating that a user would like to view information previously displayed. Areas 112b and 116b have been configured to receive a "menu" input indicating that the user would like to view options from a menu. Areas 112c and 116c have been configured to receive a "home" input indicating that the user would like to view information associated with a "home" view. In other embodiments, areas 112a-c and 116a-c may be configured, in addition to the configurations described above, for other types of specific inputs including controlling features of device 100, some non-limiting examples including adjusting overall system power, adjusting the volume, adjusting the brightness, adjusting the vibration, selecting of displayed items (on either of screen 104 or 108), operating a camera, operating a microphone, and initiating/terminating of telephone calls. Also, in some embodiments, areas 112a-c and 116a-c may be configured for specific inputs depending upon the application running on device 100 and/or information displayed on touch sensitive displays 110 and/or 114.

In addition to touch sensing, primary screen 104 and secondary screen 108 may also include areas that receive input from a user without requiring the user to touch the display area of the screen. For example, primary screen 104 includes gesture capture area 120, and secondary screen 108 includes gesture capture area 124. These areas are able to receive input by recognizing gestures made by a user without the need for the user to actually touch the surface of the display area. In comparison to touch sensitive displays 110 and 114, the gesture capture areas 120 and 124 are commonly not capable of rendering a displayed image.

Figure 1A:
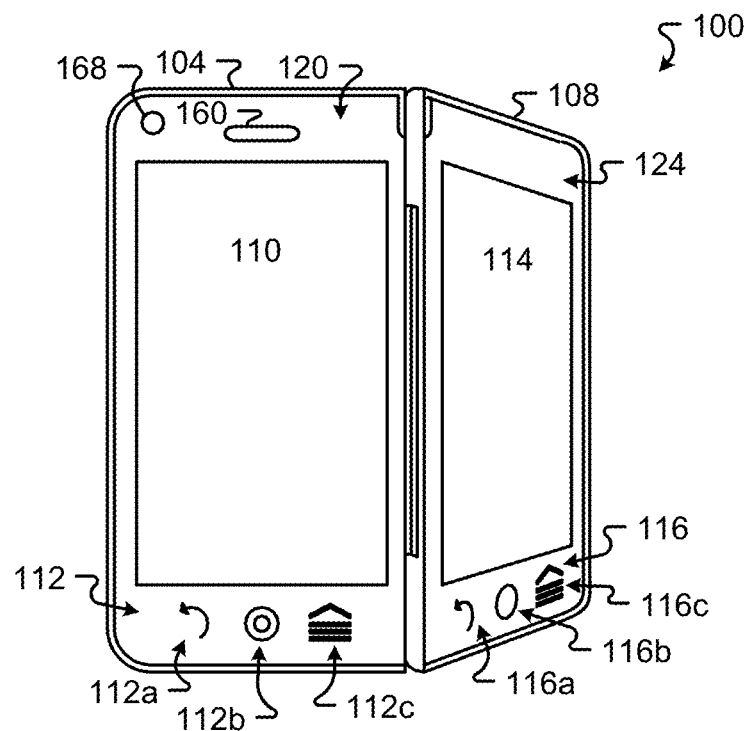
FIG. 1A includes a first view of an embodiment of a multi-screen user device.
Figure 1B:
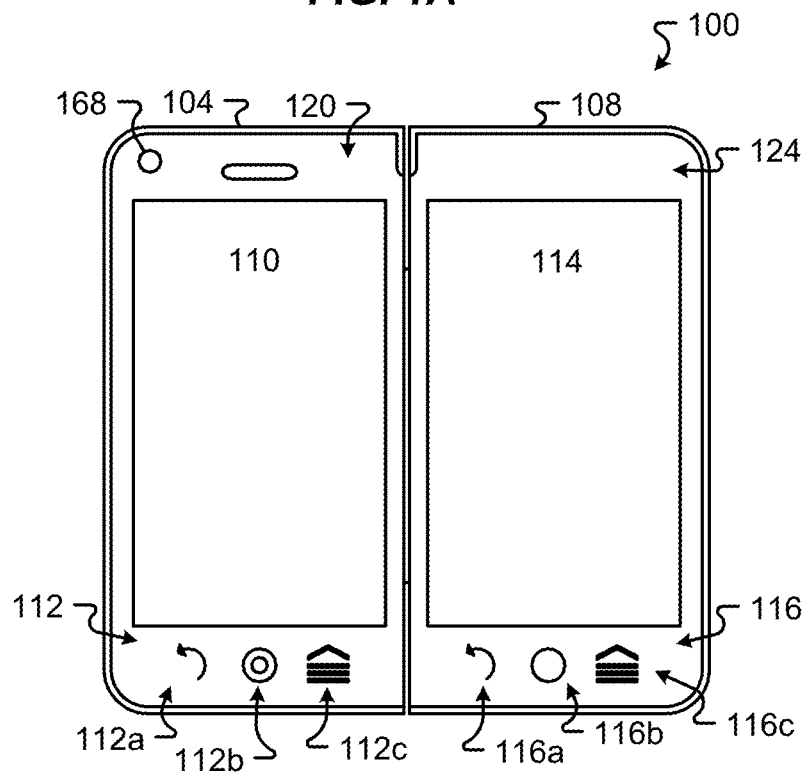
FIG. 1B includes a second view of an embodiment of a multi-screen user device.

The two screens 104 and 108 are connected together with a hinge 128, shown clearly in FIG. 1C (illustrating a back view of device 100). Hinge 128, in the embodiment shown in FIGS. 1A-1J, is a center hinge that connects screens 104 and 108 so that when the hinge is closed, screens 104 and 108 are juxtaposed (i.e., side-by-side) as shown in FIG. 1B (illustrating a front view of device 100). Hinge 128 can be opened to position the two screens 104 and 108 in different relative positions to each other. As described in greater detail below, the device 100 may have different functionalities depending on the relative positions of screens 104 and 108.

FIG. 1D illustrates the right side of device 100. As shown in FIG. 1D, secondary screen 108 also includes a card slot 132 and a port 136 on its side. Card slot 132 in embodiments, accommodates different types of cards including a subscriber identity module (SIM). Port 136 in embodiments is an input/output port (I/O port) that allows device 100 to be connected to other peripheral devices, such as a display, keyboard, or printing device. As can be appreciated, these are merely some examples and in other embodiments device 100 may include other slots and ports such as slots and ports for accommodating additional memory devices and/or for connecting other peripheral devices. Also shown in FIG. 1D is an audio jack 140 that accommodates a tip, ring, sleeve (TRS) connector for example to allow a user to utilize headphones or a headset.

Device 100 also includes a number of buttons 158. For example, FIG. 1E illustrates the left side of device 100. As shown in FIG. 1E, the side of primary screen 104 includes three buttons 144, 148, and 152, which can be configured for specific inputs. For example, buttons 144, 148, and 152 may be configured to, in combination or alone, control a number of aspects of device 100. Some non-limiting examples include overall system power, volume, brightness, vibration, selection of displayed items (on either of screen 104 or 108), a camera, a microphone, and initiation/termination of telephone calls. In some embodiments, instead of separate buttons two buttons may be combined into a rocker button. This arrangement is useful in situations where the buttons are configured to control features such as volume or brightness. In addition to buttons 144, 148, and 152, device 100 also includes a button 156, shown in FIG. 1F, which illustrates the top of device 100. In one embodiment, button 156 is configured as an on/off button used to control overall system power to device 100. In other embodiments, button 156 is configured to, in addition to or in lieu of controlling system power, control other aspects of device 100. In some embodiments, one or more of the buttons 144, 148, 152, and 156 are capable of supporting different user commands. By way of example, a normal press has a duration commonly of less than about 1 second and resembles a quick tap. A medium press has a duration commonly of 1 second or more but less than about 12 seconds. A long press has a duration commonly of about 12 seconds or more. The function of the buttons is normally specific to the application that is currently in focus on the respective display 110 and 114. In a telephone application for instance and depending on the particular button, a normal, medium, or long press can mean end call, increase in call volume, decrease in call volume, and toggle microphone mute. In a camera or video application for instance and depending on the particular button, a normal, medium, or long press can mean increase zoom, decrease zoom, and take photograph or record video.

There are also a number of hardware components within device 100. As illustrated in FIG. 1C, device 100 includes a speaker 160 and a microphone 164. Device 100 also includes a camera 168 (FIG. 1B). Additionally, device 100 includes two position sensors 172A and 172B, which are used to determine the relative positions of screens 104 and 108. In one embodiment, position sensors 172A and 172B are Hall effect sensors. However, in other embodiments other sensors can be used in addition to or in lieu of the Hall effect sensors. An accelerometer 176 may also be included as part of device 100 to determine the orientation of the device 100 and/or the orientation of screens 104 and 108. Additional internal hardware components that may be included in device 100 are described below with respect to FIG. 2.

The overall design of device 100 allows it to provide additional functionality not available in other communication devices. Some of the functionality is based on the various positions and orientations that device 100 can have. As shown in FIGS. 1B-1G, device 100 can be operated in an "open" position where screens 104 and 108 are juxtaposed. This position allows a large display area for displaying information to a user. When position sensors 172A and 172B determine that device 100 is in the open position, they can generate a signal that can be used to trigger different events such as displaying information on both screens 104 and 108. Additional events may be triggered if accelerometer 176 determines that device 100 is in a portrait position (FIG. 1B) as opposed to a landscape position (not shown).

Figure 1H:
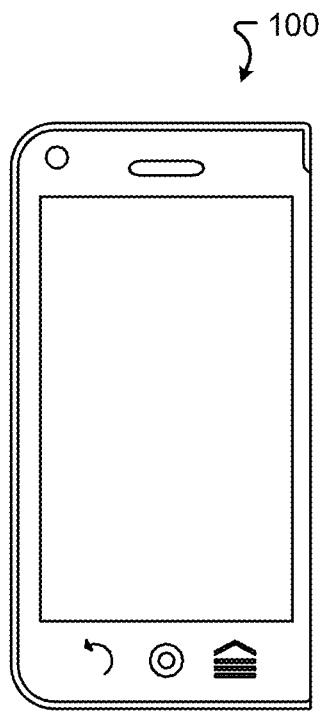
FIG. 1H includes a eighth view of an embodiment of a multi-screen user device.

In addition to the open position, device 100 may also have a "closed" position illustrated in FIG. 1H. Again, position sensors 172A and 172B can generate a signal indicating that device 100 is in the "closed" position. This can trigger an event that results in a change of displayed information on screen 104 and/or 108. For example, device 100 may be programmed to stop displaying information on one of the screens, e.g., screen 108, since a user can only view one screen at a time when device 100 is in the "closed" position. In other embodiments, the signal generated by position sensors 172A and 172B, indicating that the device 100 is in the "closed" position, can trigger device 100 to answer an incoming telephone call. The "closed" position can also be a preferred position for utilizing the device 100 as a mobile phone.

Figure 1I:
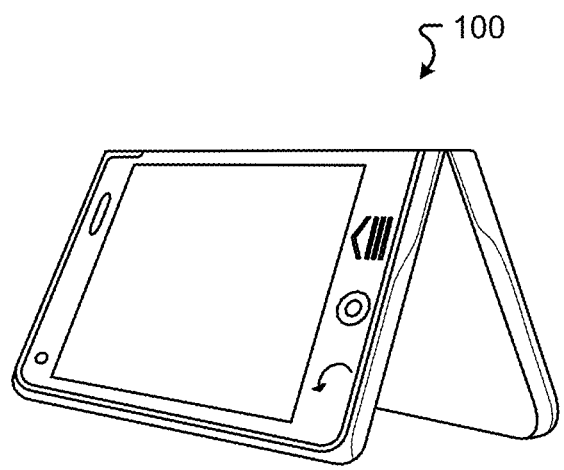
FIG. 1I includes a ninth view of an embodiment of a multi-screen user device.

Device 100 can also be used in an "easel" position which is illustrated in FIG. 1I. In the "easel" position, screens 104 and 108 are angled with respect to each other and facing outward with the edges of screens 104 and 108 substantially horizontal. In this position, device 100 can be configured to display information on both screens 104 and 108 to allow two users to simultaneously interact with device 100. When device 100 is in the "easel" position, sensors 172A and 172B generate a signal indicating that the screens 104 and 108 are positioned at an angle to each other, and the accelerometer 176 can generate a signal indicating that device 100 has been placed so that the edge of screens 104 and 108 are substantially horizontal. The signals can then be used in combination to generate events that trigger changes in the display of information on screens 104 and 108.

Figure 1J:
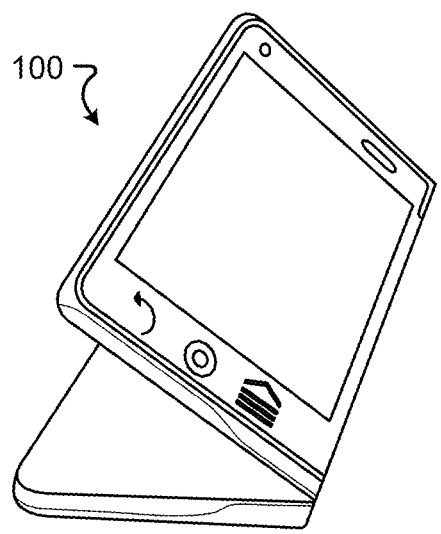
FIG. 1J includes a tenth view of an embodiment of a multi-screen user device.

FIG. 1J illustrates device 100 in a "modified easel" position. In the "modified easel" position, one of screens 104 or 108 is used as a stand and is faced down on the surface of an object such as a table. This position provides a convenient way for information to be displayed to a user in landscape orientation. Similar to the easel position, when device 100 is in the "modified easel" position, position sensors 172A and 172B generate a signal indicating that the screens 104 and 108 are positioned at an angle to each other. The accelerometer 176 would generate a signal indicating that device 100 has been positioned so that one of screens 104 and 108 is faced downwardly and is substantially horizontal. The signals can then be used to generate events that trigger changes in the display of information of screens 104 and 108. For example, information may not be displayed on the screen that is face down since a user cannot see the screen.

Transitional states are also possible. When the position sensors 172A and B and/or accelerometer indicate that the screens are being closed or folded (from open), a closing transitional state is recognized. Conversely when the position sensors 172A and B indicate that the screens are being opened or folded (from closed), an opening transitional state is recognized. The closing and opening transitional states are typically time-based, or have a maximum time duration from a sensed starting point. Normally, no user input is possible when one of the closing and opening states is in effect. In this manner, incidental user contact with a screen during the closing or opening function is not misinterpreted as user input. In embodiments, another transitional state is possible when the device 100 is closed. This additional transitional state allows the display to switch from one screen 104 to the second screen 108 when the device 100 is closed based on some user input, e.g., a double tap on the screen 110,114.

As can be appreciated, the description of device 100 is made for illustrative purposes only, and the embodiments are not limited to the specific mechanical features shown in FIGS. 1A-1J and described above. In other embodiments, device 100 may include additional features, including one or more additional buttons, slots, display areas, hinges, and/or locking mechanisms. Additionally, in embodiments, the features described above may be located in different parts of device 100 and still provide similar functionality. Therefore, FIGS. 1A-1J and the description provided above are non-limiting.

Figure 2:
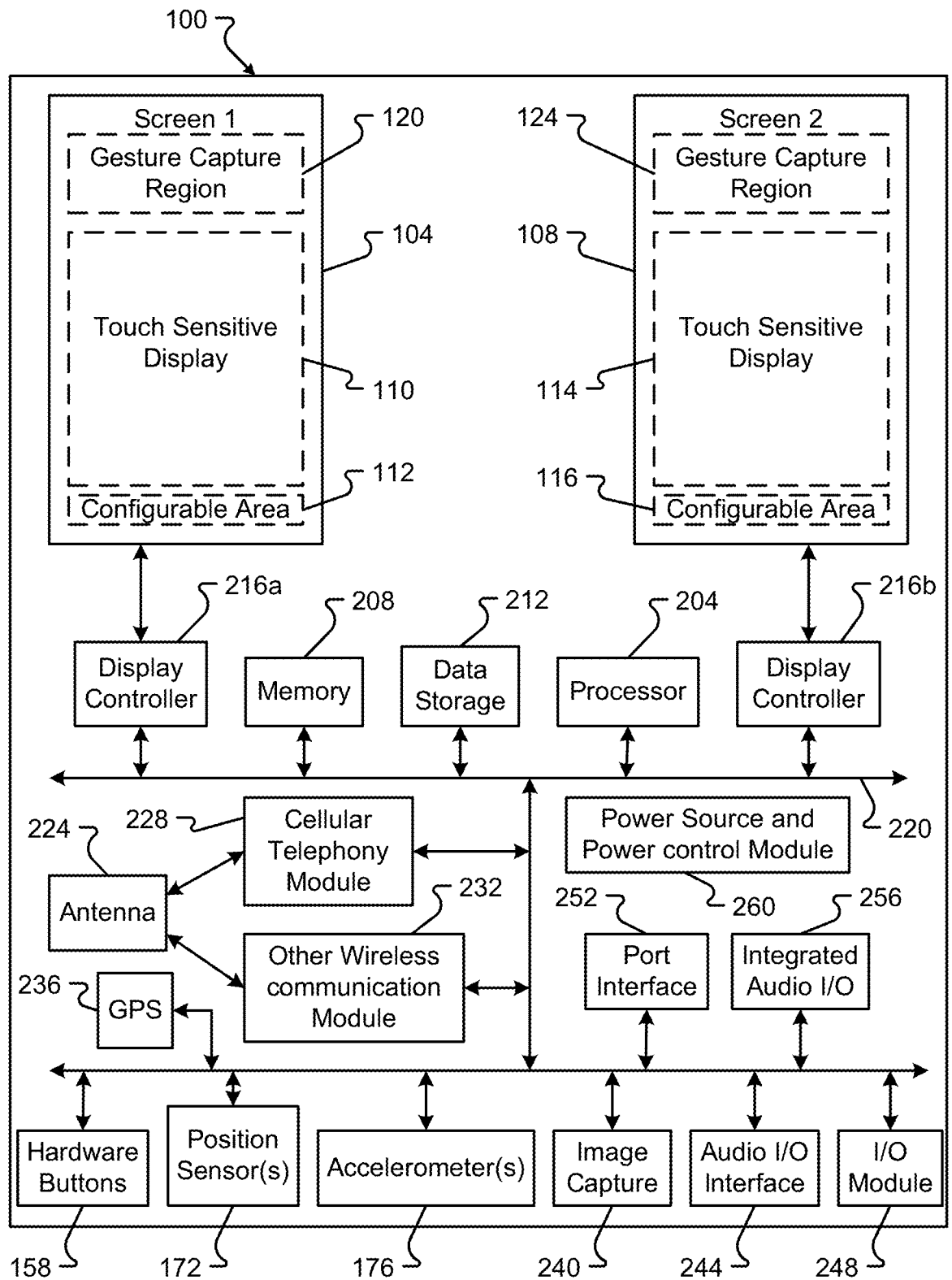
FIG. 2 is a block diagram of an embodiment of the hardware of the device.

Hardware Features:

FIG. 2 illustrates components of a device 100 in accordance with embodiments of the present disclosure. In general, the device 100 includes a primary screen 104 and a secondary screen 108. While the primary screen 104 and its components are normally enabled in both the opened and closed positions or states, the secondary screen 108 and its components are normally enabled in the opened state but disabled in the closed state. However, even when in the closed state a user or application triggered interrupt (such as in response to a phone application or camera application operation) can flip the active screen, or disable the primary screen 104 and enable the secondary screen 108, by a suitable command. Each screen 104, 108 can be touch sensitive and can include different operative areas. For example, a first operative area, within each touch sensitive screen 104 and 108, may comprise a touch sensitive display 110, 114. In general, the touch sensitive display 110, 114 may comprise a full color, touch sensitive display. A second area within each touch sensitive screen 104 and 108 may comprise a gesture capture region 120, 124. The gesture capture region 120, 124 may comprise an area or region that is outside of the touch sensitive display 110, 114 area, and that is capable of receiving input, for example in the form of gestures provided by a user. However, the gesture capture region 120, 124 does not include pixels that can perform a display function or capability.

A third region of the touch sensitive screens 104 and 108 may comprise a configurable area 112, 116. The configurable area 112, 116 is capable of receiving input and has display or limited display capabilities. In embodiments, the configurable area 112, 116 may present different input options to the user. For example, the configurable area 112, 116 may display buttons or other relatable items. Moreover, the identity of displayed buttons, or whether any buttons are displayed at all within the configurable area 112, 116 of a touch sensitive screen 104 or 108, may be determined from the context in which the device 100 is used and/or operated. In an exemplary embodiment, the touch sensitive screens 104 and 108 comprise liquid crystal display devices extending across at least those regions of the touch sensitive screens 104 and 108 that are capable of providing visual output to a user, and a capacitive input matrix over those regions of the touch sensitive screens 104 and 108 that are capable of receiving input from the user.

One or more display controllers 216a, 216b may be provided for controlling the operation of the touch sensitive screens 104 and 108, including input (touch sensing) and output (display) functions. In the exemplary embodiment illustrated in FIG. 2, a separate touch screen controller 216a or 216b is provided for each touch screen 104 and 108. In accordance with alternate embodiments, a common or shared touch screen controller may be used to control each of the included touch sensitive screens 104 and 108. In accordance with still other embodiments, the functions of a touch screen controller may be incorporated into other components, such as a processor 204.

The processor 204 may comprise a general purpose programmable processor or controller for executing application programming or instructions. In accordance with at least some embodiments, the processor 204 may include multiple processor cores, and/or implement multiple virtual processors. In accordance with still other embodiments, the processor 204 may include multiple physical processors. As a particular example, the processor 204 may comprise a specially configured application specific integrated circuit (ASIC) or other integrated circuit, a digital signal processor, a controller, a hardwired electronic or logic circuit, a programmable logic device or gate array, a special purpose computer, or the like. The processor 204 generally functions to run programming code or instructions implementing various functions of the device 100.

A communication device 100 may also include memory 208 for use in connection with the execution of application programming or instructions by the processor 204, and for the temporary or long term storage of program instructions and/or data. As examples, the memory 208 may comprise RAM, DRAM, SDRAM, or other solid state memory. Alternatively or in addition, data storage 212 may be provided. Like the memory 208, the data storage 212 may comprise a solid state memory device or devices. Alternatively or in addition, the data storage 212 may comprise a hard disk drive or other random access memory.

In support of communications functions or capabilities, the device 100 can include a cellular telephony module 228. As examples, the cellular telephony module 228 can comprise a GSM, CDMA, FDMA and/or analog cellular telephony transceiver capable of supporting voice, multimedia and/or data transfers over a cellular network. Alternatively or in addition, the device 100 can include an additional or other wireless communications module 232. As examples, the other wireless communications module 232 can comprise a Wi-Fi, BLUETOOTH™, WiMax, infrared, or other wireless communications link. The cellular telephony module 228 and the other wireless communications module 232 can each be associated with a shared or a dedicated antenna 224.

A port interface 252 may be included. The port interface 252 may include proprietary or universal ports to support the interconnection of the device 100 to other devices or components, such as a dock, which may or may not include additional or different capabilities from those integral to the device 100. In addition to supporting an exchange of communication signals between the device 100 and another device or component, the docking port 136 and/or port interface 252 can support the supply of power to or from the device 100. The port interface 252 also comprises an intelligent element that comprises a docking module for controlling communications or other interactions between the device 100 and a connected device or component.

An input/output module 248 and associated ports may be included to support communications over wired networks or links, for example with other communication devices, server devices, and/or peripheral devices. Examples of an input/output module 248 include an Ethernet port, a Universal Serial Bus (USB) port, Institute of Electrical and Electronics Engineers (IEEE) 1394, or other interface.

An audio input/output interface/device(s) 244 can be included to provide analog audio to an interconnected speaker or other device, and to receive analog audio input from a connected microphone or other device. As an example, the audio input/output interface/device(s) 244 may comprise an associated amplifier and analog to digital converter. Alternatively or in addition, the device 100 can include an integrated audio input/output device 256 and/or an audio jack for interconnecting an external speaker or microphone. For example, an integrated speaker and an integrated microphone can be provided, to support near talk or speaker phone operations.

Hardware buttons 158 can be included for example for use in connection with certain control operations. Examples include a master power switch, volume control, etc., as described in conjunction with FIGS. 1A through 1J. One or more image capture interfaces/devices 240, such as a camera, can be included for capturing still and/or video images. Alternatively or in addition, an image capture interface/device 240 can include a scanner or code reader. An image capture interface/device 240 can include or be associated with additional elements, such as a flash or other light source.

The device 100 can also include a global positioning system (GPS) receiver 236. In accordance with embodiments of the present invention, the GPS receiver 236 may further comprise a GPS module that is capable of providing absolute location information to other components of the device 100. An accelerometer(s) 176 may also be included. For example, in connection with the display of information to a user and/or other functions, a signal from the accelerometer 176 can be used to determine an orientation and/or format in which to display that information to the user.

Embodiments of the present invention can also include one or more position sensor(s) 172. The position sensor 172 can provide a signal indicating the position of the touch sensitive screens 104 and 108 relative to one another. This information can be provided as an input, for example to a user interface application, to determine an operating mode, characteristics of the touch sensitive displays 110, 114, and/or other device 100 operations. As examples, a screen position sensor 172 can comprise a series of Hall effect sensors, a multiple position switch, an optical switch, a Wheatstone bridge, a potentiometer, or other arrangement capable of providing a signal indicating of multiple relative positions the touch screens are in.

Communications between various components of the device 100 can be carried by one or more buses 222. In addition, power can be supplied to the components of the device 100 from a power source and/or power control module 260. The power control module 260 can, for example, include a battery, an AC to DC converter, power control logic, and/or ports for interconnecting the device 100 to an external source of power.

Figure 3A:
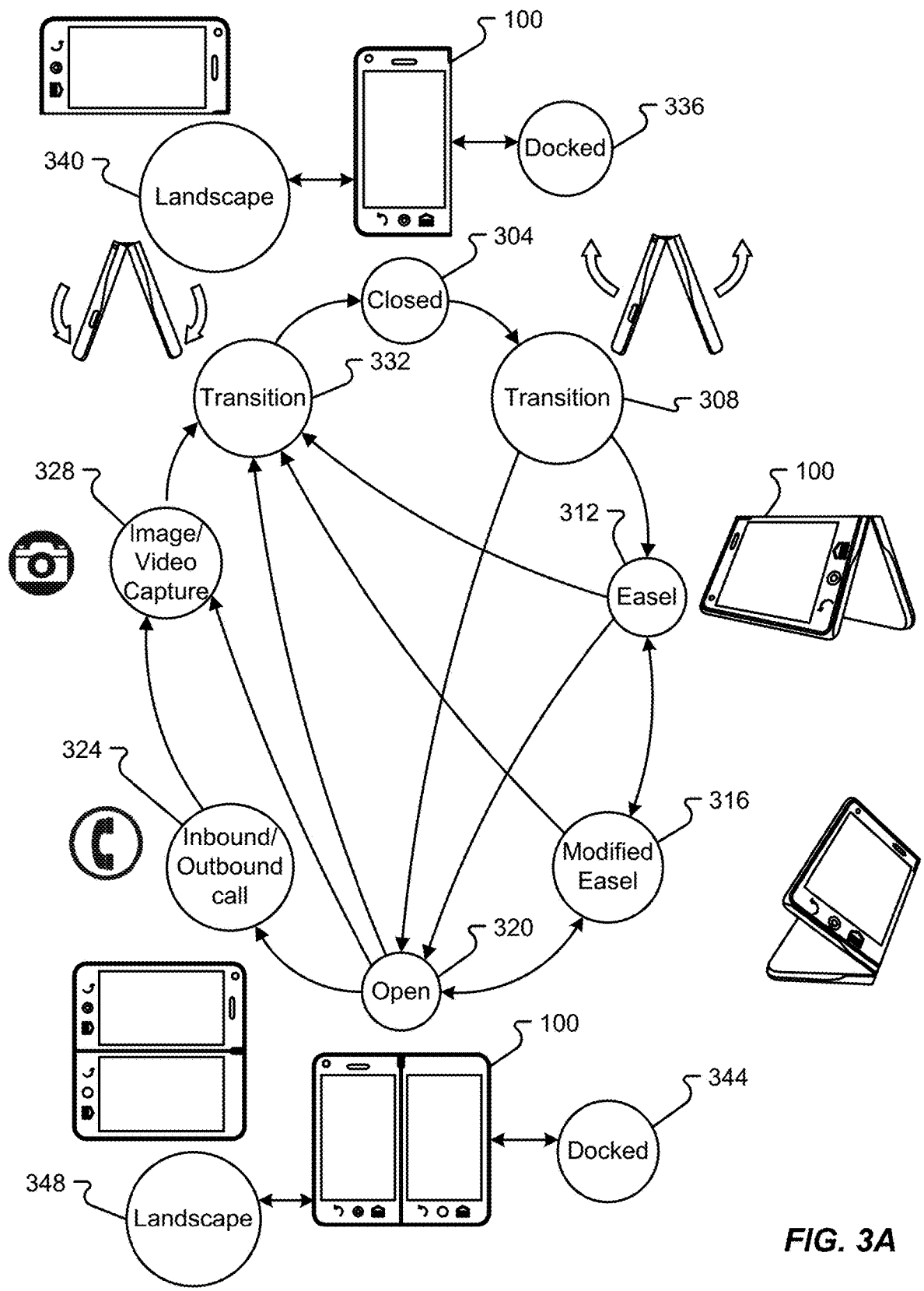
FIG. 3A is a block diagram of an embodiment of the state model for the device based on the device's orientation and/or configuration.

Device State:

FIGS. 3A and 3B represent illustrative states of device 100. While a number of illustrative states are shown, and transitions from a first state to a second state, it is to be appreciated that the illustrative state diagram may not encompass all possible states and/or all possible transitions from a first state to a second state. As illustrated in FIG. 3, the various arrows between the states (illustrated by the state represented in the circle) represent a physical change that occurs to the device 100, that is detected by one or more of hardware and software, the detection triggering one or more of a hardware and/or software interrupt that is used to control and/or manage one or more functions of device 100.

As illustrated in FIG. 3A, there are twelve exemplary "physical" states: closed 304, transition 308 (or opening transitional state), easel 312, modified easel 316, open 320, inbound/outbound call or communication 324, image/video capture 328, transition 332 (or closing transitional state), landscape 340, docked 336, docked 344 and landscape 348. Next to each illustrative state is a representation of the physical state of the device 100 with the exception of states 324 and 328, where the state is generally symbolized by the international icon for a telephone and the icon for a camera, respectfully.

In state 304, the device is in a closed state with the device 100 generally oriented in the portrait direction with the primary screen 104 and the secondary screen 108 back-to-back in different planes (see FIG. 1H). From the closed state, the device 100 can enter, for example, docked state 336, where the device 100 is coupled with a docking station, docking cable, or in general docked or associated with one or more other devices or peripherals, or the landscape state 340, where the device 100 is generally oriented with the primary screen 104 facing the user, and the primary screen 104 and the secondary screen 108 being back-to-back.

In the closed state, the device can also move to a transitional state where the device remains closed but the display is moved from one screen 104 to another screen 108 based on a user input, e.g., a double tap on the screen 110, 114. Still another embodiment includes a bilateral state. In the bilateral state, the device remains closed, but a single application displays at least one window on both the first display 110 and the second display 114. The windows shown on the first and second display 110, 114 may be the same or different based on the application and the state of that application. For example, while acquiring an image with a camera, the device may display the view finder on the first display 110 and displays a preview for the photo subjects (full screen and mirrored left-to-right) on the second display 114.

In state 308, a transition state from the closed state 304 to the semi-open state or easel state 312, the device 100 is shown opening with the primary screen 104 and the secondary screen 108 being rotated around a point of axis coincidence with the hinge Upon entering the easel state 312, the primary screen 104 and the secondary screen 108 are separated from one another such that, for example, the device 100 can sit in an easel-like configuration on a surface.

In state 316, known as the modified easel position, the device 100 has the primary screen 104 and the secondary screen 108 in a similar relative relationship to one another as in the easel state 312, with the difference being one of the primary screen 104 or the secondary screen 108 are placed on a surface as shown.

State 320 is the open state where the primary screen 104 and the secondary screen 108 are generally on the same plane. From the open state, the device 100 can transition to the docked state 344 or the open landscape state 348. In the open state 320, the primary screen 104 and the secondary screen 108 are generally in the portrait-like orientation while in landscaped state 348 the primary screen 104 and the secondary screen 108 are generally in a landscape-like orientation.

State 324 is illustrative of a communication state, such as when an inbound or outbound call is being received or placed, respectively, by the device 100. While not illustrated for clarity, it should be appreciated the device 100 can transition to the inbound/outbound call state 324 from any state illustrated in FIG. 3. In a similar manner, the image/video capture state 328 can be entered into from any other state in FIG. 3, with the image/video capture state 328 allowing the device 100 to take one or more images via a camera and/or videos with a video capture device 240.

Transition state 332 illustratively shows primary screen 104 and the secondary screen 108 being closed upon one another for entry into, for example, the closed state 304.

FIG. 3B illustrates, with reference to the key, the inputs that are received to detect a transition from a first state to a second state. In FIG. 3B, various combinations of states are shown with in general, a portion of the columns being directed toward a portrait state 352, a landscape state 356, and a portion of the rows being directed to portrait state 360 and landscape state 364.

In FIG. 3B, the Key indicates that "H" represents an input from one or more Hall Effect sensors, "A" represents an input from one or more accelerometers, "T" represents an input from a timer, "P" represents a communications trigger input and "I" represents an image and/or video capture request input. Thus, in the center portion 376 of the chart, an input, or combination of inputs, are shown that represent how the device 100 detects a transition from a first physical state to a second physical state.

As discussed, in the center portion of the chart 376, the inputs that are received enable the detection of a transition from, for example, a portrait open state to a landscape easel state—shown in bold—"HAT." For this exemplary transition from the portrait open to the landscape easel state, a Hall Effect sensor ("H"), an accelerometer ("A") and a timer ("T") input may be needed. The timer input can be derived from, for example, a clock associated with the processor.

In addition to the portrait and landscape states, a docked state 368 is also shown that is triggered based on the receipt of a docking signal 372. As discussed above and in relation to FIG. 3, the docking signal can be triggered by the association of the device 100 with one or more other device 100s, accessories, peripherals, smart docks, or the like.

User Interaction:

FIGS. 4A through 4H depict various graphical representations of gesture inputs that may be recognized by the screens 104, 108. The gestures may be performed not only by a user's body part, such as a digit, but also by other devices, such as a stylus, that may be sensed by the contact sensing portion(s) of a screen 104, 108. In general, gestures are interpreted differently, based on where the gestures are performed (either directly on the display 110, 114 or in the gesture capture region 120, 124). For example, gestures in the display 110,114 may be directed to a desktop or application, and gestures in the gesture capture region 120, 124 may be interpreted as for the system.

With reference to FIGS. 4A-4H, a first type of gesture, a touch gesture 420, is substantially stationary on the screen 104,108 for a selected length of time. A circle 428 represents a touch or other contact type received at particular location of a contact sensing portion of the screen. The circle 428 may include a border 432, the thickness of which indicates a length of time that the contact is held substantially stationary at the contact location. For instance, a tap 420 (or short press) has a thinner border 432a than the border 432b for a long press 424 (or for a normal press). The long press 424 may involve a contact that remains substantially stationary on the screen for longer time period than that of a tap 420. As will be appreciated, differently defined gestures may be registered depending upon the length of time that the touch remains stationary prior to contact cessation or movement on the screen.

Figure 4A:
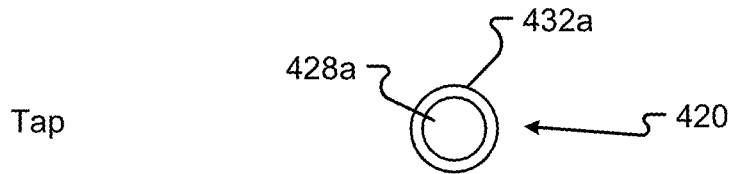
FIG. 4A is a first representation of an embodiment of user gesture received at a device.
Figure 4B:
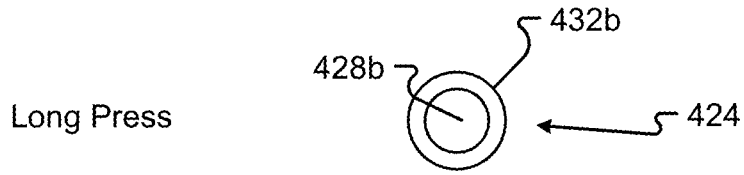
FIG. 4B is a second representation of an embodiment of user gesture received at a device.
Figure 4C:
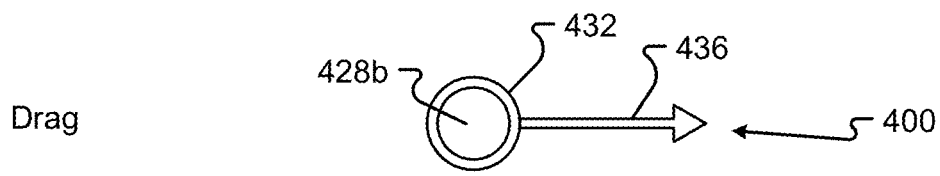
FIG. 4C is a third representation of an embodiment of user gesture received at a device.

With reference to FIG. 4C, a drag gesture 400 on the screen 104,108 is an initial contact (represented by circle 428) with contact movement 436 in a selected direction. The initial contact 428 may remain stationary on the screen 104,108 for a certain amount of time represented by the border 432. The drag gesture typically requires the user to contact an icon, window, or other displayed image at a first location followed by movement of the contact in a drag direction to a new second location desired for the selected displayed image. The contact movement need not be in a straight line but have any path of movement so long as the contact is substantially continuous from the first to the second locations.

Figure 4D:
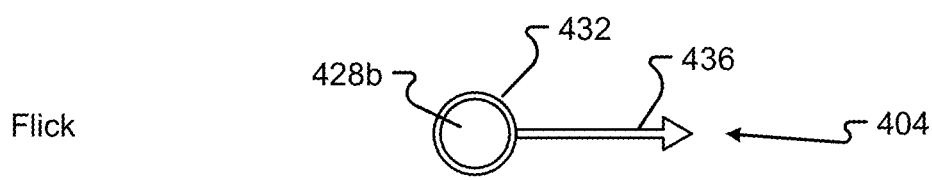
FIG. 4D is a fourth representation of an embodiment of user gesture received at a device.

With reference to FIG. 4D, a flick gesture 404 on the screen 104,108 is an initial contact (represented by circle 428) with truncated contact movement 436 (relative to a drag gesture) in a selected direction. In embodiments, a flick has a higher exit velocity for the last movement in the gesture compared to the drag gesture. The flick gesture can, for instance, be a finger snap following initial contact. Compared to a drag gesture, a flick gesture generally does not require continual contact with the screen 104,108 from the first location of a displayed image to a predetermined second location. The contacted displayed image is moved by the flick gesture in the direction of the flick gesture to the predetermined second location. Although both gestures commonly can move a displayed image from a first location to a second location, the temporal duration and distance of travel of the contact on the screen is generally less for a flick than for a drag gesture.

Figure 4E:
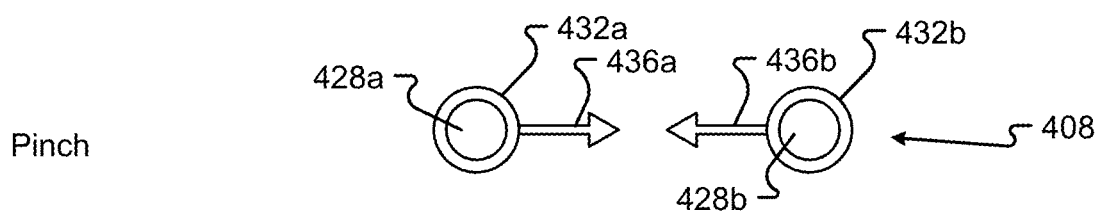
FIG. 4E is a fifth representation of an embodiment of user gesture received at a device.

With reference to FIG. 4E, a pinch gesture 408 on the screen 104,108 is depicted. The pinch gesture 408 may be initiated by a first contact 428a to the screen 104,108 by, for example, a first digit and a second contact 428b to the screen 104,108 by, for example, a second digit. The first and second contacts 428a, b may be detected by a common contact sensing portion of a common screen 104,108, by different contact sensing portions of a common screen 104 or 108, or by different contact sensing portions of different screens. The first contact 428a is held for a first amount of time, as represented by the border 432a, and the second contact 428b is held for a second amount of time, as represented by the border 432b. The first and second amounts of time are generally substantially the same, and the first and second contacts 428 a, b generally occur substantially simultaneously. The first and second contacts 428 a, b generally also include corresponding first and second contact movements 436 a, b, respectively. The first and second contact movements 436 a, b are generally in opposing directions. Stated another way, the first contact movement 436a is towards the second contact 436b, and the second contact movement 436b is towards the first contact 436a. More simply stated, the pinch gesture 408 may be accomplished by a user's digits touching the screen 104,108 in a pinching motion.

Figure 4F:
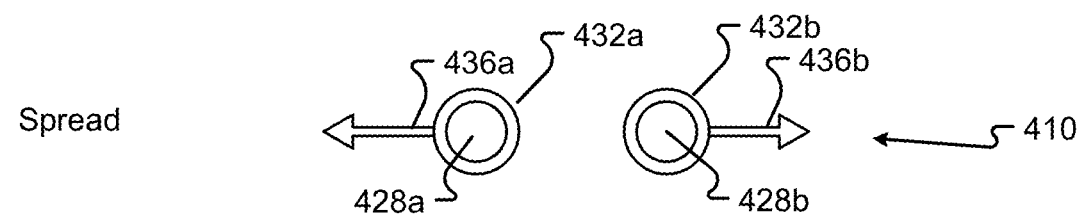
FIG. 4F is a sixth representation of an embodiment of user gesture received at a device.

With reference to FIG. 4F, a spread gesture 410 on the screen 104,108 is depicted. The spread gesture 410 may be initiated by a first contact 428a to the screen 104,108 by, for example, a first digit and a second contact 428b to the screen 104,108 by, for example, a second digit. The first and second contacts 428a,b may be detected by a common contact sensing portion of a common screen 104,108, by different contact sensing portions of a common screen 104,108, or by different contact sensing portions of different screens. The first contact 428a is held for a first amount of time, as represented by the border 432a, and the second contact 428b is held for a second amount of time, as represented by the border 432b. The first and second amounts of time are generally substantially the same, and the first and second contacts 428 a, b generally occur substantially simultaneously. The first and second contacts 428 a, b generally also include corresponding first and second contact movements 436a, b, respectively. The first and second contact movements 436 a, b are generally in a common direction. Stated another way, the first and second contact movements 436 a, b are away from the first and second contacts 428a, b. More simply stated, the spread gesture 410 may be accomplished by a user's digits touching the screen 104,108 in a spreading motion.

Figure 4G:
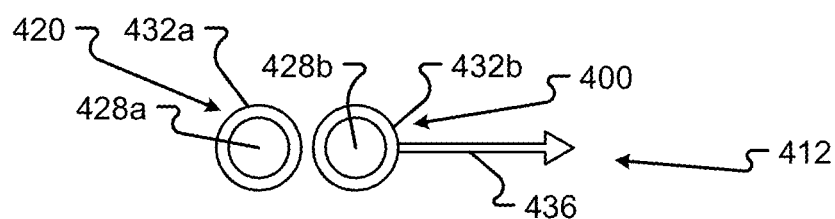
FIG. 4G is a seventh representation of an embodiment of user gesture received at a device.
Figure 4H:
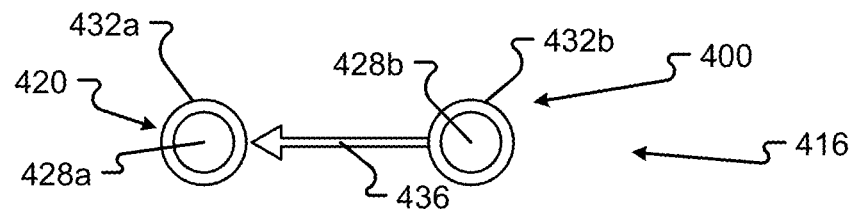
FIG. 4H is a eighth representation of an embodiment of user gesture received at a device.

The above gestures may be combined in any manner, such as those shown by FIGS. 4G and 4H, to produce a determined functional result. For example, in FIG. 4G a tap gesture 420 is combined with a drag or flick gesture 412 in a direction away from the tap gesture 420. In FIG. 4H, a tap gesture 420 is combined with a drag or flick gesture 412 in a direction towards the tap gesture 420.

The functional result of receiving a gesture can vary depending on a number of factors, including a state of the device 100, display 110, 114, or screen 104, 108, a context associated with the gesture, or sensed location of the gesture. The state of the device commonly refers to one or more of a configuration of the device 100, a display orientation, and user and other inputs received by the device 100. Context commonly refers to one or more of the particular application(s) selected by the gesture and the portion(s) of the application currently executing, whether the application is a single- or multi-screen application, and whether the application is a multi-screen application displaying one or more windows in one or more screens or in one or more stacks. Sensed location of the gesture commonly refers to whether the sensed set(s) of gesture location coordinates are on a touch sensitive display 110, 114 or a gesture capture region 120, 124, whether the sensed set(s) of gesture location coordinates are associated with a common or different display or screen 104,108, and/or what portion of the gesture capture region contains the sensed set(s) of gesture location coordinates.

A tap, when received by an a touch sensitive display 110, 114, can be used, for instance, to select an icon to initiate or terminate execution of a corresponding application, to maximize or minimize a window, to reorder windows in a stack, and to provide user input such as by keyboard display or other displayed image. A drag, when received by a touch sensitive display 110, 114, can be used, for instance, to relocate an icon or window to a desired location within a display, to reorder a stack on a display, or to span both displays (such that the selected window occupies a portion of each display simultaneously). A flick, when received by a touch sensitive display 110, 114 or a gesture capture region 120, 124, can be used to relocate a window from a first display to a second display or to span both displays (such that the selected window occupies a portion of each display simultaneously). Unlike the drag gesture, however, the flick gesture is generally not used to move the displayed image to a specific user-selected location but to a default location that is not configurable by the user.

The pinch gesture, when received by a touch sensitive display 110, 114 or a gesture capture region 120, 124, can be used to minimize or otherwise increase the displayed area or size of a window (typically when received entirely by a common display), to switch windows displayed at the top of the stack on each display to the top of the stack of the other display (typically when received by different displays or screens), or to display an application manager (a "pop-up window" that displays the windows in the stack). The spread gesture, when received by a touch sensitive display 110, 114 or a gesture capture region 120, 124, can be used to maximize or otherwise decrease the displayed area or size of a window, to switch windows displayed at the top of the stack on each display to the top of the stack of the other display (typically when received by different displays or screens), or to display an application manager (typically when received by an off-screen gesture capture region on the same or different screens).

The combined gestures of FIG. 4G, when received by a common display capture region in a common display or screen 104,108, can be used to hold a first window stack location in a first stack constant for a display receiving the gesture while reordering a second window stack location in a second window stack to include a window in the display receiving the gesture. The combined gestures of FIG. 4H, when received by different display capture regions in a common display or screen 104,108 or in different displays or screens, can be used to hold a first window stack location in a first window stack constant for a display receiving the tap part of the gesture while reordering a second window stack location in a second window stack to include a window in the display receiving the flick or drag gesture. Although specific gestures and gesture capture regions in the preceding examples have been associated with corresponding sets of functional results, it is to be appreciated that these associations can be redefined in any manner to produce differing associations between gestures and/or gesture capture regions and/or functional results.

Firmware and Software:

The memory 508 may store and the processor 504 may execute one or more software components. These components can include at least one operating system (OS) 516, an application manager 562, a desktop 566, and/or one or more applications 564*a* and/or 564*b* from an application store 560. The OS 516 can include a framework 520, one or more frame buffers 548, one or more drivers 512, previously described in conjunction with FIG. 2, and/or a kernel 518. The OS 516 can be any software, consisting of programs and data, which manages computer hardware resources and provides common services for the execution of various applications 564. The OS 516 can be any operating system and, at least in some embodiments, dedicated to mobile devices, including, but not limited to, Linux, ANDROID™, iPhone OS (IOS™), WINDOWS PHONE 7™, etc. The OS 516 is operable to provide functionality to the phone by executing one or more operations, as described herein.

The applications 564 can be any higher level software that executes particular functionality for the user. Applications 564 can include programs such as email clients, web browsers, texting applications, games, media players, office suites, etc. The applications 564 can be stored in an application store 560, which may represent any memory or data storage, and the management software associated therewith, for storing the applications 564. Once executed, the applications 564 may be run in a different area of memory 508.

The framework 520 may be any software or data that allows the multiple tasks running on the device to interact. In embodiments, at least portions of the framework 520 and the discrete components described hereinafter may be considered part of the OS 516 or an application 564. However, these portions will be described as part of the framework 520, but those components are not so limited. The framework 520 can include, but is not limited to, a Multi-Display Management (MDM) module 524, a Surface Cache module 528, a Window Management module 532, an Input Management module 536, a Task Management module 540, an Application Model Manager 542, a Display Controller, one or more frame buffers 548, a task stack 552, one or more window stacks 550 (which is a logical arrangement of windows and/or desktops in a display area), and/or an event buffer 556.

The MDM module 524 includes one or more modules that are operable to manage the display of applications or other data on the screens of the device. An embodiment of the MDM module 524 is described in conjunction with FIG. 5B. In embodiments, the MDM module 524 receives inputs from the other OS 516 components, such as, the drivers 512, and from the applications 564 to determine continually the state of the device 100. The inputs assist the MDM module 524 in determining how to configure and allocate the displays according to the application's preferences and requirements, and the user's actions. Once a determination for display configurations is made, the MDM module 524 can bind the applications 564 to a display. The configuration may then be provided to one or more other components to generate a window with a display.

The Surface Cache module 528 includes any memory or storage and the software associated therewith to store or cache one or more images of windows. A series of active and/or non-active windows (or other display objects, such as, a desktop display) can be associated with each display. An active window (or other display object) is currently displayed. A non-active windows (or other display objects) were opened and, at some time, displayed but are now not displayed. To enhance the user experience, before a window transitions from an active state to an inactive state, a "screen shot" of a last generated image of the window (or other display object) can be stored. The Surface Cache module 528 may be operable to store a bitmap of the last active image of a window (or other display object) not currently displayed. Thus, the Surface Cache module 528 stores the images of non-active windows (or other display objects) in a data store.

In embodiments, the Window Management module 532 is operable to manage the windows (or other display objects) that are active or not active on each of the displays. The Window Management module 532, based on information from the MDM module 524, the OS 516, or other components, determines when a window (or other display object) is visible or not active. The Window Management module 532 may then put a non-visible window (or other display object) in a "not active state" and, in conjunction with the Task Management module Task Management 540 suspends the application's operation. Further, the Window Management module 532 may assign, through collaborative interaction with the MDM module 524, a display identifier to the window (or other display object) or manage one or more other items of data associated with the window (or other display object). The Window Management module 532 may also provide the stored information to the application 564, the Task Management module 540, or other components interacting with or associated with the window (or other display object). The Window Management module 532 can also associate an input task with a window based on window focus and display coordinates within the motion space.

The Input Management module 536 is operable to manage events that occur with the device. An event is any input into the window environment, for example, a user interface interactions with a user. The Input Management module 536 receives the events and logically stores the events in an event buffer 556. Events can include such user interface interactions as a "down event," which occurs when a screen 104, 108 receives a touch signal from a user, a "move event," which occurs when the screen 104, 108 determines that a user's finger is moving across a screen(s), an "up event, which occurs when the screen 104, 108 determines that the user has stopped touching the screen 104, 108, etc. These events are received, stored, and forwarded to other modules by the Input Management module 536. The Input Management module 536 may also map screen inputs to a motion space which is the culmination of all physical and virtual display available on the device.

The motion space is a virtualized space that includes all touch sensitive displays 110,114 "tiled" together to mimic the physical dimensions of the device 100. For example, when the device 100 is unfolded, the motion space size may be 960×800, which may be the number of pixels in the combined display area for both touch sensitive displays 110, 114. If a user touches on a first touch sensitive display 110 on location (40, 40), a full screen window can receive touch event with location (40, 40). If a user touches on a second touch sensitive display 114, with location (40, 40), the full screen window can receive touch event with location (520, 40), because the second touch sensitive display 114 is on the right side of the first touch sensitive display 110, so the device 100 can offset the touch by the first touch sensitive display's 110 width, which is 480 pixels. When a hardware event occurs with location info from a driver 512, the framework 520 can up-scale the physical location to the motion space because the location of the event may be different based on the device orientation and state. The motion space may be as described in U.S. patent application Ser. No. 13/187,026, filed Jul. 20, 2011, entitled "Systems and Methods for Receiving Gesture Inputs Spanning Multiple Input Devices," which is hereby incorporated by reference in its entirety for all that it teaches and for all purposes.

A task can be an application and a sub-task can be an application component that provides a window with which users can interact to do something, such as dial the phone, take a photo, send an email, or view a map. Each task may be given a window in which to draw a user interface. The window typically fills a display (for example, touch sensitive display 110,114), but may be smaller than the display 110,114 and float on top of other windows. An application usually consists of multiple sub-tasks that are loosely bound to each other. Typically, one task in an application is specified as the "main" task, which is presented to the user when launching the application for the first time. Each task can then start another task or sub-task to perform different actions.

The Task Management module 540 is operable to manage the operation of one or more applications 564 that may be executed by the device. Thus, the Task Management module 540 can receive signals to launch, suspend, terminate, etc. an application or application sub-tasks stored in the application store 560. The Task Management module 540 may then instantiate one or more tasks or sub-tasks of the application 564 to begin operation of the application 564. Further, the Task Management Module 540 may launch, suspend, or terminate a task or sub-task as a result of user input or as a result of a signal from a collaborating framework 520 component. The Task Management Module 540 is responsible for managing the lifecycle of applications (tasks and sub-task) from when the application is launched to when the application is terminated.

The processing of the Task Management Module 540 is facilitated by a task stack 552, which is a logical structure associated with the Task Management Module 540. The task stack 552 maintains the state of all tasks and sub-tasks on the device 100. When some component of the operating system 516 requires a task or sub-task to transition in its lifecycle, the OS 516 component can notify the Task Management Module 540. The Task Management Module 540 may then locate the task or sub-task, using identification information, in the task stack 552, and send a signal to the task or sub-task indicating what kind of lifecycle transition the task needs to execute. Informing the task or sub-task of the transition allows the task or sub-task to prepare for the lifecycle state transition. The Task Management Module 540 can then execute the state transition for the task or sub-task. In embodiments, the state transition may entail triggering the OS kernel 518 to terminate the task when termination is required.

Further, the Task Management module 540 may suspend the application 564 based on information from the Window Management Module 532. Suspending the application 564 may maintain application data in memory but may limit or stop the application 564 from rendering a window or user interface. Once the application becomes active again, the Task Management module 540 can again trigger the application to render its user interface. In embodiments, if a task is suspended, the task may save the task's state in case the task is terminated. In the suspended state, the application task may not receive input because the application window is not visible to the user.

The frame buffer 548 is a logical structure(s) used to render the user interface. The frame buffer 548 can be created and destroyed by the OS kernel 518. However, the Display Controller 544 can write the image data, for the visible windows, into the frame buffer 548. A frame buffer 548 can be associated with one screen or multiple screens. The association of a frame buffer 548 with a screen can be controlled dynamically by interaction with the OS kernel 518. A composite display may be created by associating multiple screens with a single frame buffer 548. Graphical data used to render an application's window user interface may then be written to the single frame buffer 548, for the composite display, which is output to the multiple screens 104,108. The Display Controller 544 can direct an application's user interface to a portion of the frame buffer 548 that is mapped to a particular display 110,114, thus, displaying the user interface on only one screen 104 or 108. The Display Controller 544 can extend the control over user interfaces to multiple applications, controlling the user interfaces for as many displays as are associated with a frame buffer 548 or a portion thereof. This approach compensates for the multiple physical screens 104,108 that are in use by the software component above the Display Controller 544.

The Application Manager 562 is an application that provides a presentation layer for the window environment. Thus, the Application Manager 562 provides the graphical model for rendering by the Task Management Module 540. Likewise, the Desktop 566 provides the presentation layer for the Application Store 560. Thus, the desktop provides a graphical model of a surface having selectable application icons for the Applications 564 in the Application Store 560 that can be provided to the Window Management Module 556 for rendering.

Further, the framework can include an Application Model Manager (AMM) 542. The Application Manager 562 may interface with the AMM 542. In embodiments, the AMM 542 receives state change information from the device 100 regarding the state of applications (which are running or suspended). The AMM 542 can associate bit map images from the Surface Cache Module 528 to the tasks that are alive (running or suspended). Further, the AMM 542 can convert the logical window stack maintained in the Task Manager Module 540 to a linear ("film strip" or "deck of cards") organization that the user perceives when the using the off gesture capture area 120 to sort through the windows. Further, the AMM 542 may provide a list of executing applications to the Application Manager 562.

Figure 5A:
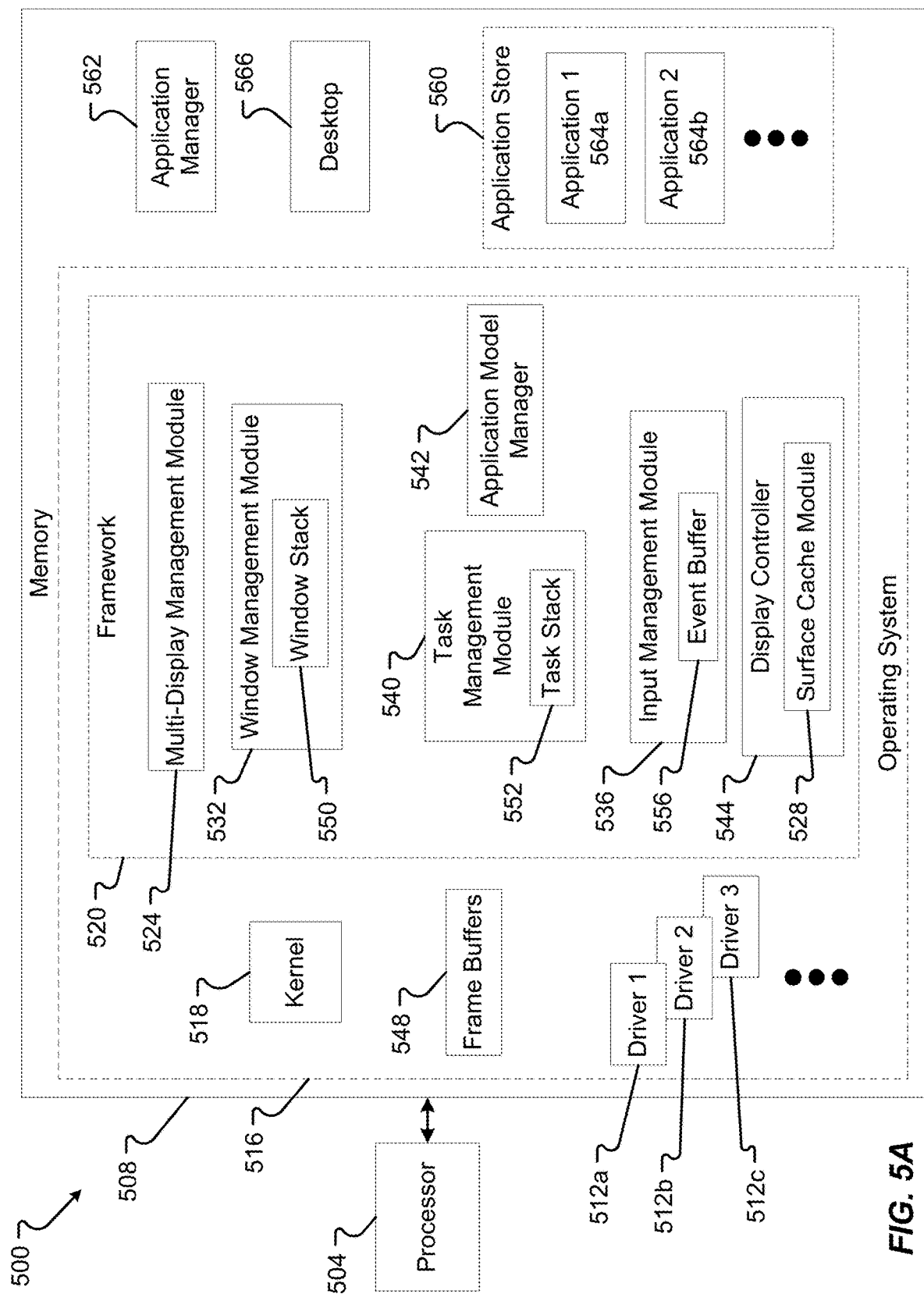
FIG. 5A is a block diagram of an embodiment of the device software and/or firmware.
Figure 5B:
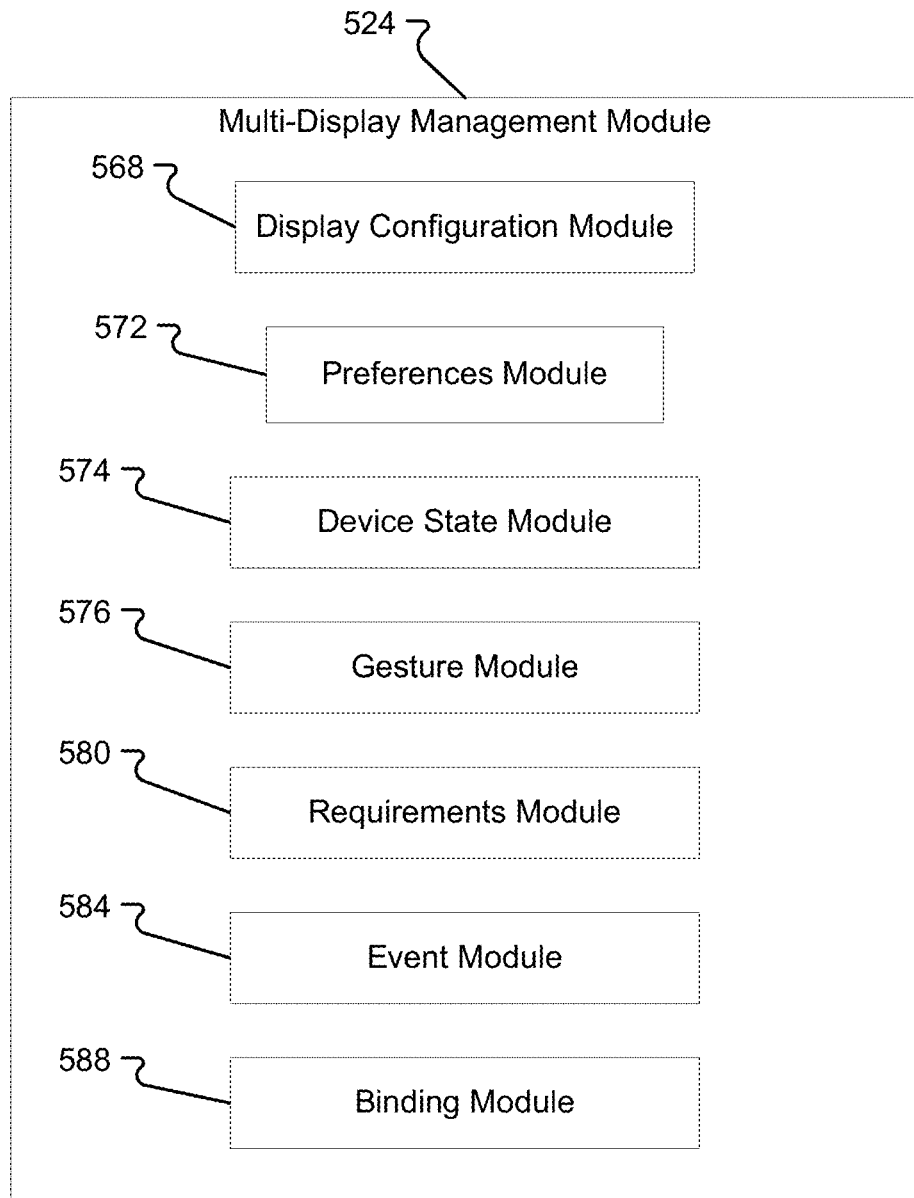
FIG. 5B is a second block diagram of an embodiment of the device software and/or firmware.

An embodiment of the MDM module 524 is shown in FIG. 5B. The MDM module 524 is operable to determine the state of the environment for the device, including, but not limited to, the orientation of the device, whether the device 100 is opened or closed, what applications 564 are executing, how the applications 564 are to be displayed, what actions the user is conducting, the tasks being displayed, etc. To configure the display, the MDM module 524 interprets these environmental factors and determines a display configuration, as described in conjunction with FIGS. 6A-6J. Then, the MDM module 524 can bind the applications 564 or other device components to the displays. The configuration may then be sent to the Display Controller 544 and/or the other components within the OS 516 to generate the display. The MDM module 524 can include one or more of, but is not limited to, a Display Configuration Module 568, a Preferences Module 572, a Device State Module 574, a Gesture Module 576, a Requirements Module 580, an Event Module 584, and/or a Binding Module 588.

The Display Configuration Module 568 determines the layout for the display. In embodiments, the Display Configuration Module 568 can determine the environmental factors. The environmental factors may be received from one or more other MDM modules 524 or from other sources. The Display Configuration Module 568 can then determine from the list of factors the best configuration for the display. Some embodiments of the possible configurations and the factors associated therewith are described in conjunction with FIGS. 6A-6F.

The Preferences Module 572 is operable to determine display preferences for an application 564 or other component. For example, an application can have a preference for Single or Dual displays. The Preferences Module 572 can determine an application's display preference (e.g., by inspecting the application's preference settings) and may allow the application 564 to change to a mode (e.g., single screen, dual screen, max, etc.) if the device 100 is in a state that can accommodate the preferred mode. However, some user interface policies may disallow a mode even if the mode is available. As the configuration of the device changes, the preferences may be reviewed to determine if a better display configuration can be achieved for an application 564.

The Device State Module 574 is operable to determine or receive the state of the device. The state of the device can be as described in conjunction with FIGS. 3A and 3B. The state of the device can be used by the Display Configuration Module 568 to determine the configuration for the display. As such, the Device State Module 574 may receive inputs and interpret the state of the device. The state information is then provided to the Display Configuration Module 568.

The Gesture Module 576 is shown as part of the MDM module 524, but, in embodiments, the Gesture module 576 may be a separate Framework 520 component that is separate from the MDM module 524. In embodiments, the Gesture Module 576 is operable to determine if the user is conducting any actions on any part of the user interface. In alternative embodiments, the Gesture Module 576 receives user interface actions from the configurable area 112,116 only. The Gesture Module 576 can receive touch events that occur on the configurable area 112,116 (or possibly other user interface areas) by way of the Input Management Module 536 and may interpret the touch events (using direction, speed, distance, duration, and various other parameters) to determine what kind of gesture the user is performing. When a gesture is interpreted, the Gesture Module 576 can initiate the processing of the gesture and, by collaborating with other Framework 520 components, can manage the required window animation. The Gesture Module 576 collaborates with the Application Model Manager 542 to collect state information with respect to which applications are running (active or paused) and the order in which applications must appear when a user gesture is performed. The Gesture Module 576 may also receive references to bitmaps (from the Surface Cache Module 528) and live windows so that when a gesture occurs it can instruct the Display Controller 544 how to move the window(s) across the display 110,114.

Thus, suspended applications may appear to be running when those windows are moved across the display 110,114.

Further, the Gesture Module 576 can receive task information either from the Task Manage Module 540 or the Input Management module 536. The gestures may be as defined in conjunction with FIGS. 4A through 4H. For example, moving a window causes the display to render a series of display frames that illustrate the window moving. The gesture associated with such user interface interaction can be received and interpreted by the Gesture Module 576. The information about the user gesture is then sent to the Task Management Module 540 to modify the display binding of the task.

The Requirements Module 580, similar to the Preferences Module 572, is operable to determine display requirements for an application 564 or other component. An application can have a set display requirement that must be observed. Some applications require a particular display orientation. For example, the application "Angry Birds" can only be displayed in landscape orientation. This type of display requirement can be determined or received, by the Requirements Module 580. As the orientation of the device changes, the Requirements Module 580 can reassert the display requirements for the application 564. The Display Configuration Module 568 can generate a display configuration that is in accordance with the application display requirements, as provided by the Requirements Module 580.

The Event Module 584, similar to the Gesture Module 576, is operable to determine one or more events occurring with an application or other component that can affect the user interface. Thus, the Event Module 584 can receive event information either from the event buffer 556 or the Task Management module 540. These events can change how the tasks are bound to the displays. The Event Module 584 can collect state change information from other Framework 520 components and act upon that state change information. In an example, when the phone is opened or closed or when an orientation change has occurred, a new message may be rendered in a secondary screen. The state change based on the event can be received and interpreted by the Event Module 584. The information about the events then may be sent to the Display Configuration Module 568 to modify the configuration of the display.

The Binding Module 588 is operable to bind the applications 564 or the other components to the configuration determined by the Display Configuration Module 568. A binding associates, in memory, the display configuration for each application with the display and mode of the application. Thus, the Binding Module 588 can associate an application with a display configuration for the application (e.g. landscape, portrait, multi-screen, etc.). Then, the Binding Module 588 may assign a display identifier to the display. The display identifier associated the application with a particular display of the device 100. This binding is then stored and provided to the Display Controller 544, the other components of the OS 516, or other components to properly render the display. The binding is dynamic and can change or be updated based on configuration changes associated with events, gestures, state changes, application preferences or requirements, etc.

User Interface Configurations:

With reference now to FIGS. 6A-J, various types of output configurations made possible by the device 100 will be described hereinafter.

Figure 6B:
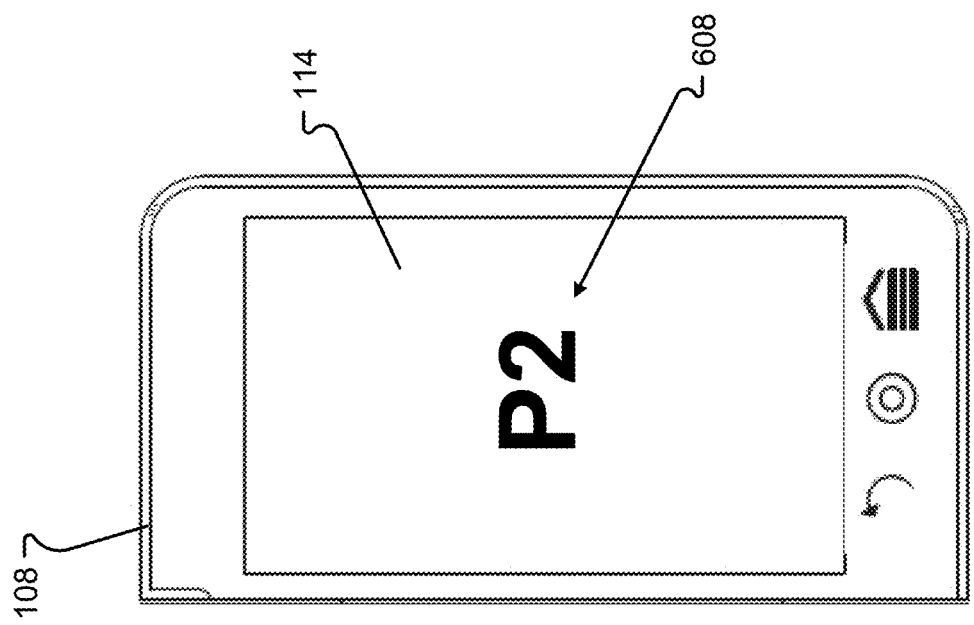
FIG. 6B is a second representation of an embodiment of a device configuration generated in response to the device state.
Figure 6A:
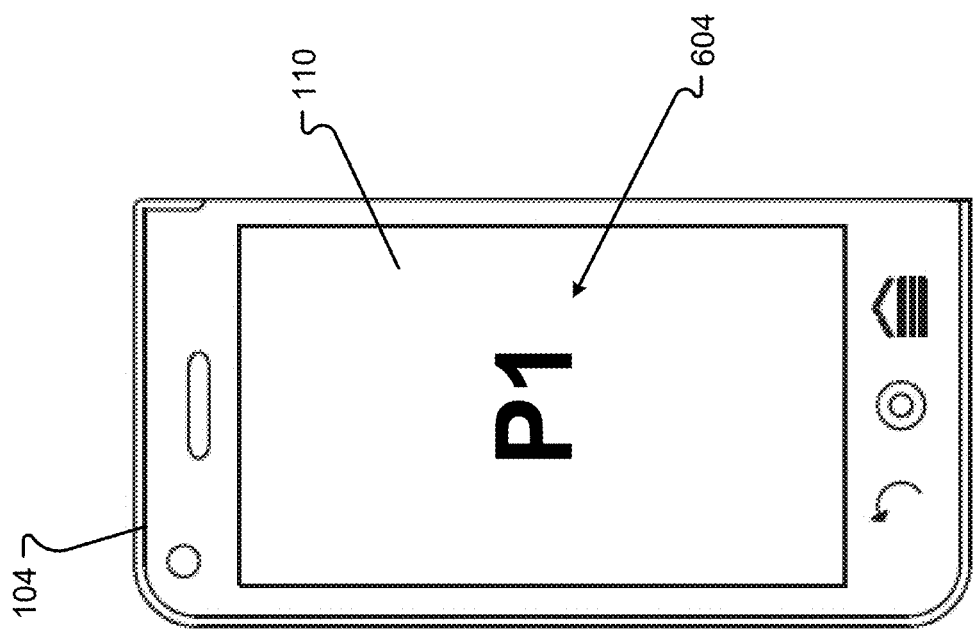
FIG. 6A is a first representation of an embodiment of a device configuration generated in response to the device state.

FIGS. 6A and 6B depict two different output configurations of the device 100 being in a first state. Specifically, FIG. 6A depicts the device 100 being in a closed portrait state 304 where the data is displayed on the primary screen 104. In this example, the device 100 displays data via the touch sensitive display 110 in a first portrait configuration 604. As can be appreciated, the first portrait configuration 604 may only display a desktop or operating system home screen. Alternatively, one or more windows may be presented in a portrait orientation while the device 100 is displaying data in the first portrait configuration 604.

FIG. 6B depicts the device 100 still being in the closed portrait state 304, but instead data is displayed on the secondary screen 108. In this example, the device 100 displays data via the touch sensitive display 114 in a second portrait configuration 608.

It may be possible to display similar or different data in either the first or second portrait configuration 604, 608. It may also be possible to transition between the first portrait configuration 604 and second portrait configuration 608 by providing the device 100 a user gesture (e.g., a double tap gesture), a menu selection, or other means. Other suitable gestures may also be employed to transition between configurations. Furthermore, it may also be possible to transition the device 100 from the first or second portrait configuration 604, 608 to any other configuration described herein depending upon which state the device 100 is moved.

Figure 6C:
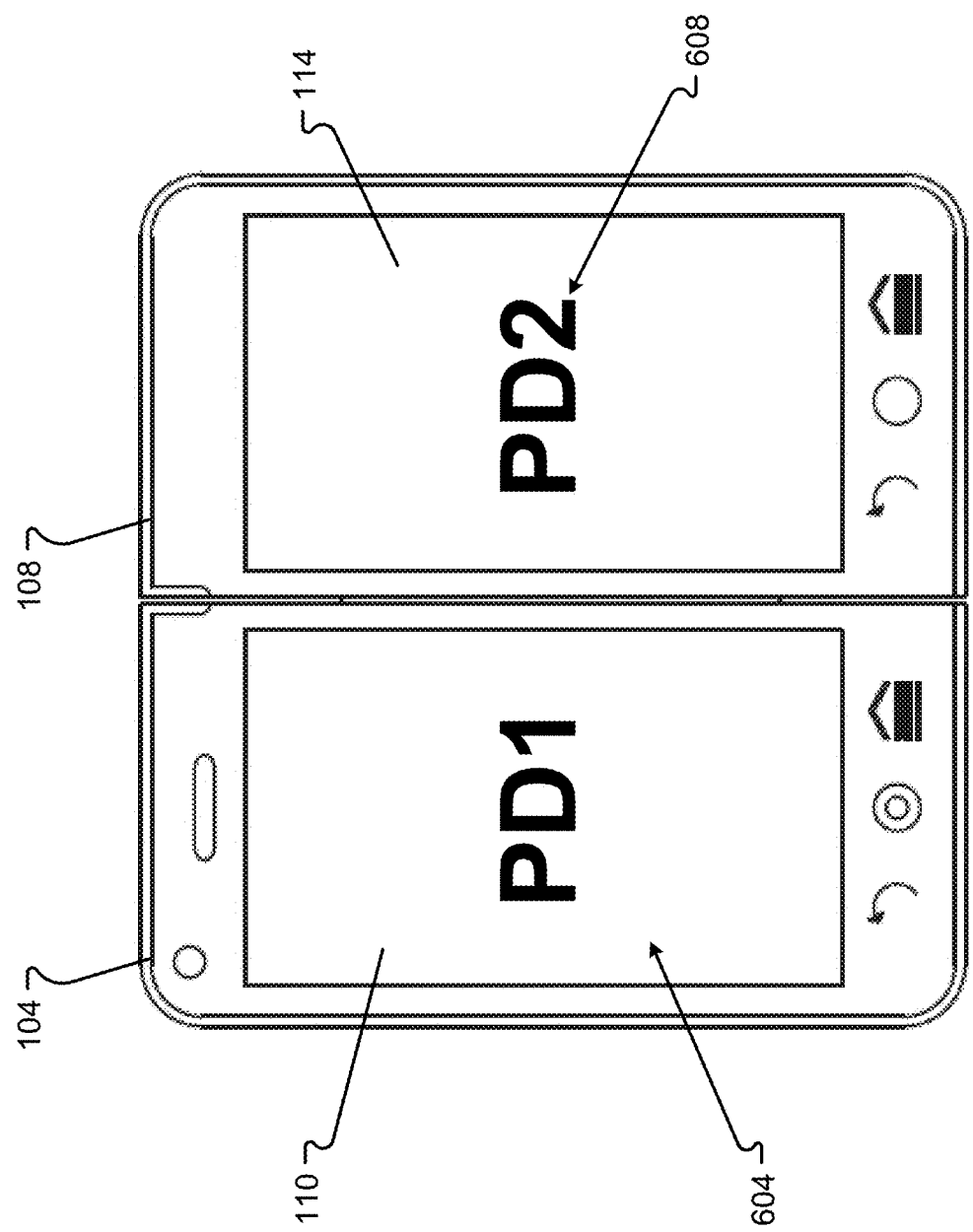
FIG. 6C is a third representation of an embodiment of a device configuration generated in response to the device state.

An alternative output configuration may be accommodated by the device 100 being in a second state. Specifically, FIG. 6C depicts a third portrait configuration where data is displayed simultaneously on both the primary screen 104 and the secondary screen 108. The third portrait configuration may be referred to as a Dual-Portrait (PD) output configuration. In the PD output configuration, the touch sensitive display 110 of the primary screen 104 depicts data in the first portrait configuration 604 while the touch sensitive display 114 of the secondary screen 108 depicts data in the second portrait configuration 608. The simultaneous presentation of the first portrait configuration 604 and the second portrait configuration 608 may occur when the device 100 is in an open portrait state 320. In this configuration, the device 100 may display one application window in one display 110 or 114, two application windows (one in each display 110 and 114), one application window and one desktop, or one desktop. Other configurations may be possible. It should be appreciated that it may also be possible to transition the device 100 from the simultaneous display of configurations 604, 608 to any other configuration described herein depending upon which state the device 100 is moved. Furthermore, while in this state, an application's display preference may place the device into bilateral mode, in which both displays are active to display different windows in the same application. For example, a Camera application may display a viewfinder and controls on one side, while the other side displays a mirrored preview that can be seen by the photo subjects. Games involving simultaneous play by two players may also take advantage of bilateral mode.

Figure 6D:
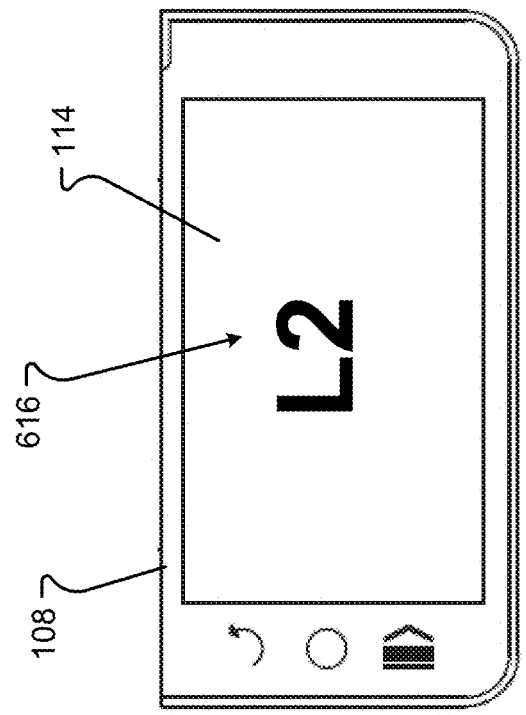
FIG. 6D is a fourth representation of an embodiment of a device configuration generated in response to the device state.
Figure 6E:
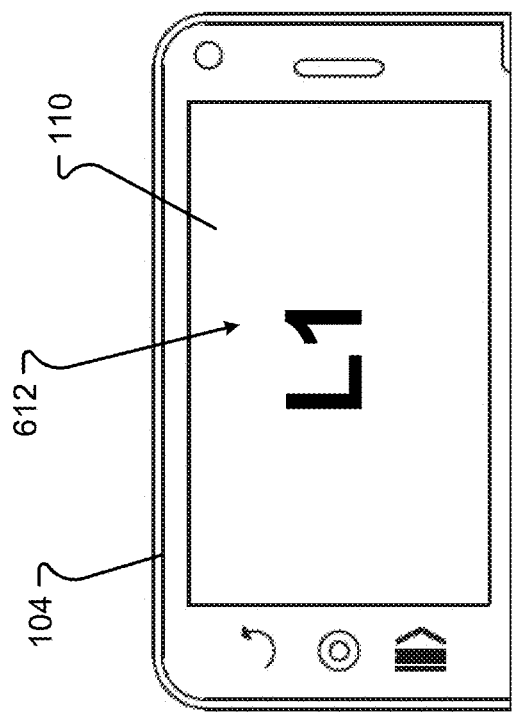
FIG. 6E is a fifth representation of an embodiment of a device configuration generated in response to the device state.

FIGS. 6D and 6E depicts two further output configurations of the device 100 being in a third state. Specifically, FIG. 6D depicts the device 100 being in a closed landscape state 340 where the data is displayed on the primary screen 104. In this example, the device 100 displays data via the touch sensitive display 110 in a first landscape configuration 612. Much like the other configurations described herein, the first landscape configuration 612 may display a desktop, a home screen, one or more windows displaying application data, or the like.

FIG. 6E depicts the device 100 still being in the closed landscape state 340, but instead data is displayed on the secondary screen 108. In this example, the device 100 displays data via the touch sensitive display 114 in a second landscape configuration 616. It may be possible to display similar or different data in either the first or second portrait configuration 612, 616. It may also be possible to transition between the first landscape configuration 612 and second landscape configuration 616 by providing the device 100 with one or both of a twist and tap gesture or a flip and slide gesture. Other suitable gestures may also be employed to transition between configurations. Furthermore, it may also be possible to transition the device 100 from the first or second landscape configuration 612, 616 to any other configuration described herein depending upon which state the device 100 is moved.

Figure 6F:
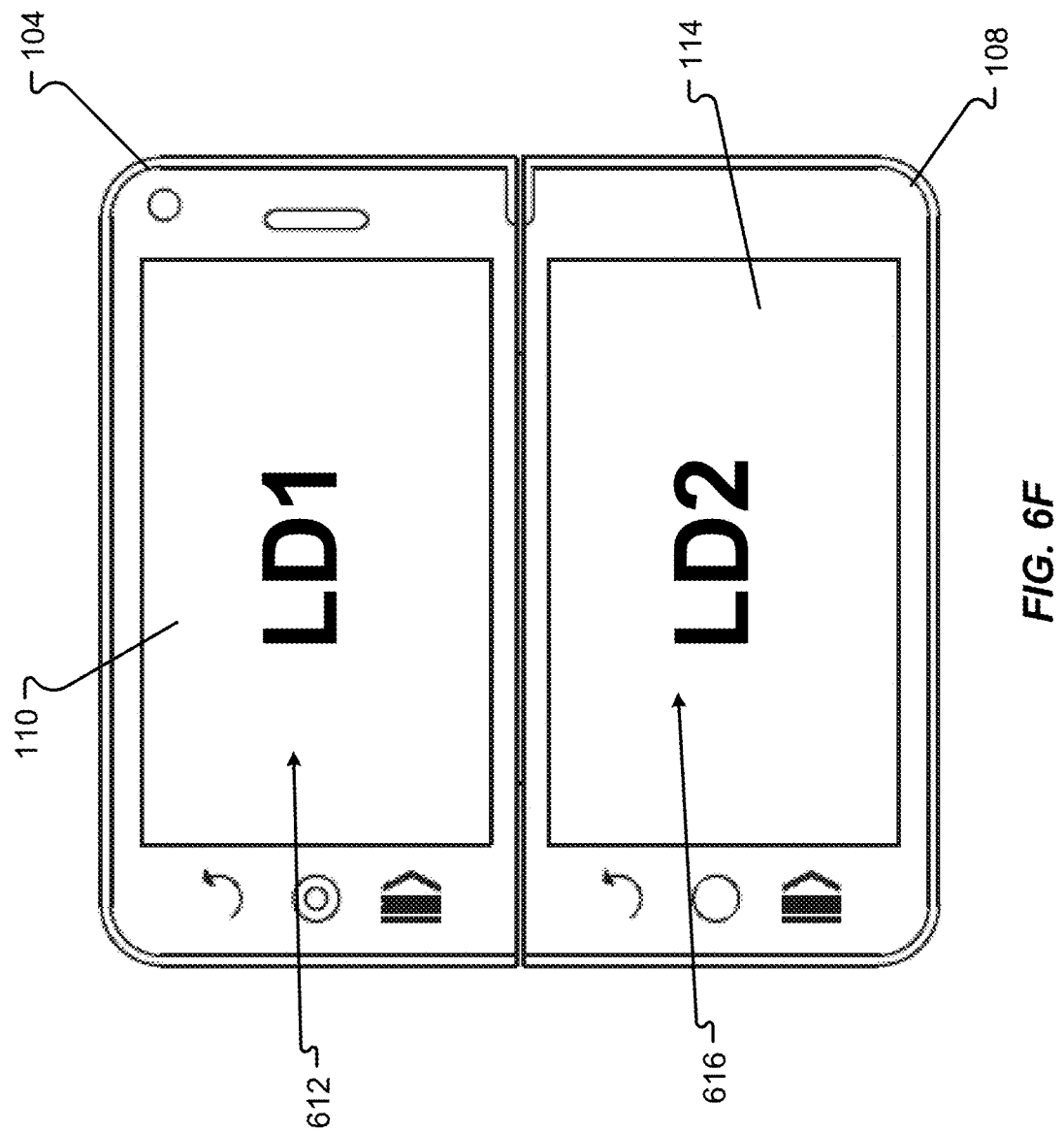
FIG. 6F is a sixth representation of an embodiment of a device configuration generated in response to the device state.

FIG. 6F depicts a third landscape configuration where data is displayed simultaneously on both the primary screen 104 and the secondary screen 108. The third landscape configuration may be referred to as a Dual-Landscape (LD) output configuration. In the LD output configuration, the touch sensitive display 110 of the primary screen 104 depicts data in the first landscape configuration 612 while the touch sensitive display 114 of the secondary screen 108 depicts data in the second landscape configuration 616. The simultaneous presentation of the first landscape configuration 612 and the second landscape configuration 616 may occur when the device 100 is in an open landscape state 340. It should be appreciated that it may also be possible to transition the device 100 from the simultaneous display of configurations 612, 616 to any other configuration described herein depending upon which state the device 100 is moved.

FIGS. 6G and 6H depict two views of a device 100 being in yet another state. Specifically, the device 100 is depicted as being in an easel state 312. FIG. 6G shows that a first easel output configuration 618 may be displayed on the touch sensitive display 110. FIG. 6H shows that a second easel output configuration 620 may be displayed on the touch sensitive display 114. The device 100 may be configured to depict either the first easel output configuration 618 or the second easel output configuration 620 individually. Alternatively, both the easel output configurations 618, 620 may be presented simultaneously. In some embodiments, the easel output configurations 618, 620 may be similar or identical to the landscape output configurations 612, 616. The device 100 may also be configured to display one or both of the easel output configurations 618, 620 while in a modified easel state 316. It should be appreciated that simultaneous utilization of the easel output configurations 618, 620 may facilitate two-person games (e.g., Battleship®, chess, checkers, etc.), multi-user conferences where two or more users share the same device 100, and other applications. As can be appreciated, it may also be possible to transition the device 100 from the display of one or both configurations 618, 620 to any other configuration described herein depending upon which state the device 100 is moved.

Figure 6I:
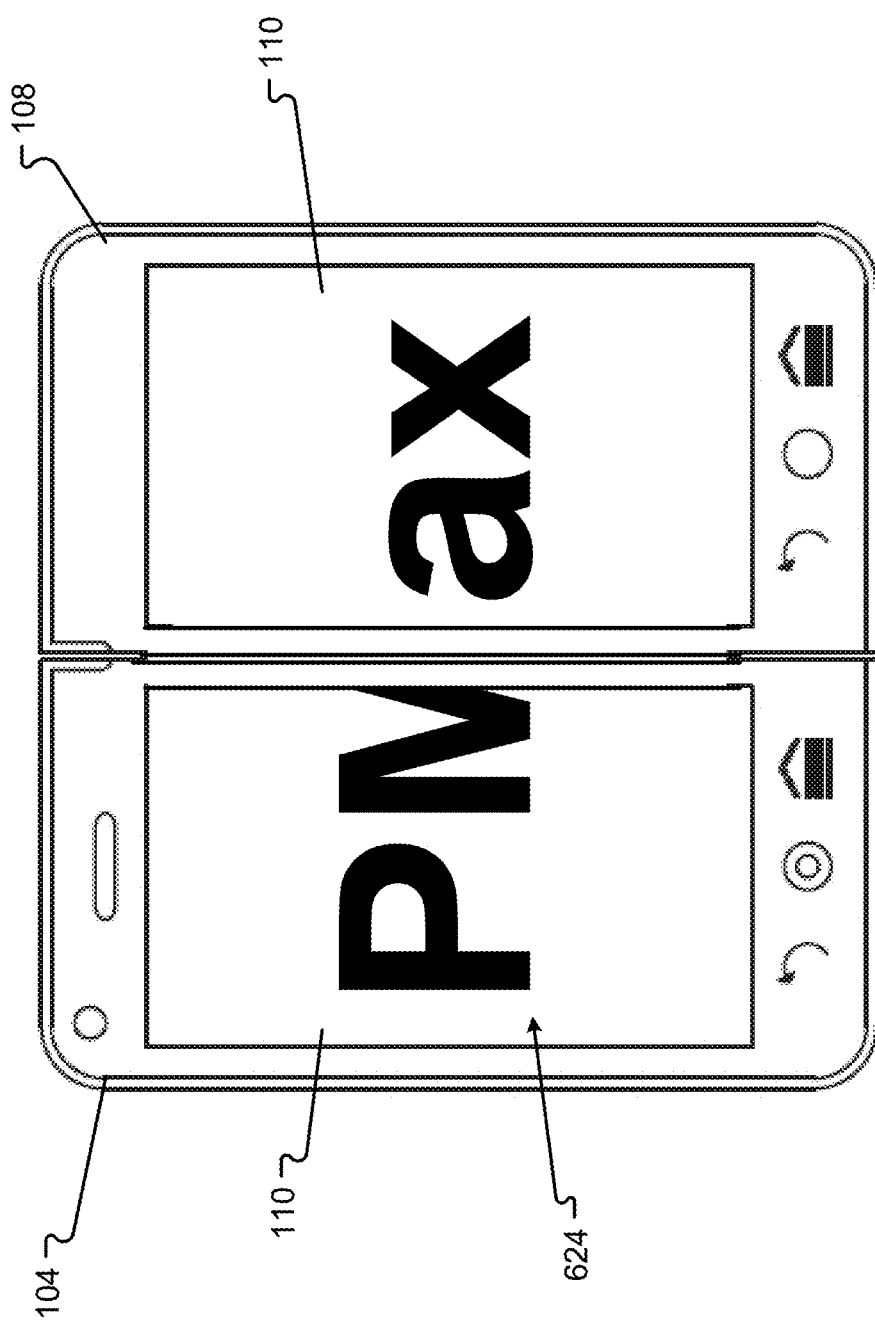
FIG. 6I is a ninth representation of an embodiment of a device configuration generated in response to the device state.

FIG. 6I depicts yet another output configuration that may be accommodated while the device 100 is in an open portrait state 320. Specifically, the device 100 may be configured to present a single continuous image across both touch sensitive displays 110, 114 in a portrait configuration referred to herein as a Portrait-Max (PMax) configuration 624. In this configuration, data (e.g., a single image, application, window, icon, video, etc.) may be split and displayed partially on one of the touch sensitive displays while the other portion of the data is displayed on the other touch sensitive display. The Pmax configuration 624 may facilitate a larger display and/or better resolution for displaying a particular image on the device 100. Similar to other output configurations, it may be possible to transition the device 100 from the Pmax configuration 624 to any other output configuration described herein depending upon which state the device 100 is moved.

Figure 6J:
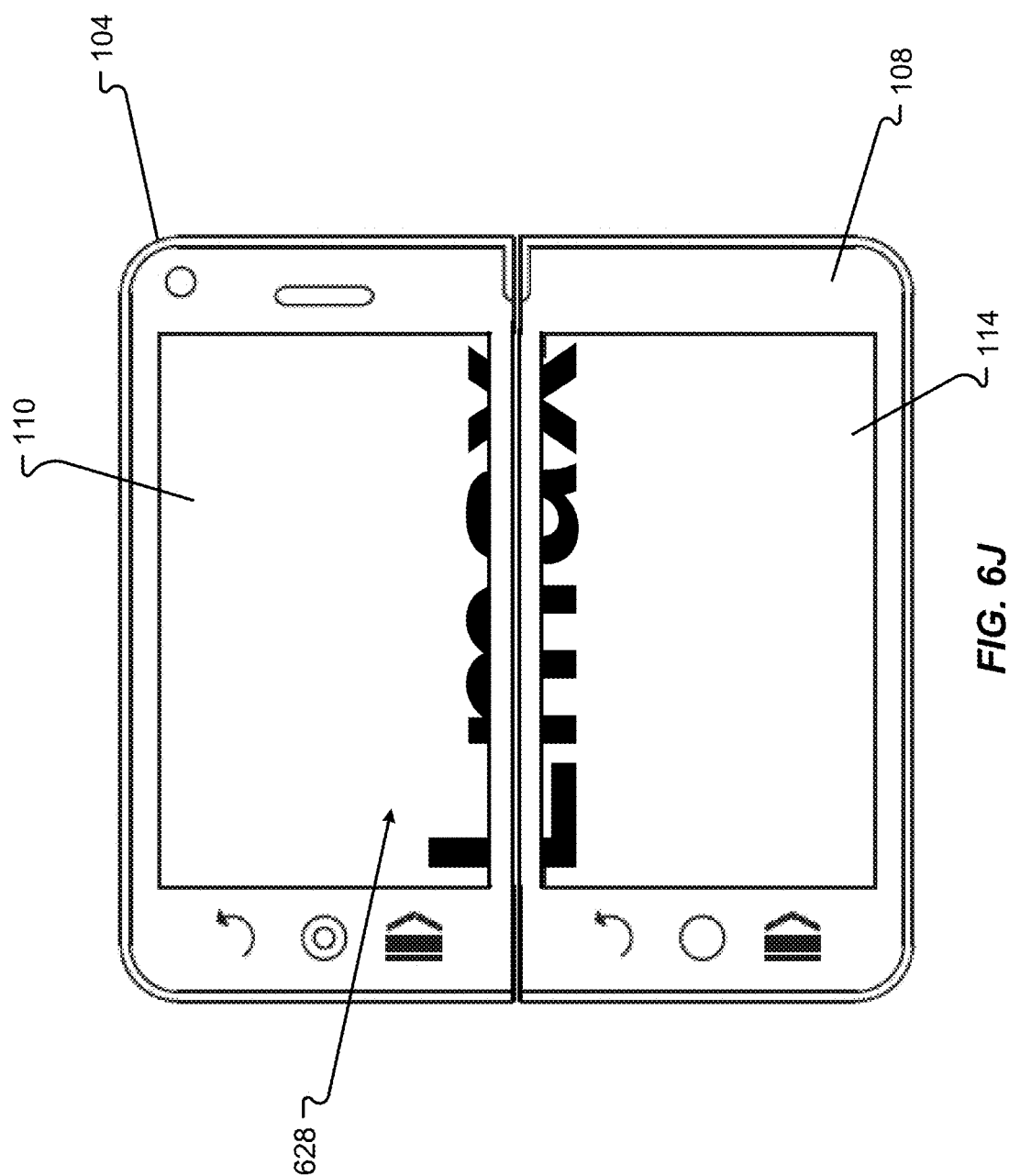
FIG. 6J is a tenth representation of an embodiment of a device configuration generated in response to the device state.

FIG. 6J depicts still another output configuration that may be accommodated while the device 100 is in an open landscape state 348. Specifically, the device 100 may be configured to present a single continuous image across both touch sensitive displays 110, 114 in a landscape configuration referred to herein as a Landscape-Max (LMax) configuration 628. In this configuration, data (e.g., a single image, application, window, icon, video, etc.) may be split and displayed partially on one of the touch sensitive displays while the other portion of the data is displayed on the other touch sensitive display. The Lmax configuration 628 may facilitate a larger display and/or better resolution for displaying a particular image on the device 100. Similar to other output configurations, it may be possible to transition the device 100 from the Lmax configuration 628 to any other output configuration described herein depending upon which state the device 100 is moved.

Figure 7A:
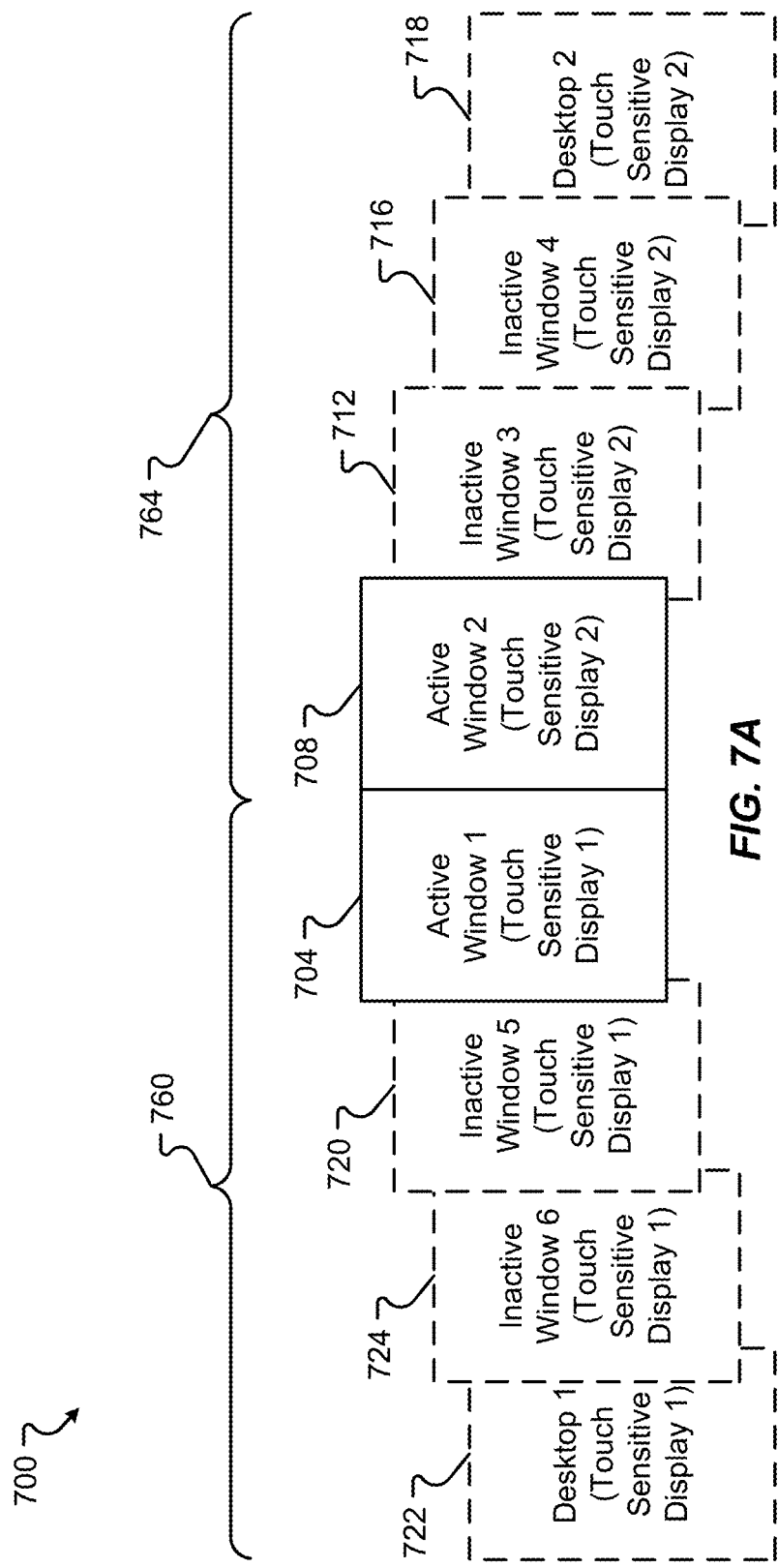
FIG. 7A is representation of a logical window stack.
Figure 7B:
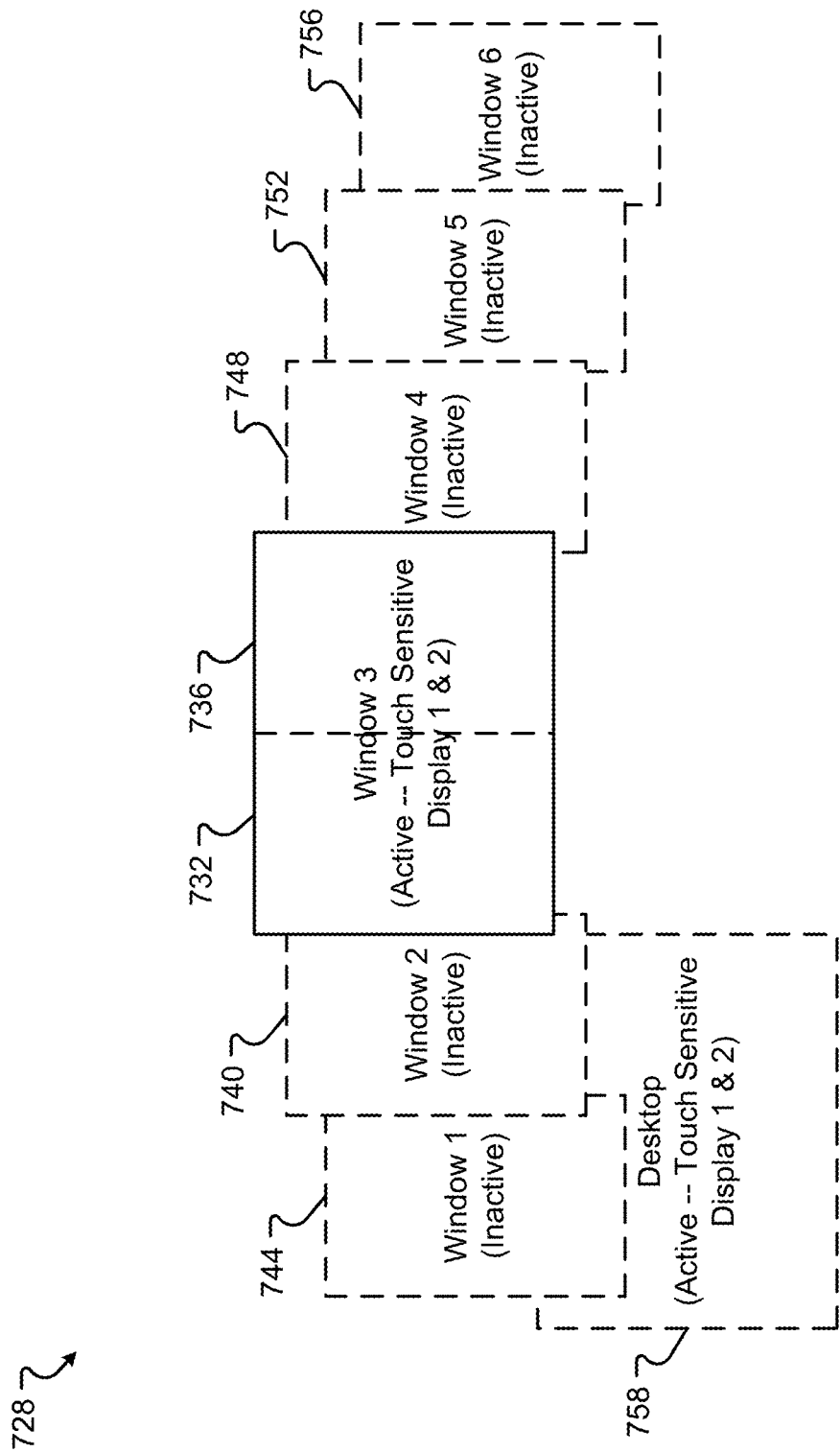
FIG. 7B is another representation of an embodiment of a logical window stack.

The device 100 manages desktops and/or windows with at least one window stack 700, 728, as shown in FIGS. 7A and 7B. A window stack 700, 728 is a logical arrangement of active and/or inactive windows for a multi-screen device. For example, the window stack 700, 728 may be logically similar to a deck of cards, where one or more windows or desktops are arranged in order, as shown in FIGS. 7A and 7B. An active window is a window that is currently being displayed on at least one of the touch sensitive displays 110, 114. For example, windows 104 and 108 are active windows and are displayed on touch sensitive displays 110 and 114. An inactive window is a window that was opened and displayed but is now "behind" an active window and not being displayed. In embodiments, an inactive window may be for an application that is suspended, and thus, the window is not displaying active content. For example, windows 712, 716, 720, and 724 are inactive windows.

A window stack 700, 728 may have various arrangements or organizational structures. In the embodiment shown in FIG. 7A, the device 100 includes a first stack 760 associated with a first touch sensitive display 110 and a second stack associated with a second touch sensitive display 114. Thus, each touch sensitive display 110, 114 can have an associated window stack 760, 764. These two window stacks 760, 764 may have different numbers of windows arranged in the respective stacks 760, 764.

Further, the two window stacks 760, 764 can also be identified differently and managed separately. Thus, the first window stack 760 can be arranged in order from a first window 704 to a next window 720 to a last window 724 and finally to a desktop 722, which, in embodiments, is at the "bottom" of the window stack 760. In embodiments, the desktop 722 is not always at the "bottom" as application windows can be arranged in the window stack below the desktop 722, and the desktop 722 can be brought to the "top" of a stack over other windows during a desktop reveal. Likewise, the second stack 764 can be arranged from a first window 708 to a next window 712 to a last window 716, and finally to a desktop 718, which, in embodiments, is a single desktop area, with desktop 722, under all the windows in both window stack 760 and window stack 764. A logical data structure for managing the two window stacks 760, 764 may be as described in conjunction with FIG. 8.

Another arrangement for a window stack 728 is shown in FIG. 7B. In this embodiment, there is a single window stack 728 for both touch sensitive displays 110, 114. Thus, the window stack 728 is arranged from a desktop 758 to a first window 744 to a last window 756. A window can be arranged in a position among all windows without an association to a specific touch sensitive display 110, 114. In this embodiment, a window is in the order of windows. Further, at least one window is identified as being active. For example, a single window may be rendered in two portions 732 and 736 that are displayed on the first touch sensitive screen 110 and the second touch sensitive screen 114. The single window may only occupy a single position in the window stack 728 although it is displayed on both displays 110, 114.

Figure 7C:
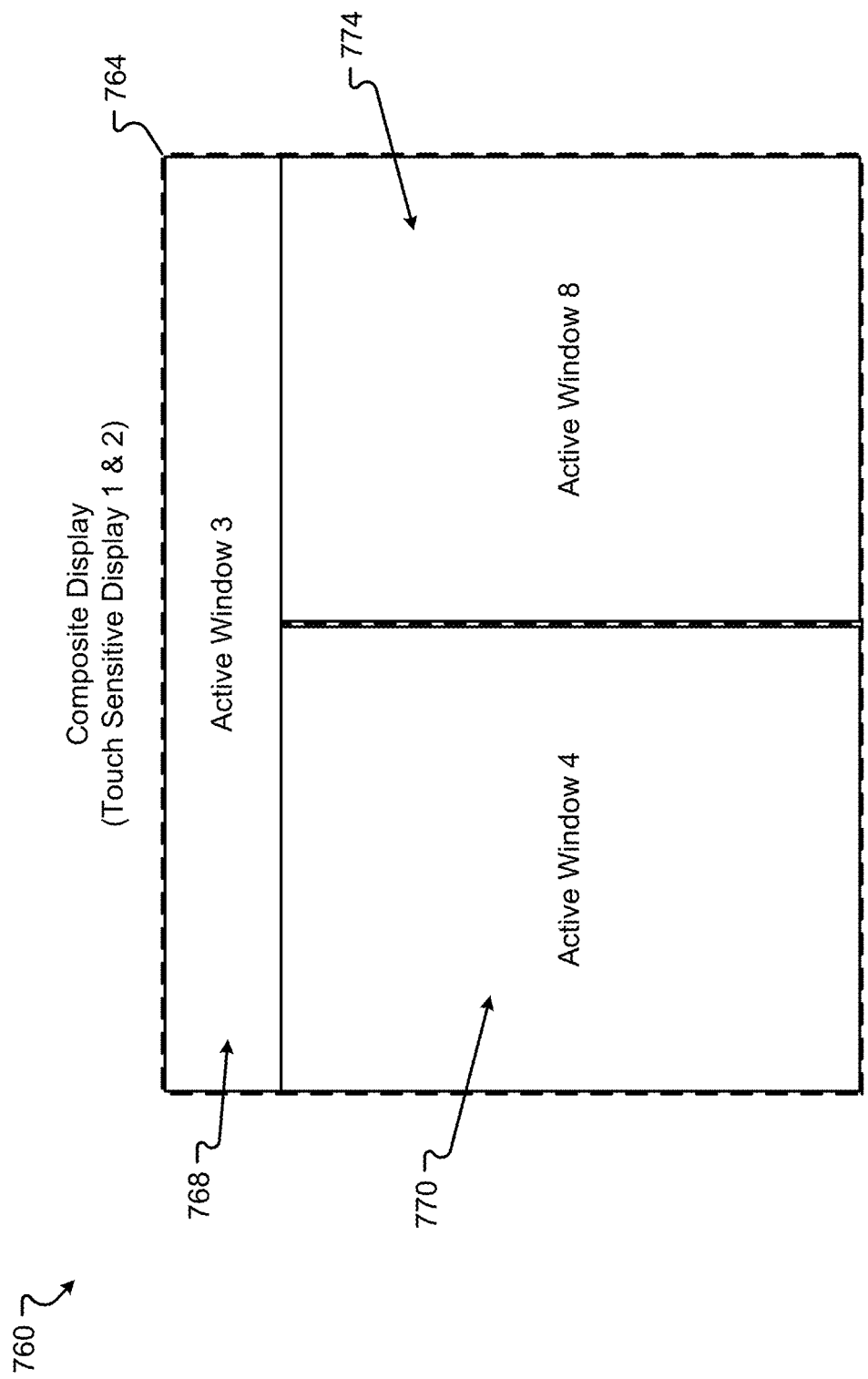
FIG. 7C is another representation of an embodiment of a logical window stack.
Figure 7D:
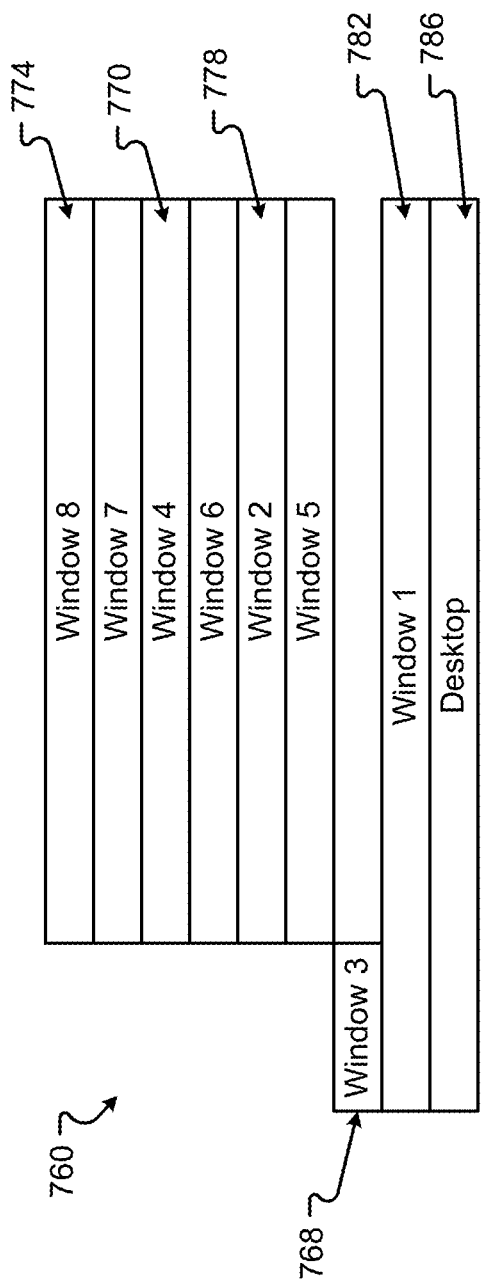
FIG. 7D is another representation of an embodiment of a logical window stack.
Figure 7E:
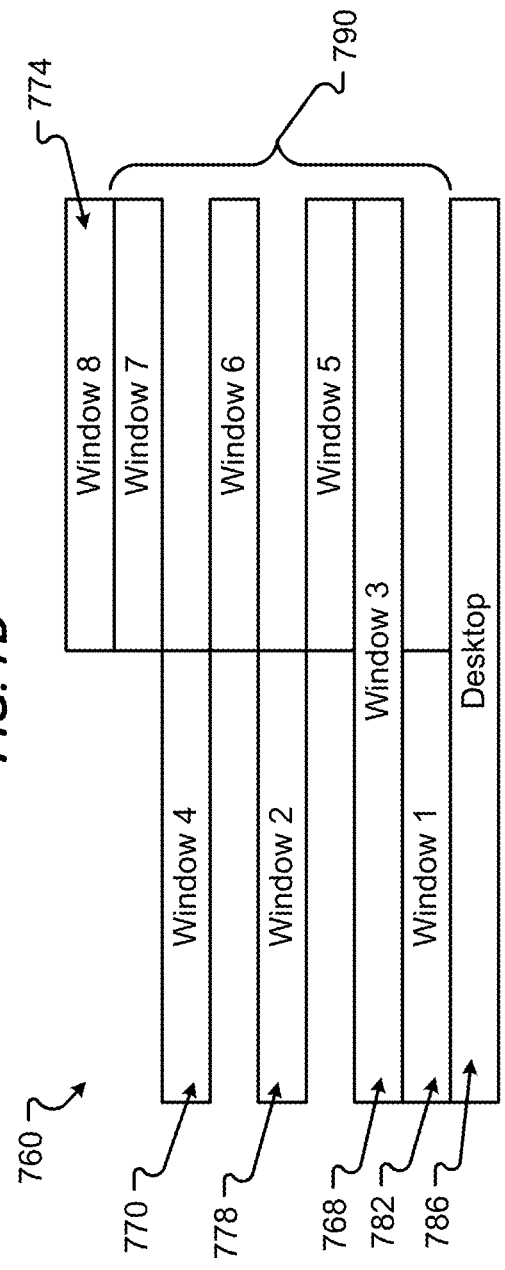
FIG. 7E is another representation of an embodiment of a logical window stack.

Yet another arrangement of a window stack 760 is shown in FIGS. 7C through 7E. The window stack 760 is shown in three "elevation" views. In FIG. 7C, the top of the window stack 760 is shown. Two sides of the window stack 760 are shown in FIGS. 7D and 7E. In this embodiment, the window stack 760 resembles a stack of bricks. The windows are stacked on each other. Looking from the top of the window stack 760 in FIG. 7C, only the top most windows in the window stack 760 are seen in different portions of the composite display 764. The composite display 764 represents a logical model for the entire display area of the device 100, which can include touch sensitive display 110 and touch sensitive display 114. A desktop 786 or a window can occupy part or all of the composite display 764.

In the embodiment shown, the desktop 786 is the lowest display or "brick" in the window stack 760. Thereupon, window 1 782, window 2 782, window 3 768, and window 4 770 are layered. Window 1 782, window 3 768, window 2 782, and window 4 770 only occupy a portion of the composite display 764. Thus, another part of the stack 760 includes window 8 774 and windows 5 through 7 shown in section 790. Only the top window in any portion of the composite display 764 is actually rendered and displayed. Thus, as shown in the top view in FIG. 7C, window 4 770, window 8 774, and window 3 768 are displayed as being at the top of the display in different portions of the window stack 760. A window can be dimensioned to occupy only a portion of the composite display 760 to "reveal" windows lower in the window stack 760. For example, window 3 768 is lower in the stack than both window 4 770 and window 8 774 but is still displayed. A logical data structure to manage the window stack can be as described in conjunction with FIG. 8.

When a new window is opened, the newly activated window is generally positioned at the top of the stack. However, where and how the window is positioned within the stack can be a function of the orientation of the device 100, the context of what programs, functions, software, etc. are being executed on the device 100, how the stack is positioned when the new window is opened, etc. To insert the window in the stack, the position in the stack for the window is determined and the touch sensitive display 110, 114 to which the window is associated may also be determined. With this information, a logical data structure for the window can be created and stored. When user interface or other events or tasks change the arrangement of windows, the window stack(s) can be changed to reflect the change in arrangement. It should be noted that these same concepts described above can be used to manage the one or more desktops for the device 100.

Figure 8:
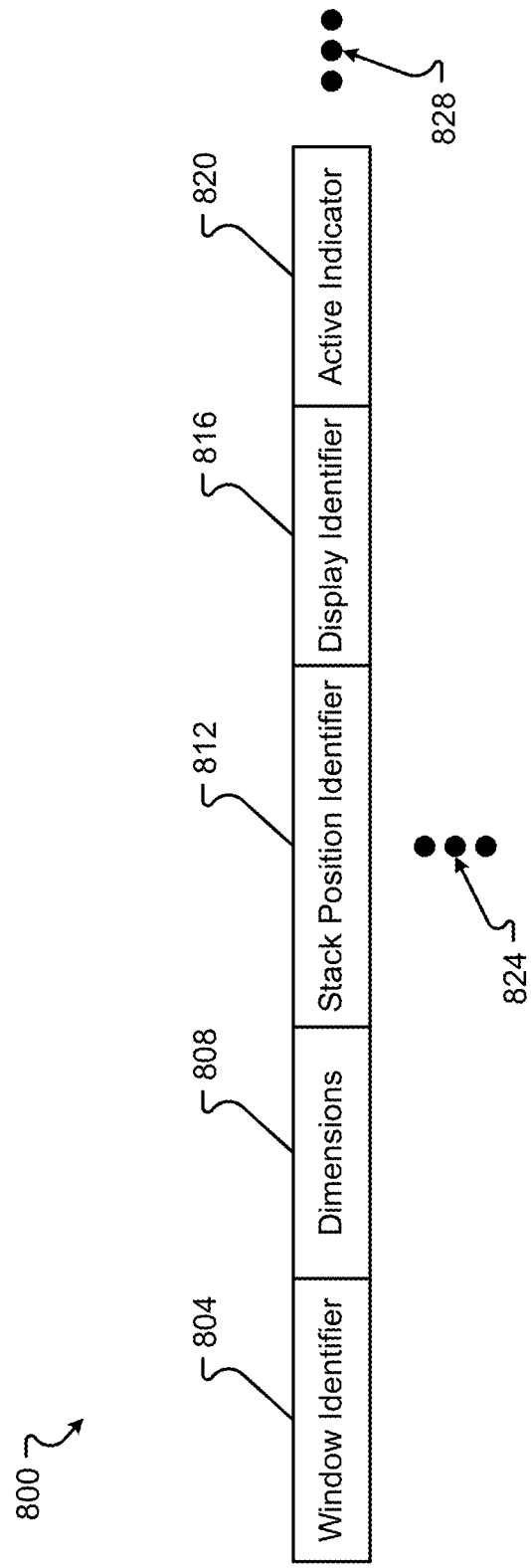
FIG. 8 is block diagram of an embodiment of a logical data structure for a window stack.

A logical data structure 800 for managing the arrangement of windows or desktops in a window stack is shown in FIG. 8. The logical data structure 800 can be any data structure used to store data whether an object, record, file, etc. The logical data structure 800 can be stored in any type of database or data storage system, regardless of protocol or standard. In embodiments, the logical data structure 800 includes one or more portions, fields, attributes, etc. that store data in a logical arrangement that allows for easy storage and retrieval of the information. Hereinafter, these one or more portions, fields, attributes, etc. shall be described simply as fields. The fields can store data for a window identifier 804, dimensions 808, a stack position identifier 812, a display identifier 816, and/or an active indicator 820. Each window in a window stack can have an associated logical data structure 800. While only a single logical data structure 800 is shown in FIG. 8, there may be more or fewer logical data structures 800 used with a window stack (based on the number of windows or desktops in the stack), as represented by ellipses 824. Further, there may be more or fewer fields than those shown in FIG. 8, as represented by ellipses 828.

A window identifier 804 can include any identifier (ID) that uniquely identifies the associated window in relation to other windows in the window stack. The window identifier 804 can be a globally unique identifier (GUID), a numeric ID, an alphanumeric ID, or other type of identifier. In embodiments, the window identifier 804 can be one, two, or any number of digits based on the number of windows that can be opened. In alternative embodiments, the size of the window identifier 804 may change based on the number of windows opened. While the window is open, the window identifier 804 may be static and remain unchanged.

Dimensions 808 can include dimensions for a window in the composite display 760. For example, the dimensions 808 can include coordinates for two or more corners of the window or may include one coordinate and dimensions for the width and height of the window. These dimensions 808 can delineate what portion of the composite display 760 the window may occupy, which may be the entire composite display 760 or only part of composite display 760. For example, window 4 770 may have dimensions 880 that indicate that the window 770 will occupy only part of the display area for composite display 760, as shown in FIGS. 7c through 7E. As windows are moved or inserted in the window stack, the dimensions 808 may change.

A stack position identifier 812 can be any identifier that can identify the position in the stack for the window or may be inferred from the window's control record within a data structure, such as a list or a stack. The stack position identifier 812 can be a GUID, a numeric ID, an alphanumeric ID, or other type of identifier. Each window or desktop can include a stack position identifier 812. For example, as shown in FIG. 7A, window 1 704 in stack 1 760 can have a stack position identifier 812 of 1 identifying that window 704 is the first window in the stack 760 and the active window. Similarly, window 6 724 can have a stack position identifier 812 of 3 representing that window 724 is the third window in the stack 760. Window 2 708 can also have a stack position identifier 812 of 1 representing that window 708 is the first window in the second stack 764. As shown in FIG. 7B, window 1 744 can have a stack position identifier 812 of 1, window 3, rendered in portions 732 and 736, can have a stack position identifier 812 of 3, and window 6 756 can have a stack position identifier 812 of 6. Thus, depending on the type of stack, the stack position identifier 812 can represent a window's location in the stack.

A display identifier 816 can identify that the window or desktop is associated with a particular display, such as the first display 110 or the second display 114, or the composite display 760 composed of both displays. While this display identifier 816 may not be needed for a multi-stack system, as shown in FIG. 7A, the display identifier 816 can indicate whether a window in the serial stack of FIG. 7B is displayed on a particular display. Thus, window 3 may have two portions 732 and 736 in FIG. 7B. The first portion 732 may have a display identifier 816 for the first display while the second portion 736 may have a display identifier 816 for the second display 114. However, in alternative embodiments, the window may have two display identifier 816 that represent that the window is displayed on both of the displays 110, 114, or a display identifier 816 identifying the composite display. In another alternate embodiment, the window may have a single display identifier 816 to represent that the window is displayed on both of the displays 110, 114.

Similar to the display identifier 816, an active indicator 820 may not be needed with the dual stack system of FIG. 7A, as the window in stack position 1 is active and displayed. In the system of FIG. 7B, the active indicator 820 can indicate which window(s) in the stack is being displayed. Thus, window 3 may have two portions 732 and 736 in FIG. 7. The first portion 732 may have an active indicator 820 while the second portion 736 may also have an active indicator 820. However, in alternative embodiments, window 3 may have a single active indicator 820. The active indicator 820 can be a simple flag or bit that represents that the window is active or displayed.

Figure 9:
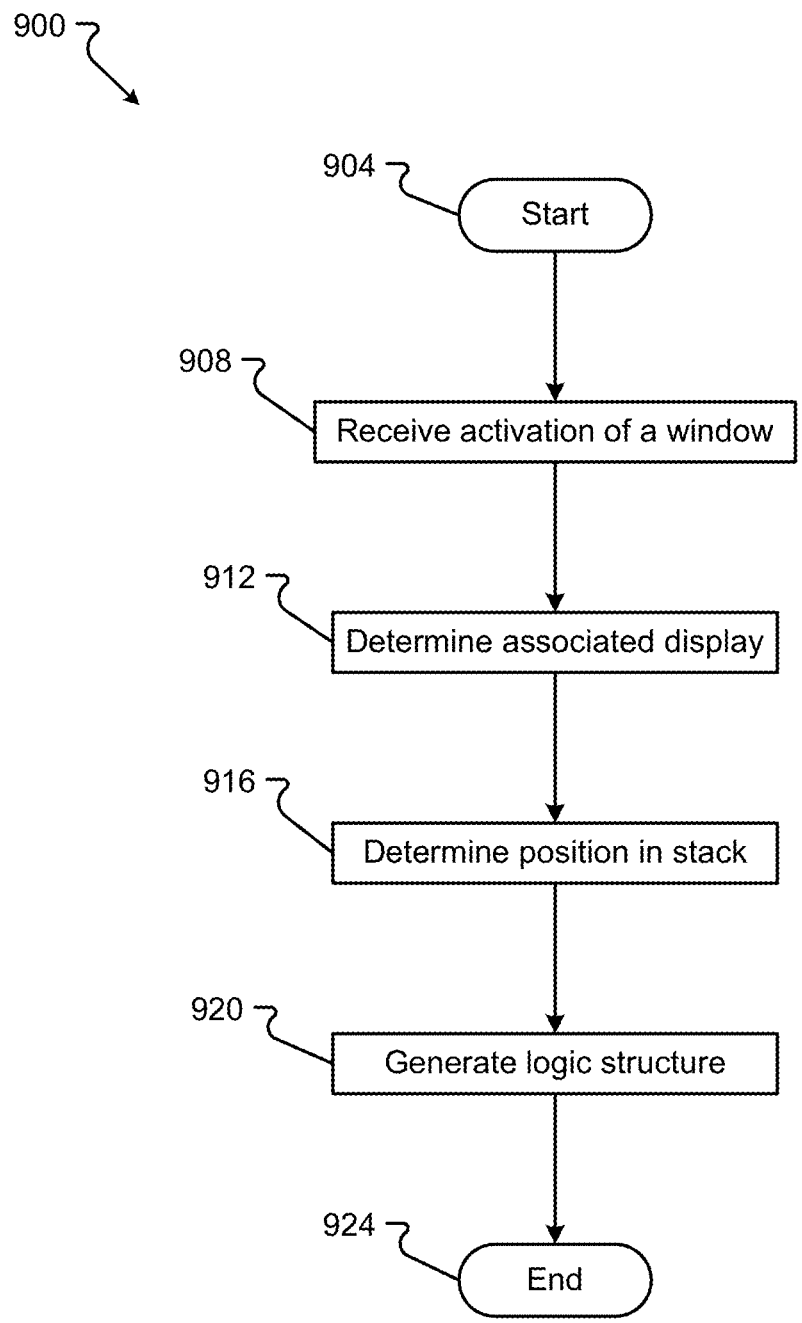
FIG. 9 is a flow chart of an embodiment of a method for creating a window stack.

An embodiment of a method 900 for creating a window stack is shown in FIG. 9. While a general order for the steps of the method 900 is shown in FIG. 9. Generally, the method 900 starts with a start operation 904 and ends with an end operation 928. The method 900 can include more or fewer steps or can arrange the order of the steps differently than those shown in FIG. 9. The method 900 can be executed as a set of computer-executable instructions executed by a computer system and encoded or stored on a computer readable medium. Hereinafter, the method 900 shall be explained with reference to the systems, components, modules, software, data structures, user interfaces, etc. described in conjunction with FIGS. 1-8.

A multi-screen device 100 can receive activation of a window, in step 908. In embodiments, the multi-screen device 100 can receive activation of a window by receiving an input from the touch sensitive display 110 or 114, the configurable area 112 or 116, a gesture capture region 120 or 124, or some other hardware sensor operable to receive user interface inputs. The processor may execute the Task Management Module 540 may receive the input. The Task Management Module 540 can interpret the input as requesting an application task to be executed that will open a window in the window stack.

In embodiments, the Task Management Module 540 places the user interface interaction in the task stack 552 to be acted upon by the Display Configuration Module 568 of the Multi-Display Management Module 524. Further, the Task Management Module 540 waits for information from the Multi-Display Management Module 524 to send instructions to the Window Management Module 532 to create the window in the window stack.

The Multi-Display Management Module 524, upon receiving instruction from the Task Management Module 540, determines to which touch portion of the composite display 760, the newly activated window should be associated, in step 912. For example, window 4 770 is associated with the a portion of the composite display 764 In embodiments, the device state module 574 of the Multi-Display Management Module 524 may determine how the device is oriented or in what state the device is in, e.g., open, closed, portrait, etc. Further, the preferences module 572 and/or requirements module 580 may determine how the window is to be displayed. The gesture module 576 may determine the user's intentions about how the window is to be opened based on the type of gesture and the location of where the gesture is made.

The Display Configuration Module 568 may use the input from these modules and evaluate the current window stack 760 to determine the best place and the best dimensions, based on a visibility algorithm, to open the window. Thus, the Display Configuration Module 568 determines the best place to put the window at the top of the window stack 760, in step 916. The visibility algorithm, in embodiments, determines for all portions of the composite display, which windows are at the top of the stack. For example, the visibility algorithm determines that window 3 768, window 4 770, and window 8 774 are at the top of the stack 760 as viewed in FIGS. 7C through 7E. Upon determining where to open the window, the Display Configuration Module 568 can assign a display identifier 816 and possibly dimensions 808 to the window. The display identifier 816 and dimensions 808 can then be sent back to the Task Management Module 540. The Task Management Module 540 may then assign the window a stack position identifier 812 indicating the windows position at the top of the window stack.

In embodiments, the Task Management Module 540 sends the window stack information and instructions to render the window to the Window Management Module 532. The Window Management Module 532 and the Task Management Module 540 can create the logical data structure 800, in step 924.

Both the Task Management Module 540 and the Window Management Module 532 may create and manage copies of the window stack. These copies of the window stack can be synchronized or kept similar through communications between the Window Management Module 532 and the Task Management Module 540. Thus, the Window Management Module 532 and the Task Management Module 540, based on the information determined by the Multi-Display Management Module 524, can assign dimensions 808, a stack position identifier 812 (e.g., window 1 782, window 4 770, etc.), a display identifier 816 (e.g., touch sensitive display 1 110, touch sensitive display 2 114, composite display identifier, etc), and an active indicator 820, which is generally always set when the window is at the "top" of the stack. The logical data structure 800 may then be stored by both the Window Management Module 532 and the Task Management Module 540. Further, the Window Management Module 532 and the Task Management Module 540 may thereinafter manage the window stack and the logical data structure(s) 800.

Demand for portable electronic devices with high levels of functionality continues to rise and personal electronic devices continue to become increasingly more portable. While computer power, battery life, screen size and overall functionality of portable phones and smart phones continues to increase, user reliance on these devices increases. Many users of such devices rely heavily on such devices for general communication, accessing the internet, cloud computing, and accessing various locally stored information such as contact information, files, music, pictures and the like. It is often desirable therefore to connect such heavily relied on devices to an additional computing device or display, such as a monitor or tablet device, such as a smartpad (SP) 1000 (see FIG. 10).

Accordingly, it is desirable for the device 100 to be able to interface with an additional device, such as the smartpad 1000, that enables functionality similar to, for example, both a tablet computer system and smart phone. Furthermore, a need exists for the above-described device to allow for various pre-existing features of both devices, such as sending and receiving phone calls and further allowing for the accessibility of applications running on the device 100. A need also exists for the above device 100 to provide the benefits of both a tablet computer system and cellular phone in one integrative device by allowing for common operations and functionality without compromising the form factor of the device.

One exemplary embodiment is directed toward a selectively removable device and smartpad system. The smartpad system is discussed in greater detail hereinafter, and can have various features for complementing the communications device, such as a smart phone or device 100. For example, the smartpad may supplement the device 100 by providing increased screen size, increased processor size, increased battery or power supply, or the like. Similarly, the device 100 may compliment the SP 1000 by providing connectivity through one or more wireless networks, access to various stored information, and the like. It will expressly recognized therefore that two or more devices of the present invention may be provided in a connected or docked and generally symbiotic relationship. It will further be recognized that the devices provide various features, benefits and functionality in their independent state(s).

In accordance with one exemplary embodiment, the device 100 is capable of being received by the SP 1000 through a recessed feature of the SP 1000 having corresponding dimensions to the device 100. In one exemplary embodiment, the SP 1000 is provided and preferably sized for receiving a predetermined device 100. In alternative embodiments, however, it is contemplated that the SP 1000 is provided, the smartpad capable of receiving a plurality of communications devices of different sizes. In such embodiments, the SP 1000 may receive communications devices of various sizes by, for example, the inclusion of additional elements, such as spacers and various adjustable features.

In accordance with one exemplary embodiment, the device 100 and SP 1000 have a docking relationship that is established when the device 100 is connected to the SP 1000 during various modes of operation. For example, in one embodiment, a system is provided comprising the SP 1000 and the device 100, the SP 1000 capable of physically receiving the device 100, wherein the device 100 is operable as the primary computing device. In such an embodiment, the SP 1000 may, for example, simply provide enhanced audio and visual features for the device 100 that comprises its own CPU, memory, and the like. It is further contemplated that the system can be placed in a mode of operation wherein the device 100 docked to the SP 1000 provide it in a more passive mode where, for example, the device 100 draws power from the SP 1000 such as to recharge a battery of the device 100.

In accordance with another exemplary embodiment, the device 100 and SP 1000 are provided wherein the device 100 is received or docked with the SP 1000 and wherein a substantial area of the device 100 is positioned within one or more compartments of the SP 1000. For example, where as various known devices comprise docking features which require or result in the docked item to be generally exposed, thereby substantially altering the external dimensions of the host device and/or creating a potential for damaging one or both devices upon impact, an exemplary embodiment contemplates the SP 1000 which receives the device 100 in a manner such that the external dimensions of the SP 1000 are not substantially altered when the devices are connected. In such an arrangement, the device 100 and associated connection means are generally protected and the SP 1000 is allowed to substantially maintain its original shape. In accordance with one exemplary embodiment, the SP 1000 is capable of receiving and/or docking the device 100 wherein the device 100 is received in lockable association with the SP 1000. As used herein, the term "lockable" is not intended to designate or limit it to any particular arrangement. Rather, lockable is intended to refer to various embodiments as described herein and will be recognized by one of ordinary skill in the art. In one embodiment, the device 100 is connectable to the SP 1000 wherein the SP 1000 comprises extension springs for first electively securing the device 100 in a docked manner and an ejection feature for releasing the device 100 from the SP 1000. Moreover, as will be described in greater detail below, it should be appreciated that the device 100 and SP 1000 can communicate using wired and/or wireless technology(ies) with equal success. Moreover, and in accordance with another exemplary embodiment, the hinged device 100 is selectively connectable to the SP 1000 wherein the device 100 is received by the SP 1000 in an open position and where in one or more preexisting ports of the SP 1000 correspond with internal receiving features of the SP 1000, such that the device 100 and the SP 1000 may be operated simultaneously in various modes of use.

In accordance with some exemplary embodiments, the SP 1000 is provided with an eject or release button to facilitate the removal of a stored or docked device 100.

Figure 10:
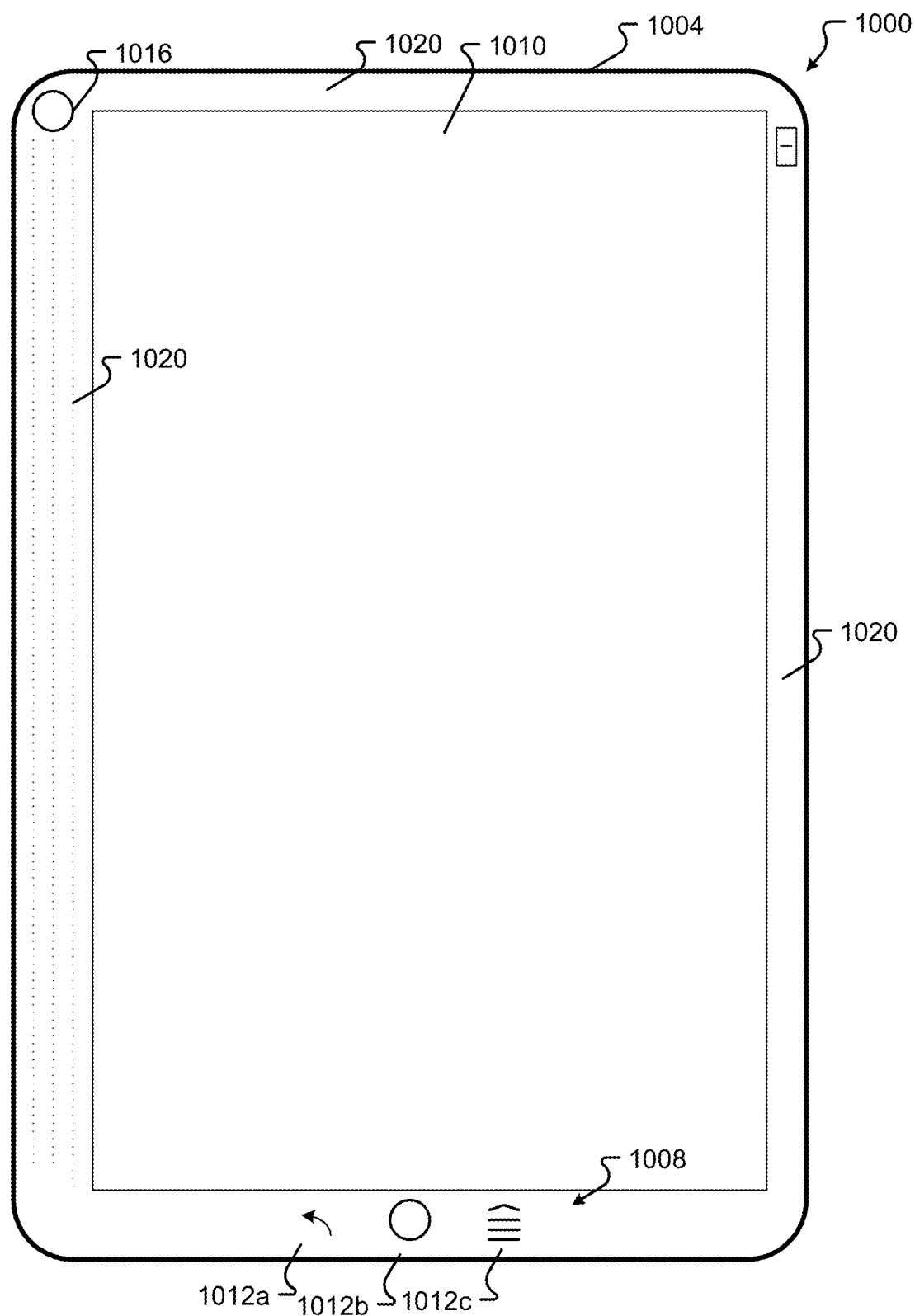
FIG. 10 illustrates an exemplary smartpad (SP).

FIG. 10 illustrates an exemplary smartpad (SP) 1000 according to an exemplary embodiment. The exemplary smartpad at least provides a larger touch sensitive display operatively coupleable to device 100.

While the following description uses the term "smart" in conjunction with the display device 1000, it is to be appreciated that this term does not necessarily connote that there is intelligence in the smartpad. Rather, it is to be appreciated that there can be "intelligence," including one or more of a processor(s), memory, storage, display drivers, etc., in the smartpad, and/or one or more of these elements shared with the device 100 via, for example, one or more of a port, bus, connection, or the like. In general, any one or more of the functions of the device 100 is extendable to the smartpad 1000 and vice versa.

The exemplary smartpad 1000 includes a screen 1004, a SP touch sensitive display 1010, a SP configurable area 1008, a SP gesture capture region(s) 1020 and a SP camera 1016. The SP 1000 also includes a port (not visible in this orientation) adapted to receive the device 100 as illustrated at least in FIG. 11.

The device 100 docks with the smartpad 1000 via the port on the SP 1000 and the corresponding port 136 on device 100. As discussed, port 136 in some embodiments is an input/output port (I/O port) that allows the device 100 to be connected to other peripheral devices, such as a display, keyboard, printing device and/or SP 1000. In accordance with one exemplary embodiment, the docking is accomplished by the device 100 sliding into the left-hand side of the SP 1000, with the device 100 being in an open state and the device 100 engaging a port in the SP 1000 corresponding to port 136. In accordance with one exemplary embodiment, the device 100 engages a doored cassette-like slot in the SP 1000 into which the device 100 slides. (See, for example, FIGS. 13A-B.) It should be appreciated, however, that there may be other configurations for physically and electrically engaging the two devices. In general, the manner of engagement is not important provided the device 100 and SP 1000 are in electrical communication with one another.

The SP 1000 includes a screen 1004. In some embodiments, the entire front surface of the SP 1000 may be touch sensitive and capable of receiving input by a user touching the front surface of the screen 1004. The screen 1004 includes touch sensitive display 1010, which, in addition to being touch sensitive, is also capable of displaying information to a user.

The screen 1004 also includes a configurable area 1008 that has been configured for specific inputs when the user touches portions of the configurable area 1008. Area 1012a is configured to receive a "back" input indicating that a user would like to view information previously displayed. Area 1012b is configured to receive a "menu" input indicating that the user would like to view options from a menu.

Area 1012c is configured to receive a "home" input indicating that the user would like to view information associated with a "home" view.

In other embodiments, areas 1012a-c may be configured, in addition to the configurations described above, for other types of specific inputs including controlling features of device 100 and/or device 1000, some non-limiting examples including adjusting overall system power, adjusting the volume, adjusting the brightness, adjusting the vibration, selecting of displayed items on screen 1004, operating the SP camera 1016, operating a microphone, and initiating/terminating of telephone calls. Also, in some embodiments, areas 1012a-c may be configured for specific inputs depending upon the application running on device 100/SP 1000 and/or information displayed on the touch sensitive displays 1010.

In addition to touch sensing, screen 1004 may also include areas that receive input from a user without requiring the user to touch the display area of the screen. For example, screen 1004 can include gesture capture area 1020. These areas are able to receive input by recognizing gestures made by a user without the need for the user to actually touch the surface of the display area. In comparison to touch sensitive display 1010 and 1014, the gesture capture area 1020 may not be capable of rendering a displayed image.

While not illustrated, there may also be a number of hardware components within SP 1000. As illustrated in FIG. 10, SP 1000 can include a speaker, a microphone and one or more cameras 1016. Upon docking the device 100 in the SP 1000, the corresponding device(s) (e.g., the speaker) in the device 100 could be disabled in favor of the speaker in the SP 1000. Similarly, other components, such as the screen 1004, microphone, speaker, etc, could be disabled on the device 100 in favor of the SP 1000.

In general, the touch sensitive display 1010 may comprise a full color, touch sensitive display. A second area within each touch sensitive screen 1004 may comprise the SP gesture capture region 1020. The SP gesture capture region 1020 may comprise an area or region that is outside of the SP touch sensitive display 1010 area that is capable of receiving input, for example in the form of gestures provided by a user. However, the SP gesture capture region 1020 does not necessarily include pixels that can perform a display function or capability.

A third region of the SP touch sensitive screen 1004 may comprise the configurable area 1008. The configurable area 1008 is capable of receiving input and has display or limited display capabilities. In embodiments, the configurable area 1008 may present different input options to the user. For example, the configurable area 1008 may display buttons or other relatable items. Moreover, the identity of displayed buttons, or whether any buttons are displayed at all within the configurable area 1008 of the SP touch sensitive screen 1004 may be determined from the context in which the device 1000 is used and/or operated. In an exemplary embodiment, the touch sensitive screen 1004 comprise liquid crystal display devices extending across at least those regions of the touch sensitive screen 1004 that is capable of providing visual output to a user, and a capacitive input matrix over those regions of the touch sensitive screen 1004 that is capable of receiving input from the user.

As discussed above with reference to FIGS. 4A through 4H, the various graphical representations of gesture inputs that may be recognized by the screens 104, 108 are also recognizable by screen 1004. As discussed, the gestures may be performed not only by a user's body part, such as a digit, but also by other devices, such as a stylus, that may be sensed by the contact sensing portion(s) of a screen 1004. In general, gestures are interpreted differently, based on where the gestures are performed (either directly on the display 1004 or in the gesture capture region 1020). For example, gestures in the display 1010 may be directed to a desktop or application, and gestures in the gesture capture region 1020 may be interpreted as for the system.

In addition to the above, the SP touch sensitive screen 1004 may also have an area that assists a user with identifying which portion of the screen is in focus. This could be a bar of light or in general an indicator that identifies which one or more portions of the SP touch sensitive screen 1004 are in focus. (See, for example, FIG. 29.)

One or more display controllers (such as display controllers 216*a*, 216*b* and/or dedicated display controller(s) on the SP 1000) may be provided for controlling the operation of the touch sensitive screen 1004 including input (touch sensing) and output (display) functions.

In accordance with one exemplary embodiment, a separate touch screen controller is provided for the SP 1000 in addition to each of the controllers for the touch screens 104 and 108. In accordance with alternate embodiments, a common or shared touch screen controller may be used to control any one or more of the touch sensitive screens 104 and 108, and/or 1004. In accordance with still other embodiments, the functions of the touch screen controllers may be incorporated into other components, such as a processor and memory or dedicated graphics chip(s).

In a similar manner, the SP 1000 may include a processor complementary to the processor 204, either of which may comprise a general purpose programmable processor or controller for executing application programming or instructions. In accordance with at least some embodiments, the processors may include multiple processor cores, and/or implement multiple virtual processors. In accordance with still other embodiments, the processors may include multiple physical processors. As a particular example, the processors may comprise a specially configured application specific integrated circuit (ASIC) or other integrated circuit, a digital signal processor, a controller, a hardwired electronic or logic circuit, a programmable logic device or gate array, a special purpose computer, or the like. The processors generally function to run programming code or instructions implementing various functions of the device 100 and/or SP 1000.

The SP 1000 can also optionally be equipped with an audio input/output interface/device(s) (not shown) to provide analog audio to an interconnected speaker or other device, and to receive analog audio input from a connected microphone or other device. As an example, the audio input/output interface/device(s) 256 may comprise an associated amplifier and analog to digital converter usable with SP 1000. Alternatively or in addition, the device 100 can include an integrated audio input/output device 256 and/or an audio jack for interconnecting an external speaker or microphone via SP 1000. For example, an integrated speaker and an integrated microphone can be provided, to support near talk or speaker phone operations.

Hardware buttons (not shown) but similar to hardware buttons 158 can be included for example for use in connection with certain control operations. Examples include a master power switch, volume control, etc., as described in conjunction with FIGS. 1A through 1J. One or more image capture interfaces/devices 1016, such as a camera, can be included for capturing still and/or video images. Alternatively or in addition, an image capture interface/device 1016 can include a scanner or code reader. An image capture interface/device 1016 can include or be associated with additional elements, such as a flash or other light sources.

Communications between various components of the device 100 and SP 1000 can be carried by one or more buses and/or communications channels. In addition, power can be supplied to one or more of the components of the device 100 and Sp 1000 from a power source and/or power control module 260. The power control module 260 and/or device 100 and/or SP 1000 can, for example, include a battery, an AC to DC converter, power control logic, and/or ports for interconnecting the device 100/1000 to an external source of power.

The middleware 520 may also be any software or data that allows the multiple processes naming on the devices to interact. In embodiments, at least portions of the middleware 520 and the discrete components described herein may be considered part of the OS 516 or an application 564. However, these portions will be described as part of the middleware 520, but those components are not so limited. The middleware 520 can include, but is not limited to, a Multi-Display Management (MDM) class 524, a Surface Cache class 528, a Window Management class 532, an Activity Management class 536, an Application Management class 540, a display control block, one or more frame buffers 548, an activity stack 552, and/or an event buffer 556—all of the functionality thereof extendable to the SP 1000. A class can be any group of two or more modules that have related functionality or are associated in a software hierarchy.

The MDM class 524 also includes one or more modules that are operable to manage the display of applications or other data on the screen of the SP 1000. An embodiment of the MDM class 524 is described in conjunction with FIG. 5B. In embodiments, the MDM class 524 receives inputs from the OS 516, the drivers 512 and the applications 564. The inputs assist the MDM class 524 in determining how to display the information required by the user. Once a determination for display configurations is determined, the MDM class 524 can bind the applications 564 to a display configuration. The configuration may then be provided to one or more other components to generate the display on the SP 1000.

Figure 11:
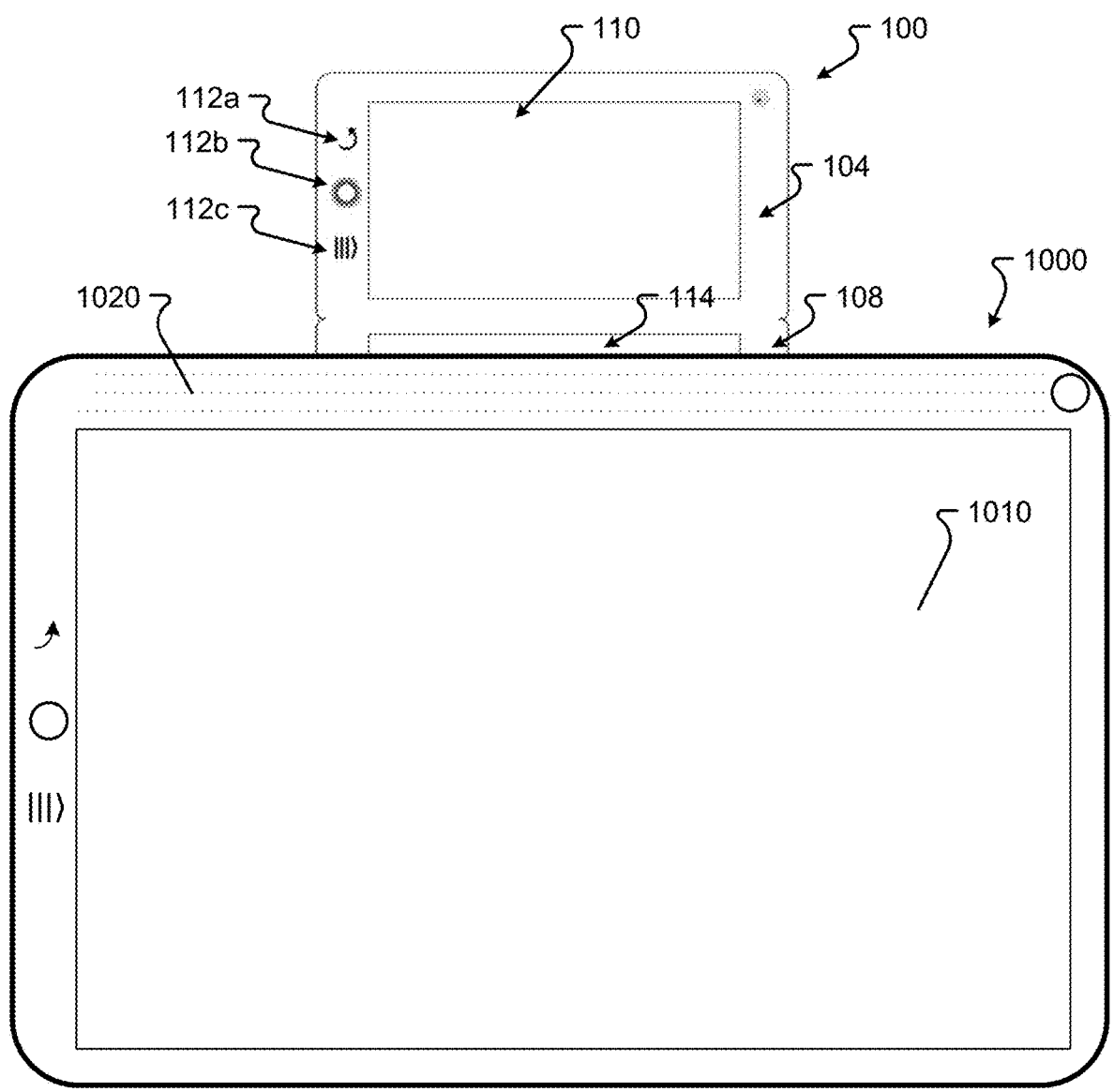
FIG. 11 illustrates an exemplary method of associating the smartpad with the device.
Figure 12:
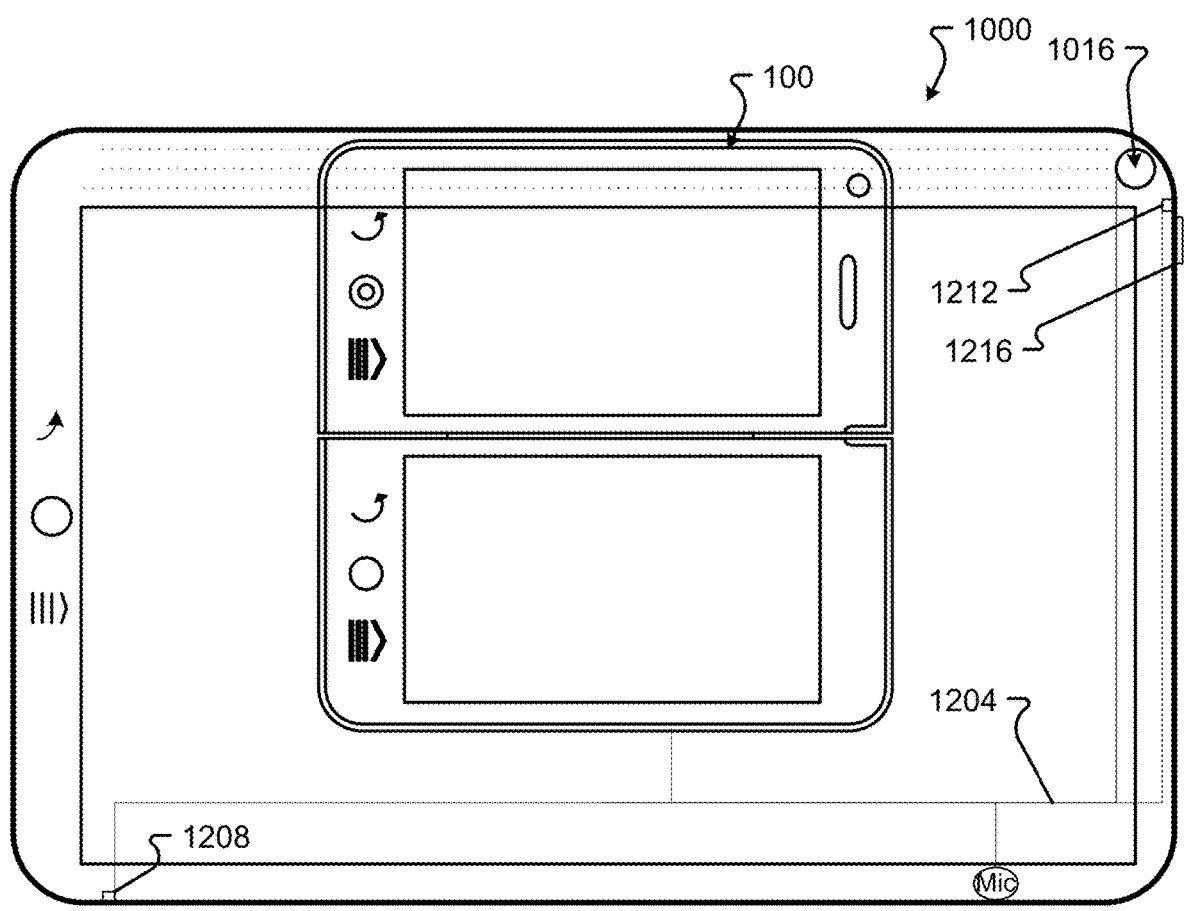
FIG. 12 illustrates a docked device with the smartpad.

FIG. 11 illustrates an exemplary embodiment showing the device 100 docking with the SP 1000. More specifically, the device 100 is being inserted into a slot (not shown) on the SP 1000. On completion of the inserting of device 100 into SP 1000 (See FIG. 12), device 100 communicates with the SP 1000 via bus or other wired or wireless electrical means 1204. The device 100 is also connected with, for example, the camera/video camera 1016, microphone (Mic), and power port 1208.

In conjunction with the docking of device 100 with SP 1000, one or more of the devices can begin power management. For example, one or more of the device 100 and SP 1000 can include power supplies, such as batteries, solar, or in general any electrical supply, any one or more of which being usable to supply one or more of the device 100 and SP 1000. Furthermore, through the use of, for example, an AC power adaptor connected to port 1208, the SP 1000 can supply power to device 100, such as to charge device 100. It will be appreciated that the power management functionality described herein can be distributed between one or more of the device 100 and SP 1000, with power being sharable between the two devices.

In addition to power management functions, upon the device 100 being docked with the SP 1000, the displays on device 100 can be turned off to, for example, save power. Furthermore, electrical connections are established between the device 100 and SP 1000 such that the speaker, microphone, display, input capture region(s), inputs, and the like, received by SP 1000 are transferrable to device 100. Moreover, the display on device 1000 is enabled such that information that would have been displayed on one or more of the touch sensitive displays 110 and 114 is displayed on touch sensitive display 1010. As will be discussed in greater detail herein, the SP 1000 can emulate the dual display configuration of the device 100 on the single display 1010.

The SP 1000 can optionally be equipped with the headphone jack 1212 and power button 1216. Moreover, any hardware buttons or user input buttons on the device 100 could be extended to and replicated on the SP 1000.

This dock event between the device 100 and SP 1000 can be seen as states 336 or 344 in FIG. 3A. As will be appreciated, and in accordance with one of the illustrative embodiments herein, the device 100 is docked with SP 1000 with the device being in the open state 210. However, it is to be appreciated that the device 100 can be docked with the SP 1000 in the closed state 304, or docked via, for example, a cable without the device 100 necessarily being inserted into the SP 1000.

Figure 13A:
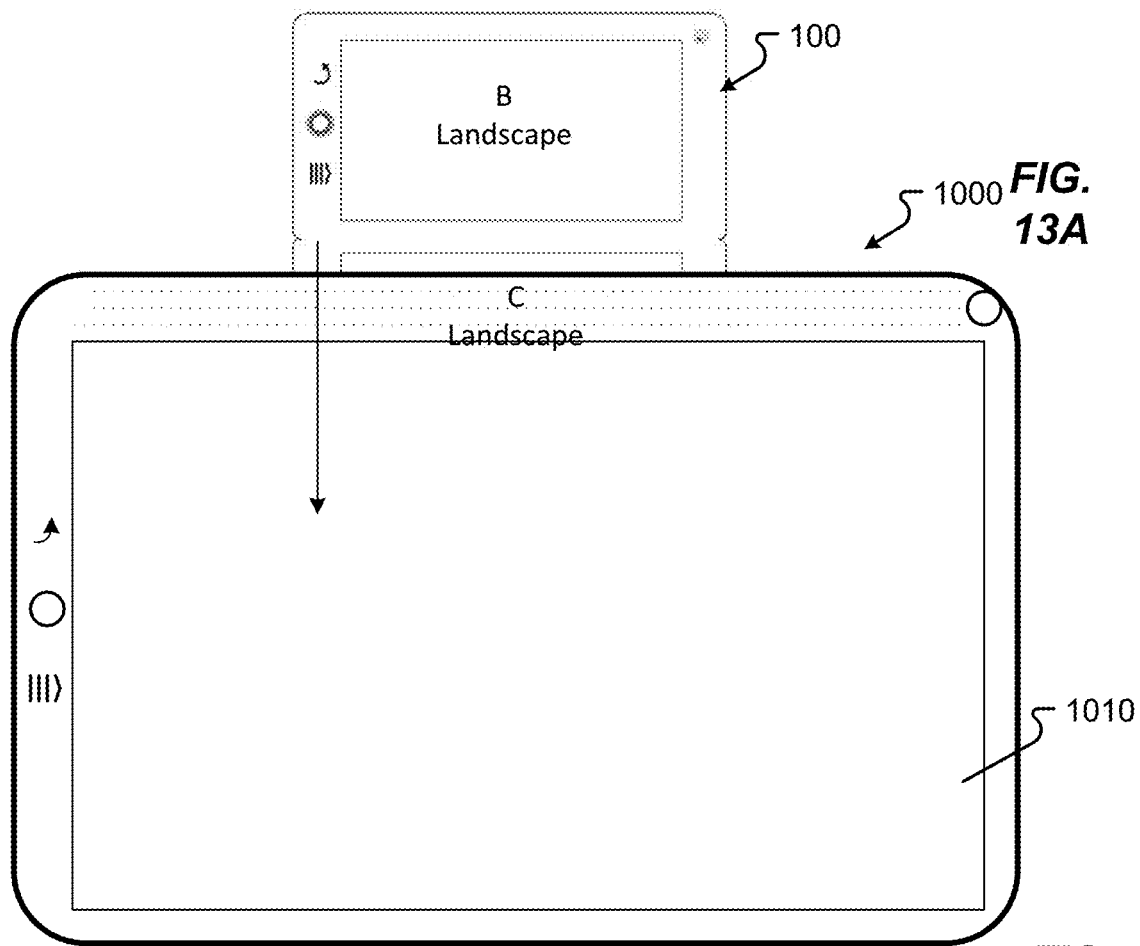
FIGS. 13A-13B illustrate an exemplary method for screen orientation.
Figure 13B:
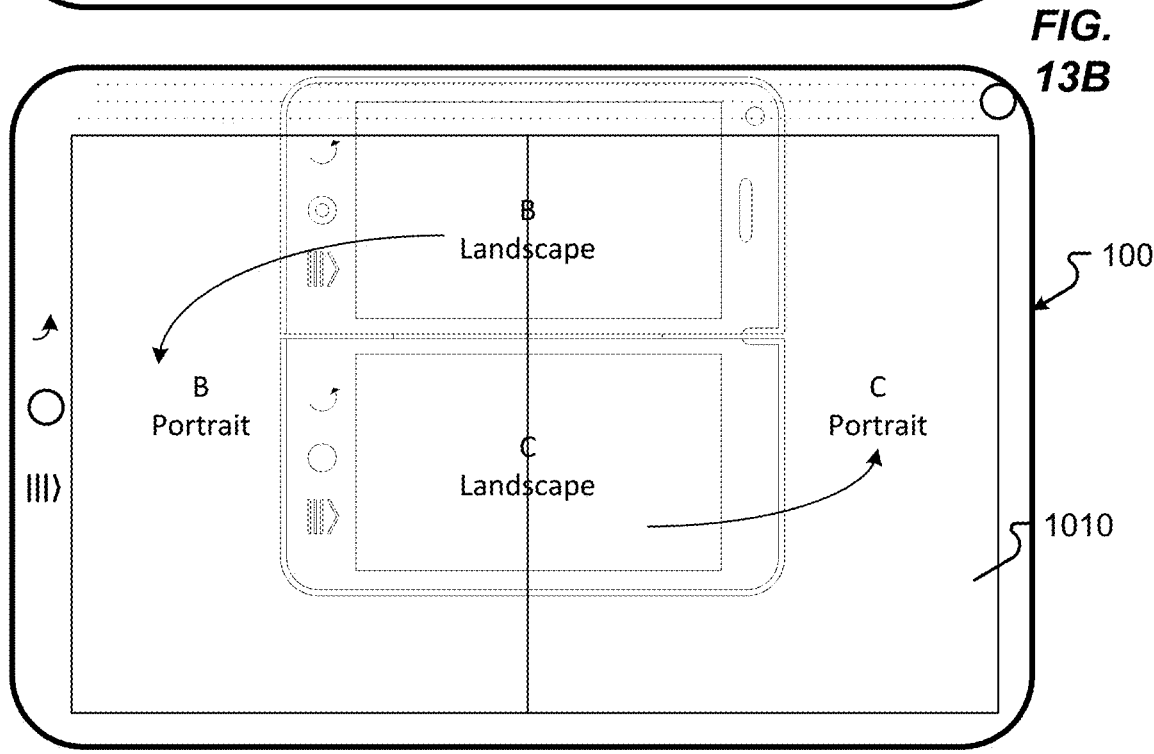

FIGS. 13A-B illustrate application reorientation according to an exemplary embodiment of the invention. In particular, FIG. 13A illustrates the device 100 being inserted into the SP 1000. Before being associated with the SP 1000, the device 100 has two applications, both in the landscape mode, represented by application "B" in landscape on a first screen and application "C" in landscape on a second screen (partially obscured by SP 1000).

FIG. 13B illustrates the re-orientation of the windows for the two applications based on the device 100 being associated with the SP 1000, the SP 1000 being in the landscape orientation. In accordance with this exemplary embodiment, application "B" on the device 100 is re-oriented to be in the portrait orientation on the SP 1000, and in a similar manner, application "C" on the device 100 is reoriented to the portrait orientation on the right-hand side the touch sensitive display 1010. As will be appreciated, the reorientation of the application(s) from the device 100 to the SP 1000 can occur in a similar manner for a single application running on the device 100. For example, if there is only one application running on device 100, and the application is running in landscape mode, when the device 100 is docked with the SP 1000, the orientation of the application is reoriented to be appropriate for the current orientation of the SP 1000. For example, if the application on the device 100 is in portrait mode, and the SP 1000 is in landscape mode, the application is reoriented from portrait mode on the device 100 to landscape mode on the SP 1000. In a similar manner, if the application on the device is in landscape mode, and upon being docked to the SP 1000 in portrait mode, the application is reoriented into portrait mode for appropriate viewing on the SP 1000.

In accordance with one exemplary embodiment, the accelerometer 176 on device 100 is used to determine the orientation of both the device 100 and SP 1000, and consequently the orientation of the touch screen display 1010. Therefore, the accelerometer(s) 176 outputs a signal that is used in connection with the display of information to control the orientation and/or format in which information is to be displayed to the user on display 1010. As is to be appreciated, reorientation can include one or more of a portrait to landscape conversion, a landscape to portrait conversion, a resizing, a re-proportioning and/or a redrawing of the window(s) associated with the application(s).

On reorienting of the running application(s), the application(s) is displayed on display 1010 on SP 1000.

In accordance with an optional exemplary embodiment, priority can be given to the application that is in focus. For example, and using again applications "B" and "C" as illustrated in FIG. 13B, if instead application C was in focus before docking, application C could be reoriented and displayed on the left-hand portion of display 1010, and application B, which was not in focus before docking, displayed on the right-hand portion of display 1010 upon docking.

In accordance with another optional embodiment, the application in focus could be displayed in full-screen mode on display 1010 with the application(s) not in focus placed into a window stack that is, for example, in a carousel-type arrangement as discussed hereinafter.

Figure 14:
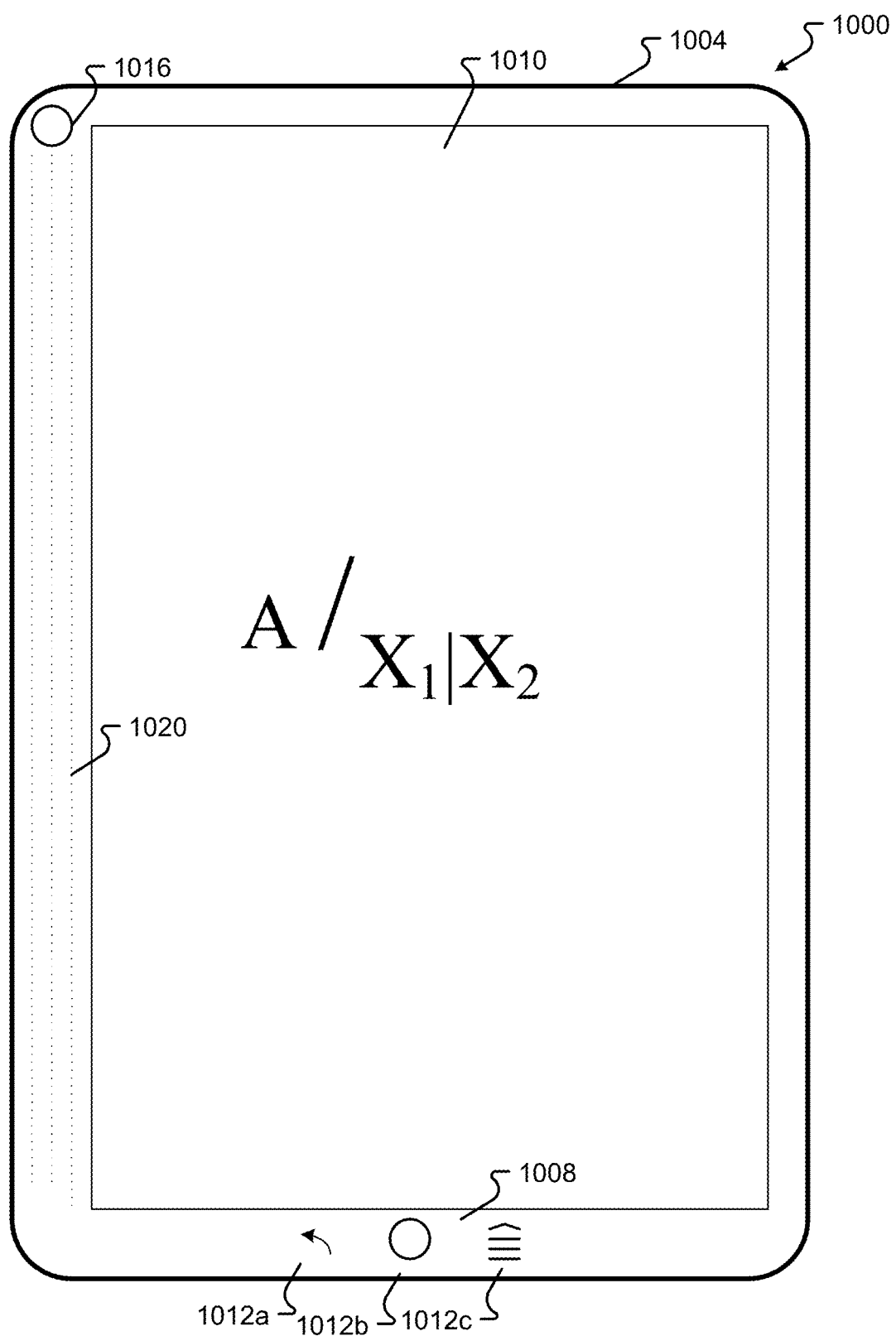
FIG. 14 illustrates a method for displaying an application when the SP is in a portrait mode.

FIG. 14 illustrates an exemplary embodiment of a single application mode for the SP 1000. In the single application mode, all applications are launched and displayed in full screen. The single application mode can be indicated by a multi-tasking icon in the enunciator bar, or at some other location on screen 1004.

Figure 15:
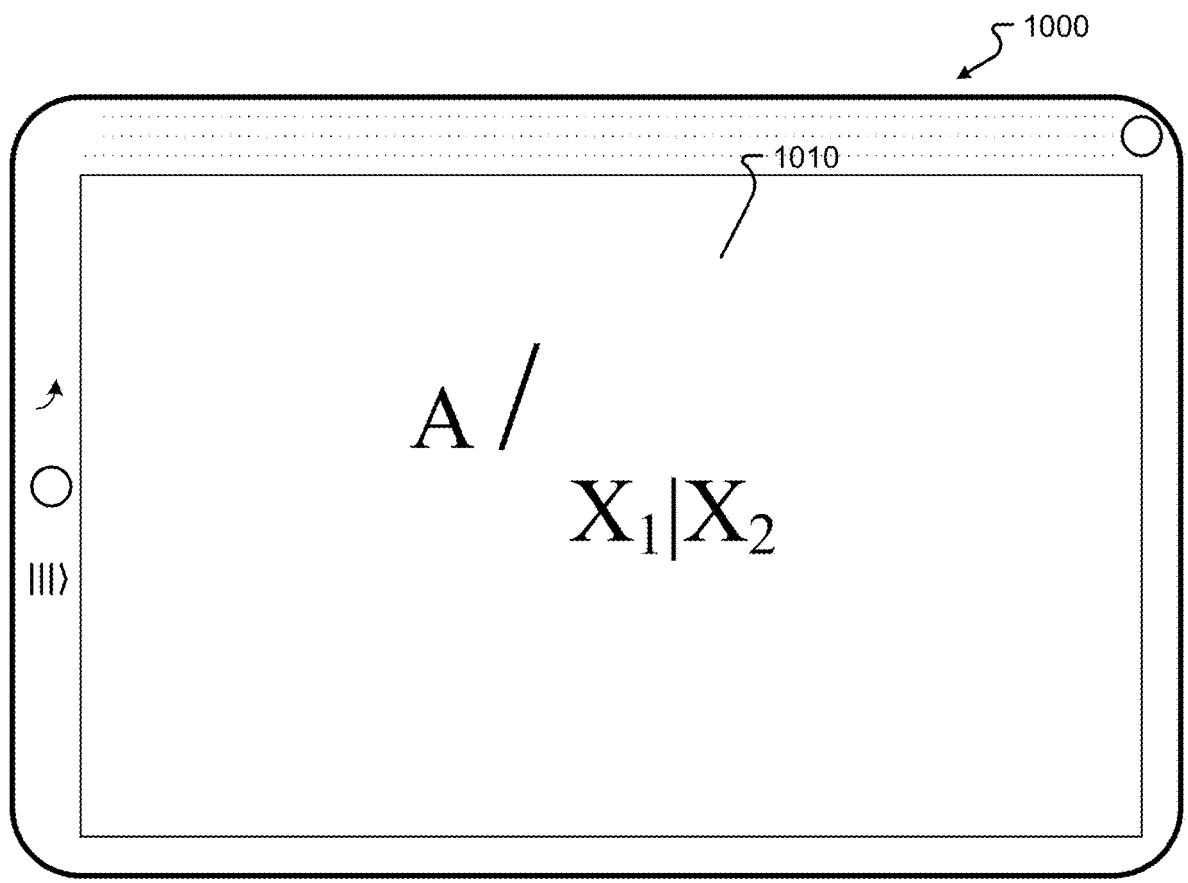
FIG. 15 illustrates a method for displaying an application when the SP is in a landscape mode.

Displaying of the application(s) are managed by one or more of the display controller 544, framework 520, window management module 532, display configuration module 568, as well as middleware 520 and associated classes. In single application mode, all dual screen capable applications can be launched in either a dual screen or max mode, where the application is displayed substantially filling the display 1010. This is applicable to when the SP 1000 is either in the portrait mode, as illustrated in FIG. 14, or in the landscape mode, as illustrated in FIG. 15. In these figures, the "A" represents the single application with the X1, X2 being variables representing the coordinates and/or location of the window in which the application "A" is to be displaced. A similar notation is used hereinafter for the multi-application mode, with it being appreciated that, for example, X1 may contain the coordinate information for the displaying of the window for a first application, and X2 may contain the coordinate information for the displaying of a window corresponding to a second application, and so on.

Figure 61:
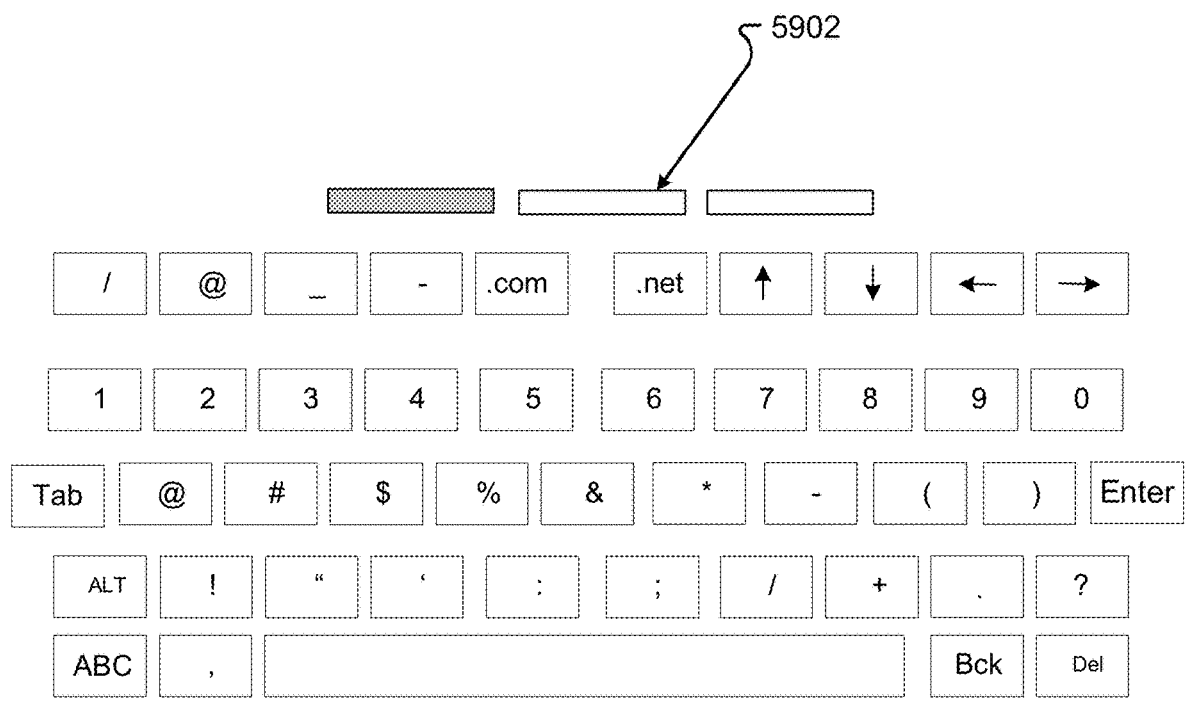
FIG. 61 illustrates another exemplary keyboard and slider configuration.

Therefore, in one exemplar embodiment, when a single application is executed, a single application can launch in the full screen mode and can be correlated to the max mode as discussed in relation to FIG. 61 where a single application spans both screens of the device 100. This max mode is applicable to both the portrait and landscape orientations as illustrated in FIG. 14 and FIG. 15 with the display configuration module 568 appropriately (re)sizing the window for the application to fit on substantially all or all of the display 1010.

This resizing can occur regardless of whether a native application on the device 100 actually supports the orientation of the SP 1000. Therefore, even if the application does not support a particular orientation on device 100, the display configuration module 568 can appropriately re-render and/or re-size the window for the application for appropriate display on the SP 1000.

Figure 16:
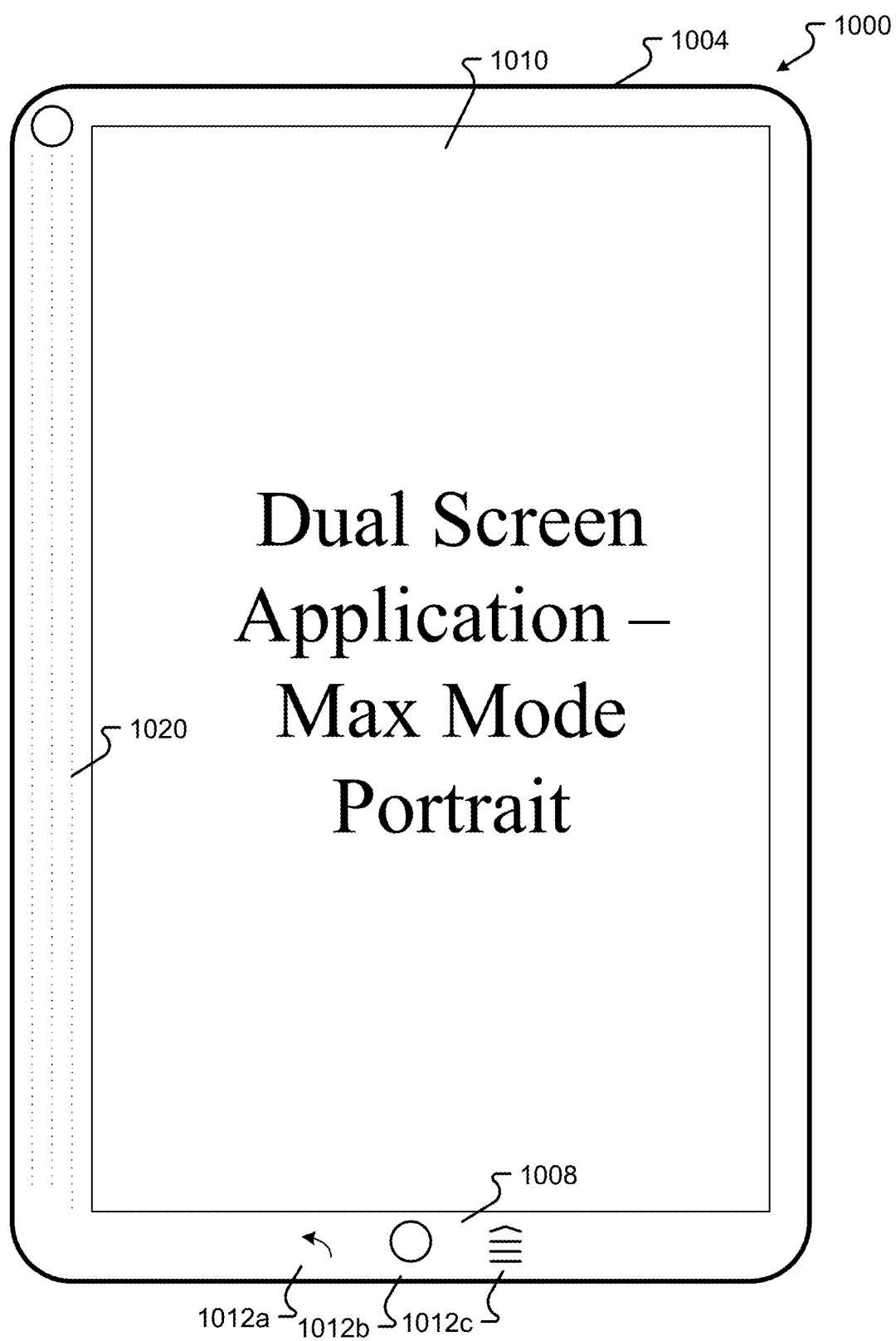
FIG. 16 illustrates an example of a dual screen application in portrait max mode.
Figure 17:
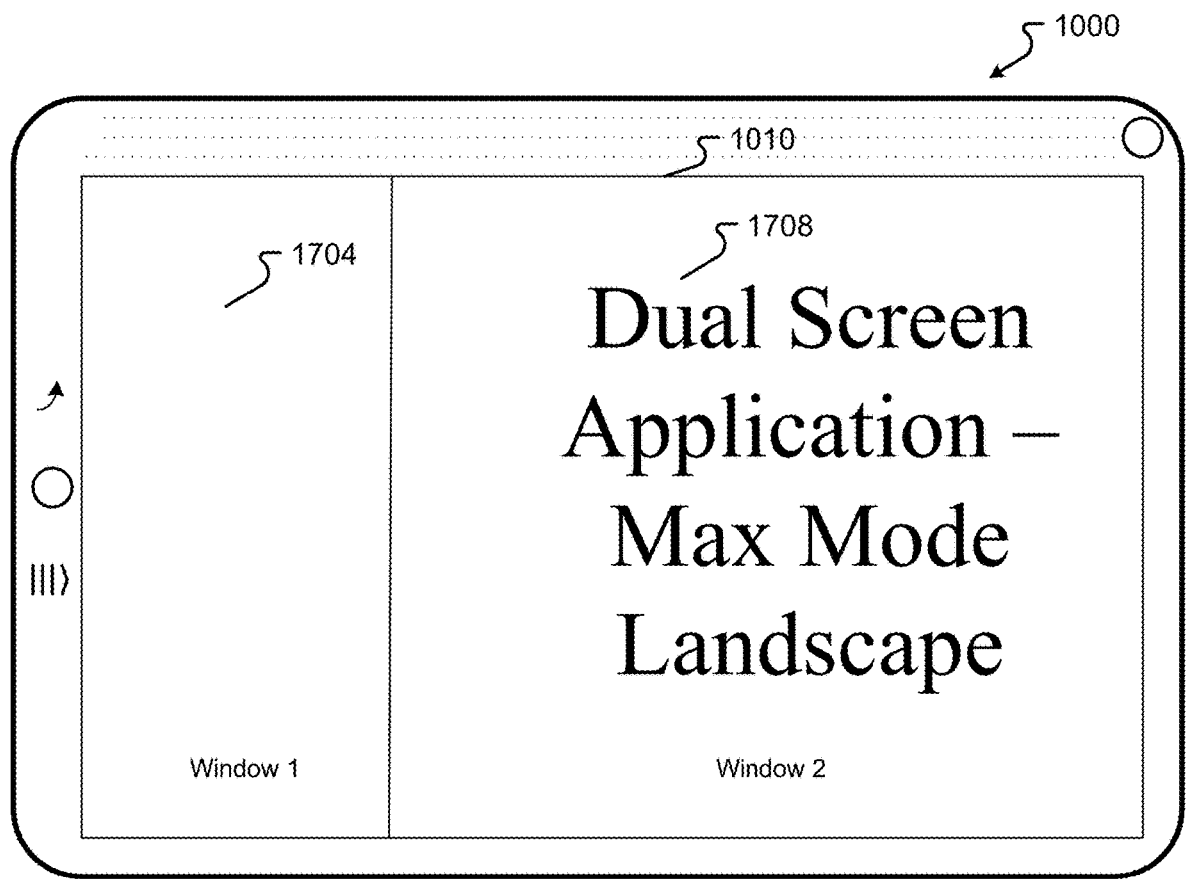
FIG. 17 illustrates an example of a dual screen application in max mode landscape.

FIG. 16 and FIG. 17 illustrate an exemplary method of rendering a single application, that is a dual screen application, in the portrait max mode and landscape max mode, respectively. More specifically, in FIG. 16, the rendering of a dual screen application in portrait mode will display on display 1010 one of the two screens substantially or completely filling display 1010. A user then, for example using a gesture, could scroll between the two screens of the single application. In the landscape mode, as illustrated in FIG. 17, the screen 1010 is divided into a first portion 1704 and a second portion 1708. In this exemplary embodiment, the first screen of the dual screen application is rendered in first portion 1704, and the second screen of the dual screen application is rendered in the second portion 1708. While a certain portion of the screen 1010 is illustratively logically divided for the first portion 1704 and the second portion 1708, it should be appreciated that the screen real estate assigned to each portion can vary, for example, based on one or more of optimum display for the window(s), type of information being displayed in each portion, user preferences, rules associated with the application, and/or the like.

In accordance with a first example, the first portion is allocated one third of the screen 1010's resolution, while the second portion 1708 is allocated two thirds of the screen real estate. In accordance with another example, the screen 1010 is split 50/50. In accordance with yet another example, the first portion could be allocated 70% of the screen 1010's real estate, while the second portion 1708 could be allocated 30%. The managing and resizing of these windows can again be done in cooperation with the display configuration module 568, as well as the windows management module 532 and display controllers for successful rendering of the location of the window(s) on the SP 1000.

As will be appreciated, and in a manner similar to the operation of device 1000, should the SP 1000 change orientation (e.g., from landscape to portrait or vice versa) the window(s) for the application(s) can be redrawn in the appropriate orientation taking into account window prioritization based on whether a particular application and current focus is for a dual screen application or a single screen application.

Focus can also be taken into consideration when determining which window of the application should be displayed when the SP 1000 is in the portrait position. For example, if the application is an e-mail client, and the application natively is displayed on dual screens on device 1000 (a first screen being directed toward showing inbox content, and the second screen being a preview window for a specific item in the inbox) the system can evaluate which window is currently in focus, and ensure that window is displayed in the portrait max mode when the SP 1000 is in the portrait orientation.

In FIG. 17 the SP 1000 is configured to merge windows from the dual screen application on to a single display 1010. In this landscape orientation, data (e.g., a single image, application, window, icon, video, etc.) from a first window is displayed in a first portion of the display 1010 while data (e.g., a single image, application, window, icon, video, etc.) is shown in a second portion of the display 1010. Similar to other output configurations, it may be possible to transition the SP 1000 from the shown output configuration to any other output configuration described herein, depending on, for example, into which state the SP 1000 is moved.

Some other exemplary embodiments of windows management within the SP 1000 upon the device 100 docking with the SP 1000 are as follows: For example, a device 100 is docked to the SP 1000, with the SP 1000 in a portrait orientation and there are two single-screen applications running on the device 1000, the application in focus is placed in a lower portion of the display 1010, and the application not in focus is placed on an upper portion of the display 1010. Another exemplary scenario, where the device 100 is docked to a portrait-oriented SP 1000 where one dual-screen application is running on the device 100 and the SP 1000 is in a dual application mode, applies gravity drop as discussed herein.

In another exemplary scenario, where the device 100 is running two single-screen applications, and the SP 1000 is in a landscape dual application mode, the first application is assigned to a first portion of the display 1010 and the second application is assigned to a second portion of the display 1010.

In yet another exemplary scenario where the device 100 is running one dual-screen application and the SP 1000 is in dual application landscape mode, both screens of the dual screen application can be shown on the SP 1000.

Stickiness can also apply to the SP 1000 such that, for example, when a first application is in focus, upon docking to a single application mode SP 1000, the application remains visible after docking. As another example of stickiness, if a second application is in focus upon docking to a single application mode SP 1000, application two remains visible after docking.

In accordance with another example, the device 100 is running one dual-screen application and is docked to a landscape-oriented SP 1000 in max mode, the windows are re-oriented to be side-by-side, opposed to one above the other.

Figure 18:
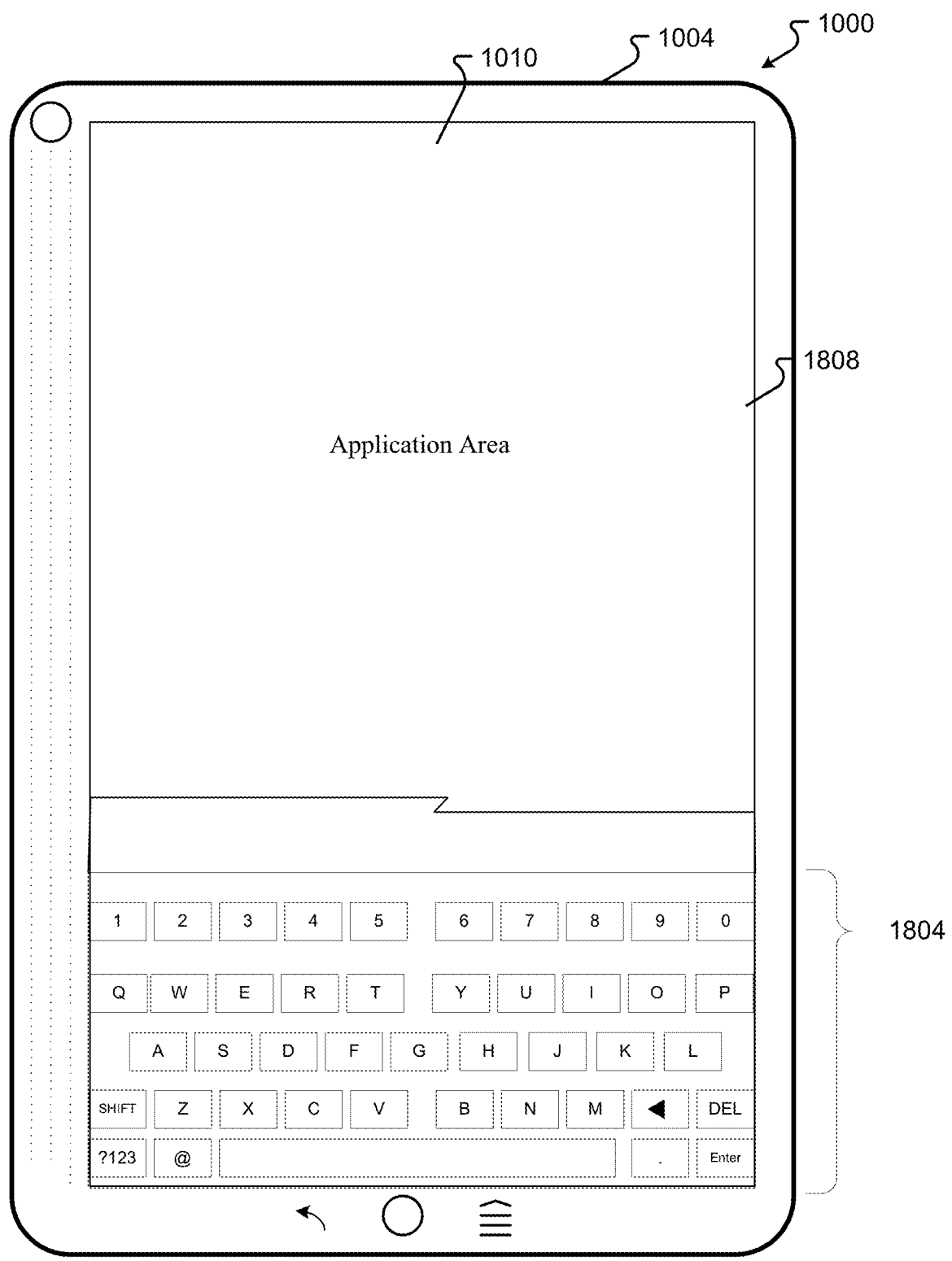
FIG. 18 illustrates an example of keyboard management on the SP.
Figure 19:
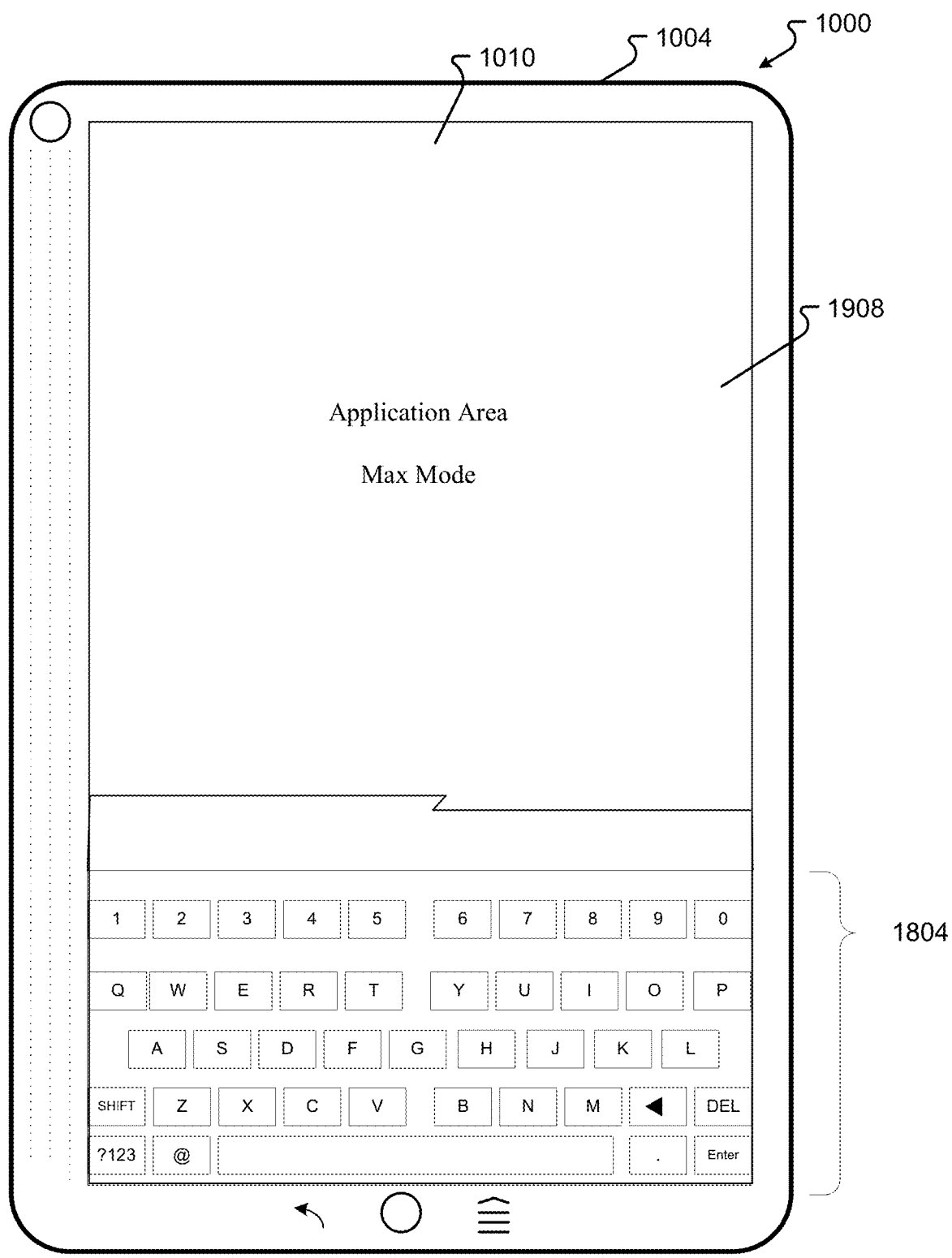
FIG. 19 illustrates an example of keyboard management on the SP with an application area in max mode.

FIG. 18 through FIG. 21 generally illustrate the management and display of a virtual keyboard 1804 on display 1010. More specifically, in FIG. 18, in portrait mode, the virtual keyboard 1804 is positioned below application area 1808, where an application is displayed in, for example, max mode. In general, it is preferred that the keyboard can be glued to the lower-portion of the display 1010, regardless of whether the SP is in the landscape or portrait mode. However, it is to be appreciated that, for example, based on user preferences, the screen can be glued to another portion of the screen, or can be moved to another location via, for example, a gesture. In FIG. 18, the application area 1808 displays, for example, a standard application with the virtual keyboard 1804 being displayed in the lower portion of display 1010. In FIG. 19, for example, the application area 1908 is showing a dual-screen enabled application in max mode. The keyboard 1804 is again similarly displayed in the lower portion of the display 1010.

Figure 20:
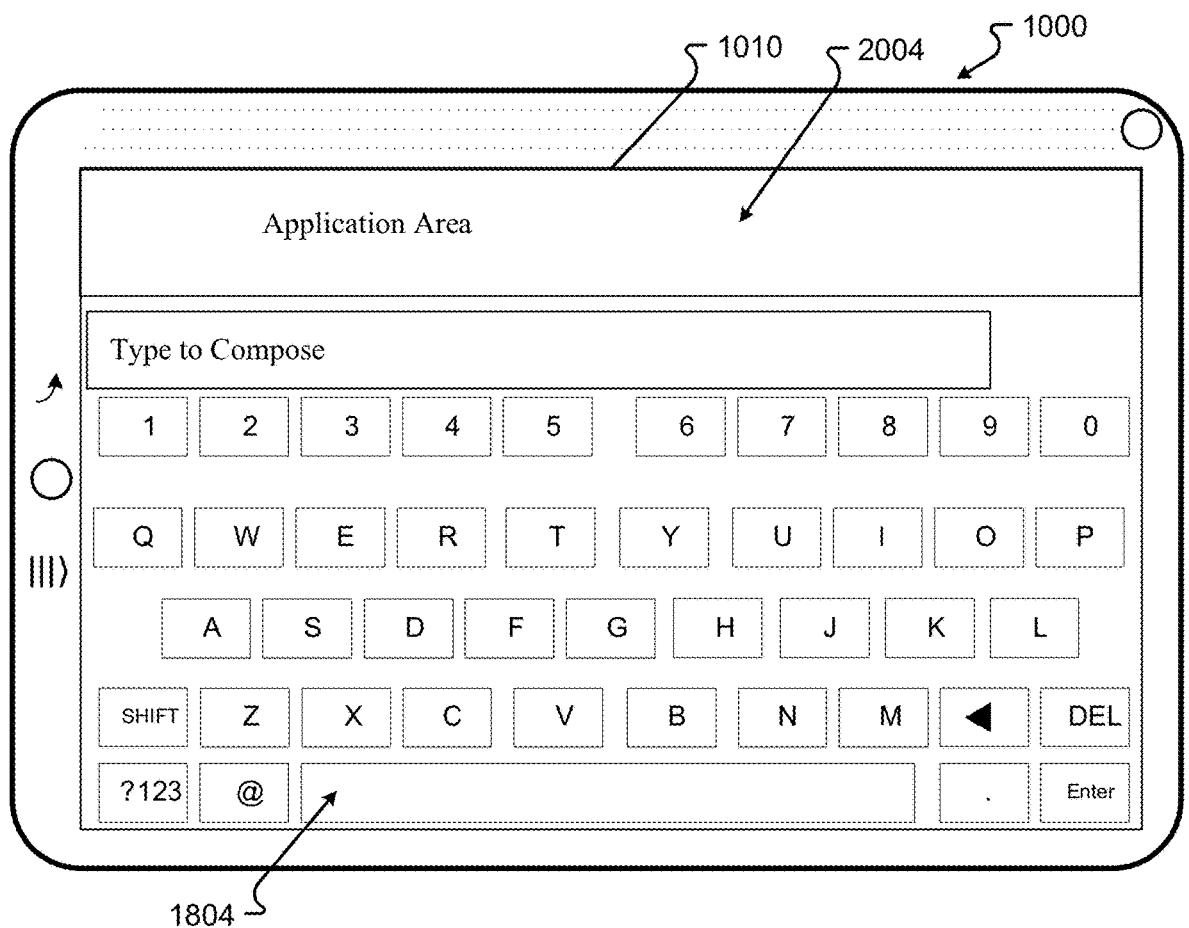
FIG. 20 illustrates another example of keyboard management for the SP in landscape mode.
Figure 21:
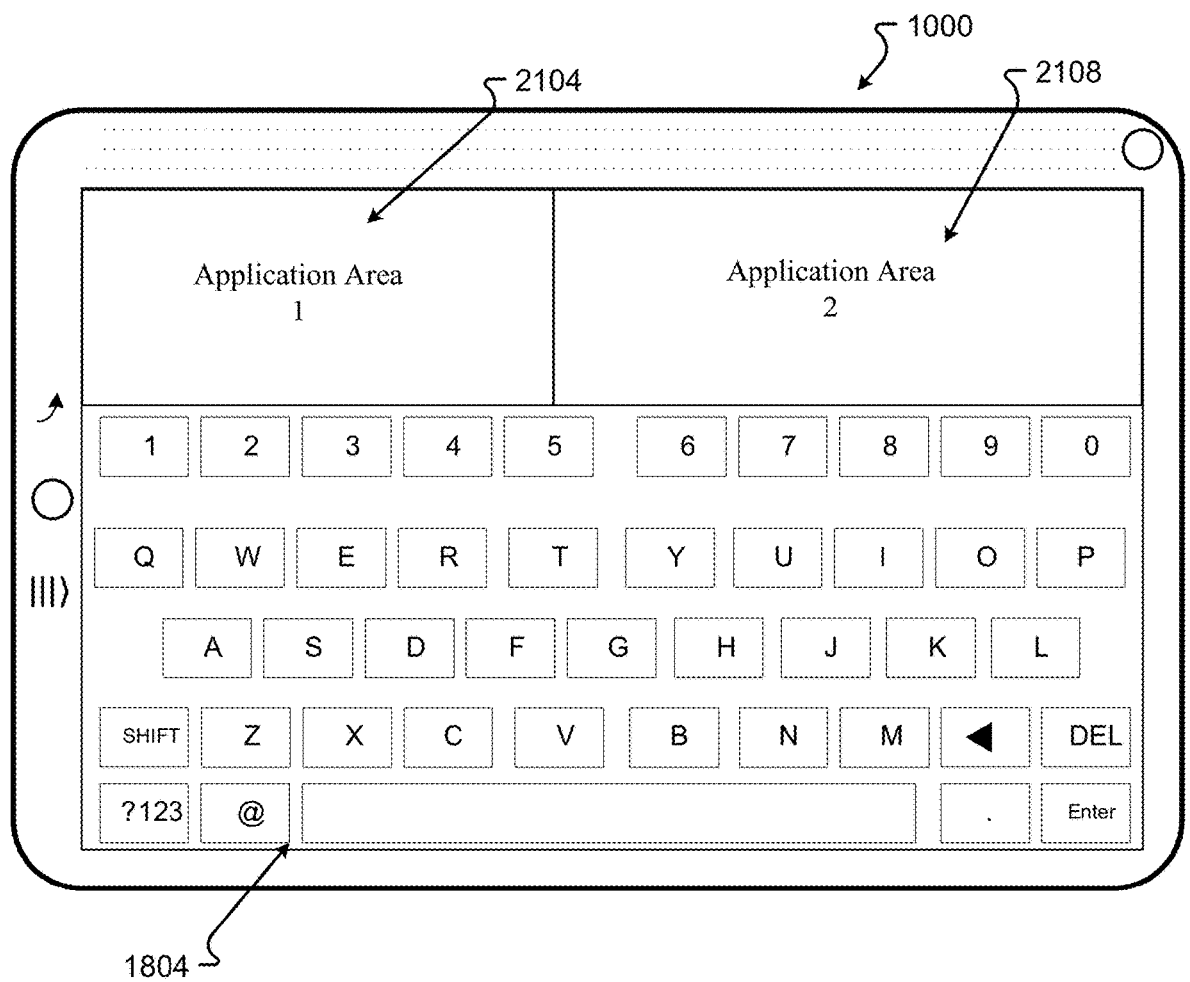
FIG. 21 illustrates an example of a dual screen application running in a dual screen emulation mode on the SP with a virtual keyboard.

In FIG. 20, in SP landscape mode, the keyboard 1804 is displayed in the lower portion of display 1010 with the application area 2004 substantially or completely filling the displayable area above the keyboard 1804. In FIG. 21, the SP is again in landscape mode and displaying a dual-screen enabled application in max mode, the application area 1 2104 and application area 2 2108, the keyboard 1804 is displayed below the two application areas.

In general, in the embodiments illustrated in FIG. 18 through FIG. 21, a first determination is made as to whether a keyboard should be displayed. If the keyboard is to be displayed, the next determination is made as to the orientation of the SP. If the SP is in a portrait mode, the virtual keyboard is presented also in a portrait mode, preferable on the lower portion of the screen. If the SP is in a landscape mode, the keyboard is optionally re-sized to be substantially displayed on a lower portion of the display with, for example, one or more application windows being located above the virtual keyboard. With the orientation of the SP change, the keyboard is also reoriented to be coincident with the orientation of the SP. Similarly, when the keyboard is no longer required, the keyboard is hidden with the application area(s) being expanded to again substantially fill the display 1010.

Figure 22:
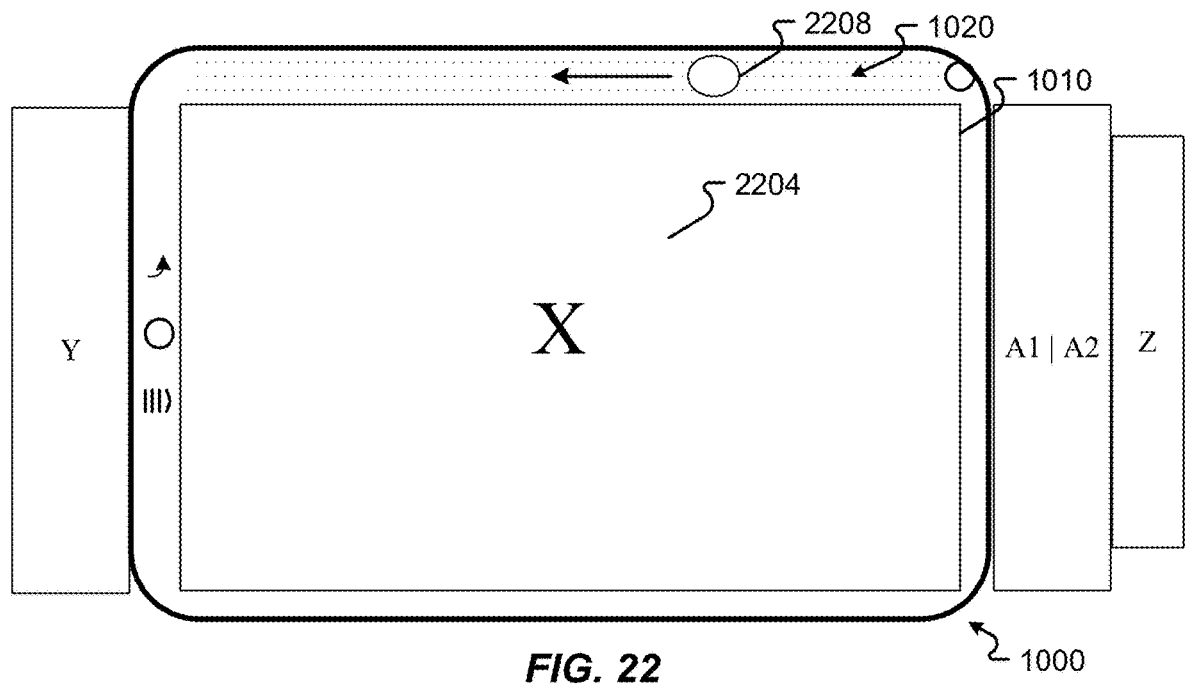
FIG. 22 illustrates an example of application window stack management on the SP.
Figure 23:
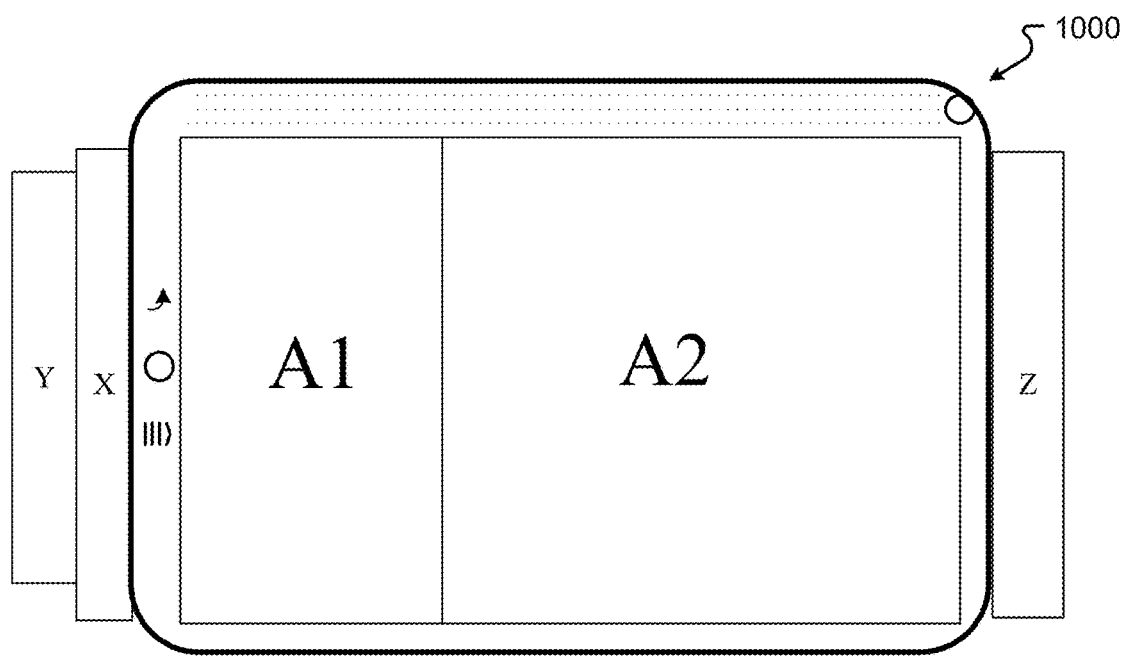
FIG. 23 illustrates another example of application window stack management on the SP.

FIG. 22 and FIG. 23 illustrate exemplary methods of managing window positions on the SP 1000. In particular, in FIG. 22, application X 2204 is in view on display 1010. On receiving user input, such as the swipe motion represented by 2208 in the gesture capture region 1020, application X is "scrolled" to the left to be replaced with the dual-screen application A1|A2, as shown in FIG. 23. If the same gesture 2208 were to be repeated again, application Z would come into view. Similarly, if in FIG. 22 gesture 2208 was in the opposite direction, to the right, application Y would come into view on display 1010. Scrolling through available windows is of course applicable to both the landscape and portrait mode of the SP in a similar manner. For example, in portrait mode, instead of the gesture traversing from left to right or right to left, the gesture could traverse in a downward motion, or in an upward motion, with the virtual stacks of the windows being located "above" or "below" the device, similar to a rolodex. Thus, when the user initiates a downward type gesture, the next application "above" is displayed on display 1010.

Figure 24:
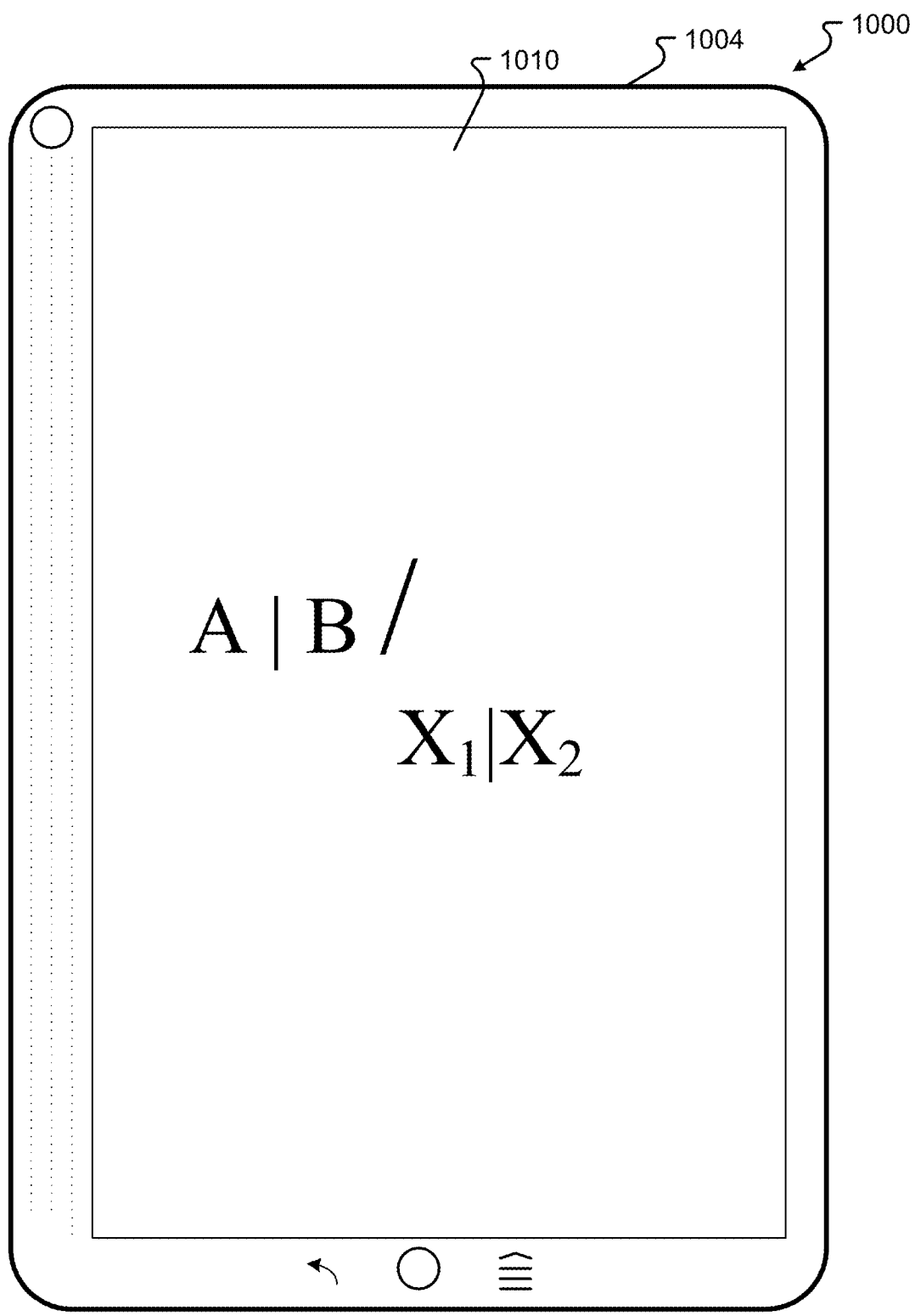
FIG. 24 illustrates an example of multi application mode of the SP, wherein in the multi application mode the SP emulates the device in its mini-tablet form.
Figure 25:
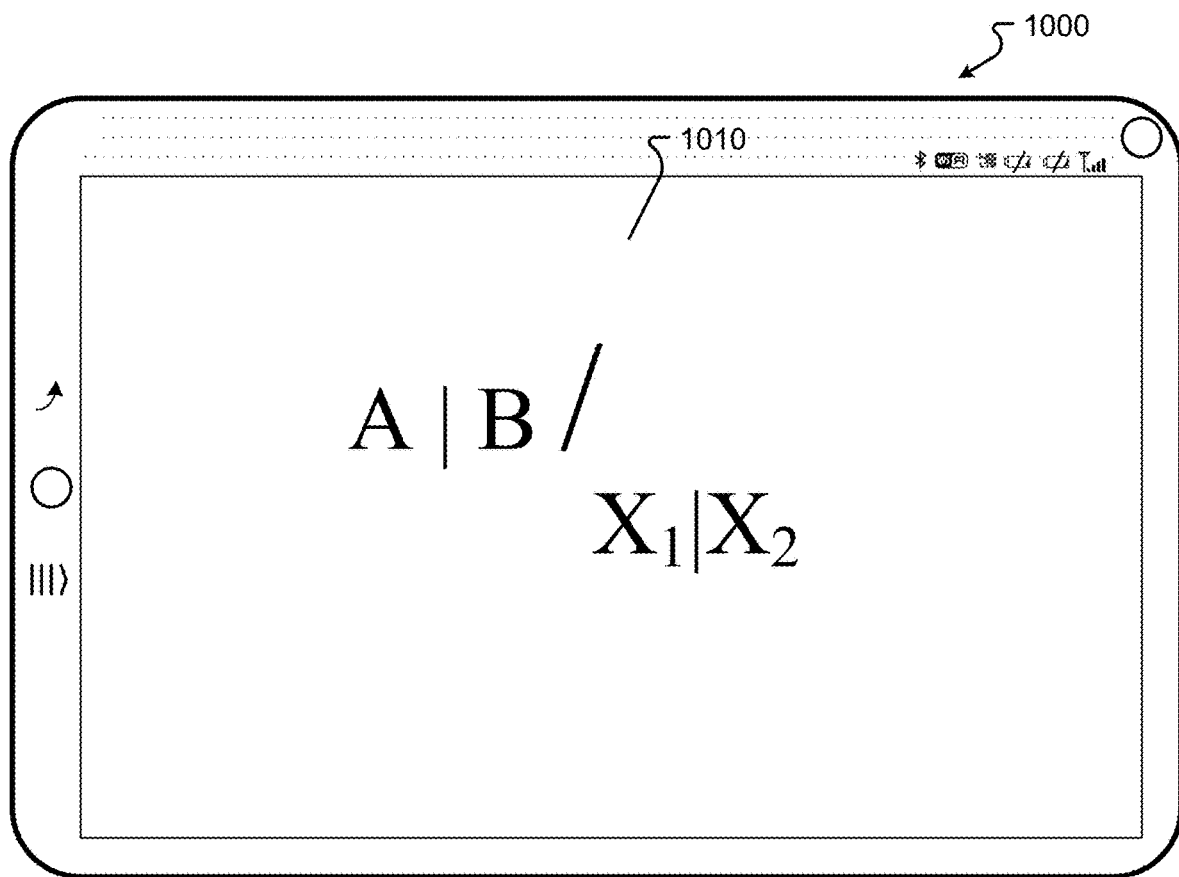
FIG. 25 illustrates another example of multi application mode of the SP.

FIG. 24 illustrates the multi application mode of the SP 1000, wherein in the multi application mode the SP 1000 emulates the device 100 in its mini-tablet form—with this mode optionally being invoked by selection of a multi application button (shown and described hereinafter). A simplified way of understanding this mode is to appreciate that the mode emulates the device 100 being opened. In this multi application mode, the SP 1000 can inherit the rules regarding the display of information on the device 100—For example, that all applications are launched in single screen mode. One exception could be applications that support a max mode can be by default automatically expanded to this mode if provided the opportunity.

In this mode, each application has the ability to determine how the application appears in each orientation (e.g., portrait and landscape).

Figure 26:
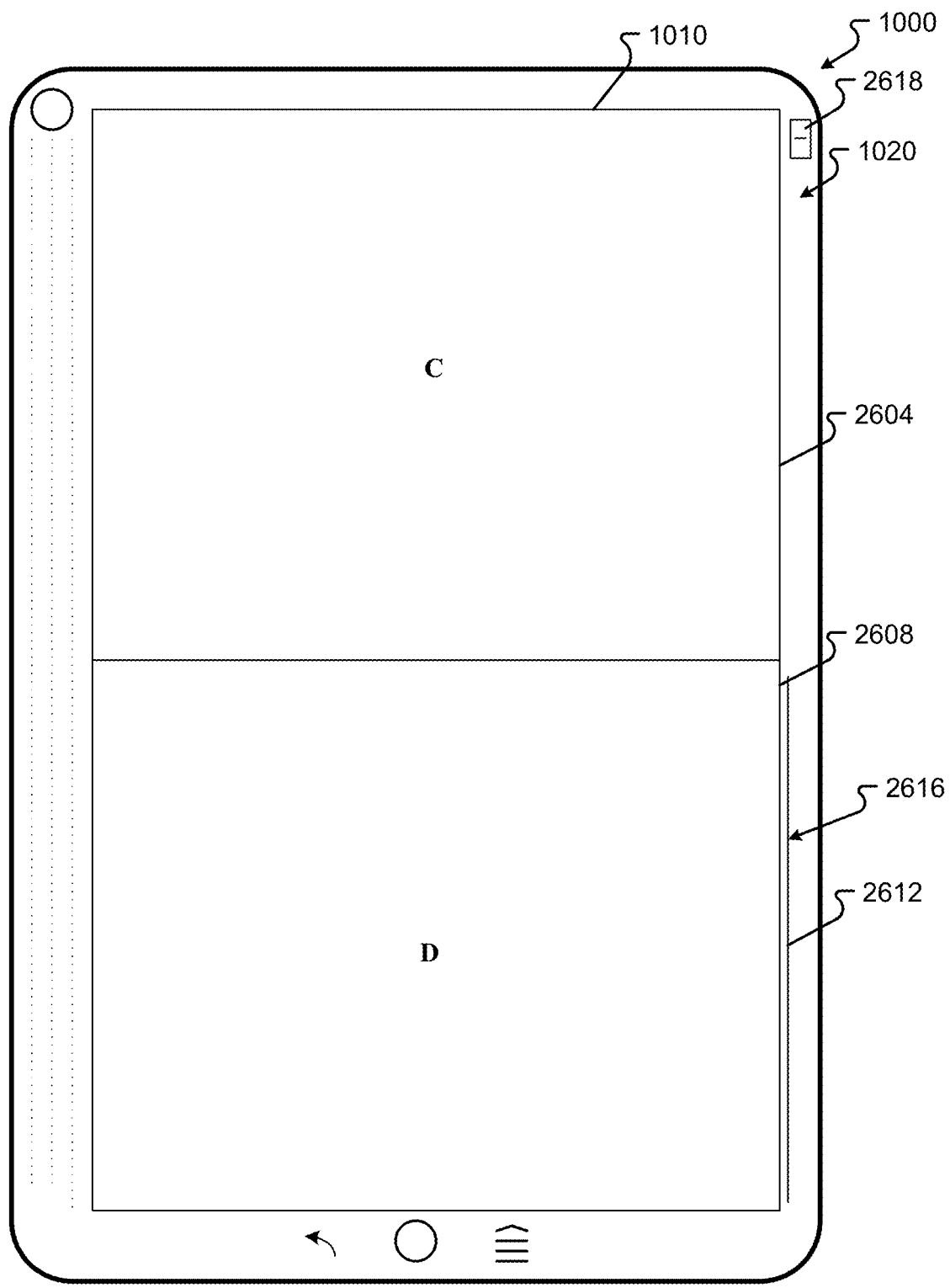
FIG. 26 illustrates another example of multi application mode of the SP.

FIG. 26 illustrates an exemplary method of managing the multiple application mode of the SP 1000. In the multiple application mode, multiple applications can be managed and displayed within the display 1010. In multi application mode, the SP 1000 having the single screen emulates the dual screens of the device 100. To initiate the multiple application mode, a button/toggle 2618 is selected, which allows the user to select multiple applications for display in the display 1010. In this exemplary embodiment, a first application 2604 C, is shown in the upper-portion of the portrait mode SP 1000 and a second application 2608 D, is shown in a lower-portion of screen 1010. In conjunction with the displaying of multiple applications in the multiple application mode, focus indicator 2616 can be provided to assist the user with identifying which application is in focus. As discussed, this focus indicator 2616 can be a light bar, or other indicator (such as an indicator in the screen 1010 or beside 2608) drawing the user's attention to which application is in focus. In the exemplary embodiment in FIG. 26, application D 2608 is in focus as represented by the focus indicator 2616. In accordance with this exemplary embodiment, and while the focus indicator 2616 is shown in the gesture capture region 1020, it should be appreciated that the focus indicator could be located in some other portion of the SP 1000. For example, the window for the application in focus could be slightly re-sized to allow for the display of a bar of pixels adjacent to the window, which would similarly alert the user to the fact that that application is in focus. Similarly, the application in focus could appear at normal brightness while the application not in focus could be slightly dimmed. In general, any technique could be used to assist the user in readily determining which application is in focus.

To change focus, a user could use any of the gestures discussed herein or could, for example, simply touch the area where application C is displayed, thereby changing focus to application C, at which point a corresponding relocation of the focus indicator 2616 to adjacent to application C would occur.

Figure 27:
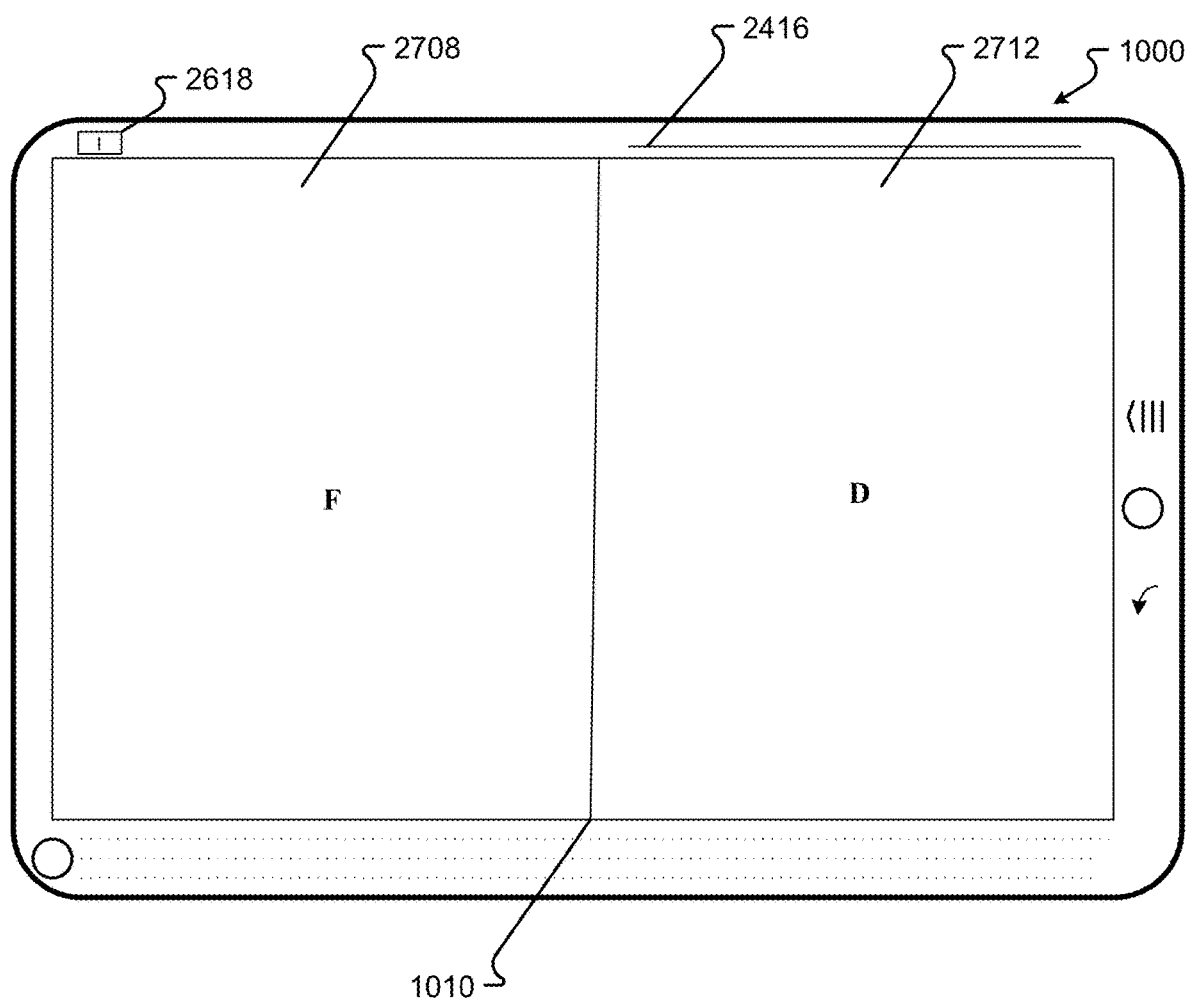
FIG. 27 illustrates another example of multi application mode of the SP.

FIG. 27 illustrates a similar scenario for a landscape mode SP 1000. In particular, and upon selection of the multi application mode, the display 1010 is divided between, in this example, a first application D 2712, and a second application F 2708. Here, application D is displayed on the right-hand portion of display 1010 and application F displayed on the left-hand portion of display 1010. While in this exemplary embodiment, the display real estate is split 50/50 between the two applications, it should be appreciated that one application could be displayed on a larger portion of the display 1010 than the other. In this particular exemplary embodiment, application D is in focus, as represented by focus indicator 2416.

In the multiple application mode, in both portrait and landscape orientations, each application could have its own associated window stack as show in FIG. 22 and FIG. 23, or there could be one stack shared between all of the displayed applications. More specifically, if each application has its own stack, with a stack structure similar to that illustrated in FIG. 22, a stack would be available for the first application, such as application X, and a similar stack would be available for application Y. Each of these stacks could be independently scrolled through using, for example, a gesture as discussed above.

Figure 28:
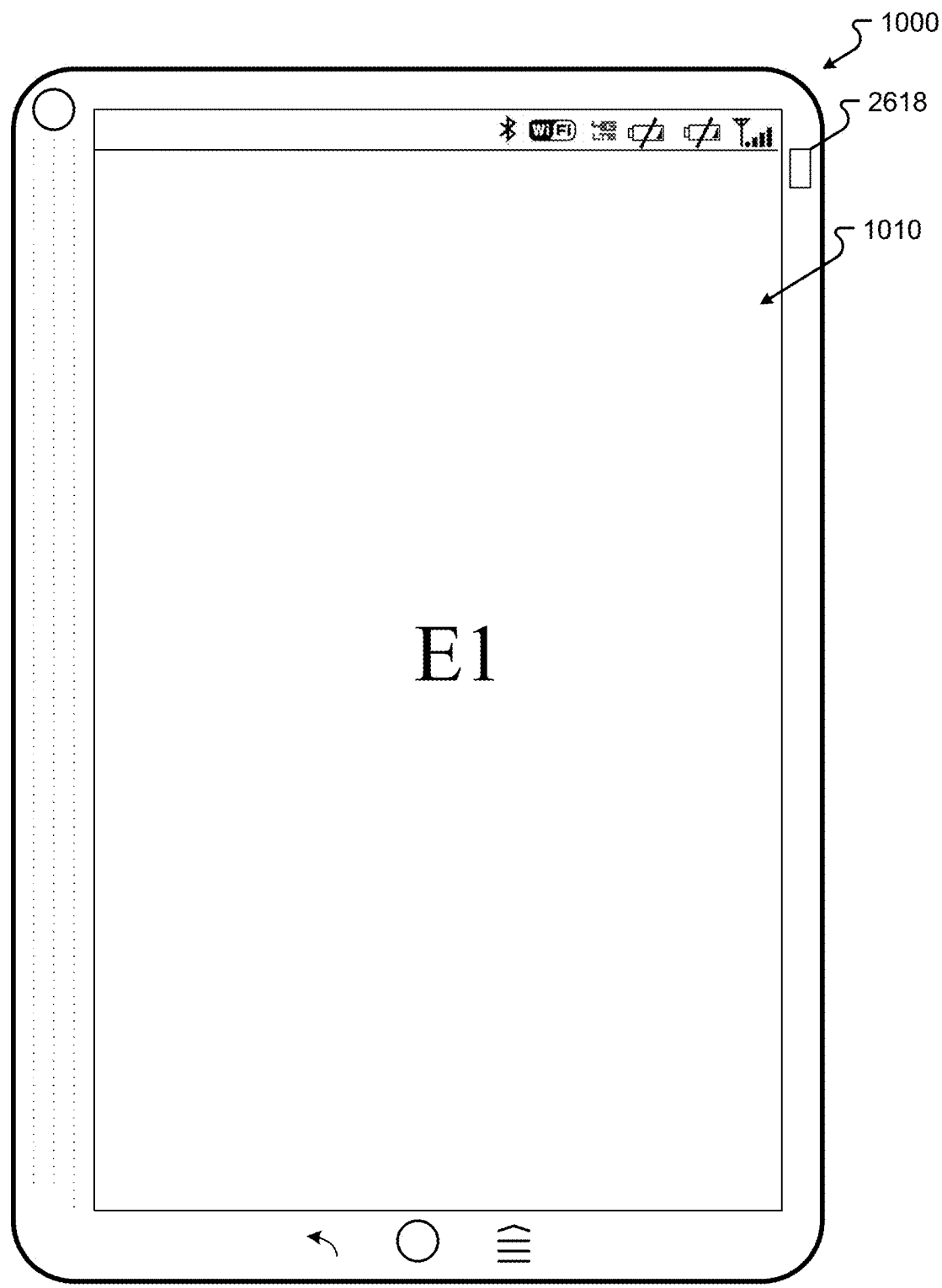
FIG. 28 illustrates a method for managing screen display.

FIG. 28 illustrates an exemplary method for managing screen display characteristics according to another embodiment of this invention. In accordance with this embodiment, a determination is made whether an application can be maximized, and if it can be maximized, it is expanded to the dual screen mode or max mode, as appropriate, to substantially fill the display 1010 as illustrated in the figure. Here, application E1, which is an application that can be maximized, has been expanded using the max mode to substantially or completely fill display 1010.

In FIG. 28, button 2618 allows a user to toggle between a single screen mode (as illustrated in FIG. 28) and an emulated dual screen mode, for example, as illustrated in FIG. 26 and FIG. 27. Here, button 2618 does not include the "|" therefore indicating to the user the SP 1000 is in single screen mode.

Figure 29:
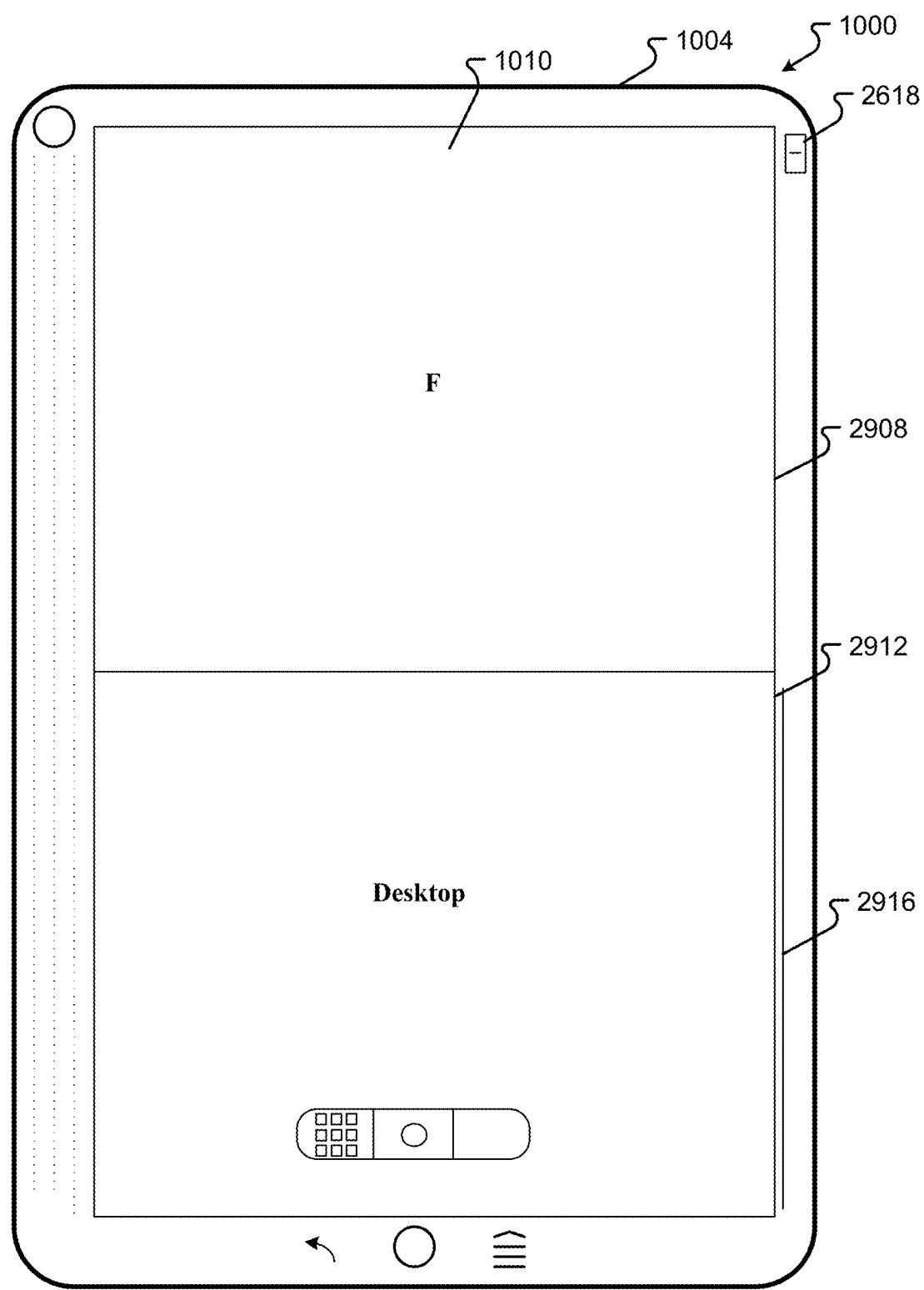
FIG. 29 illustrates an exemplary method for managing screen display with the desktop.

FIG. 29 illustrates an exemplary method of managing windows. In this exemplary embodiment, and similar to the operation of the device 100, when the last application in the stack is moved to the side, the desktop is displayed. Even more specifically, as shown in FIG. 29, application F 2908 is displayed in an upper portion of display 1010 and the desktop 2912 is displayed in the lower portion of display 1010. Here the desktop is in focus, as illustrated by the focus indicator 2916. This configuration is available since the user has selected the dual-screen emulation mode button 2618.

Figure 30:
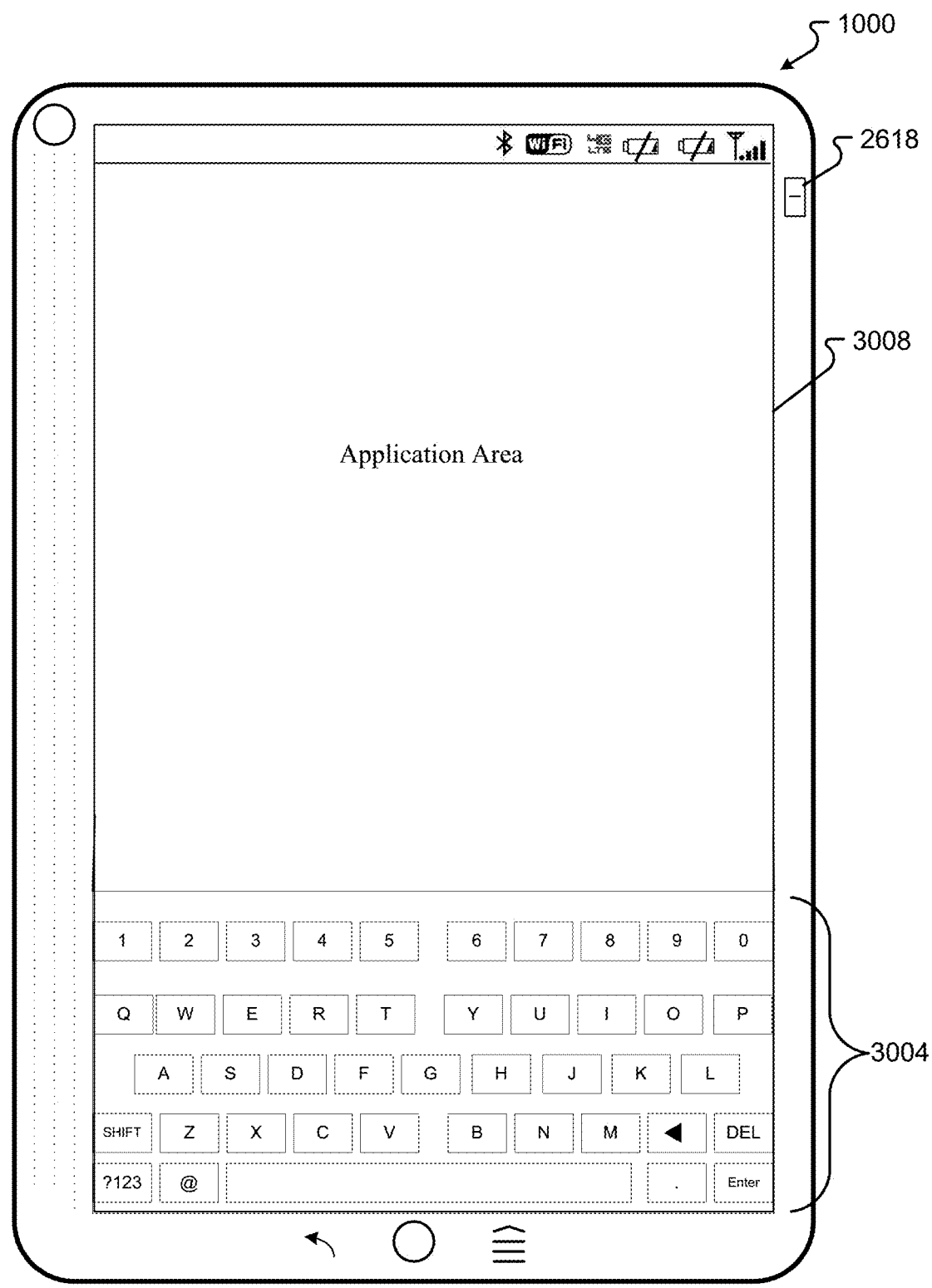
FIG. 30 illustrates an exemplary method of managing screen display with a keyboard.

FIG. 30 illustrates an exemplary method of displaying a keyboard according to one embodiment. In particular, when the SP is in portrait mode, the SP will have a keyboard area 3004 and an application area 3008. Upon display of the keyboard 3004, the application in application area 3008 is resized to substantially or completely fill the area of the screen not occupied by the keyboard 3004.

Figure 31A:
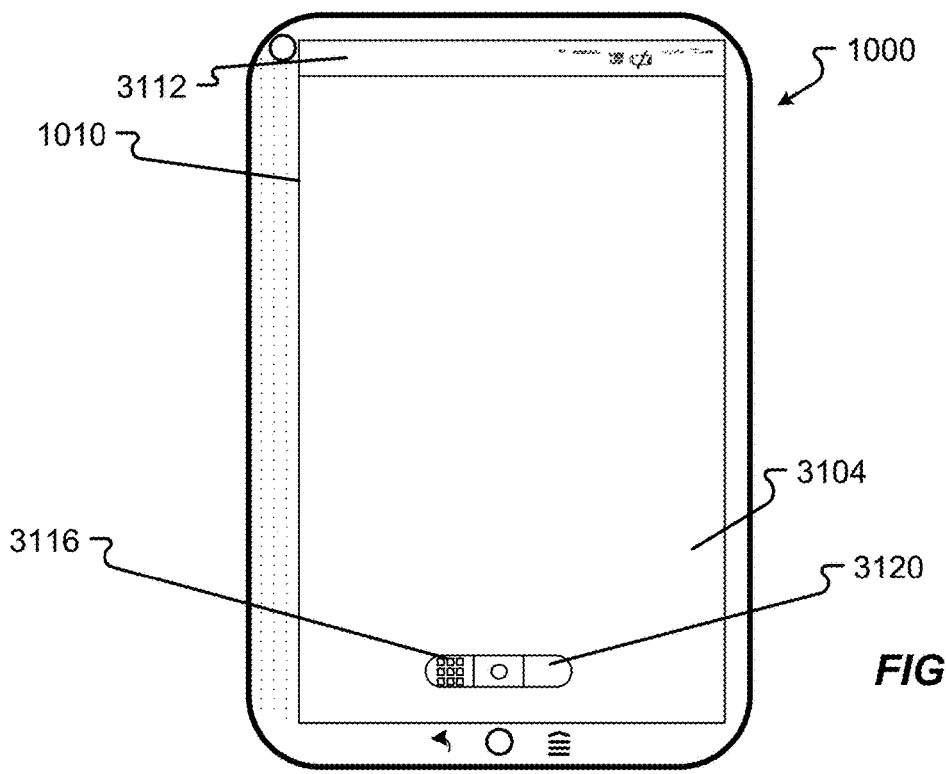
FIGS. 31A and 31B illustrate desktop management on the SP.
Figure 31B:
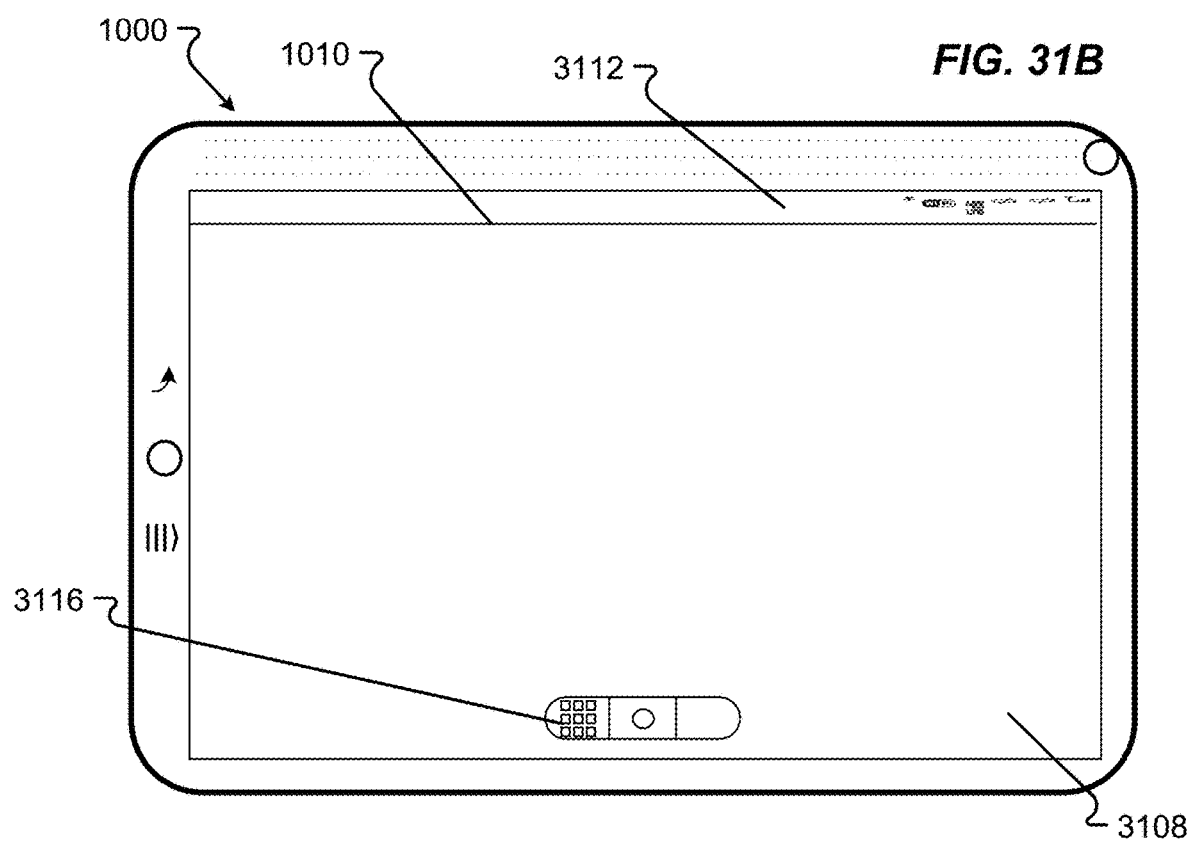

FIG. 31A and FIG. 31B illustrate desktop availability in both the single application mode and dual application mode in both the SP landscape mode and SP portrait mode. In particular, and in accordance with an exemplary embodiment, the desktop 3104 will occupy the entirety of the screen 1010. Additionally, and in accordance with this exemplary embodiment where the desktop is shown in a full-screen mode, the enunciator bar 1312 can be expanded across the entirety of the screen 1010. This can occur in both the portrait mode as shown in FIG. 31A as well as the landscape mode as illustrated in FIG. 31B. From here, upon selection of the application launcher 3116, the application launcher can optionally expand across the entirety of the screen 1010 in either the portrait or landscape mode. Similarly, the file explorer, which is launched by pressing the file explorer button 3120, can be similarly expanded into substantially all or all of the screen 1010 space.

Figure 32A:
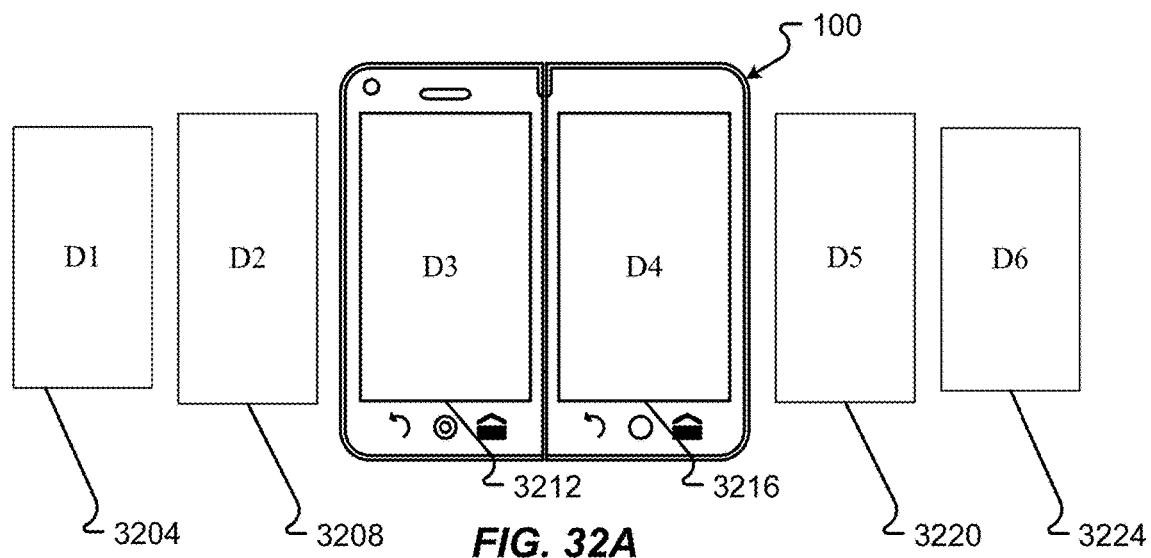
FIGS. 32A and 32B illustrate exemplary methods for desktop panel management.
Figure 32B:
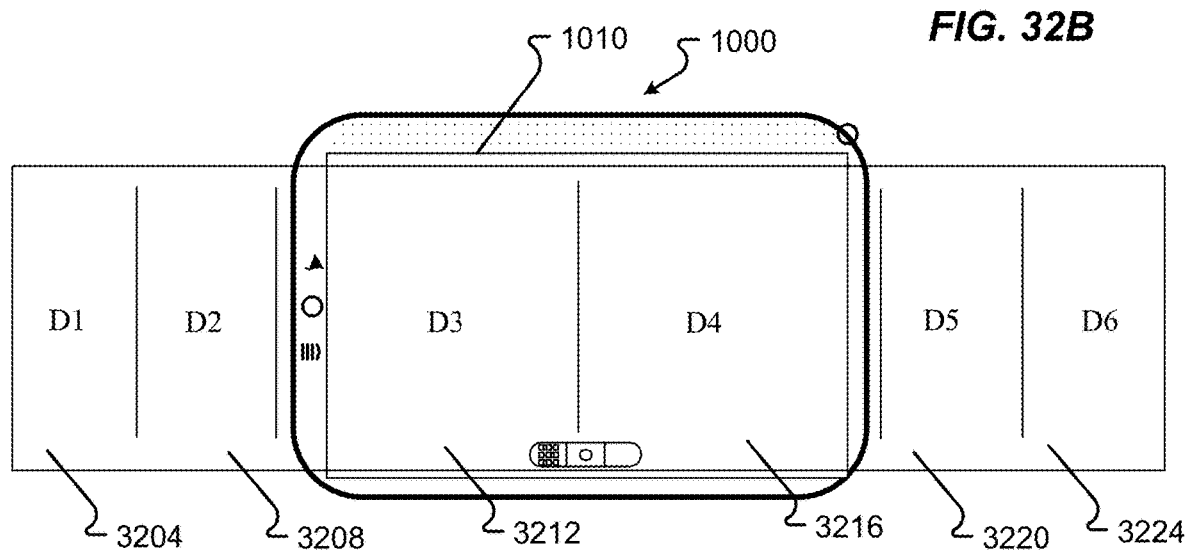

FIG. 32A and FIG. 32B illustrate screen redrawing that may be required to transition the desktop from the device 100 to the SP 1000. In particular, in FIG. 32A, six exemplary desktop panels are shown 3204-3224. These desktop panels are moveable in a carousel-like fashion based on gesture input from a user. However, it may not be possible to directly translate these panels to display correctly on the SP 1000 without the panels being distorted or not occupying the entirety of the screen 1010. Accordingly, in accordance with one exemplary embodiment, one or more of the panels 3204-3224 can be resized when displayed on the SP 1000 to accommodate all or substantially all of the screen 1010. In accordance with another exemplary embodiment, more than two of the panels can be shown on the screen 1010, such as a portion of panel D2 3208, a portion of panel D3 3212 and a portion of panel D4 3216. In this manner, the desktop illustrated on the SP 1000 will have a similar look-and-feel to the desktop panels shown on device 100. The same carousel-like motion is available via a gesture input to the SP 1000 such that a user can scroll to the one or more panels of the desktop.

Figure 33:
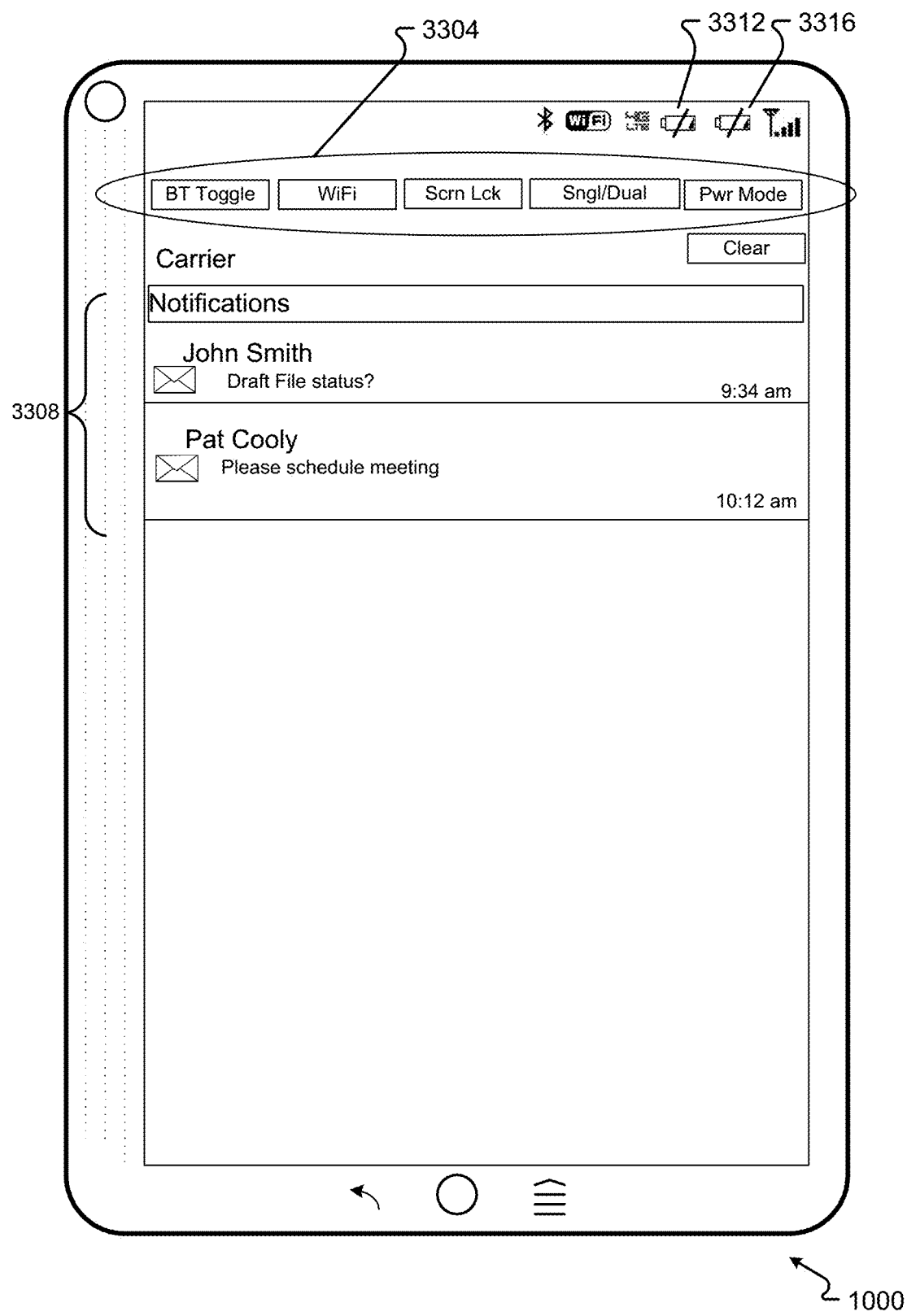
FIG. 33 illustrates exemplary notification management on the SP.

FIG. 33 illustrates an exemplary notifications display that behaves on the SP 1000 in a very similar manner to that of the device 100. In particular, and whether in the portrait or landscape mode, notifications and status/toggle buttons are provided that allow the user to, for example, toggle on or off Bluetooth®, WiFi, screen lock, dual or single screen mode, power options, and the like. These, as well as other options, are generally shown in area 3304. Additional notifications can also be shown in area 3308 including one or more of carrier information, notification information, communication information, and the like as discussed above.

In more detail, area 3304 provides some buttons for standard widgets such as WiFi toggle on and off, Bluetooth® toggle on and off, and the like. The screen lock toggle can allow, for example, user to lock the screen thereby prohibiting it from rotating despite the orientation of the SP 1000. The toggle can change color or display characteristics to indicate whether screen lock has been enabled. The single/dual application mode button toggles, for example, three different states including a dual application mode state, a single application mode state, and a single application lock state. The power mode toggle toggles between a handset optimized, SP optimized, hybrid power consumption, or of the like. These power modes can be associated with power levels, as indicated by the two battery status indicators 3312 and 3316 which correspond to the power levels in the device 100 and SP 1000, respectively.

Figure 34A:
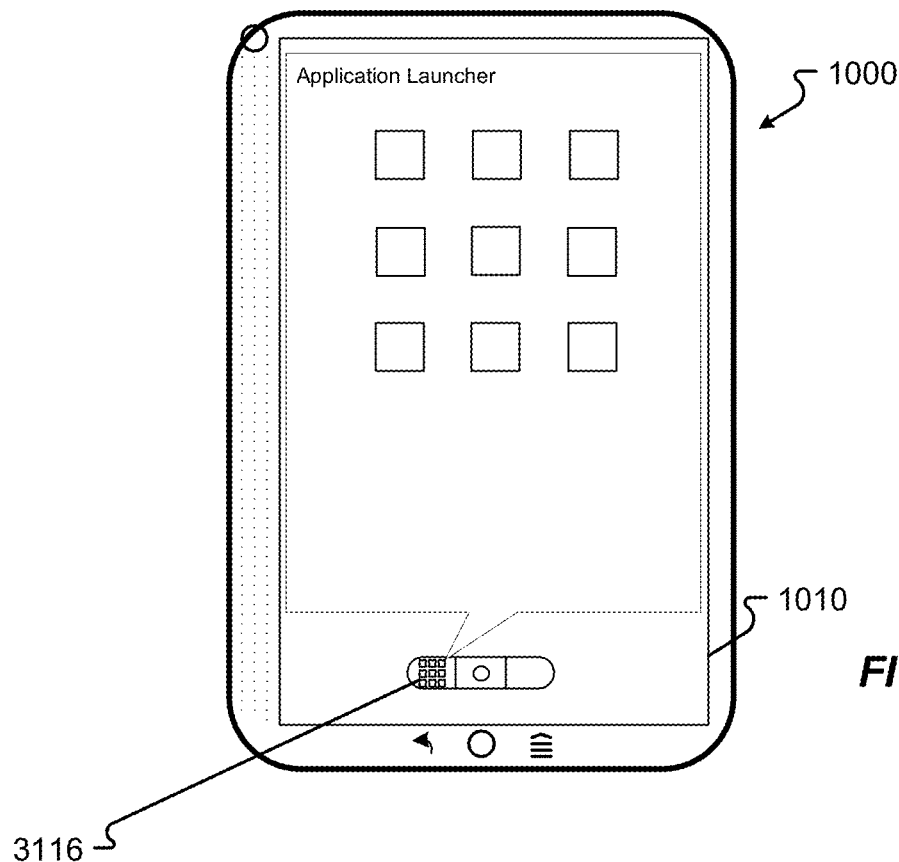
FIGS. 34A and 34B illustrate exemplary techniques for application management.
Figure 34B:
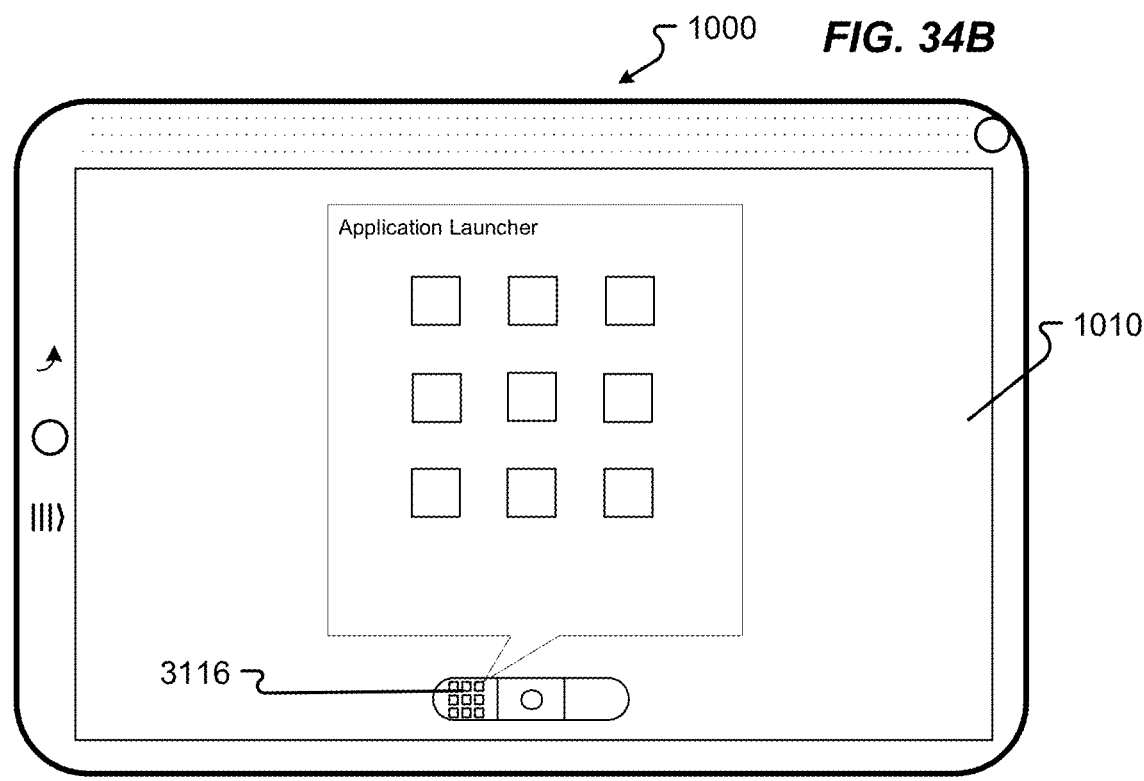

FIG. 34A and FIG. 34B show exemplary methods of launching and displaying the application launcher upon selection of the application launcher button 3116. In both the portrait mode illustrated in FIG. 34A and landscape mode illustrated in 34B, and when the SP is in single application mode, the application launcher can appear in a bubble so as to not necessarily take up the entirety of the screen 1010. However, for example, upon receiving an appropriate gesture or input by the user, the application launcher can be expanded to take up the entirety of the screen 1010. This could further be classified in a preference such that the default is to always open the application launcher in a bubble so as to not take up the entirety of the screen 1010, or to always open in full screen mode, taking up substantially all or all of the screen 1010.

Figure 35A:
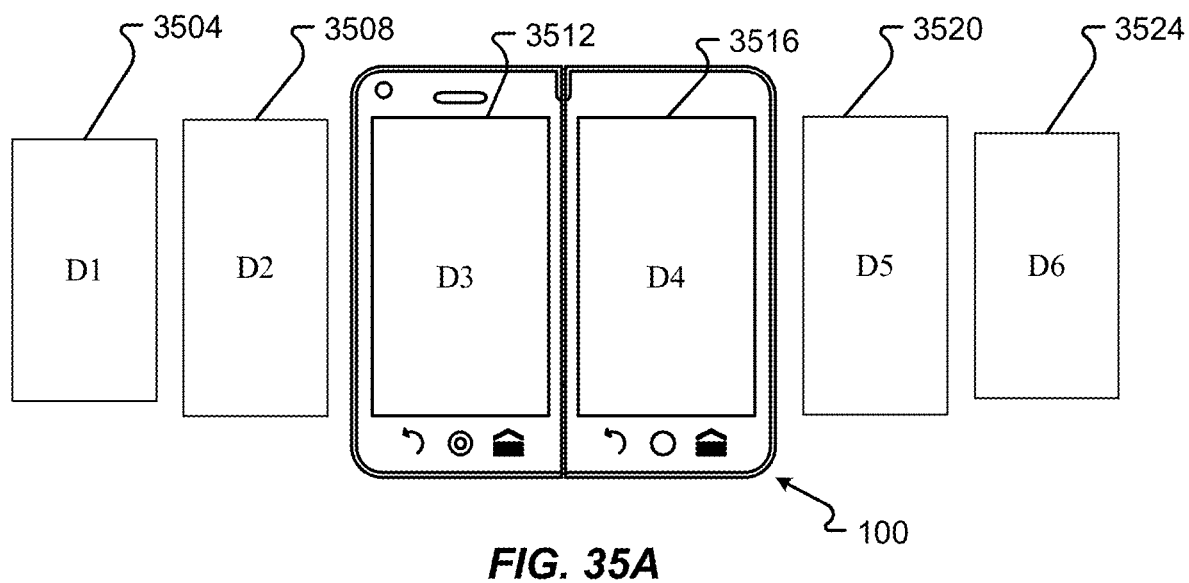
FIGS. 35A and 35B illustrate an exemplary method for providing desktop previews or hints.
Figure 35B:
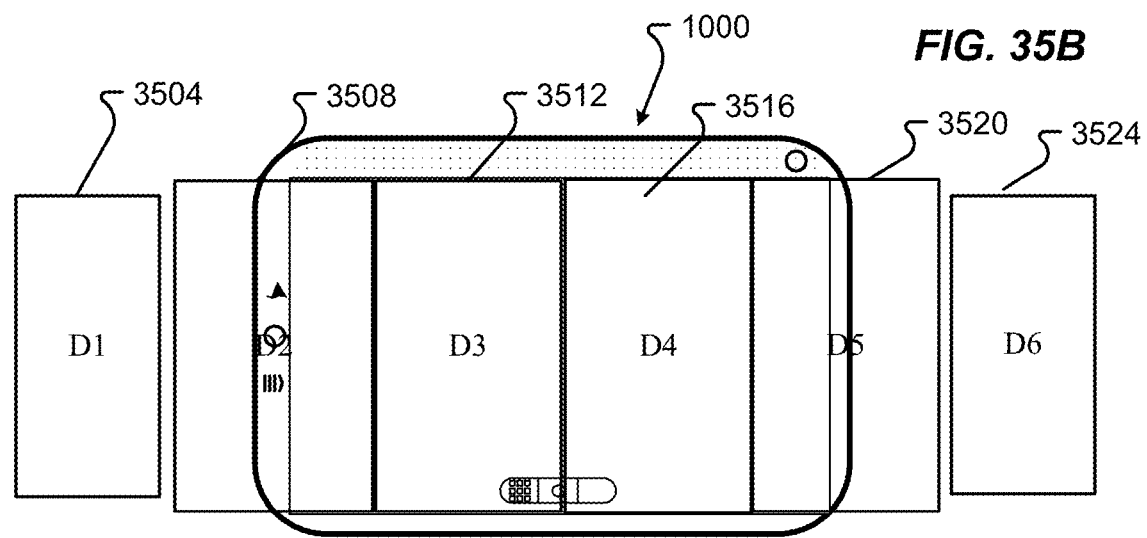

FIG. 35A and FIG. 35B illustrate an optional embodiment whereby the system could provide "hints" as to the content of desktop panels that are not fully in view. More specifically, FIG. 35A shows the first embodiment of the desktop panels D1-D6, 3504-3524 respectively. As discussed, a user is able to scroll through these panels in a carousel-type fashion, revealing any of the content in D1-D6. In accordance with the optional embodiment illustrated in FIG. 35B, where the same panels D1-D6 are available for viewing by user, the user is given a preview of one or more adjacent panels, here D2 3508 and D5 3520. In this configuration, this user is able to "peek" at the content of the adjacent panel(s) without necessarily scrolling in a carousel like fashion to view the entirety of the panel. More specifically, the entirety of panel D3 3512 and D4 3516 is shown on the display 1010. In addition, approximately one third of panel D2 3508 and one third of panel D5 3520 are also shown on the display 1010. As will be appreciated, more or less of panels D2 and D5 could be shown, with the greater of the panel being shown, the more visibility into that portion of the desktop the user would have.

Figure 36:
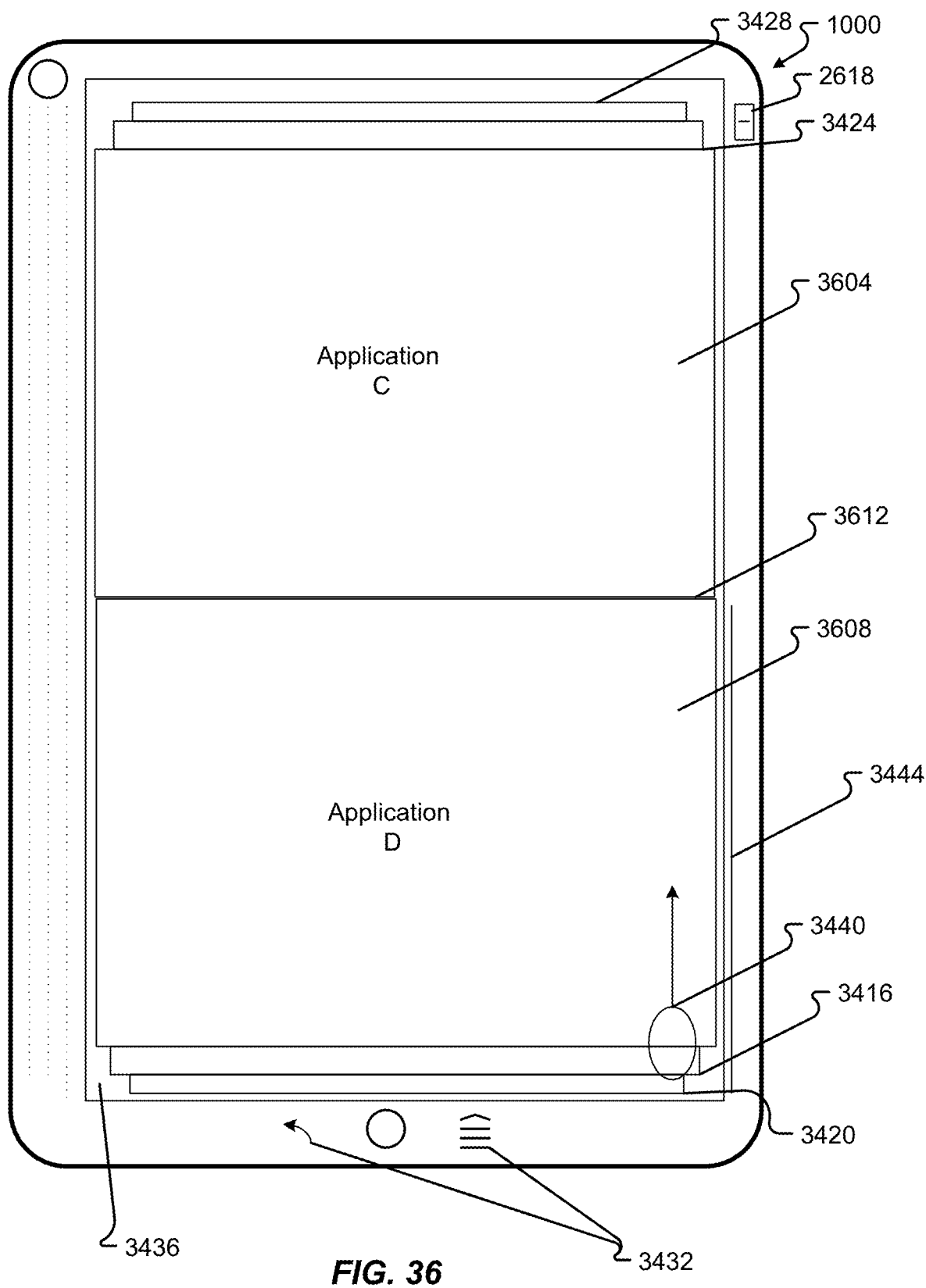
FIG. 36 illustrates an exemplary carousel application window stack.

FIG. 36 illustrates an optional embodiment for managing in a multiple application mode the stack of windows. This elegant method reinforces the conceptual model and assists the user with visualizing spatially the "carousel" type arrangement of the stack in the multi application mode. As is to be appreciated, while the exemplary embodiment shown in FIG. 36 is directed toward portrait mode of SP1000, it can work equally well in the landscape mode with the difference being instead of the carousel rotating from a top to bottom or bottom to top type arrangement, the "carousel" could be manipulated in a left to right or right to left type operation. However, the carousel could also work in a top to bottom or bottom to top mode in landscape mode as well.

In this exemplary embodiment, when multi-application mode is enabled via button 2618, application C 3604 and application D 3608 can be displayed, separated by separator 3612. In accordance with this optional exemplary embodiment, there are also one or more overflow applications behind application C 3604, here the overflow applications being 3424 and 3428. In a similar manner, there can be one or more overflow applications behind application D 3608, here application 3416 and application 3420. In this particular exemplary embodiment, the back and menu buttons 3432 can be enabled with a portion of the desktop 3436 being viewable behind the application stack. Upon receipt of one or more input gestures, such as gesture 3440, a user can scroll through the "carousel" of applications, in this instance, relocating application D 3608 to application C 3604's position, and thereby revealing application 3416. In addition, the focus indicator can be displayed near the application that is in focus. In this particular example, focus indicator 3444 is displayed beside application D. In accordance with an optional exemplary embodiment, instead of the stack "stopping" when the user reaches the last application, such as application 3420 or application 3428, the applications can be stacked in a circular manner, and continuously rotate in response to one or more input gestures by a user.

Figure 37:
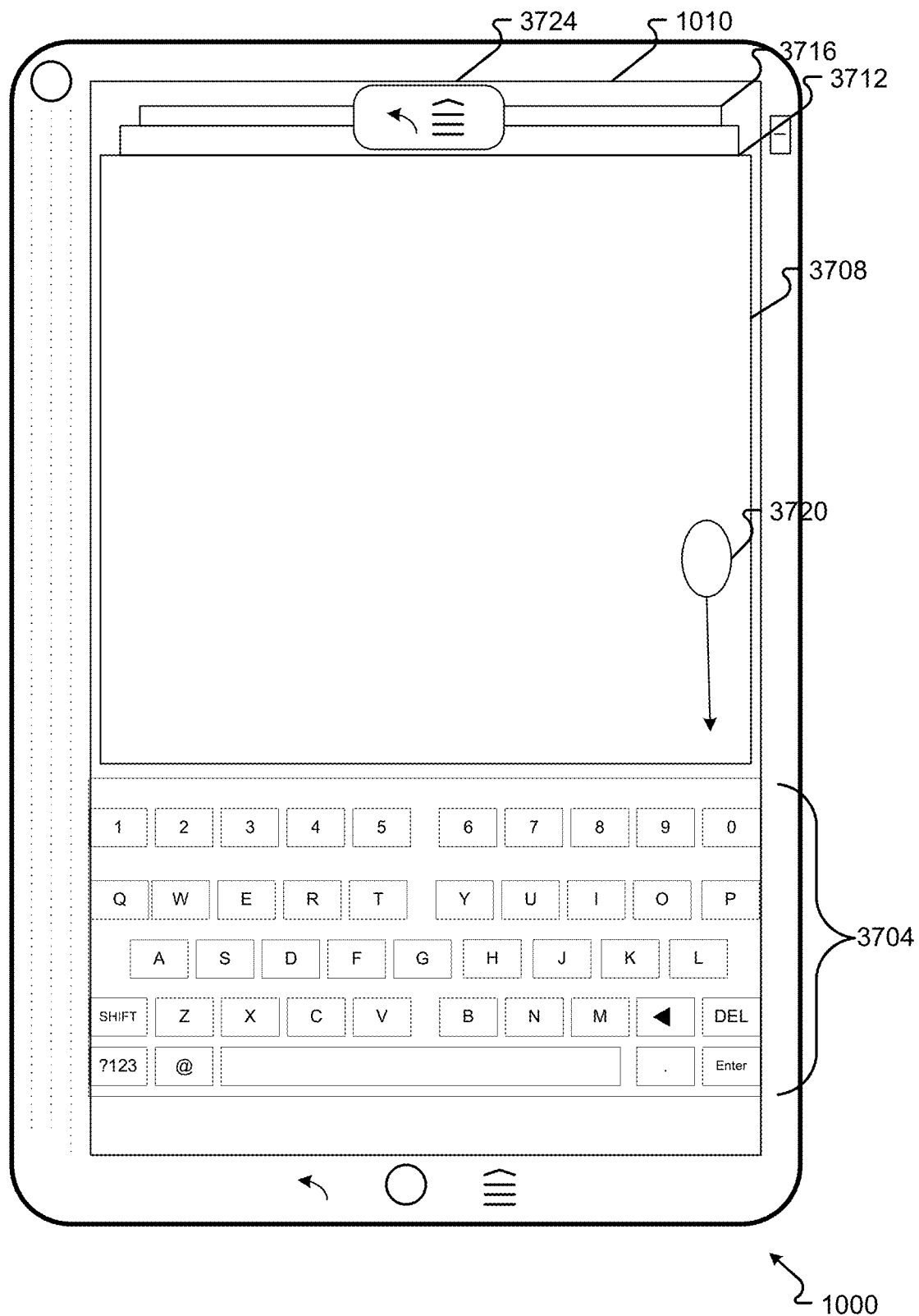
FIG. 37 illustrates an exemplary carousel application window stack with a virtual keyboard.

These concepts can be extended to the situation where the keyboard is also displayed in the multiple application mode. For example, and as illustrated in FIG. 37, the keyboard 3704 is displayed below the application stack 3708. "Behind" the application stack 3708, are additional applications 3712 and 3716 that the user can access via, for example, initiation of gesture 3720. This exemplary embodiment has the applications scroll in a carousel-like fashion into and out of view, with the keyboard 3704 remaining visible, for example, at the bottom of display 1010. As with the embodiment in FIG. 35, the back and menu buttons can be enabled and, for example, virtually displayed on the display 1010 as illustrated by graphical button 3724.

Figure 38:
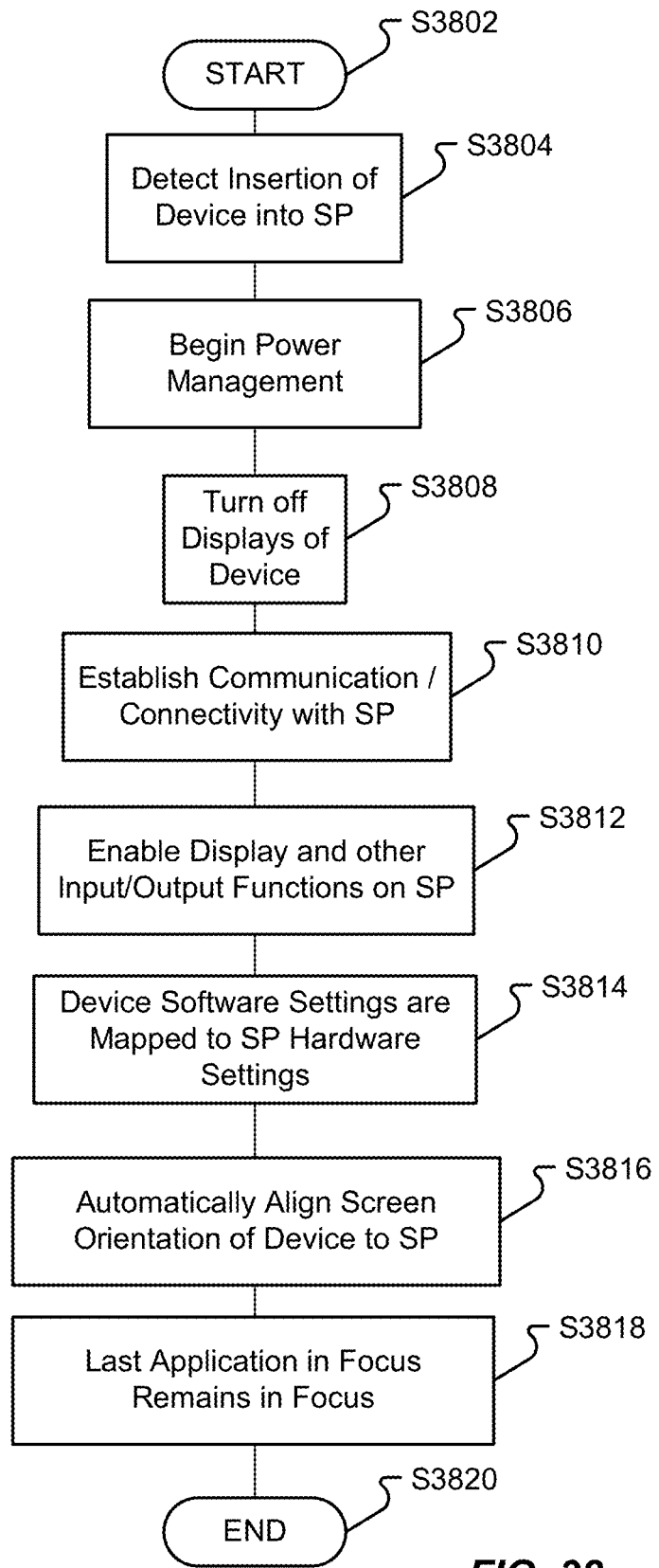
FIG. 38 illustrates an exemplary method for associating the device and the SP.

FIG. 38 outlines an exemplary method for docking the device 100 with the smartpad 1000. In particular, control begins in step S3802 and continues to step S3804. In step S3804 the insertion of the device into the SP is detected. Next, in step S3806, power management can optionally begin. For example, and as discussed, the SP can be used as a power source for the device, the device can be used as a power source for the SP, power can be shared between the two devices and/or the SP can be plugged in, via for example, an AC adaptor, which is capable of charging one or more of the SP and the device 100. Then, in step S3808, the display of the device 100 is optionally turned off to, for example, conserve power. Control then continues to step S3810. In step S3810, communication and/or connectivity are established between the device 100 and the SP. Next, in step S3812, display and other input/output functions on the SP are enabled. Then, in step S3814, the device software settings are mapped to the smartpad hardware settings. Control then continues to step S3816.

In step S3816, the screen orientation of the device is automatically aligned to the orientation of the SP. Next, in step S3818, the last application in focus on the device remains in focus and is displayed on the SP. Normal operation and interaction with the SP then continues utilizing, for example, the same gestures as are usable with the device 100. Control then continues to step S3820 where the control sequence ends.

Figure 39:
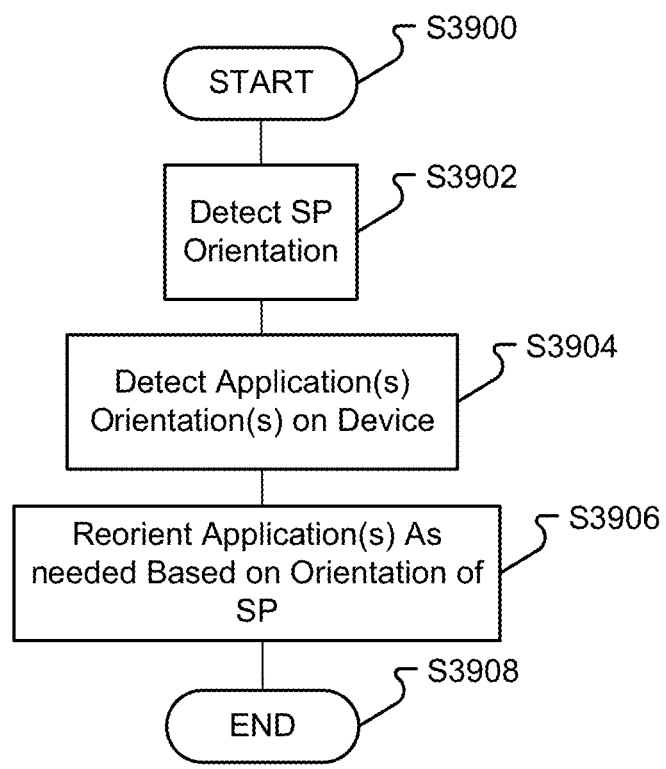
FIG. 39 illustrates an exemplary method for application reorientation based on SP orientation.

FIG. 39 illustrates an exemplary method of application/display orientation/reorientation. In particular, control begins in step S3900 and continues to step S3902. In step S3902, the orientation of the SP is detected. Next, in step S3904, the application orientation on the device is detected. Then, in step S3906, one or more displayed applications are reoriented to be in the same orientation as the SP. In addition, and based on the need for reorientation, a re-drawing or re-sizing of the application can also occur with the application(s) being displayed on the SP. Control then continues to step S3908 where the control sequence ends.

Figure 40:
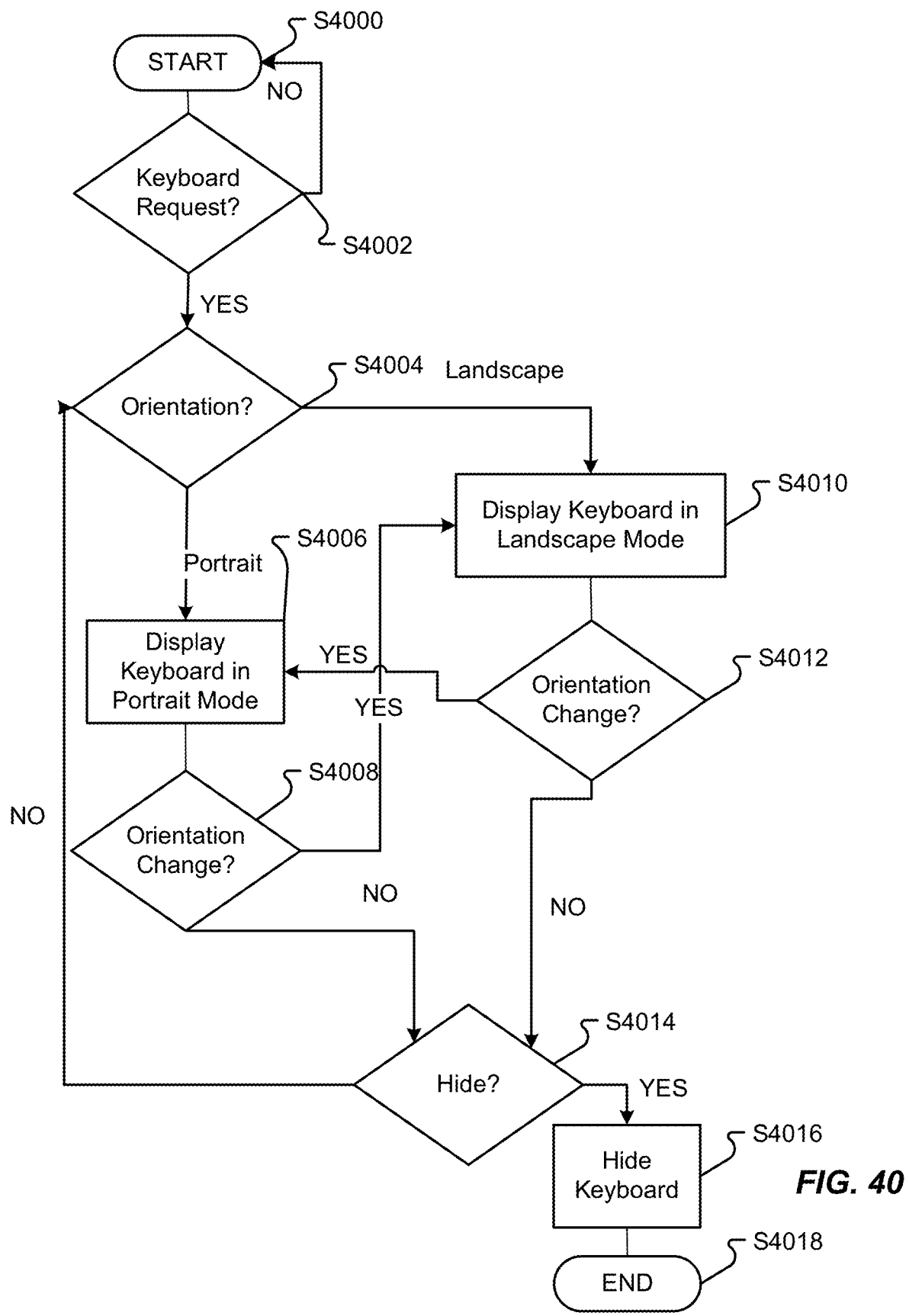
FIG. 40 illustrates an exemplary method for managing the keyboard on the SP.

FIG. 40 outlines an exemplary method for managing the keyboard. In particular, control begins in step S4000 and continues to step S4002. In step S4002, determination is made as to whether a keyboard request has been detected. If a keyboard request has not been detected, control jumps back to step S4000 with control otherwise continuing to step S4004. In step S4004, a determination is made as to the orientation of the SP. If the SP is in the landscape orientation, control jumps to step S4010 with control otherwise continuing to step S4006 with the SP being in the portrait orientation. In step S4006, the keyboard is displayed in the portrait mode.

Next, in step S4008, a determination is made as to whether there has been an orientation change. If there has been an orientation change, control jumps to step S4010 with control otherwise continuing to step S4014.

In step S4010, the keyboard is displayed in the landscape mode. Next, in step S4012, a determination is made as to whether there has been a change in orientation of the SP. If there has been a change in the orientation, control jumps to step S4006 with control otherwise continuing to S4014.

In step S4014, a determination is made as to whether the keyboard should be hidden. If the keyboard should be hidden, control continues to step S4016 with control otherwise continuing back to step S4004.

In step S4016, the keyboard is hidden with control continuing to step S4018 where the control sequence ends.

Figure 41:
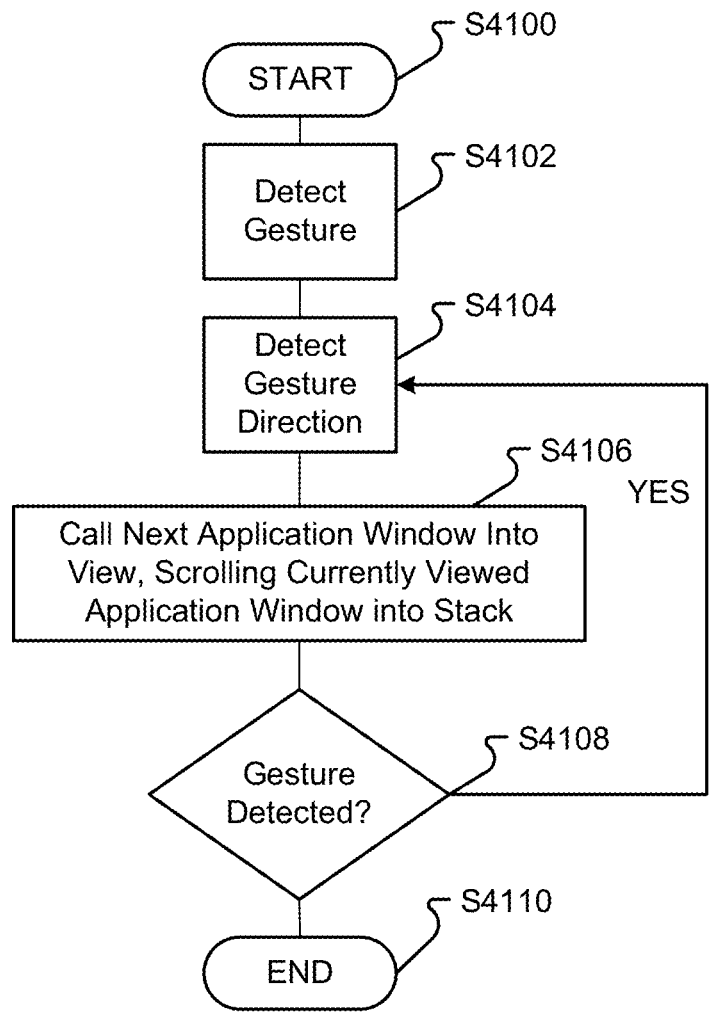
FIG. 41 illustrates an exemplary method for window manipulation based on one or more gestures.

FIG. 41 illustrates an exemplary method for window management. In particular, control begins in step S4100 and continues to step S4102. In step S4102 a gesture is detected. As will be appreciated, and similar to the device 100, this gesture can be on the touch-sensitive display, in a configurable area, and/or in the gesture capture region(s). In step S4104, gesture direction can also optionally be detected. Then, in step S4106, the next application window can be brought into view, enabling, for example, a user to scroll through application window stack. A determination is then made as to whether another gesture has been detected. If another gesture has been detected, control jumps back to step S4104 with control otherwise continuing to step S4110.

Figure 42:
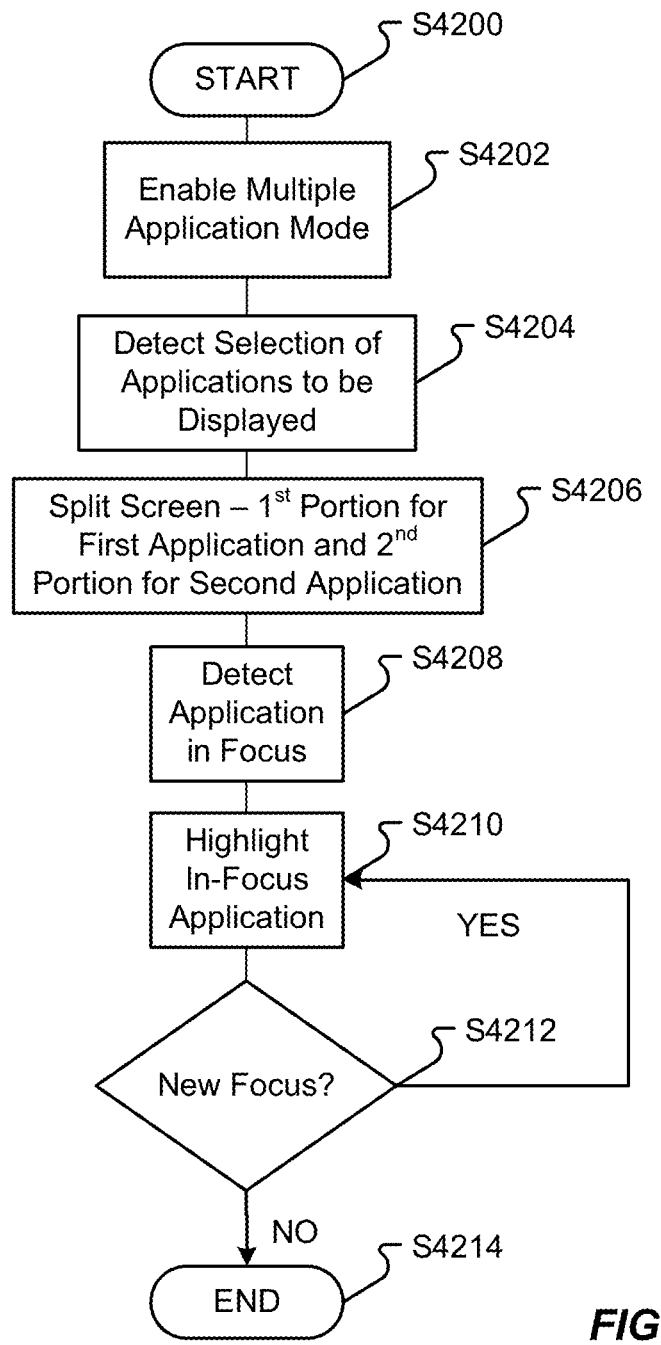
FIG. 42 illustrates an exemplary method for application highlighting when an application is in focus in multi application mode.

FIG. 42 outlines an exemplary method for screen management. In particular, control begins in step S4200 and continues to step S4202. In step S4202, multiple application mode is enabled via, for example, selection of a button or toggle. Next, in step S4204, a user is optionally prompted to select which applications will be displayed. In an alternative embodiment, two adjacent applications in the stack are displayed, with one of the applications being the application that is currently in focus. Then, in step S4206, the screen is split with the first portion of the screen displaying a first application and a second portion of the screen displaying a second application. Next, in S4208, the application that was detected to be in focus is then highlighted on the SP in step S4210. Control then continues to step S4212.

In step S4212, a determination is made as to whether a new application has been brought into focus. If a new application has been brought into focus, control jumps back to step S4210 where that application is highlighted with an "in-focus" indicator. Otherwise, control continues to step S4214 where the control sequence ends.

Figure 43:
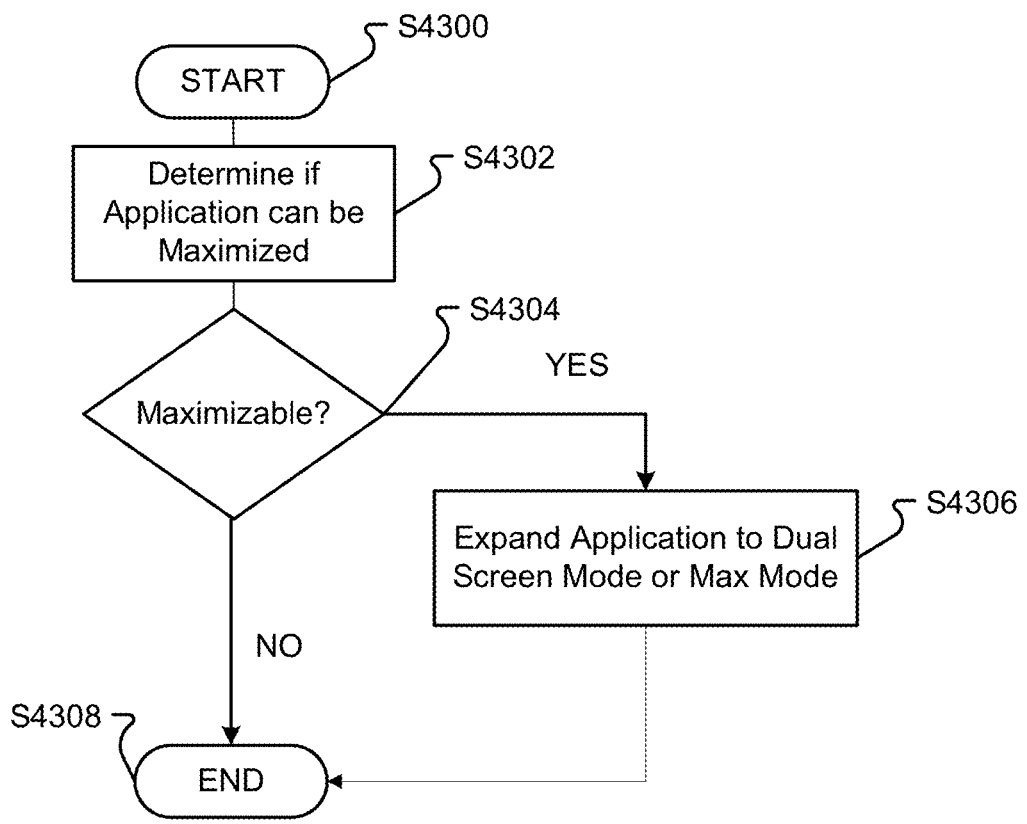
FIG. 43 illustrates an exemplary method for application maximization.

FIG. 43 outlines an exemplary method for windows management. In particular, control begins in step S4300 and continues to step S4302. In step S4302, a determination is made as to whether the application can be maximized. Next, in step S4304, if the application is maximizable, control jumps to step S4306 where the application is expanded to either the dual screen mode or the max mode. Control then continues to step S4308 where the control sequence ends.

Figure 44:
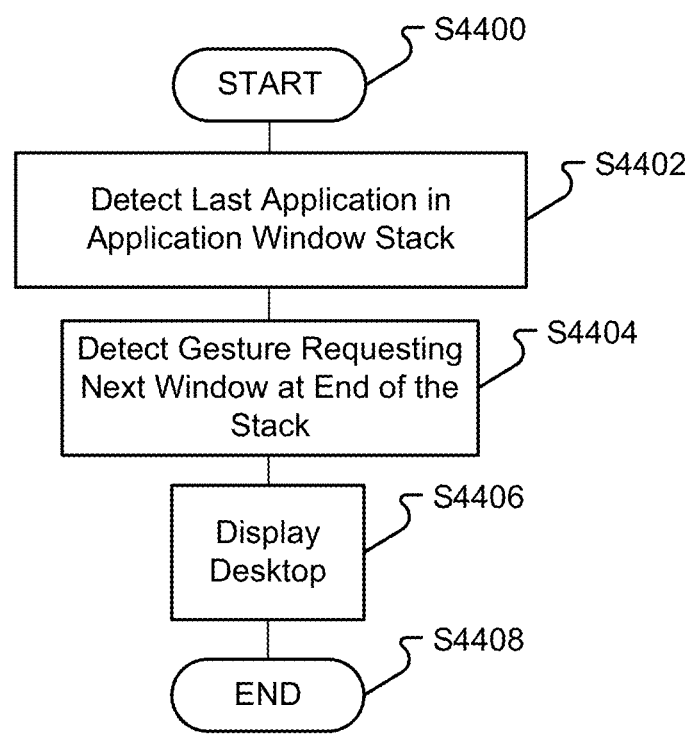
FIG. 44 illustrates an exemplary method for transitioning from an application window to the desktop.

FIG. 44 outlines an exemplary method for transitioning from an application window to the desktop. In particular, control begins in step S4400 and continues to step S4402. In step S4402, the last application in the application window stack is detected. Next, in step S4404, a gesture is detected, the gesture requesting a "next" window, however the current window is the last application in the window stack. In this scenario, in step S4406, the desktop is displayed in that there are no further windows to display in the application window stack. Control then continues to step S4408 where the control sequence ends.

Figure 45:
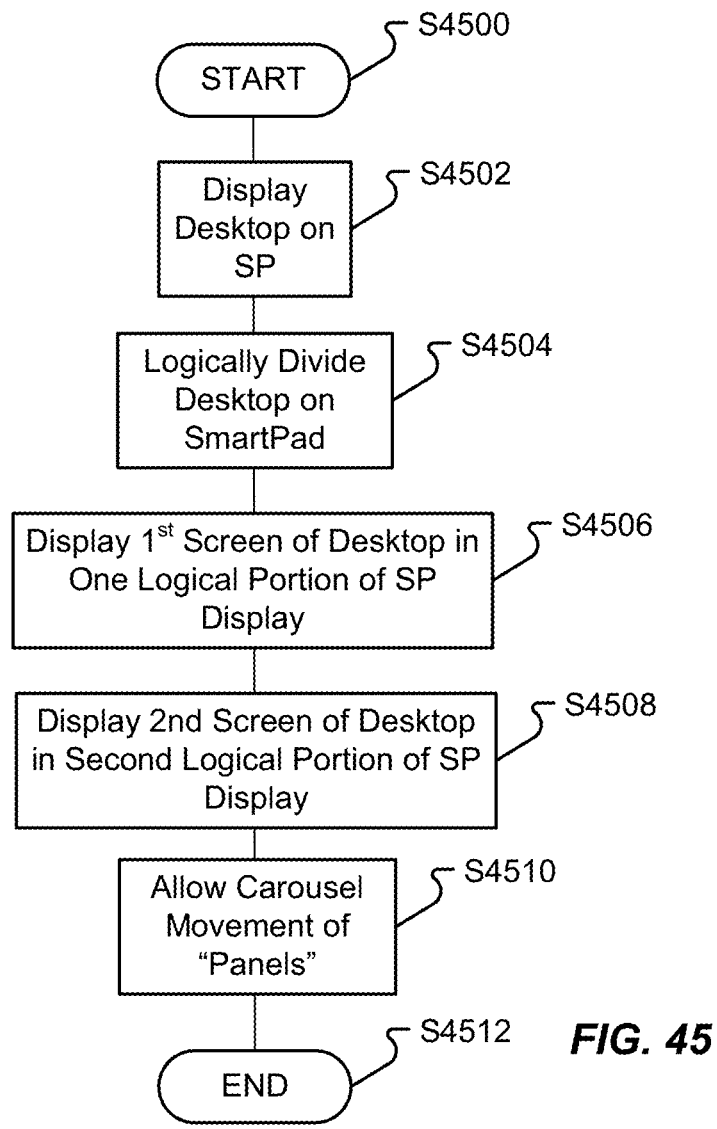
FIG. 45 illustrates an exemplary method for managing the display of the desktop and/or one or more panels on the SP.

FIG. 45 illustrates an exemplary method of emulating the multi-screen display of the device 100 on the SP1000. In particular, control beings in step S4500 and continues to step S4502. In step S4502, the desktop is displayed on the SP. Next, in step S4504, the desktop is logically divided on the SP into, for example, two sections. Then in step S4506, a first screen of the desktop is displayed in a first logical portion of the SP display. Then, in step S4508, a second screen of the desktop is displayed in a second logical portion of the SP display. Control then continues to step S4510.

In step S4510, carousel movement of the "panels" shown in the display can be initiated through user input, such as a gesture. Control then continues to step S4512 where the control sequence ends.

Figure 46:
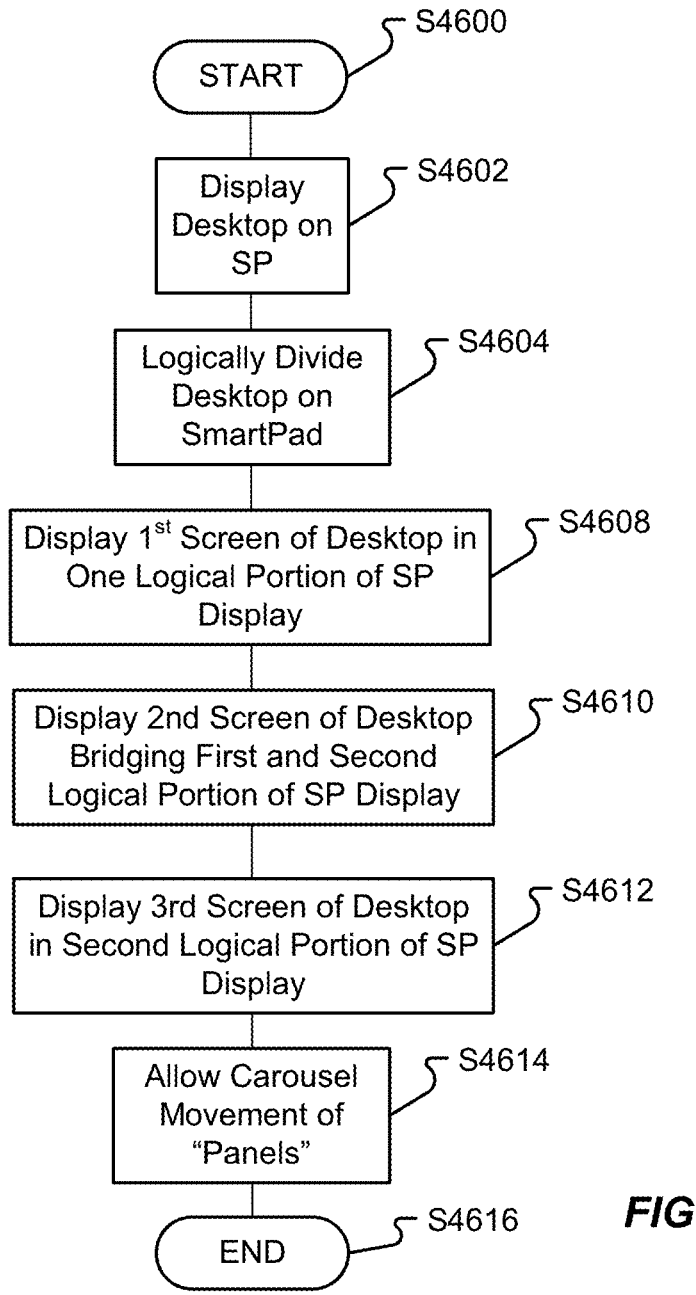
FIG. 46 illustrates an exemplary method for merging panels for display on the SP.

FIG. 46 outlines an exemplary method of displaying multiple "panels" of the desktop on the SP. In particular, control begins in step S4600 and continues to step S4602. In step S4602, a portion of the desktop is displayed on the SP. Next, in step S4604, the desktop is logically divided on the smartpad to accommodate multiple desktop "panels." Then, in step S4608, the first screen or panel of the desktop is displayed in one logical portion of the SP display. Then, in step S4610, a second screen or panel of the desktop is displayed bridging a first and a second logical portion of the SP display. Then, a third screen or panel of the desktop is displayed in the second logical portion of the SP display. Control then continues to step S4614.

In step S4614 carousel movement of the panels can be affected by, for example, an input of a gesture by the user. Control then continues to step S4616 where the control sequence ends.

Figure 47:
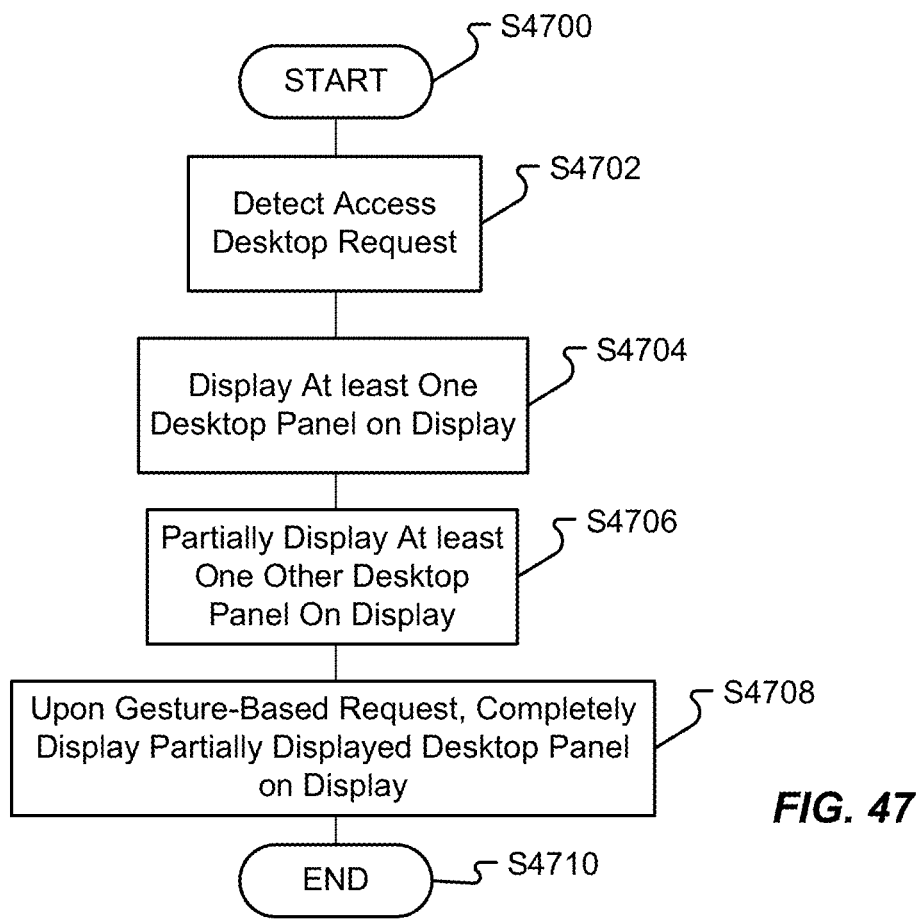
FIG. 47 illustrates an exemplary method for previewing one or more panels on the SP.

FIG. 47 outlines an exemplary method of displaying one or more portions of the desktop. In particular, control begins in step S4700 and continues to step S4702. In step S4702, an access request to the desktop is detected. Next, in step S4704, at least one desktop panel is displayed. Then, in step S4706, at least one additional desktop panel is partially displayed on the desktop. Control then continues to step S4708.

In step S4708, and upon detection of a gesture, the partially displayed panel can be completely displayed on the display of the SP. Control then continues to step S4710 where the control sequence ends.

Figure 48:
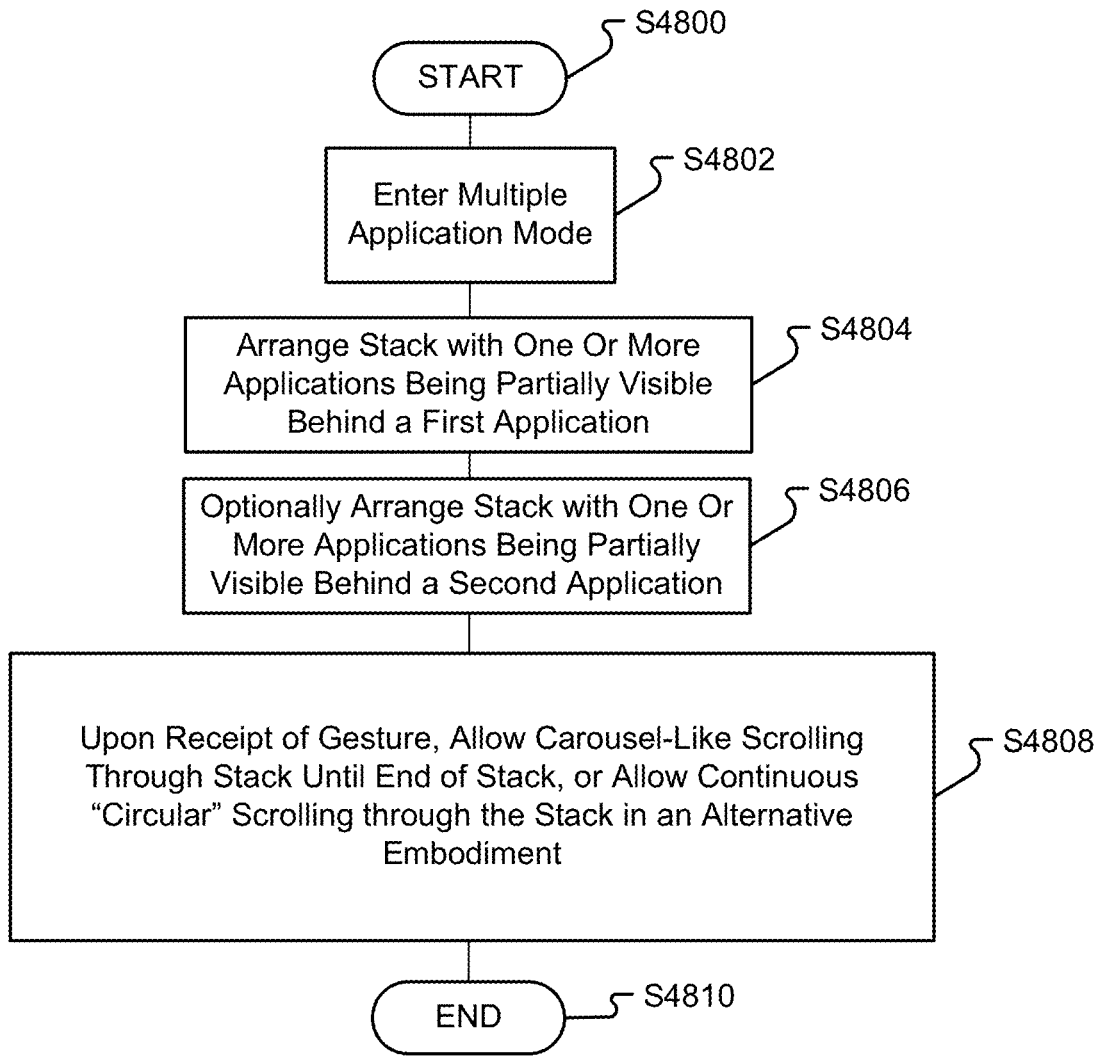
FIG. 48 illustrates an exemplary method for stack management in multi application mode.

FIG. 48 outlines an exemplary method of windows management in multiple application mode. In particular, control begins in step S4800 and continues to step S4802. In step S4802, multiple application mode is entered. Next, in step S4804, the windows stack is arranged with one or more applications being partially visible behind a first application. Next, in step S4806, the stack can be arranged with one or more applications also partially being visible behind a second application. Then, in step S4808, and upon receiving an input gesture from a user, carousel-like scrolling can be enabled through the stack until the end of the stack is reached, or in a second embodiment, the stack can have a "circular" arrangement where continuous scrolling through the stack is possible. Control then continues to step S4810 where the control sequence ends.

Figure 49:
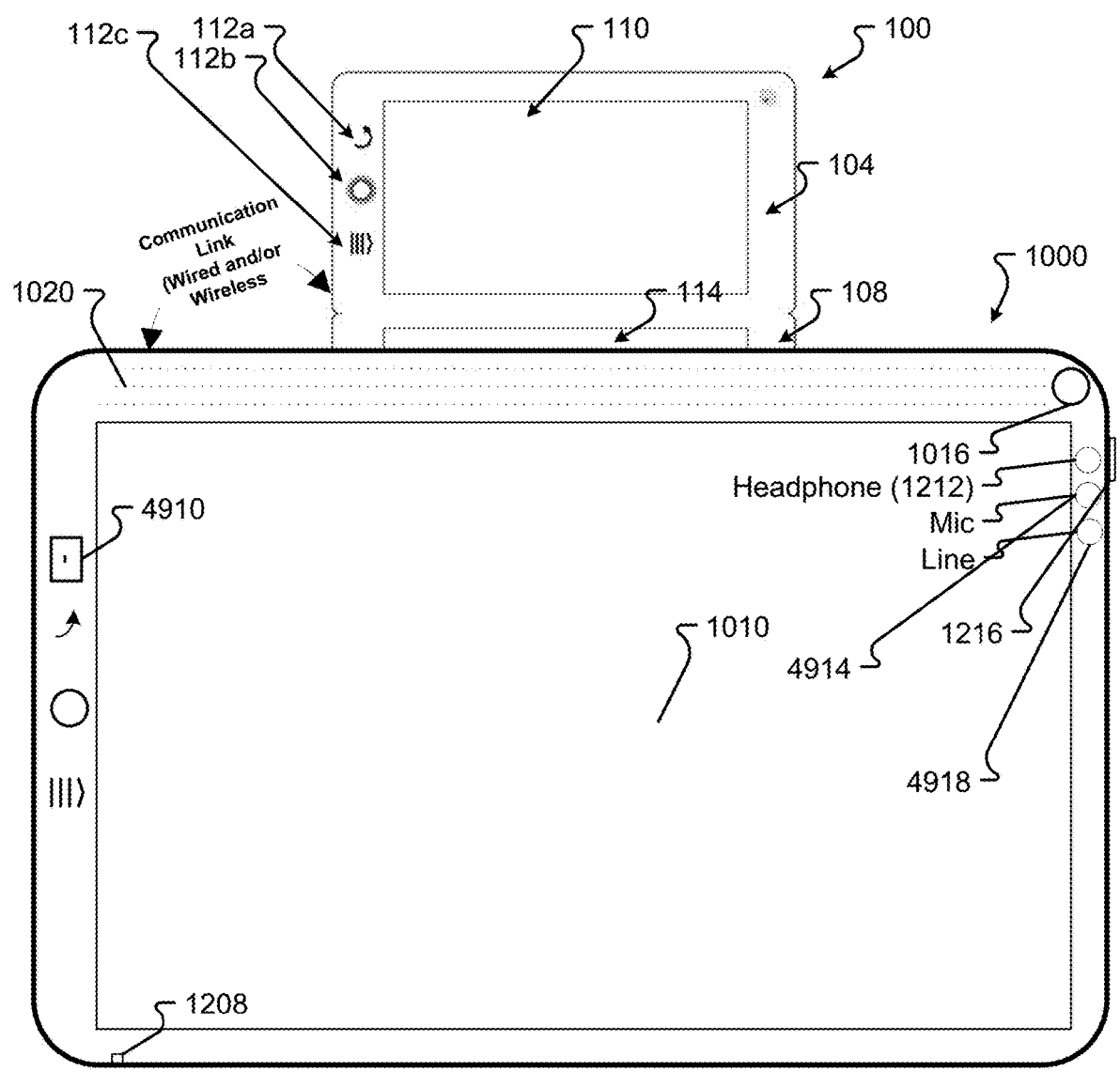
FIG. 49 illustrates exemplary device and SP hardware and docking.

FIG. 49 illustrates another exemplary embodiment of the device 100 and SP 1000 in greater detail. As illustrated, the device 100 is being inserted into a slot (not shown) on the SP 1000. As discussed, and upon completion of the inserting of the device 100 into the SP 1000, the device 100 communicates with the SP 1000 via one or more wired or wireless electrical means, such as communication link as illustrated in the figures. As will be appreciated however, communication can begin before or during insertion of the device 100 into the SP 1000.

In accordance with one exemplary embodiment, the SP 1000 includes a camera 1016, headphone jack 1212, microphone jack 4914, power port 1208, line-in jack 4018, and power button 1216. In this exemplary embodiment, a button, 4910, such as a capacitive button, allows switching between application modes. For example, activation of this button can cause the SP 1000 to switch to a single application mode, multi-application mode, or toggle between modes. For example, with a single touch, the SP 1000 device automatically switch to single application mode. With two quick touches, the SP 1000 could switch to multi-application mode. In an alternative exemplary embodiment, button 4910 can be programmed to alter any function(s) of the SP 1000 and can optionally, for example, be programmed by a user.

The headphone jack 1212 can be any headphone jack including standard 3.5 mm jacks, 2.5 mm jacks, and quarter-inch jacks. In addition, the SP 1000 can be equipped such that audio information can be communicated wirelessly to a user's headphones, with the wireless capability optionally be provided in addition to the headphone jack 1212.

The power button 1216 can be a mechanical, semi-mechanical, touch sensitive, or other style button that allows a user to either turn power on or power off to the SP 1000.

In addition, the power button 1216 can be used to place the SP 1000 in a sleep or hibernate mode.

The image capture interfaces/devices 1016, as discussed, can capture one or more of still image information, video information, as well as other information such as information associated with a code, such as a barcode, QR code, or the like in conjunction with a code reader application (not shown).

In addition, the SP 1000 can be equipped with near field communication capabilities that allow, for example, the SP 1000 to communicate with one or more other devices. In accordance with one exemplary embodiment, the SP 1000 and the device 100 both include near field communication capabilities such as they are able of communication with one another, and/or one or more other devices either individually, or on their own. As discussed, this capability can be used optionally in conjunction with one or more other communication protocols such as Bluetooth®, Wi-Fi and, for example, 4G LTE.

Figure 50A:
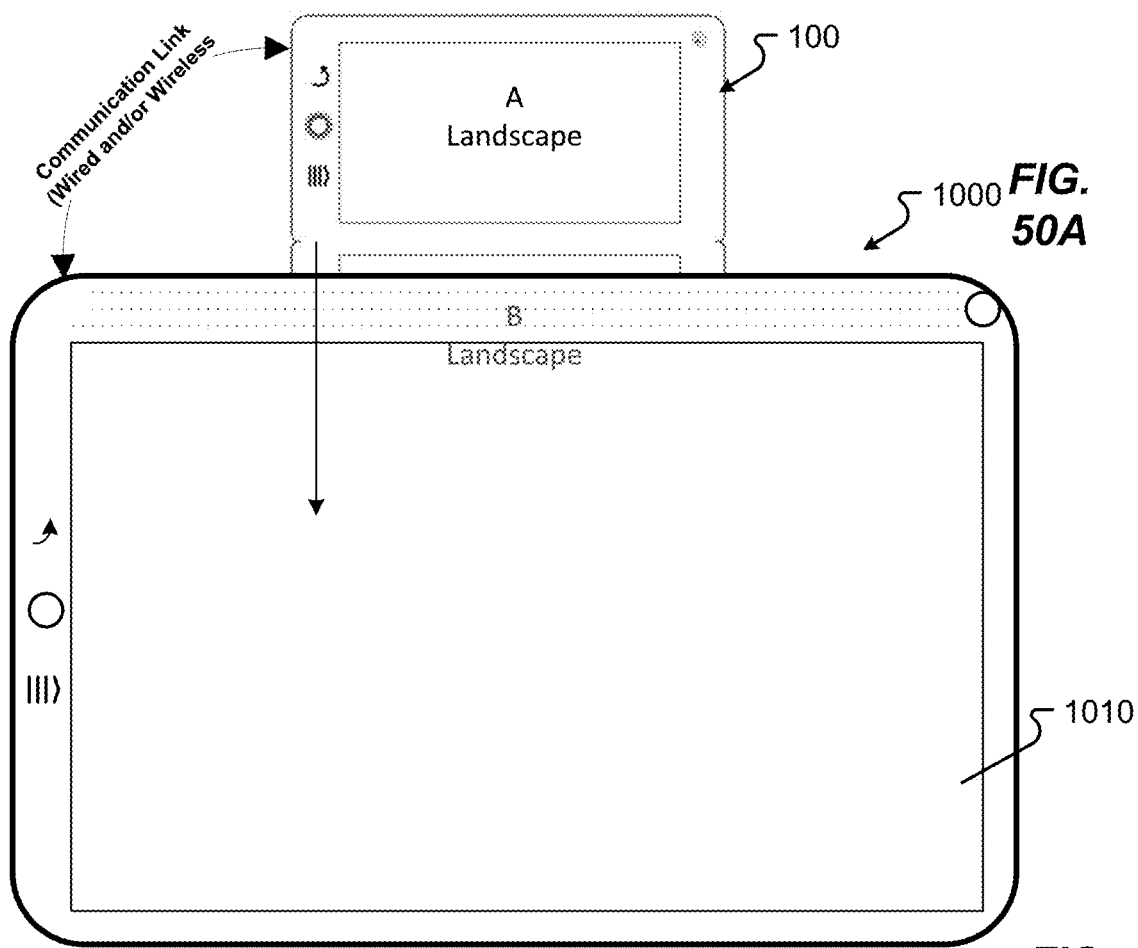
FIG. 50A illustrates exemplary device and SP hardware and docking.
Figure 50B:
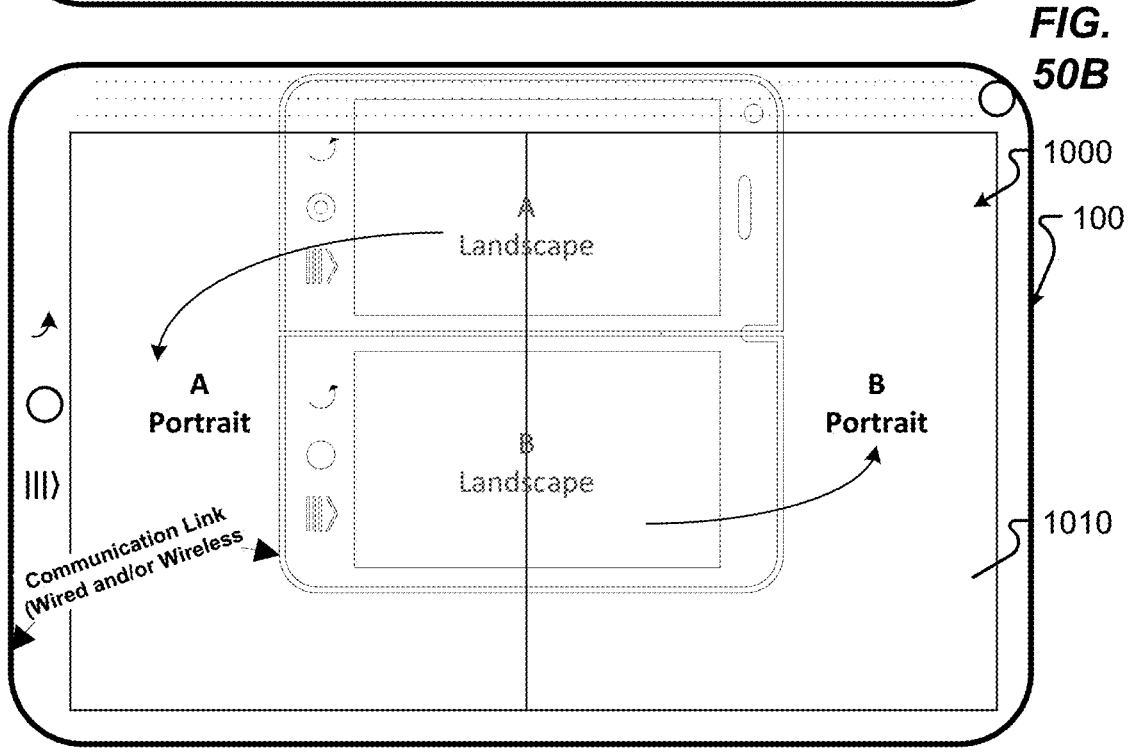
FIG. 50B illustrates exemplary device and SP hardware and docking and screen management.

FIGS. 50A-50B illustrates exemplary operations that can occur when a device 100 is docked into the SP 1000. As one examples of docking activity, automatic screen orientation event(s) can occur to align the device 100 displays to that of the SP 1000 orientation. This activity would be initiated upon the detection of a docking event. As another example, the last application in focus on the device 100 can continue to be in focus on the SP 1000. As yet another example, applications on the device 100 that need to degrade in experience can do so elegantly, taking into account new or different hardware, such as a video camera, and the SP 1000 hardware capabilities.

As an even further example, one or more software settings on the device 100 can be mapped to the new hardware capabilities/requirements/limitations on the SP 1000, and can optionally automatically be adjusted to ensure compatibility (to the extent possible) with the hardware on the SP 1000. Moreover, and as previously discussed, one or more of wired and/or wireless communications can be established as the docking event between the device 100 and the SP 1000 occurs.

As illustrated in FIG. 50B, and upon docking of the device 100 into the SP 1000, one or more applications can also automatically re-orient to the appropriate orientation based on the current status of the SP 1000. As illustrated in FIG. 50b, there are two applications running on the device 100, "A Landscape" and "B Landscape." The "A Landscape" application is re-oriented for display on the SP 1000 as a portrait application, here, "A Portrait." In a similar manner, the "B Landscape" application is re-oriented into a right-hand portion of the SP 1000 display in the portrait mode, here "B Portrait."

In accordance with an optional exemplary embodiment, the SP 1000 behavior changes in relation to how the power button 1216 behaves relative to state of the SP 1000, the state of the device 100, and/or one or more docking events. More specifically, when the SP 1000 does not contain a docked handset, the power button behaves as follows (the times indicated below being arbitrary and capable of being any length of time):

For a short press or tap, the onscreen display of the SP 1000 can be shown provided there is sufficient charge.

For a medium press, such as a one second hold of the power button, SP 1000 can show the onscreen display. Again, if there is sufficient charge.

For a long press, such as a 12 second hold, again the onscreen display can be shown if there is sufficient charge.

Alternatively, if the SP 1000 is already on, pressing of the power button can transition the SP 1000 to either a stand-by, hibernate, or off state.

In accordance with another exemplary embodiment, where the SP 1000 contains an active device 100 that has been docked with the SP 1000, the power button can behave in exactly the same manner as the power button on the device 100. For example, a short tap or press can toggle the stand-by mode. A medium press, if in stand-by mode, then awakes the device. If active, a medium press can display device power menu. In this state, a long press could, for example, trigger a hard reset.

When a powered-off device 100 is docked with the SP 1000, in accordance with one exemplary embodiment, engaging of the power button will always activate the device regardless of press length. For example, a short press or tap will power on the device 100. Similarly, a medium press or long press will also power on the device 100.

When docked, typically only the settings that are available on the SP 1000 will be available to be viewed or changed. In the case of unique settings, the SP 1000 settings can be shown. Furthermore, when there is a competing, conflicting, or non-equivalent feature in the device 100, the SP settings can govern. Similarly, when undocked, only the settings that are available on the device 100 will be available to view or change, and in the case of unique settings, the settings on the device 100 will be shown.

Figure 51:
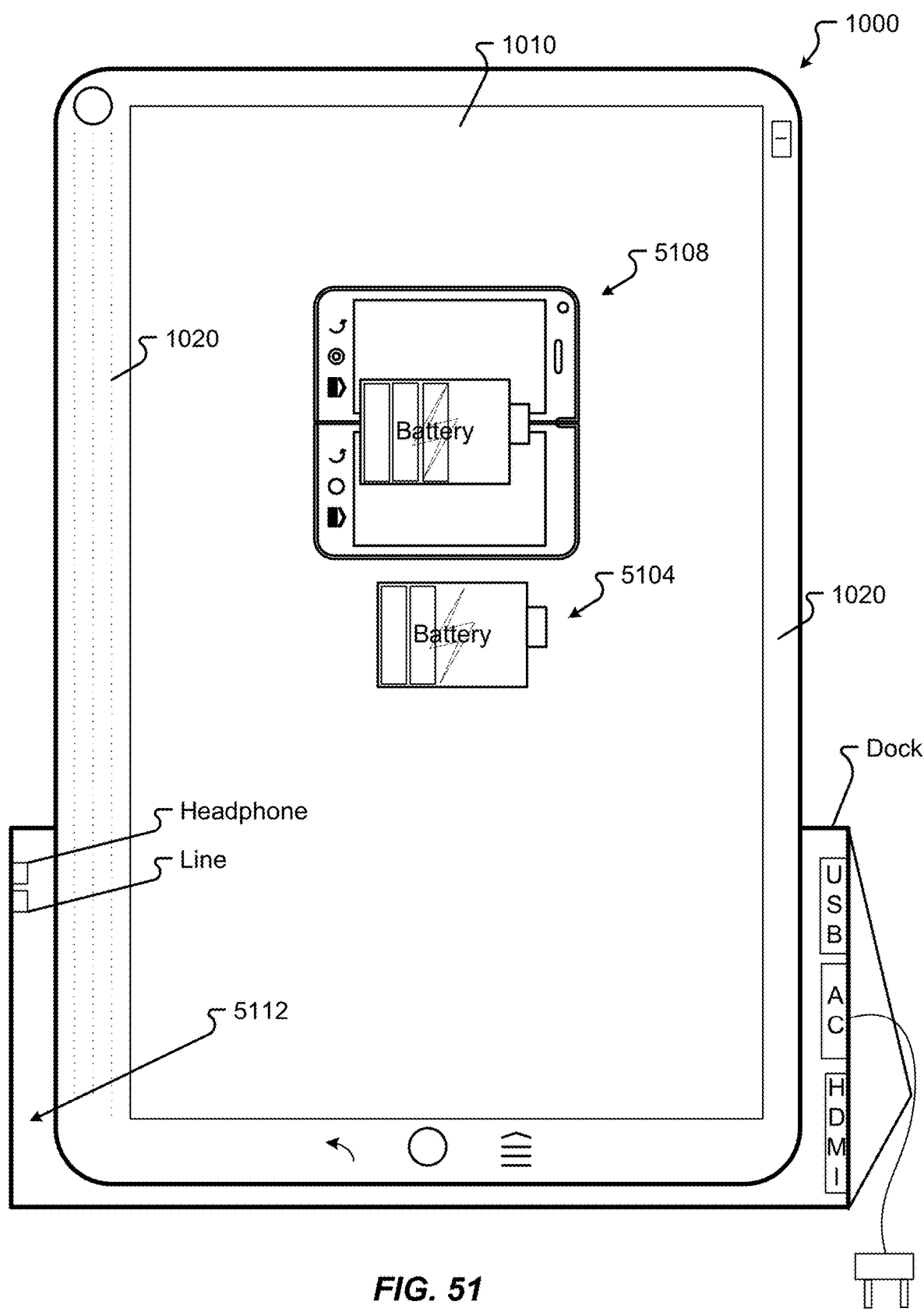
FIG. 51 illustrates exemplary SP power management.

FIG. 51 illustrates an exemplary state of the SP 1000 during a charging event. Here, the battery on the SP 1000 has been depleted, and it is in a charging state as indicated by the lightning bolt icon as shown in the display 1010. In conjunction with the lightning bolt icon, it should be appreciated that a battery icon 5104 can also be displayed, here shown with two bars indicating the battery is approximately 30% charged and in a charging state. In conjunction with a optional embodiment a battery icon 5108 can also be displayed, here shown with three bars indicating the battery is approximately 60% charged and in a charging state for the docked device 100.

The SP 1000 can also be docked to a dock 5112 that allows one or more of charging of the SP 1000 and device 100, as well as connectivity via one or more of a USB port, charger port, video connector and audio ports.

Figure 52:
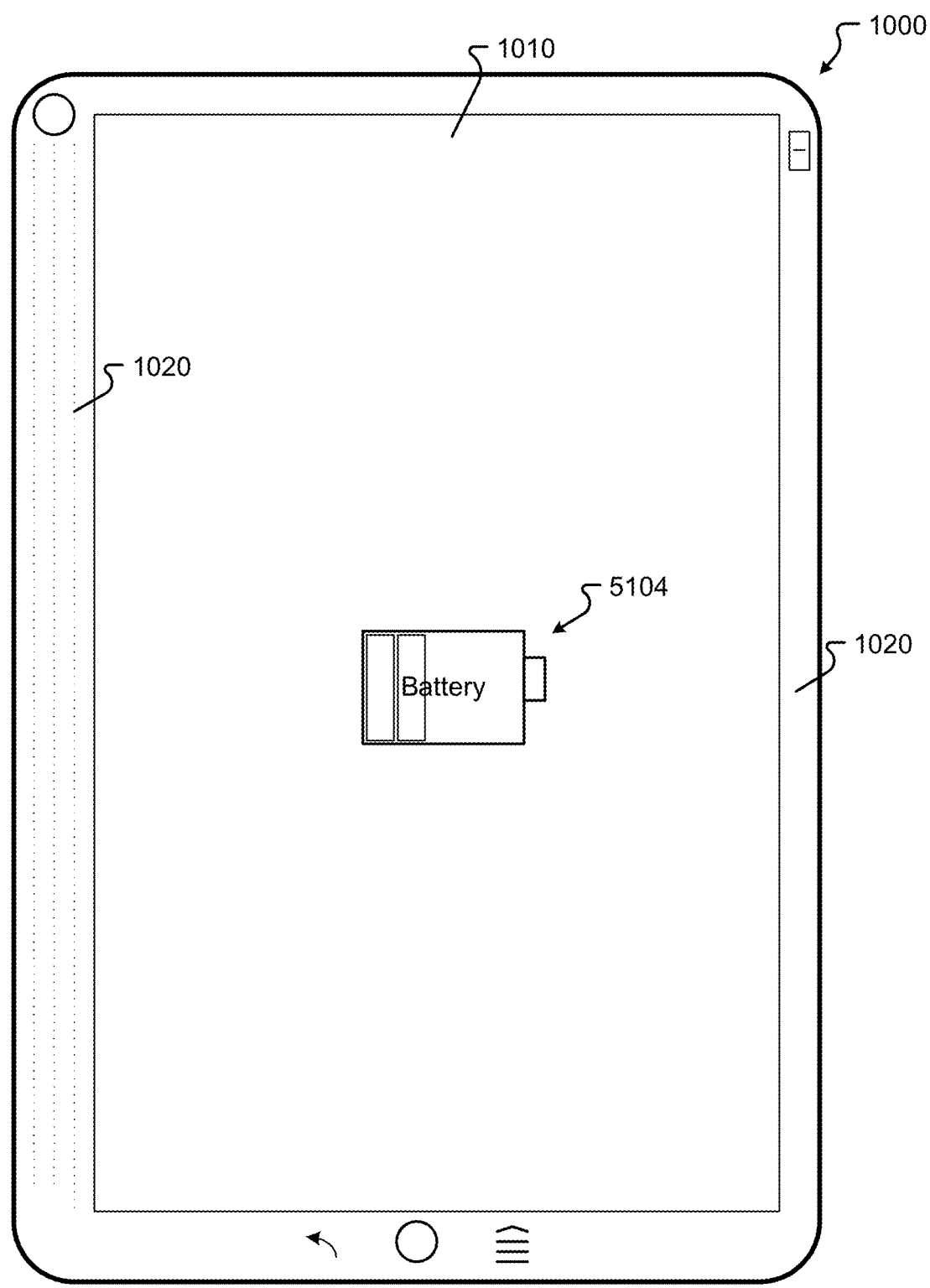
FIG. 52 illustrates exemplary SP power management.

FIG. 52 illustrates another exemplary embodiment, where the SP 1000 is not docked with the device 100, and here the battery status indicator is shown illustrating that the SP 1000 contains approximately a 30% charge, and that it is not charging, by lack of the lightning bolt icon being displayed.

Figure 53:
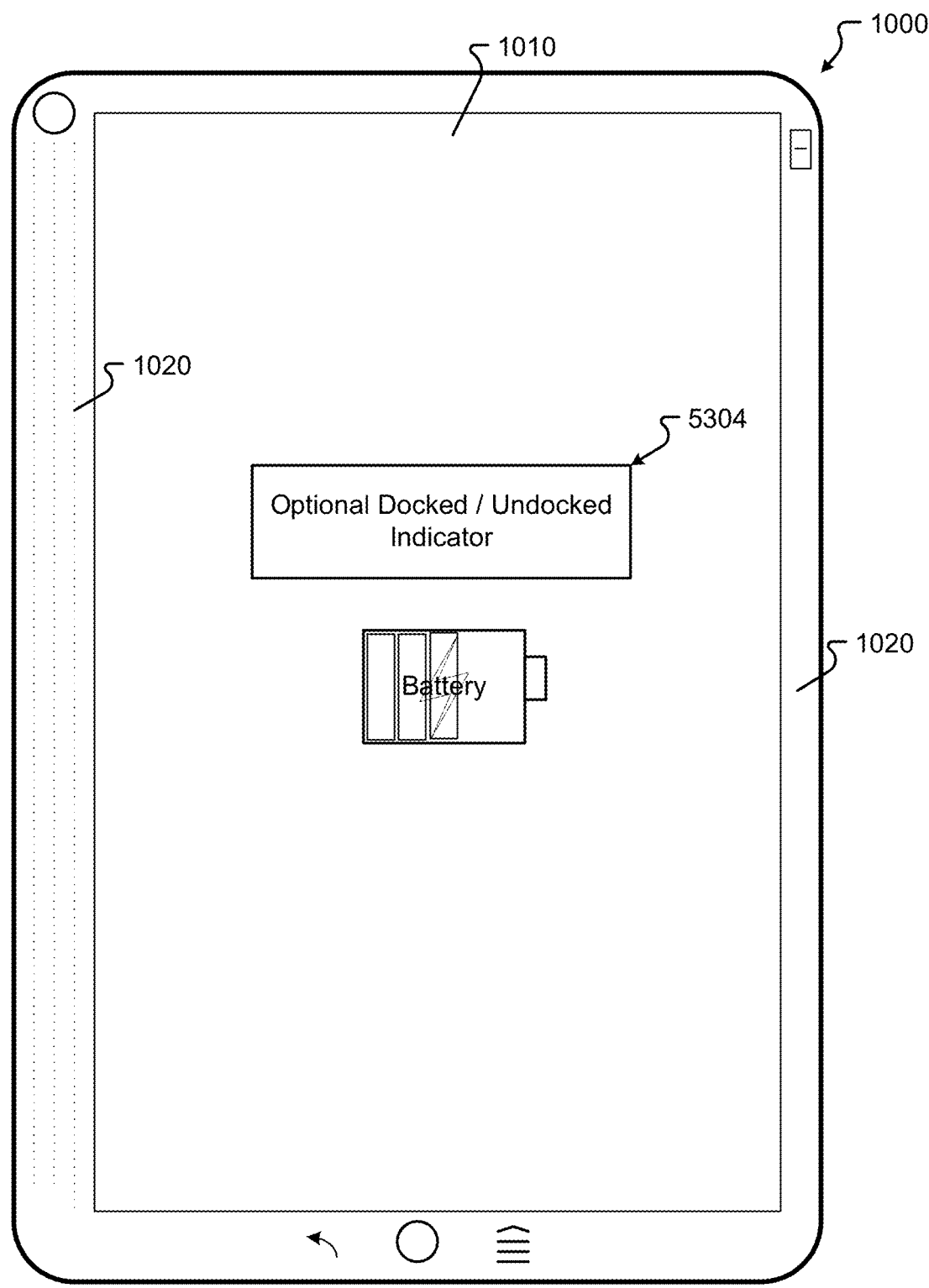
FIG. 53 illustrates exemplary SP power management and status indicators.

In FIG. 53, an optional indicator 5304 can be provided on display 1010 indicating whether the SP 1000 is in a docked or undocked state. As discussed above, this can have an effect on how charging occurs as well as if and when power should be shared between the SP 1000 and the device 100, or vice versa. In FIG. 53, the SP 1000 is shown in a charging state, with the battery being approximately 60% charged.

In accordance with one optional embodiment, the display 1010 can include multiple graphical representations of charged state of one or more of the device 100 and SP 1000 when the device 100 is docked in the SP 1000. For example, the charge state of the device 100 can be illustrated on the display 1010, optionally in conjunction with the charge state of the SP 1000, as discussed above.

In the situation where the power supply may not have enough power to charge both the SP 1000 and device 100 simultaneously, one or more of the devices can regulate a priority charging protocol, where, for example, either based on user or device preferences, either the SP 1000 or device 100 is charged first, and the other device is charged, as needed. This can similarly be indicated by a graphical representation in the display 1010, showing, for example, which device is currently being charged, the amount of time left to charge, and a total amount of time left before both devices are charged.

FIG. 54 illustrates exemplary icons that can be associated with the above-described operations. For example, where a handset such as device 100 is being charged by the SP 1000, the first icon associated with the phone or device 100 is shown with the charging "lightning bolt" and the charged status of the SP 1000 is shown in a charged, but depleting state. In a second scenario, both the device 100 and SP 1000 are shown in a charging state. In a third scenario, where both the device 100 and SP 1000 are depleting, icons illustrating a charged, but depleting state can be shown, for example, on the display 1010.

In a first battery charging mode, where the mode is set for device optimized, priority is given to the device 100 so as to charge it before charging the SP 1000. Icons illustrating this priority can be shown as display 1010 as discussed. Similarly, if running in an SP optimized mode, an icon highlighting the fact that the SP 1000 will charge before the device 100 can be used to illustrate the charging protocol.

Battery level status indicators can also be shown for both devices, for example in a status tray. For example, one or more levels, with a further indicator when a warning threshold has been reached, can be shown for one or more of the devices. Similarly, low, medium, and full battery charge states can also be indicated for one or more of the devices on the display 1010 and/or in a status tray.

Figure 55:
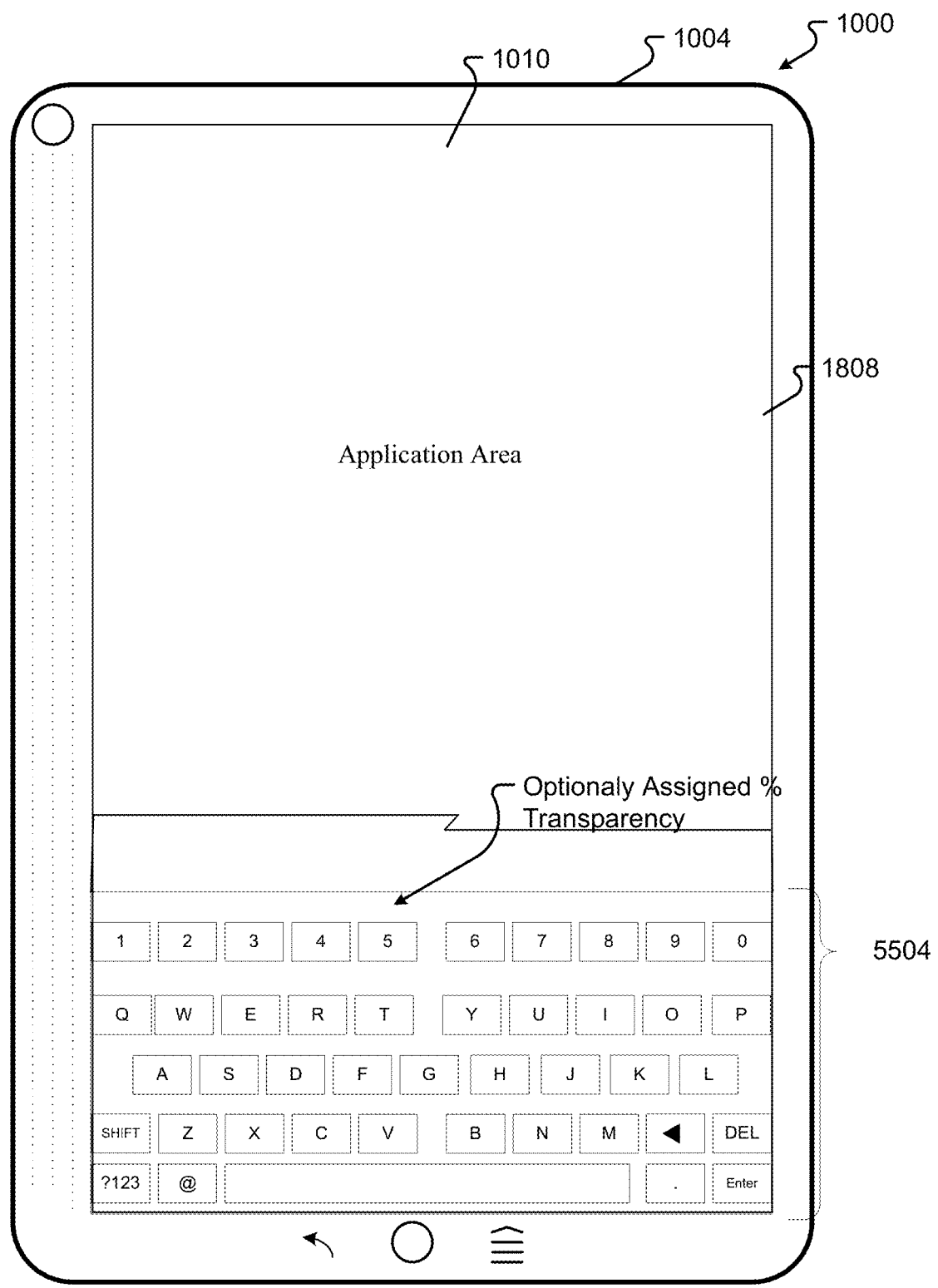
FIG. 55 illustrates an exemplary keyboard configuration.

FIGS. 55-67 illustrate exemplary keyboard placements and orientations. In FIG. 55, in portrait mode, the virtual keyboard 5504 is positioned below the application area 1808. In general, it is preferred that the keyboard 5504 be glued to the lower-portion of the display 1010, regardless of whether the SP 1000 is in the landscape or portrait mode. However, it is to be appreciated that, for example, based on user preferences, application preferences, or a combination thereof, the keyboard can be glued to any other portion of the display 1010 or can be customized and relocated to another portion of the display based on, for example, a gesture.

In FIG. 55, the application area 1808 displays, for example, a standard application with the virtual keyboard 5504 being displayed in the lower portion of the display 1010. This virtual keyboard, as discussed hereinafter, can take on a number of different configurations and is capable of being dynamic based on one or more of the state of the SP 1000, the state of the device 100 and/or one or more applications that are currently active.

In this exemplary embodiment, the virtual keyboard 5504 takes up approximately 30% of the display area 1010 with the application area 1808 consuming the remaining approximately 60%. Here, the SP 1000 is running in a single application mode, with the single, active application being resized and displayed in the application area 1808. This insures the entirety of the application is still visible, while the SP 1000 also displays the virtual keyboard 1804. In accordance with an optional embodiment, the keyboard is overlayed, with a percentage of transparency, over the application area 1808 such that the underlying application can still be seen.

Figure 56:
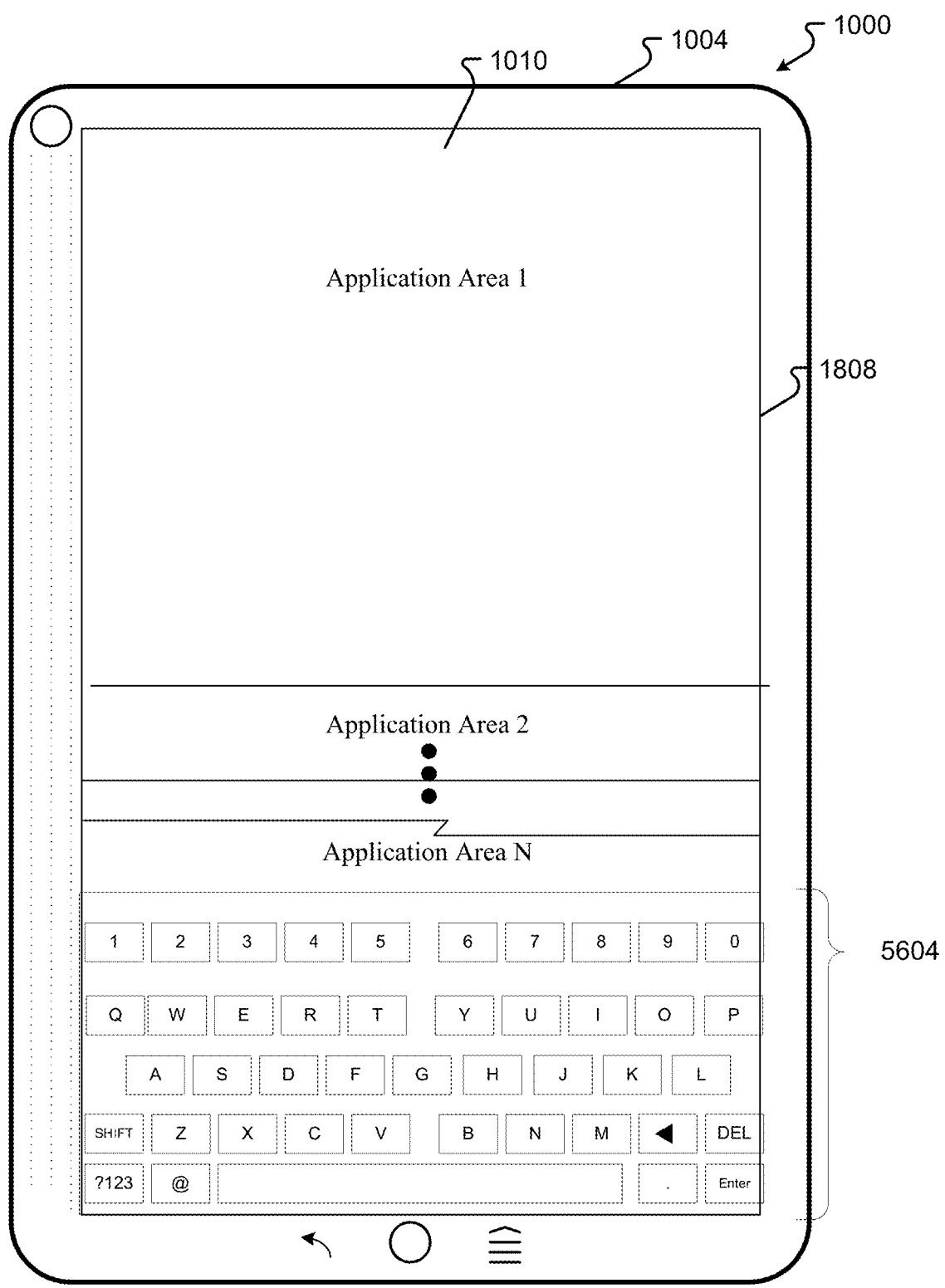
FIG. 56 illustrates another exemplary keyboard configuration.

FIG. 56 illustrates another exemplary embodiment where the SP 1000 is in a portrait orientation, and in a dual- or multi-application mode. In this exemplary embodiment, application area 1 is resized and preserved for viewing, while application areas 2–N become partially obscured by the virtual keyboard 5604. In accordance with an optional embodiment, the application(s) at the bottom of the display 1010 can be dimmed out and remain inactive until the virtual keyboard 5604 is dismissed.

Figure 57:
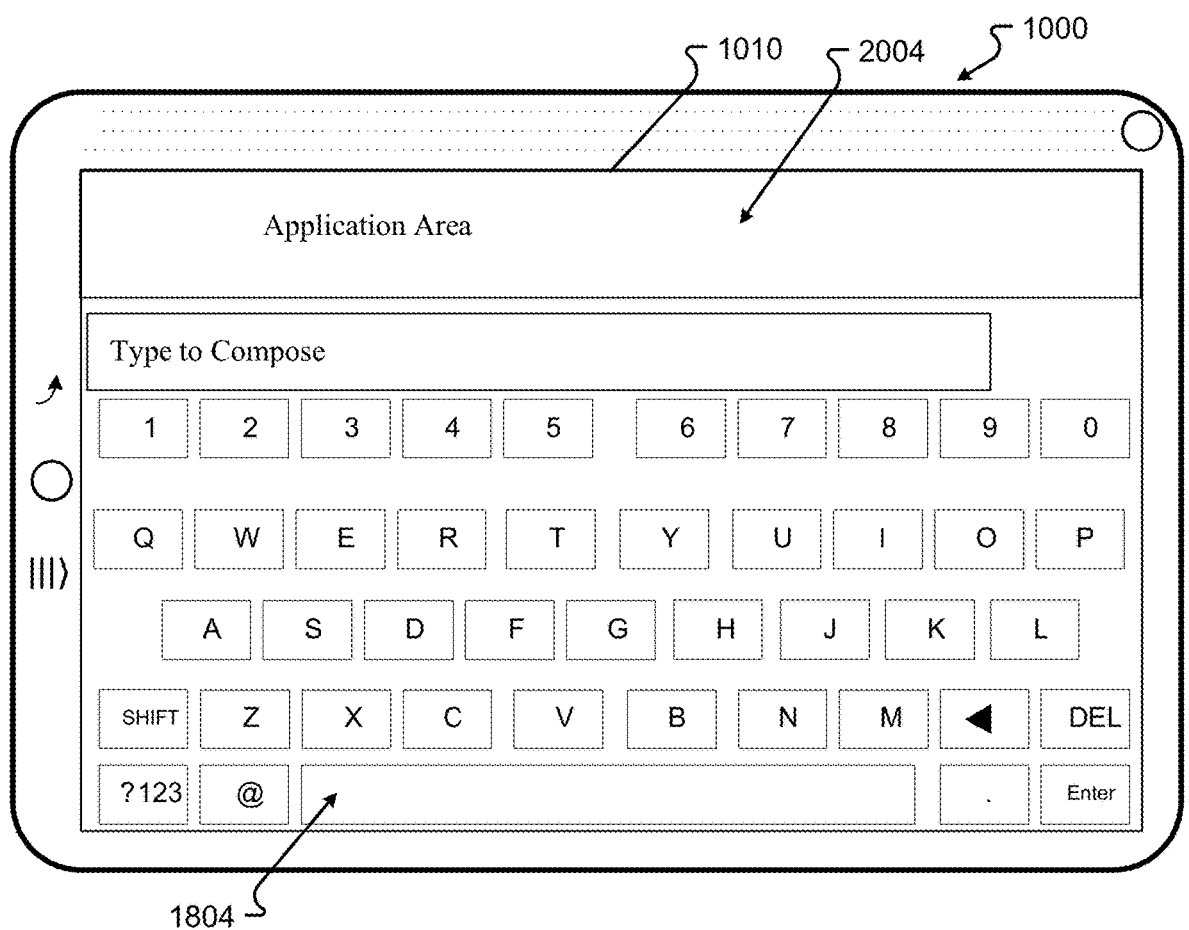
FIG. 57 illustrates an exemplary keyboard configuration in landscape mode.

FIG. 57 illustrates an exemplary embodiment where the SP 1000 is in tablet-landscape mode, with a single-application running in application area 2004. In this mode, the virtual keyboard 1804 can consume, for example, anywhere from approximately 40 to approximately 80% of the display 1010. In accordance with one exemplary embodiment, the virtual keyboard 1804, via a gesture, can be one or more of moved and zoomed to different locations within the display 1010, to, for example, show more of the applications in area 2004.

Figure 58:
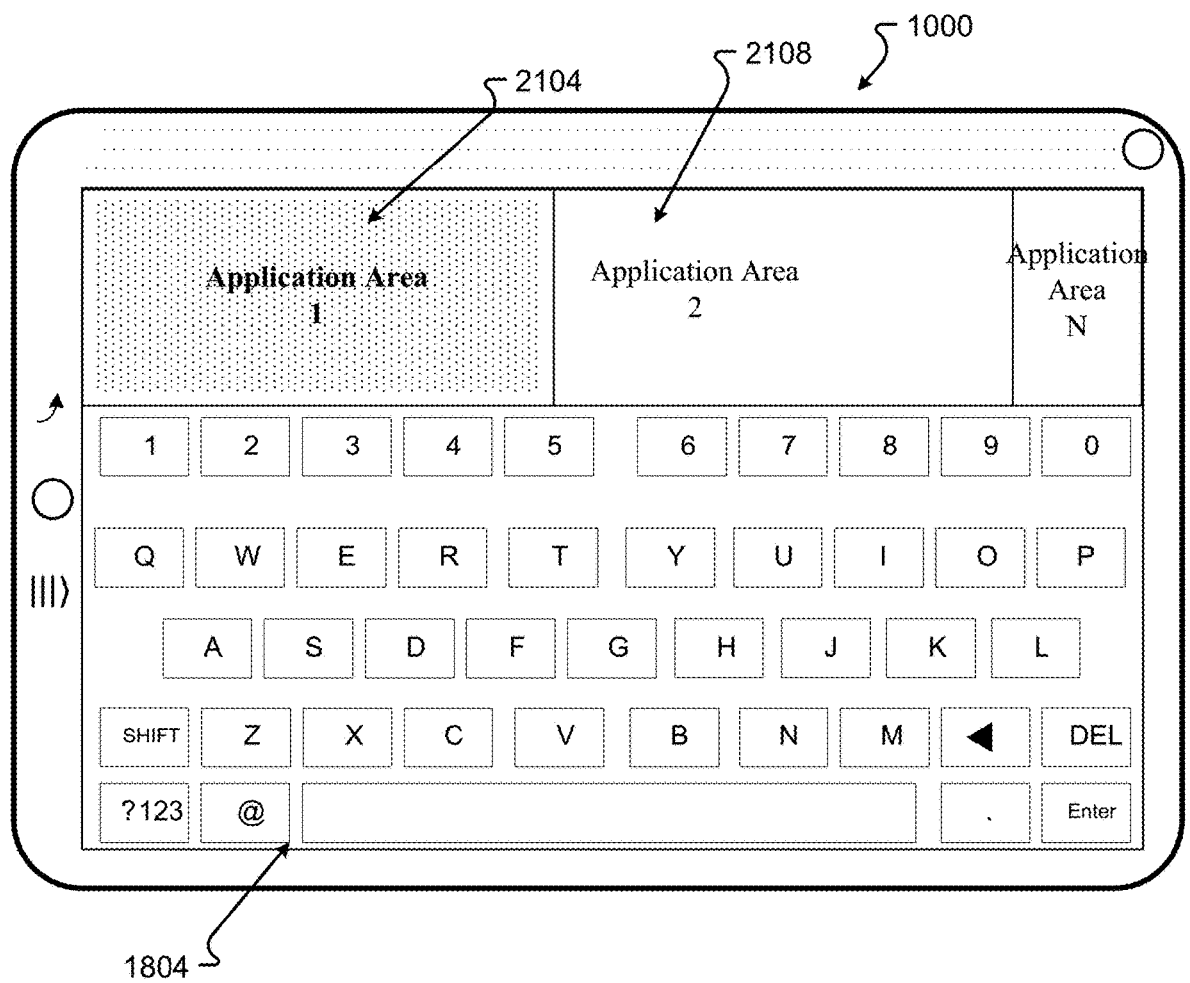
FIG. 58 illustrates an exemplary keyboard configuration in landscape mode.

In FIG. 58, when the SP 1000 is in a landscape orientation, in a dual-application mode, the keyboard 1804 can be identical to the keyboard discussed above, with either one of the applications in view having keyboard focus. In this exemplary embodiment, application area 1204 is in focus, and is therefore associated with input from the keyboard. Here, application area 2208 through application area N are not in focus, and can optionally be dimmed to assist the user with understanding which application is associated with receiving input from the keyboard 1804. As with the above embodiment and via, for example, a gesture, the keyboard 1804 can be manipulated, such as zoomed or repositioned with the corresponding application area(s) and/or resized to consume more or less of the display 1010.

FIGS. 59-67 illustrate exemplary keyboard layouts, some of the keyboard layouts being dynamically chosen based on, for example, an active application. In accordance with one exemplary embodiment, the default keyboard layout can contain the following keys. Character keys: These are regular character keys such as those found in the QWERTY standard keyboard with input from them being input into, for example, an in focus input field. These character keys can be, for example, colored light grey and are also capable of being dynamic, as discussed hereinafter, and can be replaced by other keys when a keyboard layout changes. The shift key modifies the character keys to allow for upper-case letters. Double-tapping on the shift key can lock the device into a CAPS-lock state. A number-punctuation key (?123) can change the character keys into a set of numbered and punctuation keys. Other common keys are a comma key, a space-bar key, a period-key, an enter-key, where the label on the enter-key can be dependent on the input field's properties. Additional common keys are a delete key, a back arrow key, a slider bar, and a tab-key that allows the input focus to step to the next field in a multi-field form.

Figure 59:
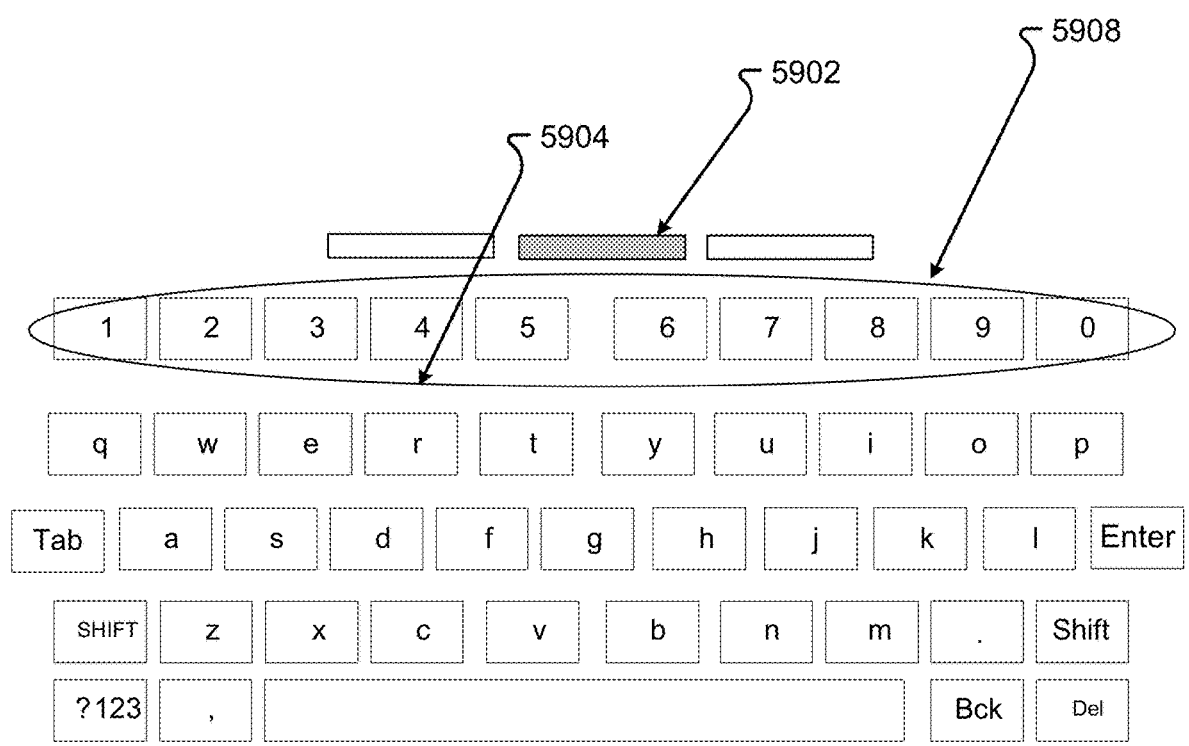
FIG. 59 illustrates an exemplary keyboard and slider configuration.

As illustrated in FIG. 59 a slider bar 5902 is shown that allows for selection of the various slider bar keys 5908. As shown in FIG. 59, slider 5902 is in the default (center) location and the keyboard 5904 is a standard QWERTY keyboard. As discussed hereinafter, the slider-bar 5902 can be manipulated by, for example, a gesture or selection by the user on the touch-sensitive display 1010. While three selectable regions are shown on the slider bar 5902, (corresponding to 3 separate sets of slider bar keys 5908) it should be appreciated that any number of selectable combinations of slider bars and keys can be shown. Similarly, for each of the different types of keyboards described, there could be an associated set of slider bar keys. Optionally, the set of slider bar keys can be keyboard agnostic.

Figure 60:
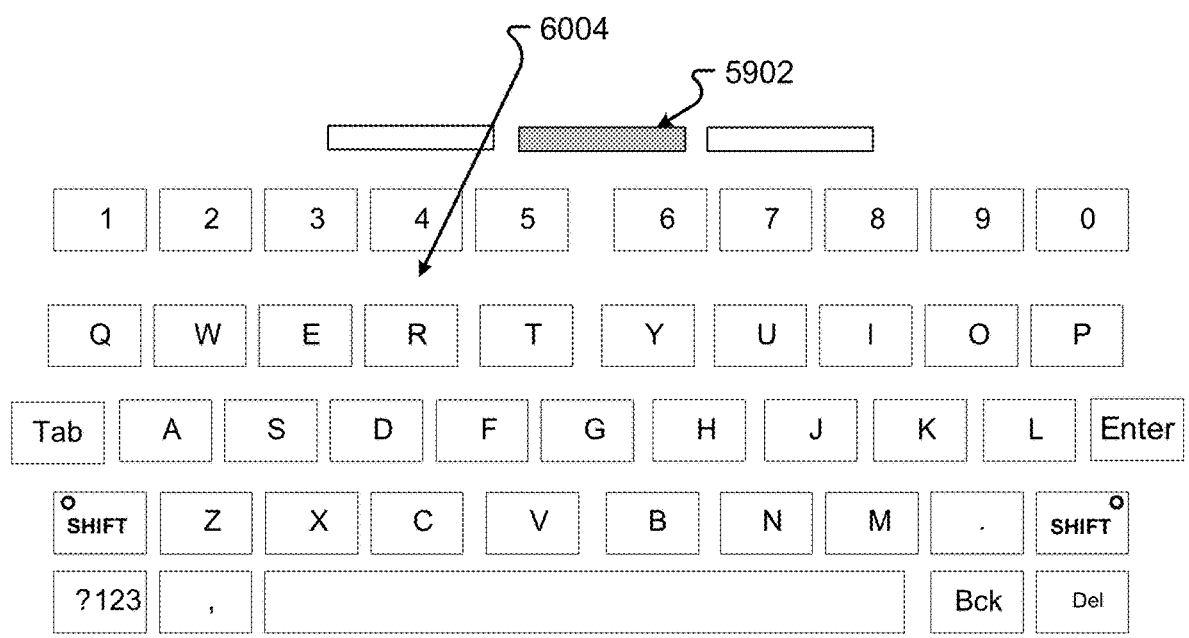
FIG. 60 illustrates another exemplary keyboard and slider configuration.

FIG. 60 illustrates an exemplary uppercase layout of a keyboard. Here, the keys 6004 are in capitals and again, in accordance with this exemplary embodiment, the slider-bar 5902 is highlighted and in the center position. In this exemplary embodiment, the "shift" key is highlighted indicating the keyboard is in a caps-lock mode with selecting of the shift key toggling the keyboard back to normal, lower-case format.

FIG. 61 illustrates an exemplary keyboard in a punctuation/number layout. Here, the punctuation/number keyboard layout contains an ALT key that modifies the character keys to an alternative set of punctuation keys, and an ABC key that modifies the character keys back to the standard keyboard layout. As illustrated in this exemplary embodiment, the slider-bar 5902 defaults to another location within the slider bar highlighting the fact that another set of slider keys is shown.

In conjunction with this punctuation/number layout, alternative keys such as .com, .net, direction arrows, slash signs, and the like, that are commonly used with internet navigation, are also provided.

In accordance with an optional embodiment, blank keys can be provided in one or more of the slider and keyboard area than can be customized by a user.

Figure 62:
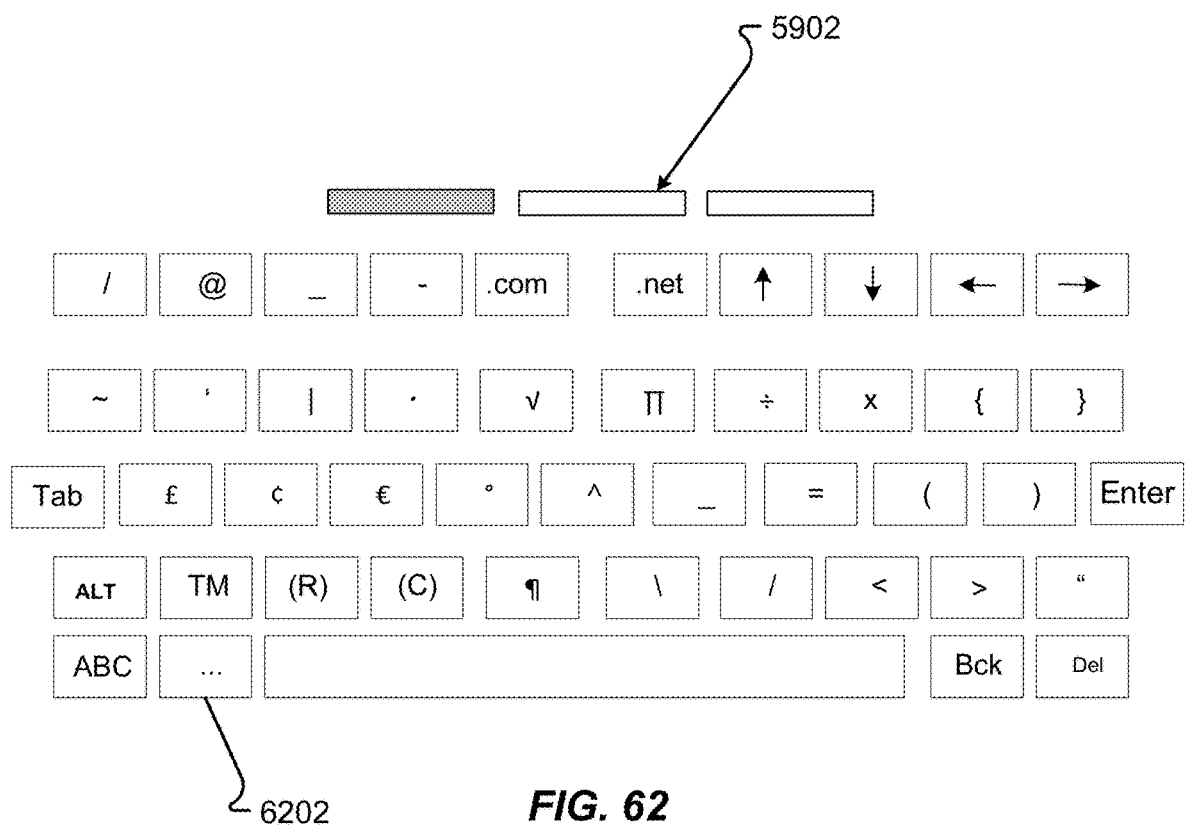
FIG. 62 illustrates another exemplary keyboard and slider configuration.

FIG. 62 illustrates a secondary or alternative punctuation layout. Here, the secondary/alternative punctuation layout contains secondary punctuation keys, which can also include optional currency symbols, and an ALT key which modifies the character keys into the primary set of punctuation keys. Note that the ALT key can optionally be highlighted when this particular layout is shown on the display 1010. The ABC key modifies the character keys back to the standard keyboard layout and additional punctuation keys are provided where tapping of the " . . . " key 6202 can bring up even further punctuation keys.

Figure 63:
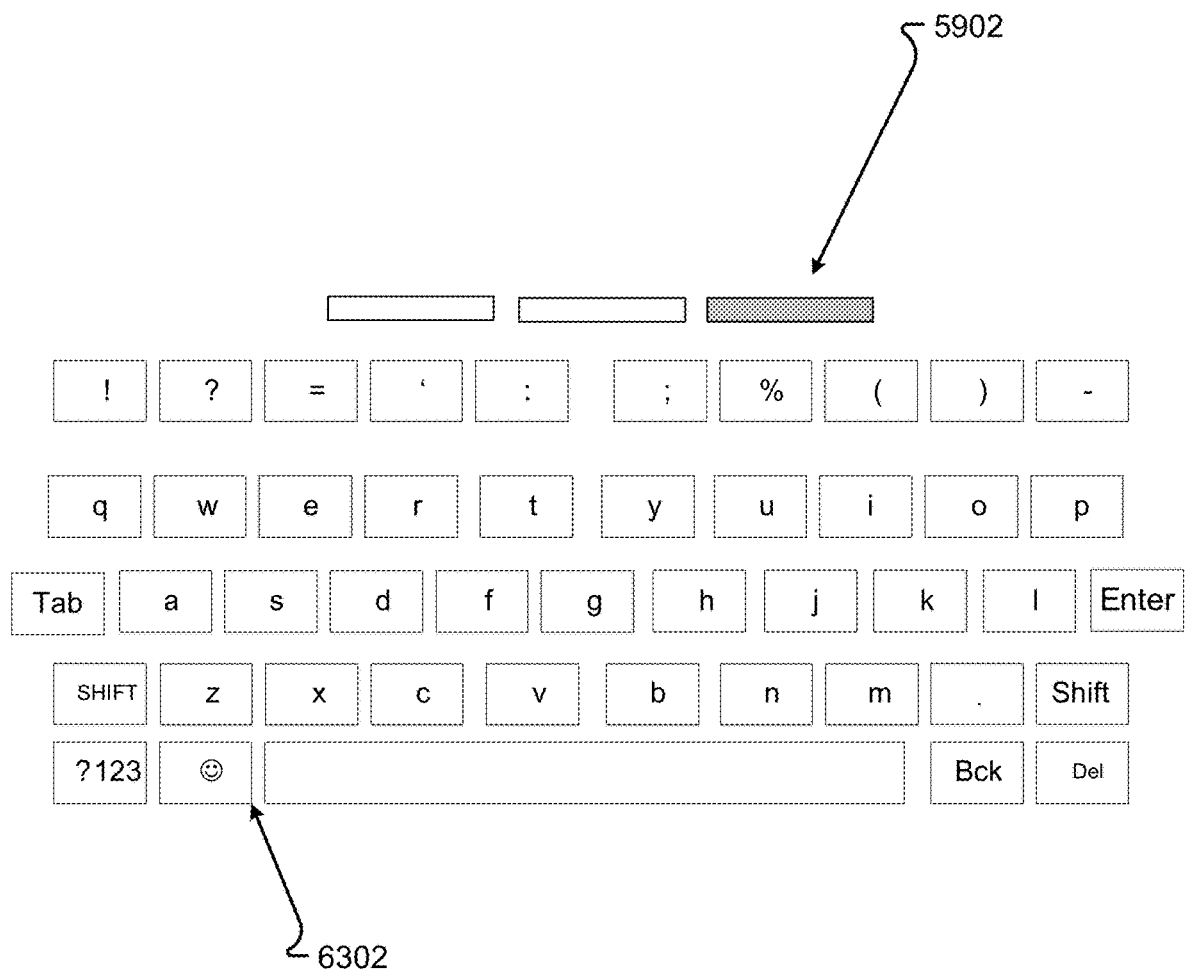
FIG. 63 illustrates another exemplary keyboard and slider configuration.

FIG. 63 illustrates a first exemplary contextual layout keyboard. In this particular exemplary embodiment, the keyboard is the messaging layout that is used for, for example, composing SMS and instant messages. This layout can include optional keys, such as the smiley key 6302, with the slider bar illustrated in another position indicating that another set of slider keys are shown.

Figure 64:
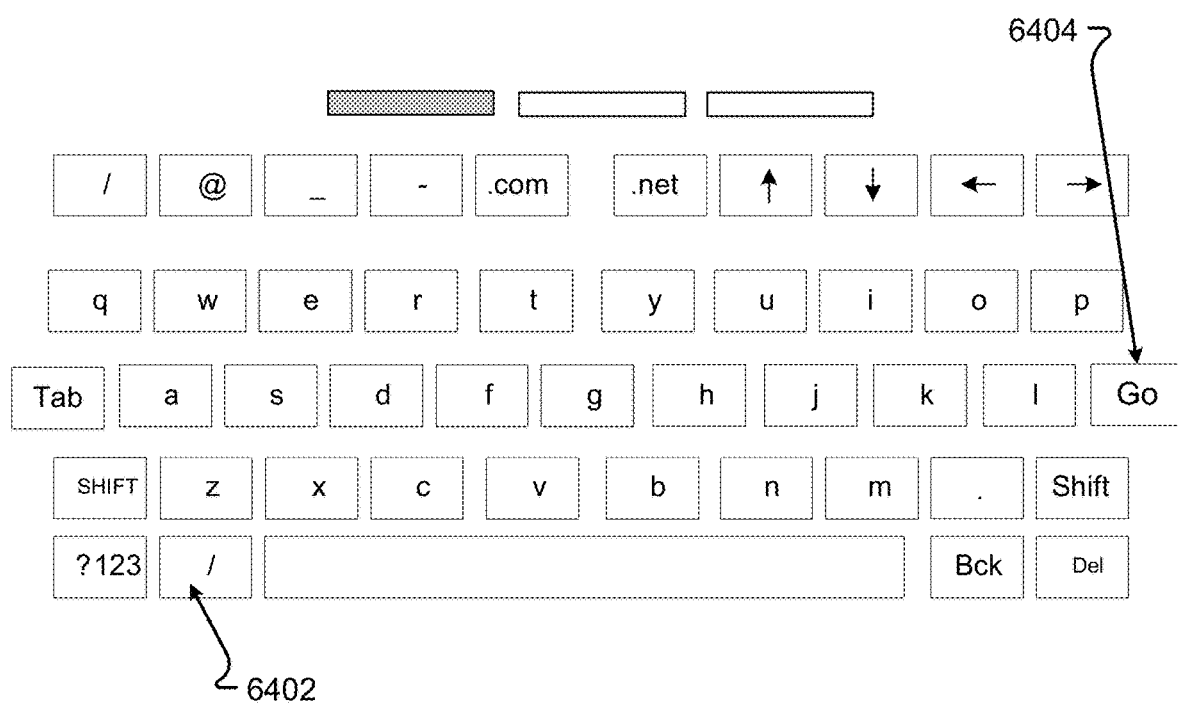
FIG. 64 illustrates another exemplary keyboard and slider configuration.

FIG. 64 illustrates an exemplary URL keyboard layout. This exemplary keyboard can be used, for example, whenever URL's are entered. This layout contains a slash key 6402 and a go key 6404 which replaces the standard enter key.

Figure 65:
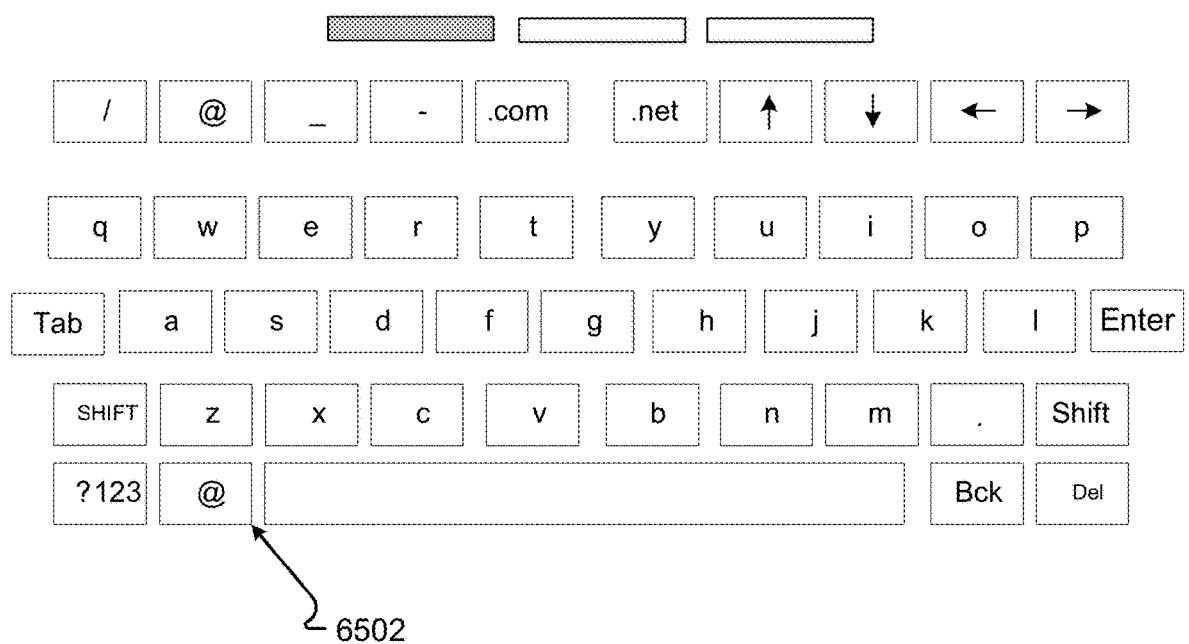
FIG. 65 illustrates another exemplary keyboard and slider configuration.

FIG. 65 illustrates an exemplary e-mail keyboard layout that is used for, for example, entering e-mail addresses. This layout contains the following special key, 6502, where the comma key is replaced with an "@" symbol 6502.

Figure 66:
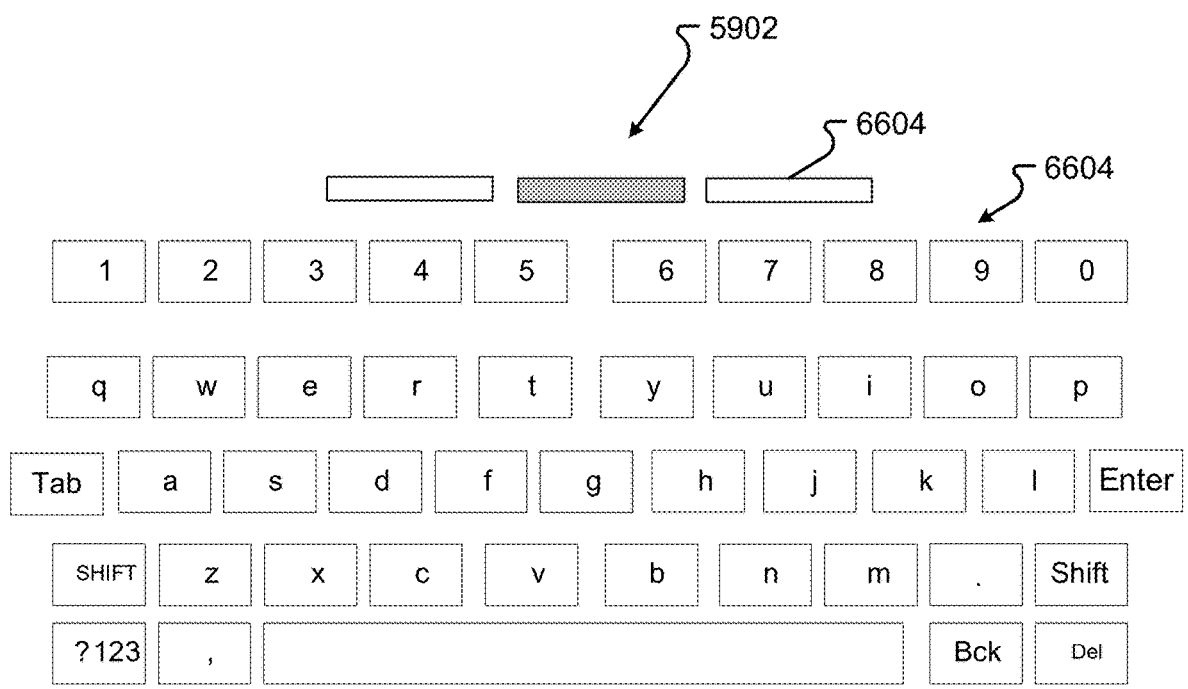
FIG. 66 illustrates another exemplary keyboard and slider configuration.

FIG. 66 illustrates an exemplary web form layout, with this layout being displayed when a multi-field web form is displayed in a web browser and one of the input fields is selected. The web form layout shown here is identical to the default layout with the slider bar 5902 having selected the number bar 6604 as the slider bar keys.

As is to be appreciated, this slider may not be limited to any particular number of corresponding keys as shown in, for example, the number bar position 6604, rather any number of slider bars with corresponding key sets can be created that have any number of keys. As yet another option, there can be 2 or more rows of keys in the slider bay 6604.

Utilizing gesture or other selection means, the selection of any one of the representative block 6604 brings up a corresponding set of keys. In this manner, the keys associated with the selected slider bar can be independent of the keys shown in the various keyboard configurations discussed above. Moreover, the selection of the slider can be dynamic based, for example, on the application in focus.

Figure 67:
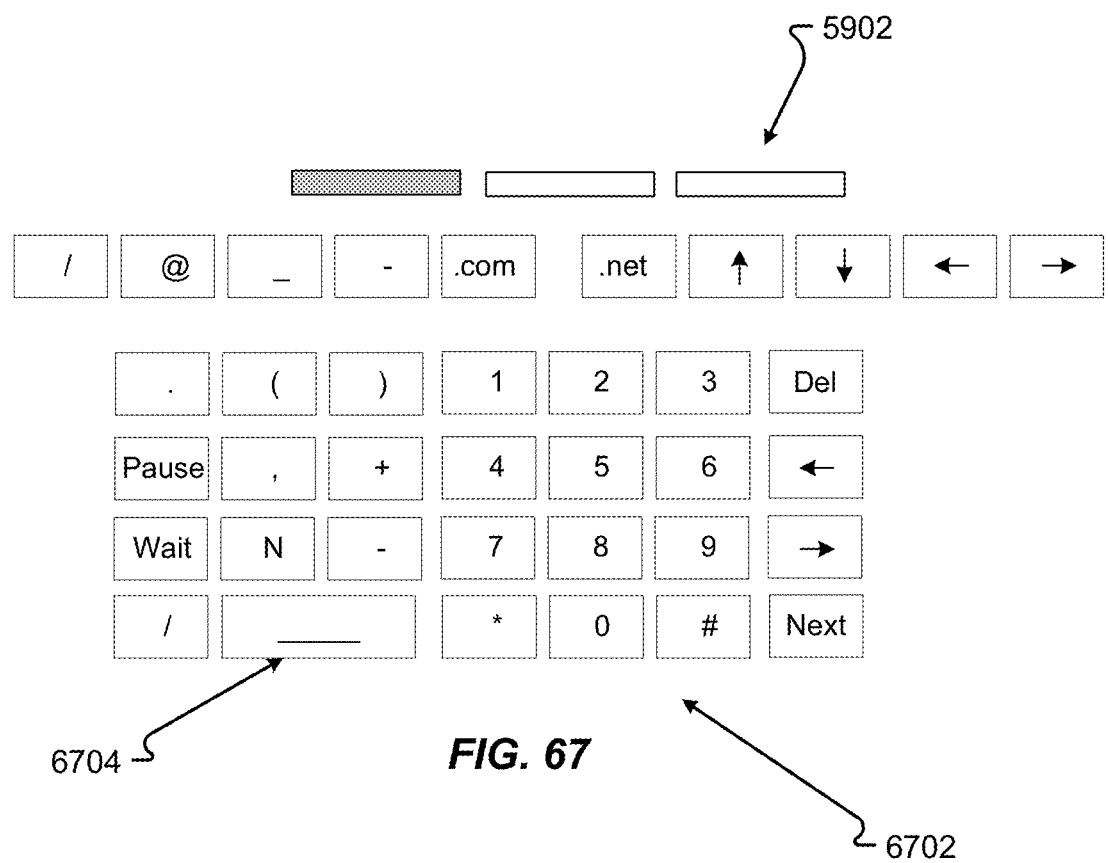
FIG. 67 illustrates another exemplary keyboard and slider configuration.

FIG. 67 illustrates an exemplary numerical layout for a keyboard. Here, and in addition to the number key 6702, a space bar 6704 is provided as well as pause, wait, and next keys. As with the other embodiments, this number layout can be associated with any of the keys corresponding to a selected slider bar.

Figure 68:
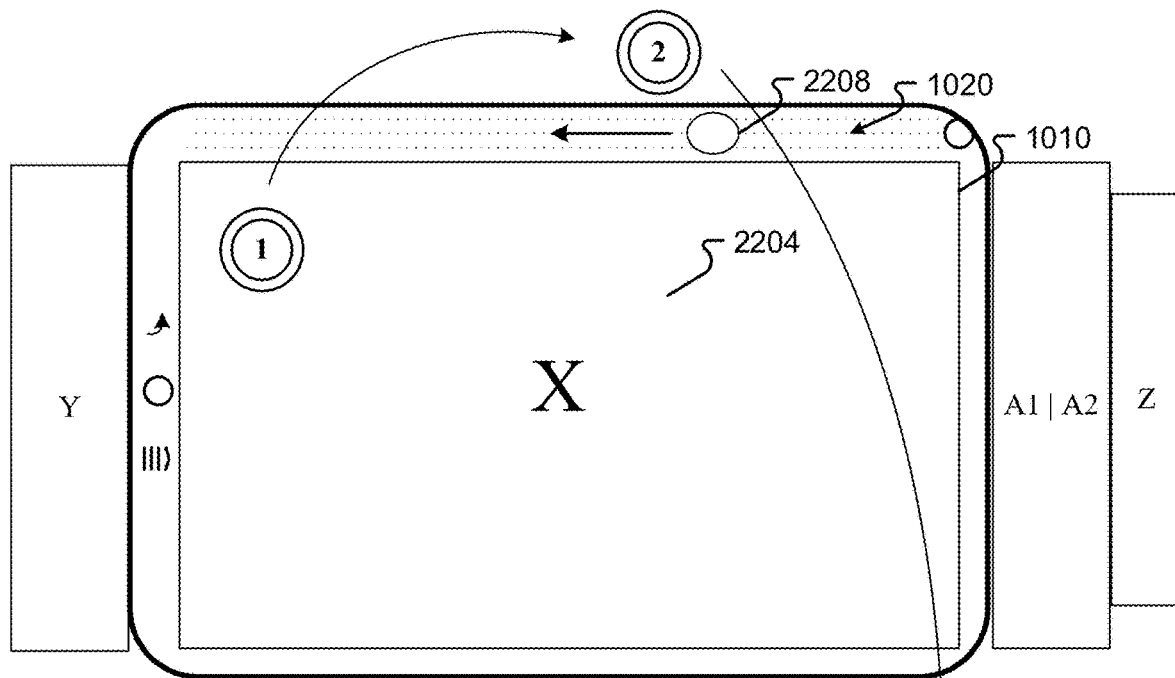
FIG. 68 illustrates exemplary window stack management.
Figure 69:
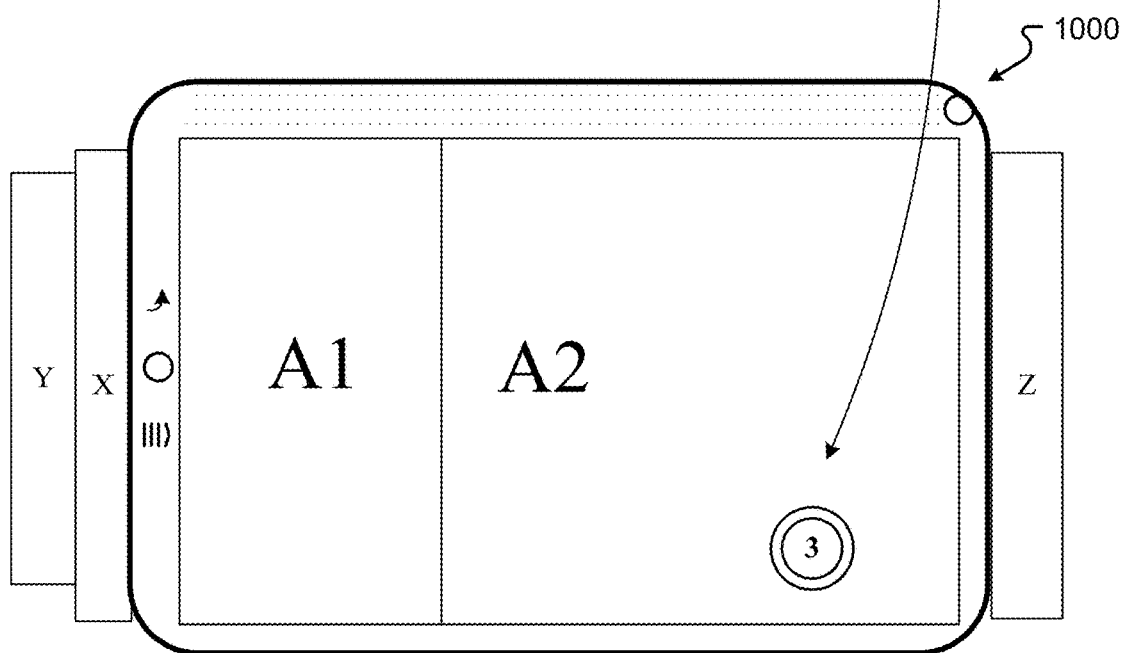
FIG. 69 illustrates exemplary window stack management.

FIGS. 68 and 69 illustrate exemplary methods of managing window positions on the SP 1000. In particular, in FIG. 68, application "X" 2204 is in view on display 1010. On receiving user input, such as a gesture or swipe motion represented by 2208 in the gesture capture region 1020, application X is "scrolled" or moved to the left to be replaced with the dual-screen application A1|A2, as shown in FIG. 69. If the same gesture 2208 were to be repeated again, application Z would come into view. This type of action allows "scrolling" through one or more of the applications in the application stack. As previously discussed, the applications can be stored or represented linearly in nature, where in accordance with this exemplary embodiment application Y is on one end of the stack, and application Z on the other end of the stack. Upon reaching the end of the stack, one or more of audio or visual feedback could be presented to the user indicating that they have reached the end of the stack.

In accordance with an optional embodiment, the applications revolve in a "Rolodex" type fashion such that after application Z is reached, and the user "scrolls" to the left again, application Y would be presented. As illustrated in FIGS. 68-69, the stepwise process to initiate movement and display to another application in the stack commences with a gesture in one or more of the gesture capture region 1020 and touch sensitive display 1010 as represented by item 2. Here, the active application X, represented by item 1, can gradually transition off the display 1010, or disappear in favor of the dual-screen application which is illustrated in max mode, as illustrated by item 3 in FIG. 69. Repeating of this sequence of steps 1, 2, 3, would bring application Z into view on the display 1010 in max mode, since it is a single screen application.

Figure 70:
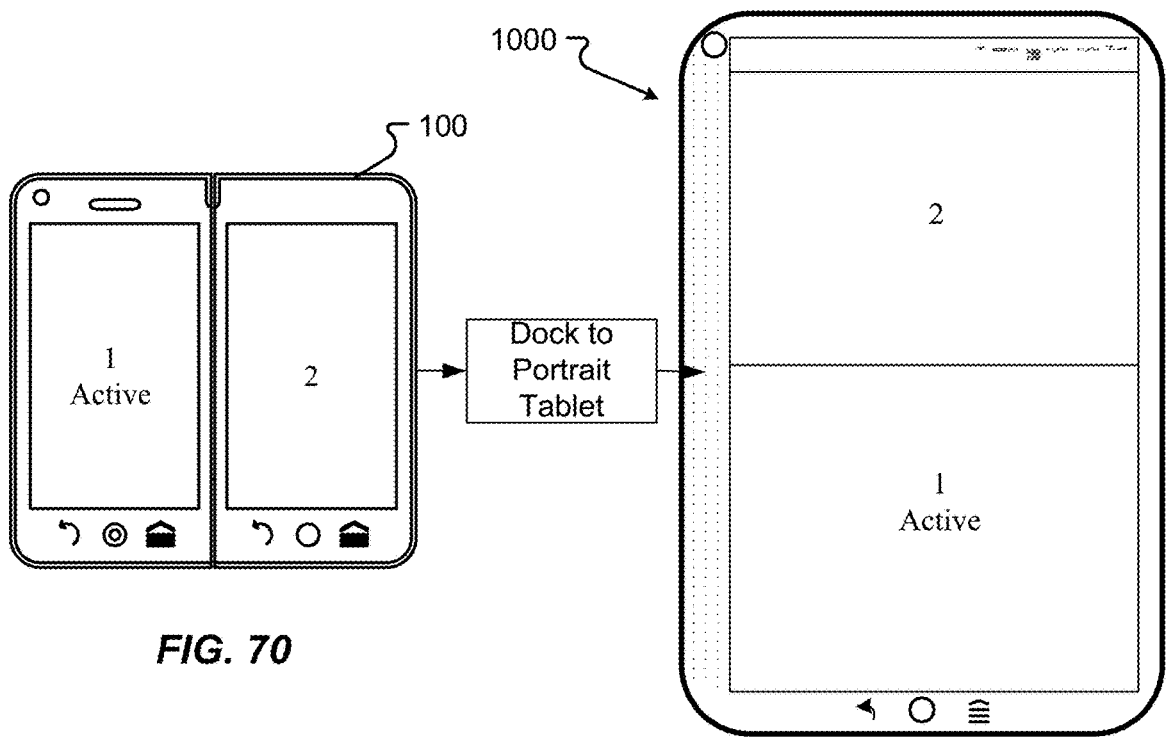
FIG. 70 illustrates exemplary window/application management upon docking.
Figure 71:
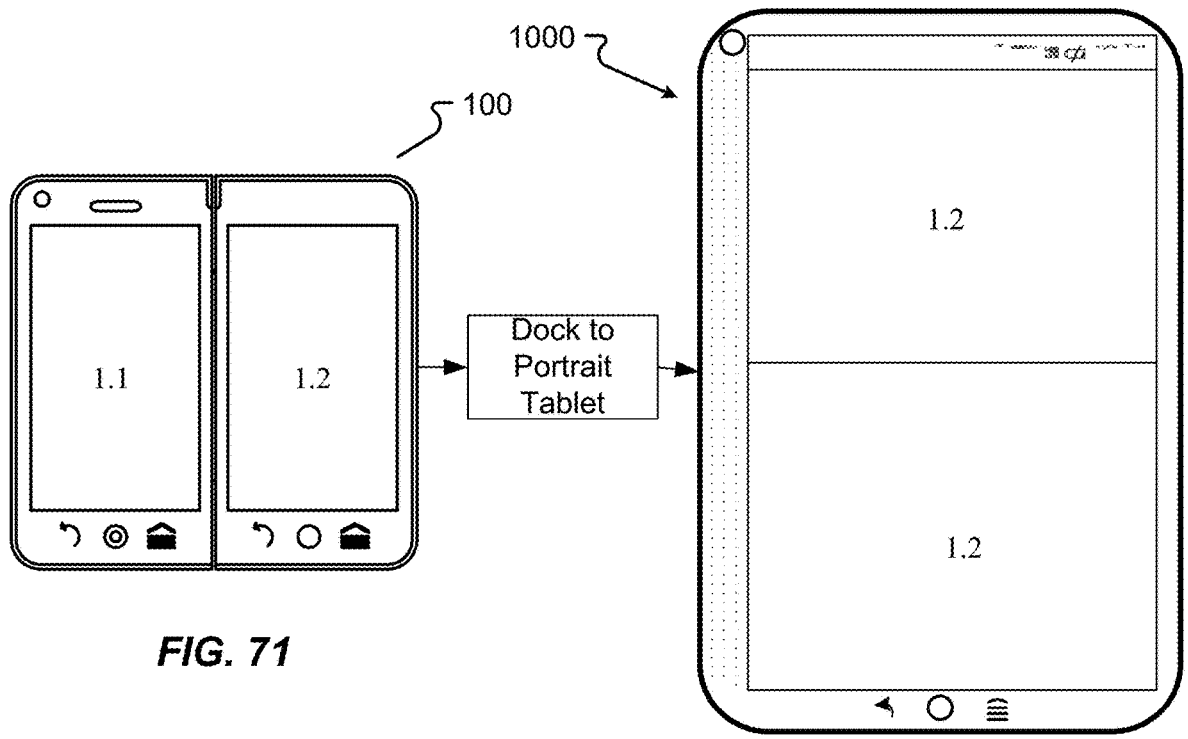
FIG. 71 illustrates exemplary window/application window management upon docking.

FIGS. 70 and 71 illustrate docking to a portrait tablet in dual application mode. Here, when the device 100 is docked to a portrait SP 1000, the device is always in a portrait dual orientation. Upon docking, the applications need to be re-oriented on the SP accordingly, this is considered a counter-clockwise rotation of the displayed information on device 100. If the SP was last used in single application mode, the mode would be remembered upon a re-docking event occurring with the device 100.

As shown in FIG. 70, the device 100 with two single-screen applications is docked to a portrait as SP 1000 in dual-application mode. Here, focus remains on the application that was in focus on the device 100. Here, active application 1 on device 100 remains as active application 1 on SP 1000. In FIG. F1, device 100 with one dual-screen application is docked to a portrait SP in dual-application mode. Here, gravity drop is applied so that application 1.2 fills the display on SP 1000.

Figure 72:
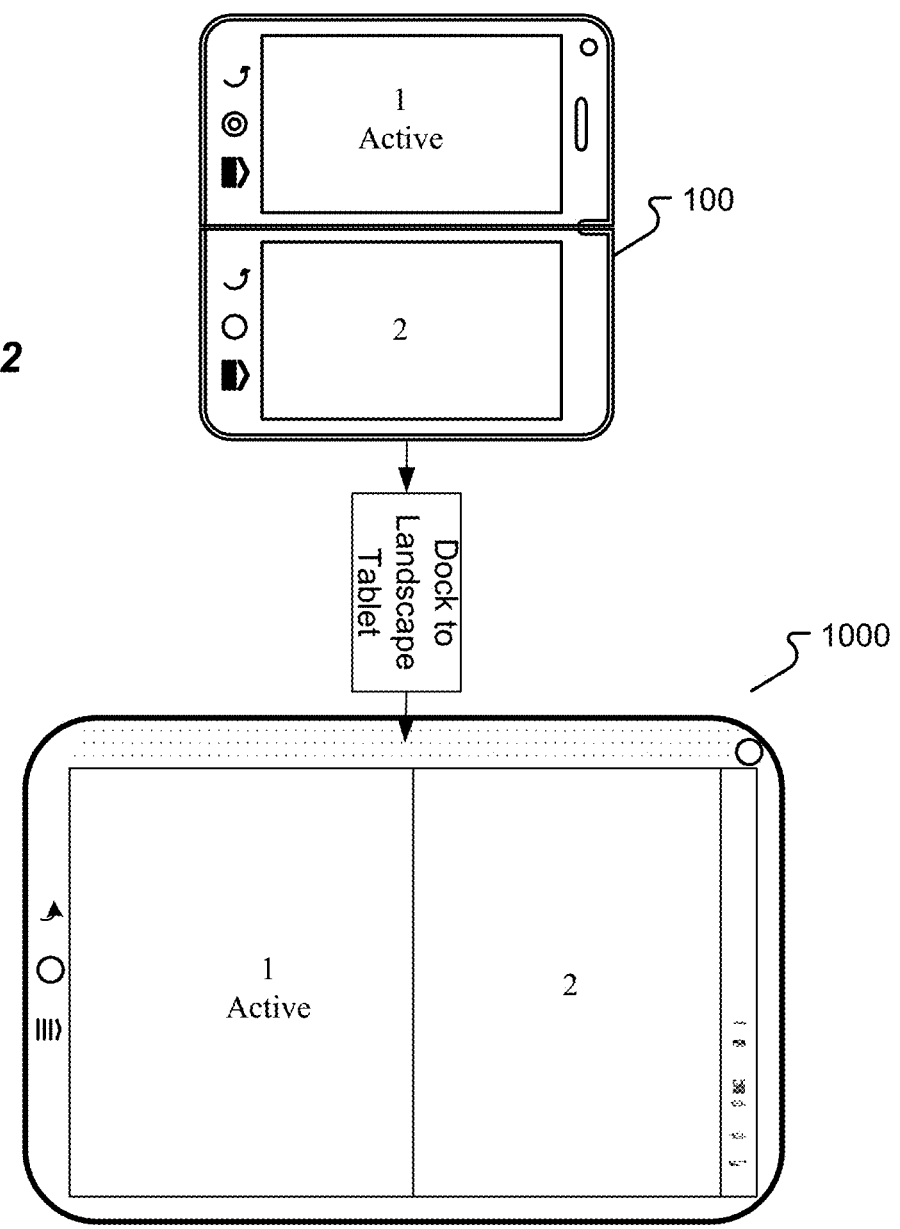
FIG. 72 illustrates exemplary window/application window management upon docking.

FIG. 72 illustrates docking to a landscape SP running in dual application mode. Here, when the device 100 is docked to a landscape SP, the device is always in landscape dual orientation. Upon docking, the applications on the device need to be re-oriented on the SP accordingly (this is considered a counter-clockwise rotation of the device). If the SP was last used in a single application mode, the mode could be remembered upon a re-docking of the handset. As more particularly illustrate in FIG. 72, the device 100 with two single-screen applications is docked to a landscape SP in dual-application mode. Focus remains on the application that was in focus on the device, here, application 1.

Figure 73:
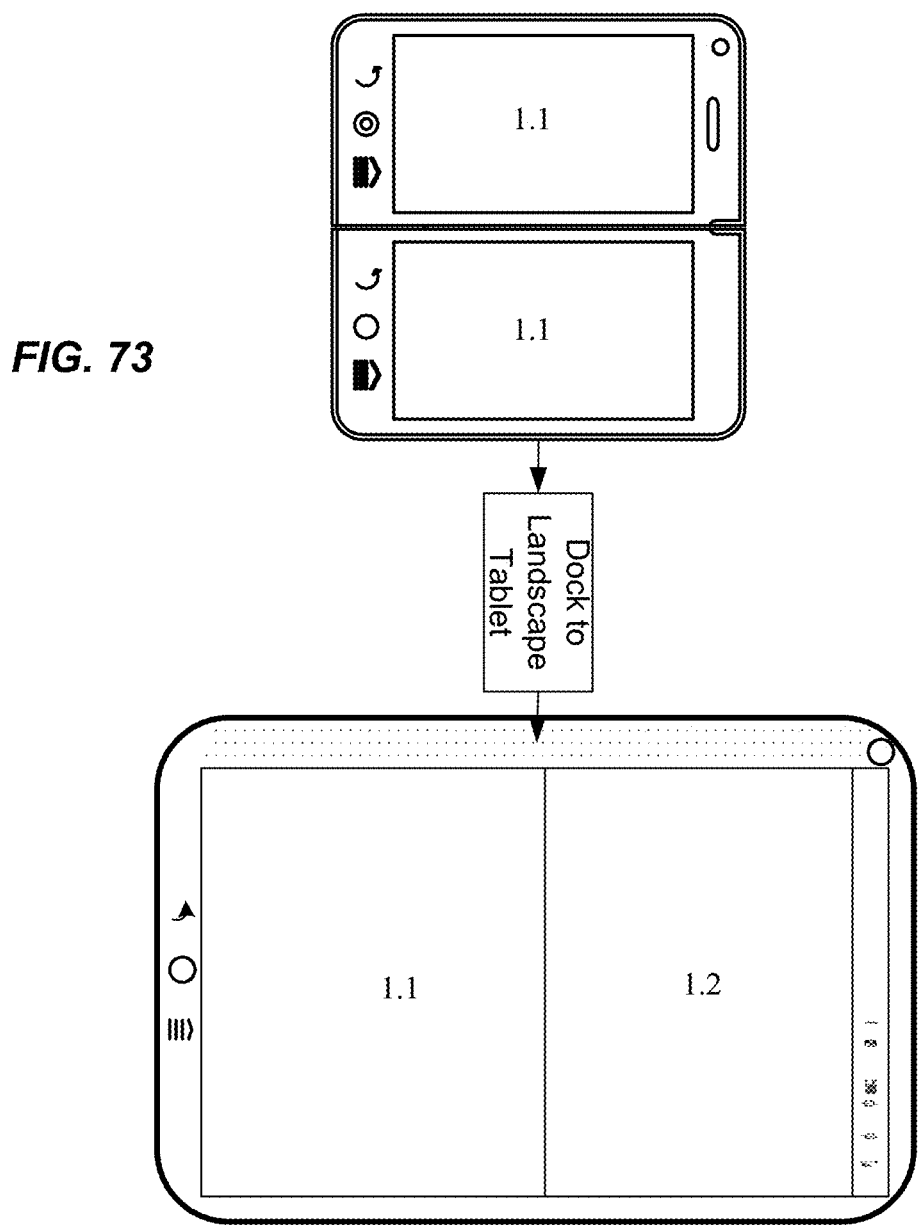
FIG. 73 illustrates exemplary window/application window management upon docking.
Figure 74:
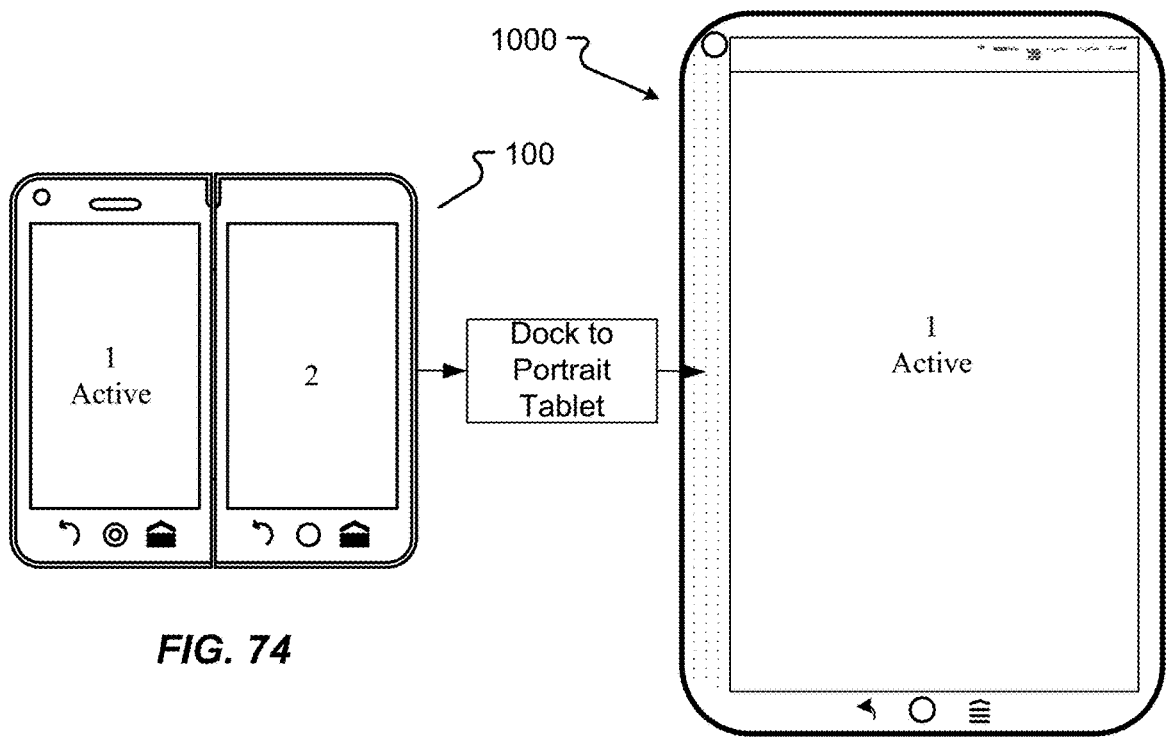
FIG. 74 illustrates exemplary window/application window management upon docking.
Figure 75:
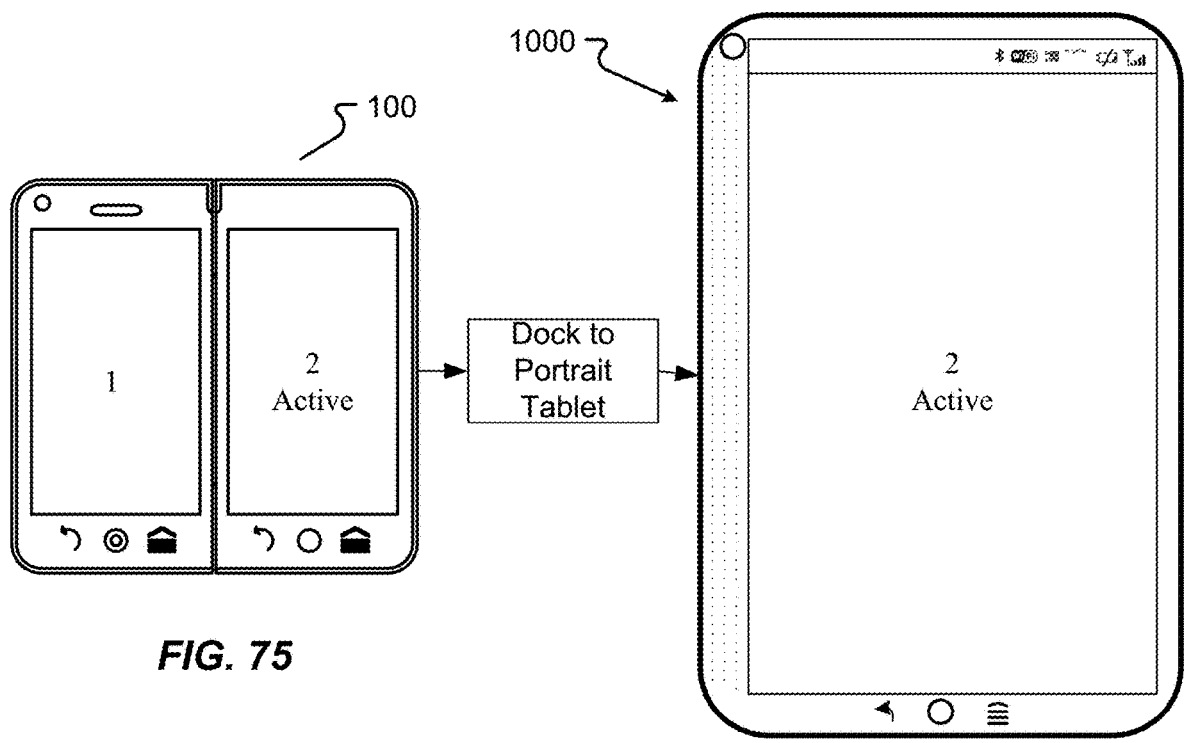
FIG. 75 illustrates exemplary window/application window management upon docking.

In FIG. 73, the device 100 with one dual-screen application is docked to a landscape SP in dual-application mode. FIGS. 74 and 75 illustrate the docking of the device 100 to the SP 1000 in portrait-single application mode, where the applications on the device 100, are shown in focus on the SP 1000.

FIGS. 76-79 illustrate docking to a portrait oriented SP running in single-application mode. Here, as the device 100 is always open during docking, the only "mismatch" can happen when docking to a SP in single application mode. As a general rule of thumb, the application in focus remains visible on the SP. If the SP was last used in single application mode, the mode could be remembered upon a re-docking event.

Figure 76:
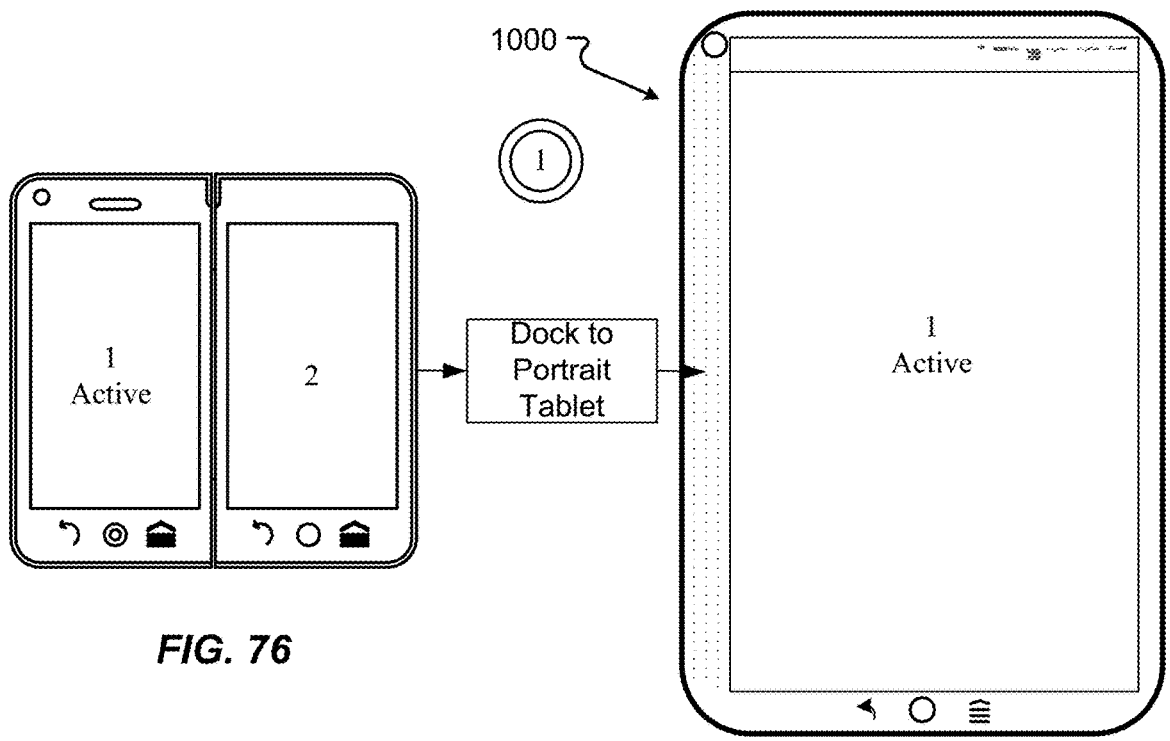
FIG. 76 illustrates exemplary window/application window management upon docking.
Figure 77:
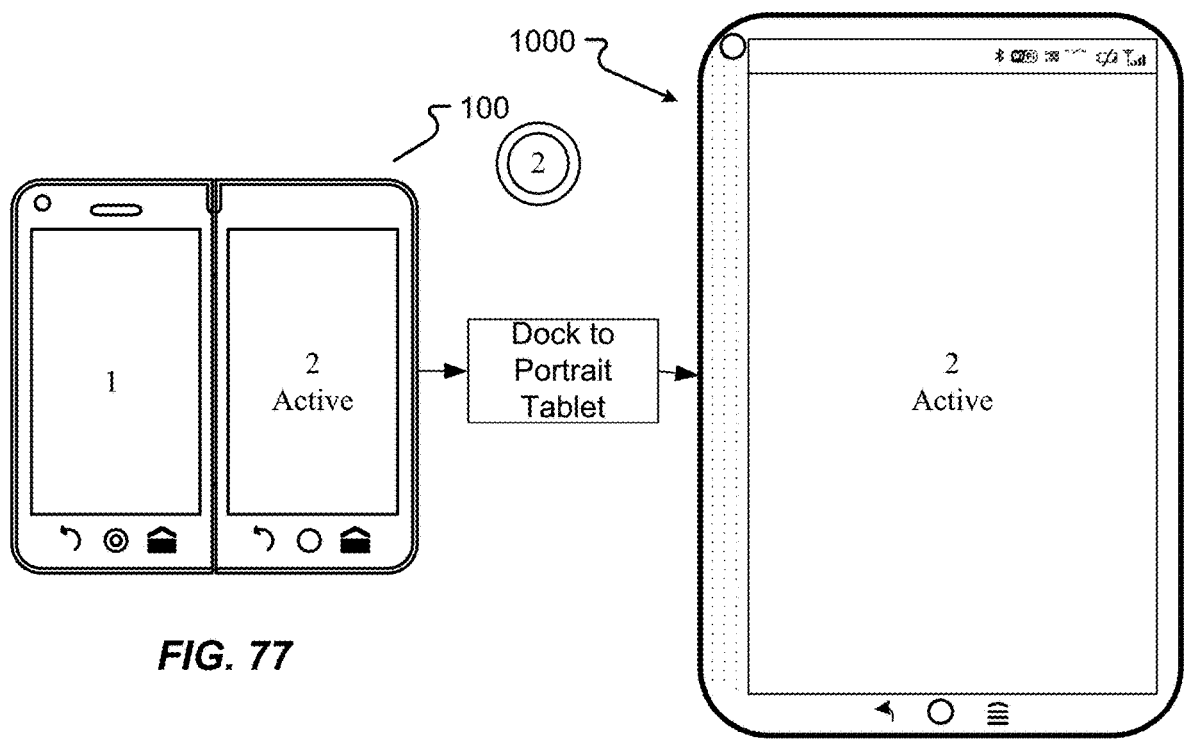
FIG. 77 illustrates exemplary window/application window management upon docking.
Figure 78:
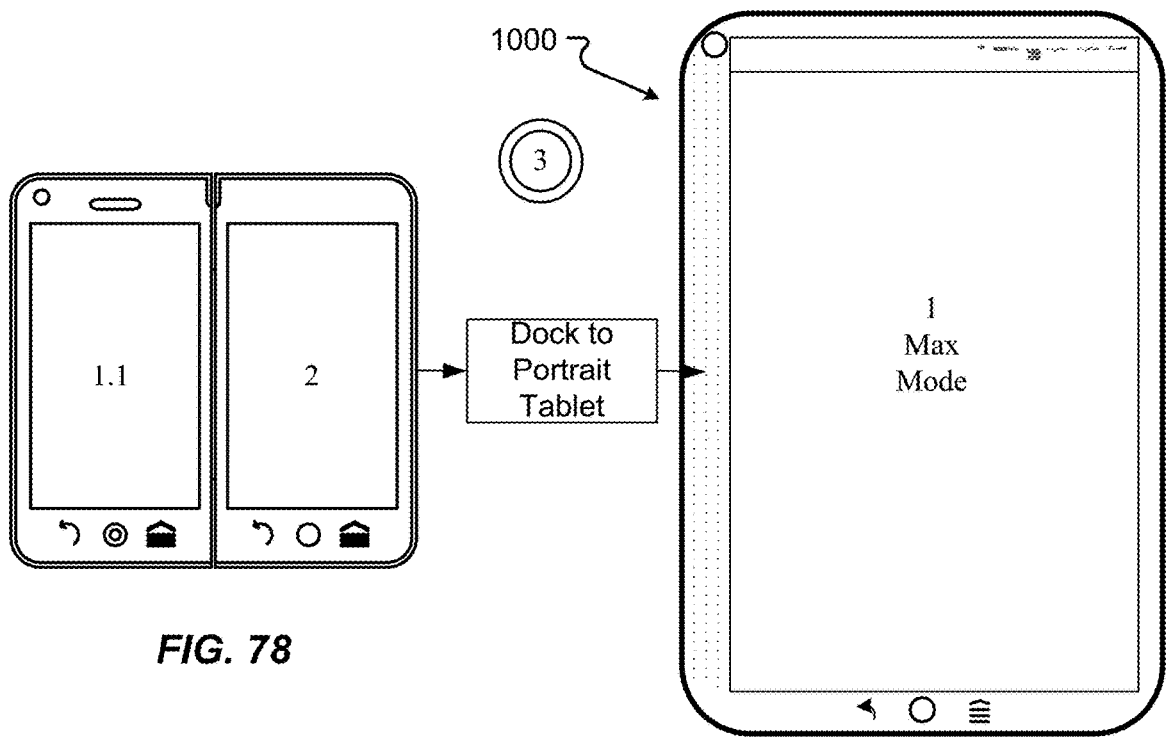
FIG. 78 illustrates exemplary window/application window management upon docking.

As illustrated more particularly in FIG. 76, application 1 is in focus upon docking to a single-application mode SP, where application 1 remains visible and in focus after docking. As shown in sequence 2 in FIG. 77, application 2 is in focus on the device 100 and upon docking to the single-application mode SP 1000, application 2 remains visible and in focus. Sequence three as illustrated in FIG. 78 illustrates a minimized dual-screen application being in focus when the device 100 is docked into the SP in single-application mode. Here, the application will be presented in its max mode on the SP 1000 as shown.

Figure 79:
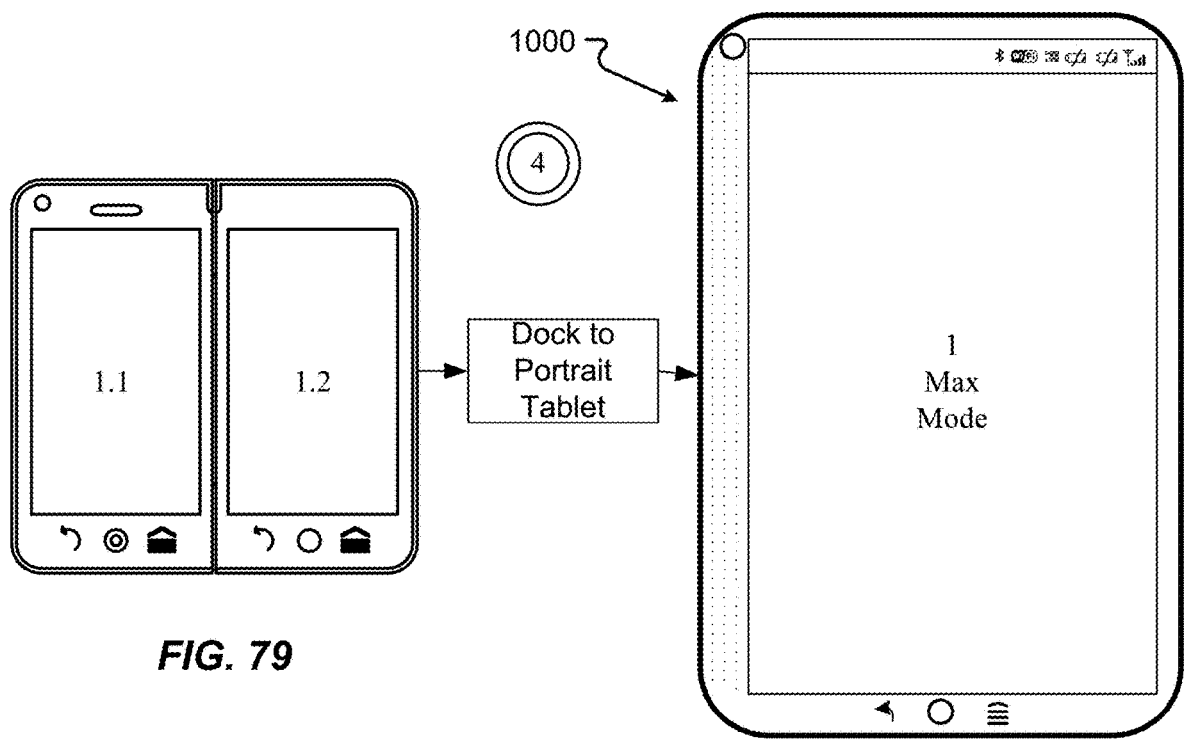
FIG. 79 illustrates exemplary window/application window management upon docking.
Figure 80:
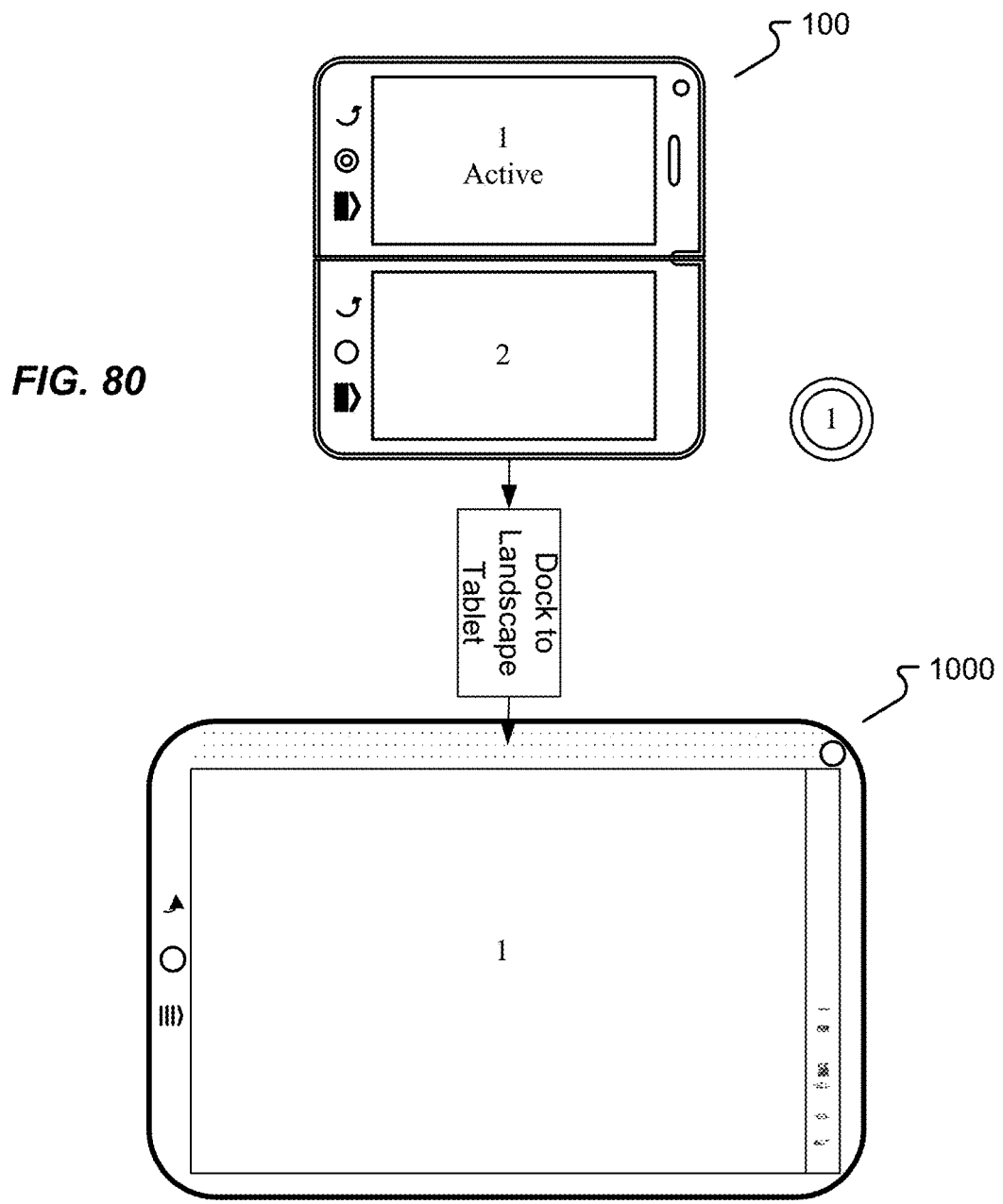
FIG. 80 illustrates exemplary window/application window management upon docking.
Figure 81:
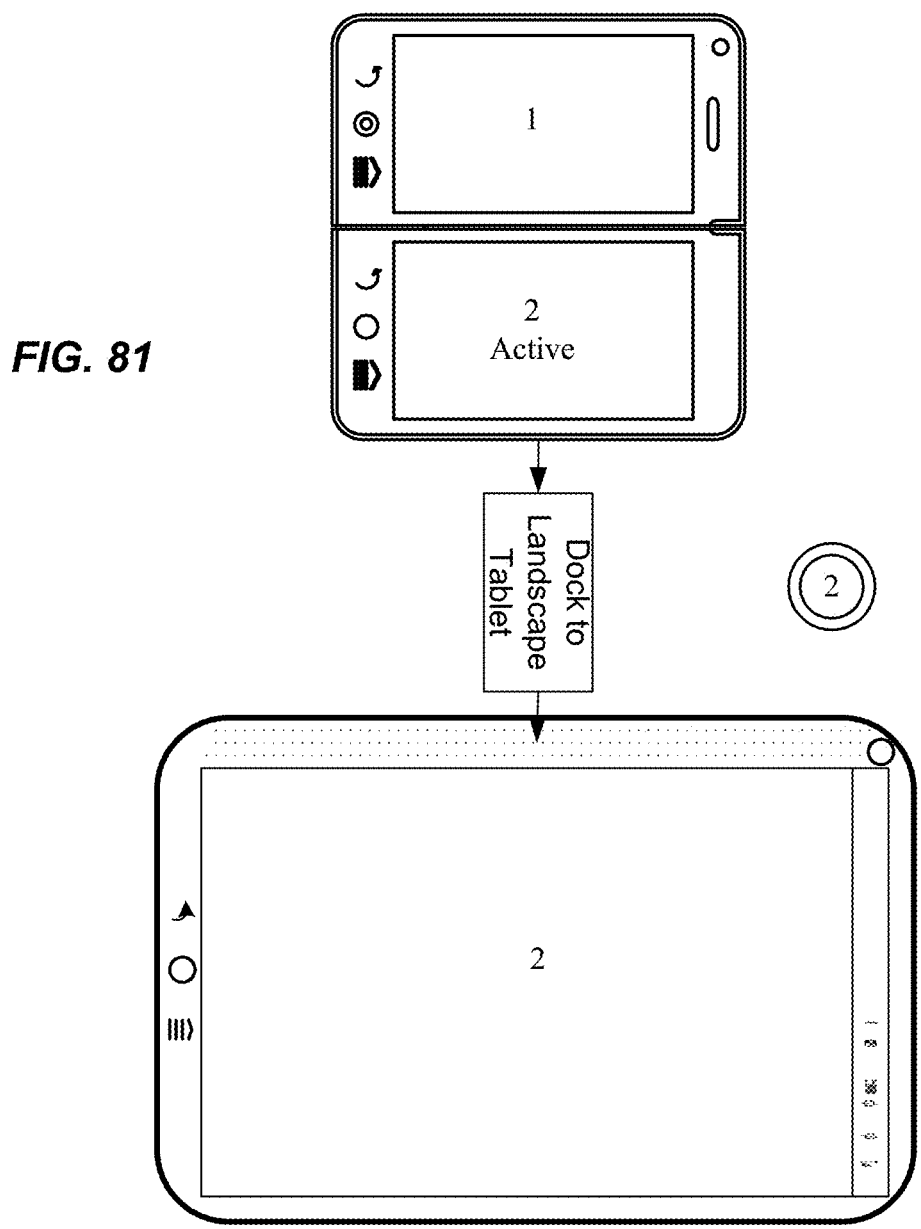
FIG. 81 illustrates exemplary window/application window management upon docking.

Sequence four as illustrated in FIG. 79 shows the situation where a maximized dual-screen application is in view when the device is docked to the SP in single-application mode. Here, the application will be presented in max mode on the SP 1000.

FIGS. 80-83 illustrate docking to a landscape oriented SP 1000 running in single-application mode. Here, if the SP was last used in single-application mode, the mode could be remembered upon a re-docking event as discussed above. As shown in sequence one illustrated in FIG. 80, application 1 is in focus upon docking to a single application mode SP, where upon docking, application 1 remains visible after docking. In sequence two illustrated in FIG. 81, application 2 is in focus upon docking to a single-application mode SP, and application 2 remains visible after docking.

Figure 82:
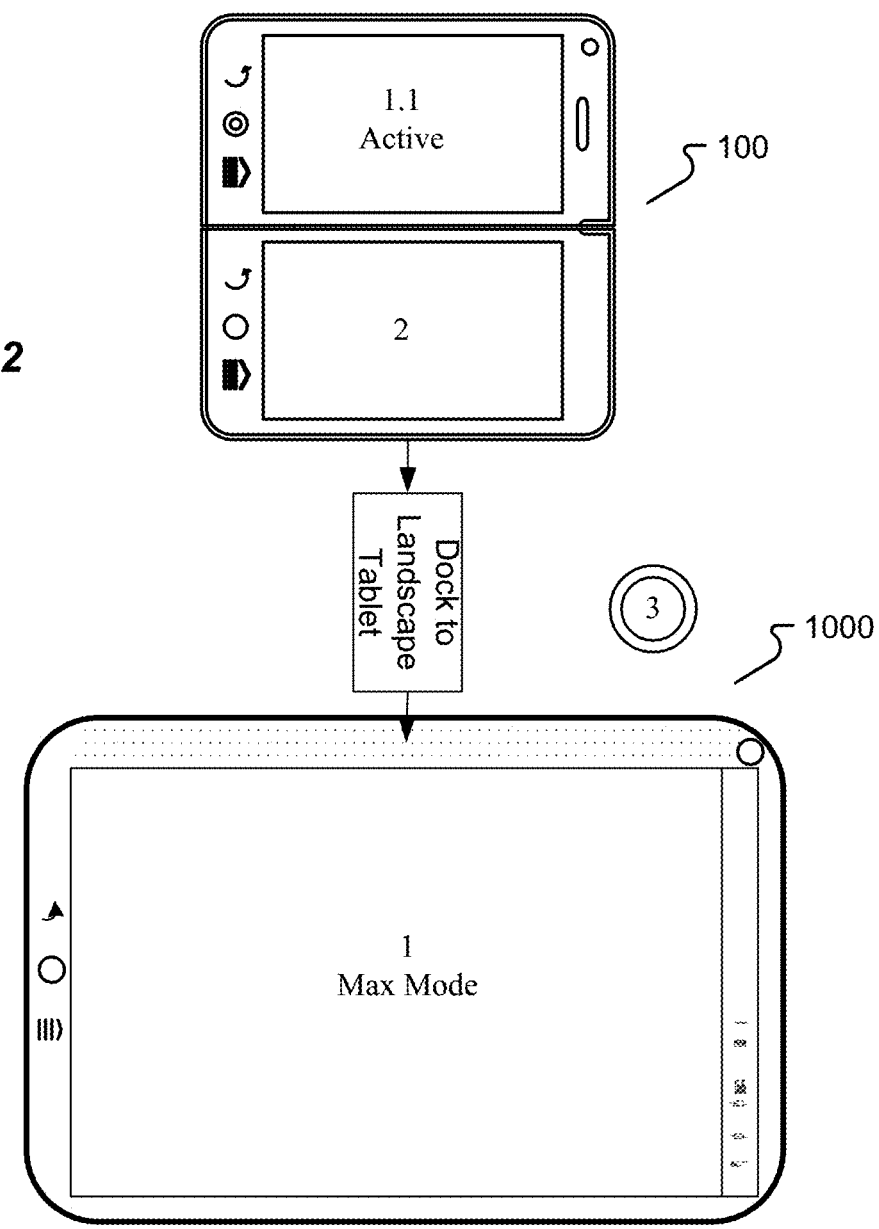
FIG. 82 illustrates exemplary window/application window management upon docking.

Sequence 3 as illustrated in FIG. 82 shows a situation where when a minimized dual-screen application is in focus when the handset is docked to a SP in single-application mode, where the application will be presented in its max mode on the SP 1000.

Figure 83:
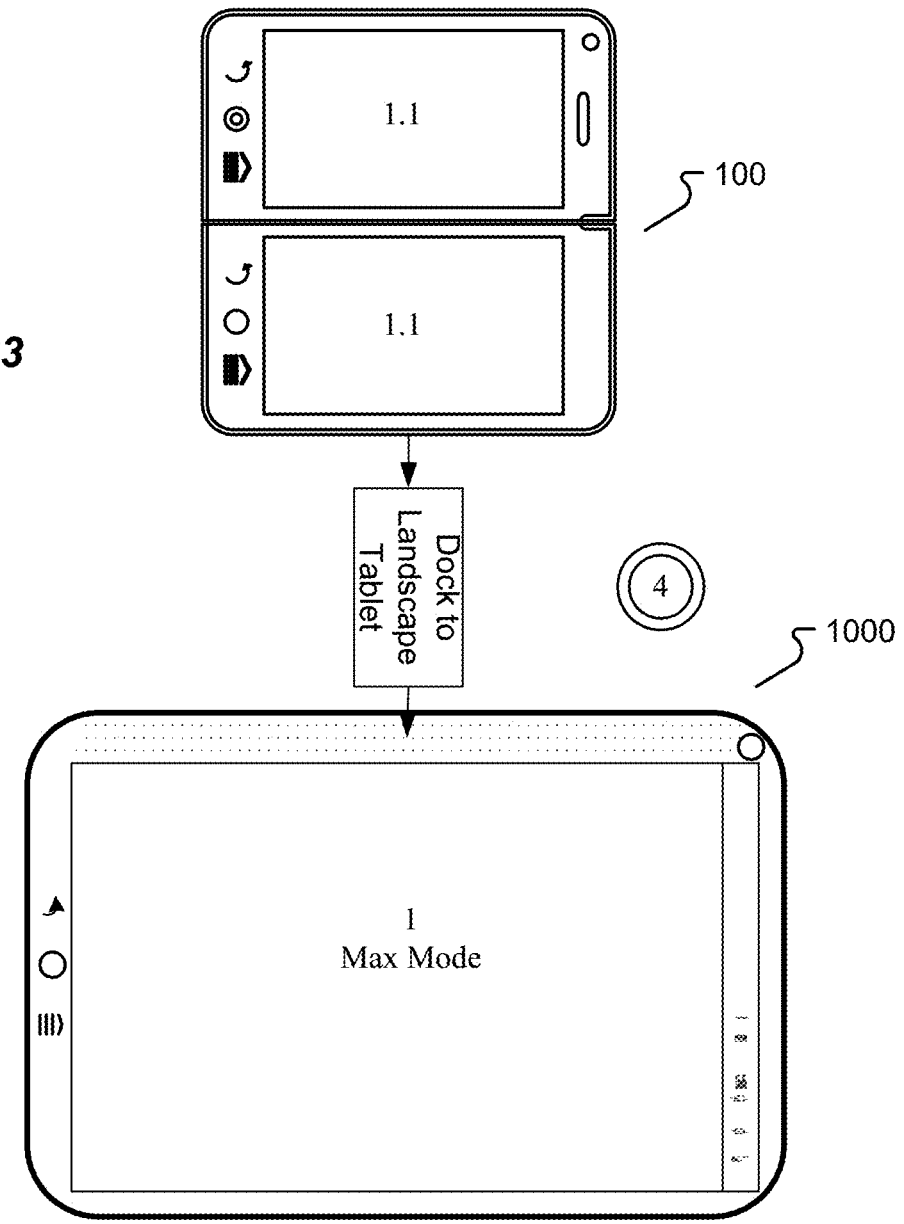
FIG. 83 illustrates exemplary window/application window management upon docking.

Sequence 4 as illustrated in FIG. 83 shows a situation where when a maximized dual-screen application is in view when the device 100 is docked to the SP 1000 in single-application mode, where the application will be presented in its max mode on the SP 1000.

Figure 84:
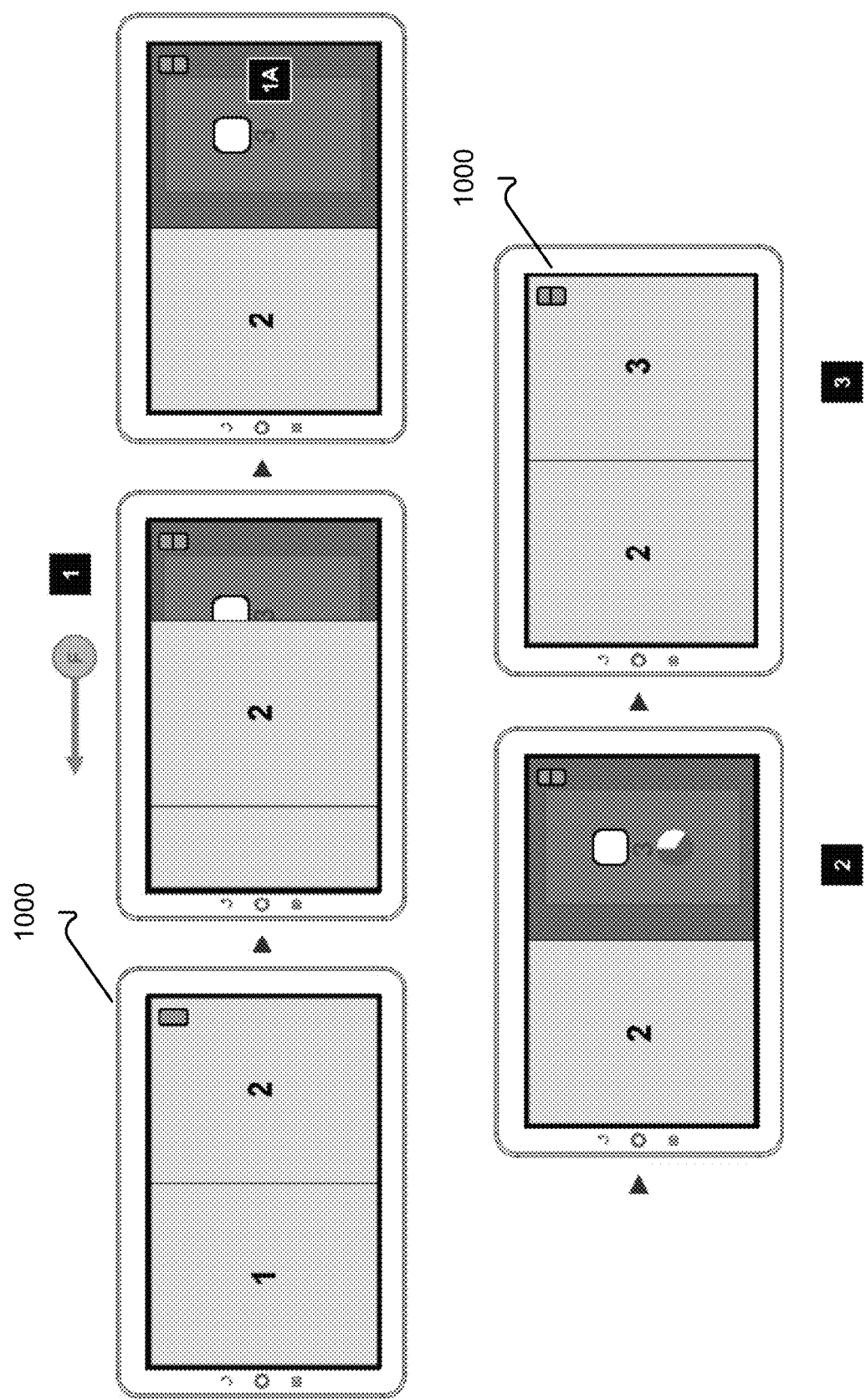
FIG. 84 illustrates exemplary window management after docking.

FIG. 84 illustrates exemplary window management after docking. In general, and in accordance with an exemplary embodiment, when applications are stacked through window management events, a screenshot can be captured to represent one or more of the applications in the stack. The introduction of the SP 1000 introduces a new level of complexity in handling window management events and application screenshots. In addition to the orientation of the device having potentially changed, the device may have also been docked or undocked as well. This could cause the stacked image to be the wrong size, aspect ratio, and/or the like.

As illustrated by step one in FIG. 84, when the application is revealed in the stack and is the wrong size, the application screenshot can be displayed as a thumbnail and dimmed. As illustrated by step 1A, to help the user to recognize the application, the application icon can be overlaid on top of the screenshot. Step 2 illustrates than once the screenshot is completely revealed, the application can be activated.

If the application was suspended at the time, an indicator can inform the user that they may have to wait while the application is activated (re-activated). As illustrated by step 3 in FIG. 84, once the application is ready, the application can be displayed at full size and the dimming effect can be removed. If the application was displayed in a different orientation than the corresponding screenshot, the application can also be rotated to its target orientation, if applicable.

The above exemplary steps can occur each time the stored screenshot is not the same size as the destination area(s) for the application. The orientation of the screenshot need not be taken into account when making this decision, only its size. If the application is the exact size, the card from the stack can just be introduced in a normal, full size, not dimmed, and no icon arrangement. The corresponding application can then be activated and rotated if applicable.

Various situations where mismatched screenshot sizes occur on the SP 1000 are discussed below. Note that the orientation of the screenshot consistently matches the orientation of the SP 1000, not necessarily the orientation of the application. Specifically, in FIG. 85, step 4, a screenshot from the device (all orientations) on a landscape tablet dual-application SP 1000.

Step 5 in FIG. 85 illustrates a screenshot from landscape tablet single or portrait tablet single mode on a landscape tablet dual-application SP 1000. As illustrated in step 6, an exemplary screenshot is shown for the device (all orientations) on a landscape tablet single application SP 1000. As illustrated in step 7 in FIG. 85, with a "F" representing a gesture, such as a flip or swipe, the SP 1000 is shown with a screenshot from a landscape tablet dual or portrait tablet dual on a landscape tablet single SP 1000.

Figure 86:
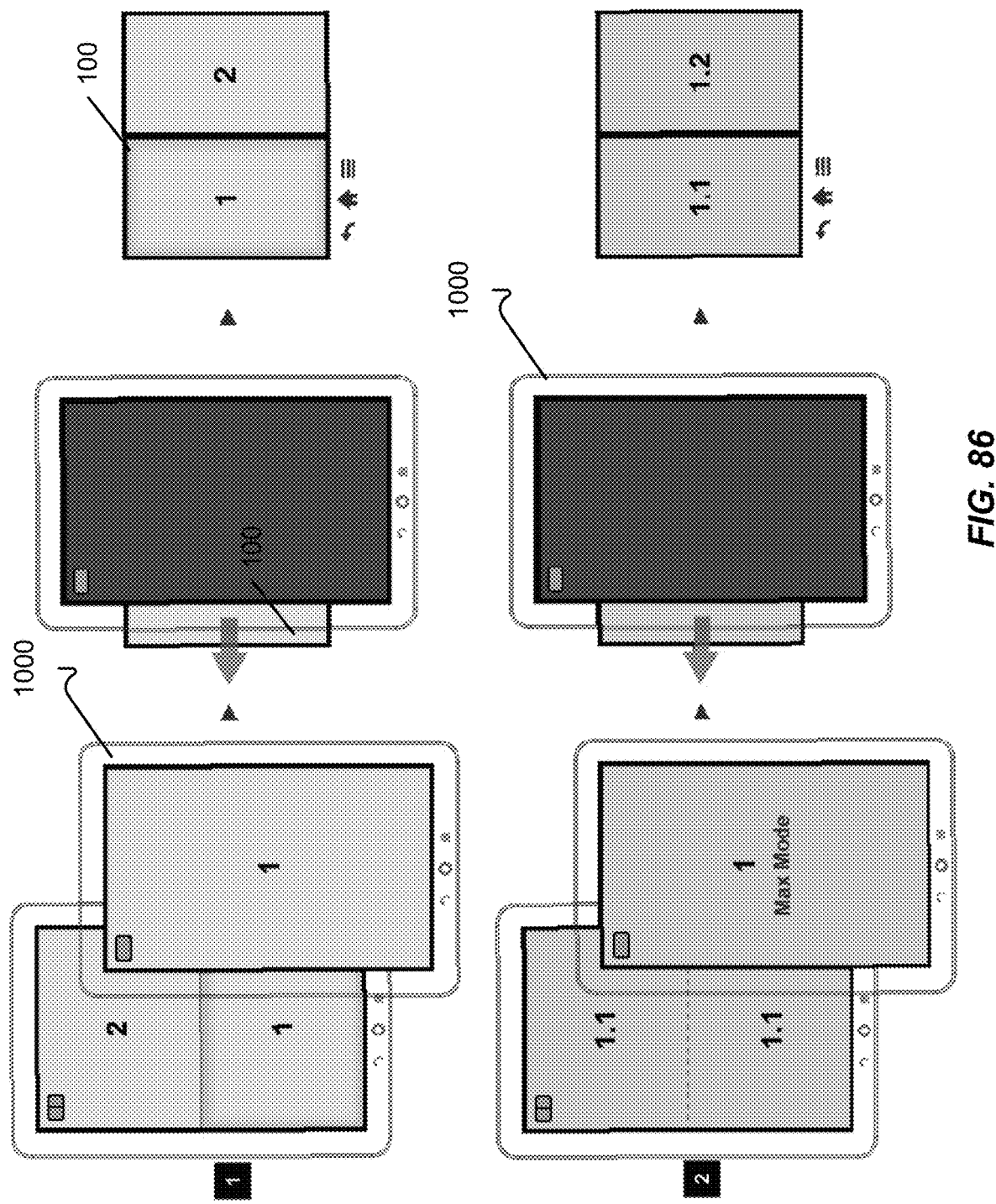
FIG. 86 illustrates exemplary window management.

FIG. 86 generally represents an exemplary embodiment of undocking from a portrait oriented SP 1000. When the device 100 is undocked from the SP 1000, the device 100 can slide out in a portrait dual-orientation. Upon undocking, the applications should be re-oriented on the device 100 accordingly, this being considered a clockwise rotation of the device 100.

As shown in sequence one of FIG. 86, the device 100 is undocked from the SP 1000 (in either application mode), and the applications are re-oriented and focus remains on the application that had focus prior to undocking from the SP 1000.

In sequence two in FIG. 86, a maximized dual-screen application remains maximized on the SP 1000. Here, standard orientation rules apply.

Figure 87:
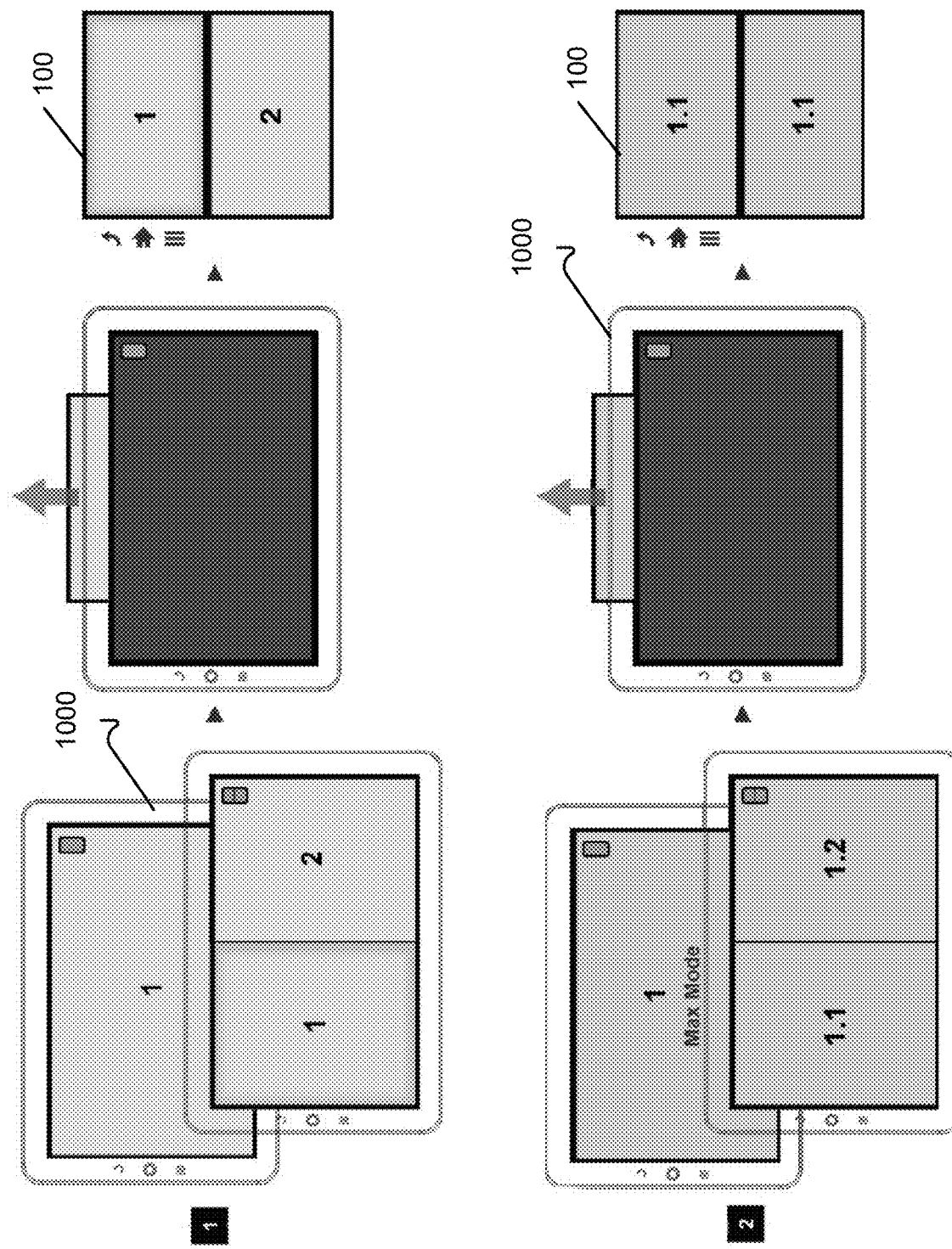
FIG. 87 illustrates exemplary window management.

FIG. 87 illustrates exemplary embodiments of undocking from a landscape-oriented SP 1000. Here, and in accordance with an exemplary embodiment, when the device 100 is undocked from a landscape-oriented SP 1000, the device 100 slides out in a landscape-dual orientation. Upon undocking, the applications should be re-oriented on the handset accordingly, with this being considered a clockwise rotation of the device 100. As shown in sequence one of FIG. 87, the device 100 is undocked from the SP 1000, in either application mode, and the applications are re-oriented with focus remaining on the application that had focus prior to the undocking event. As illustrated in sequence 2, a maximized dual-screen application remains maximized on the device 100. Here, standard orientation rules apply, as does the gravity drop feature as previously discussed.

Figure 89:
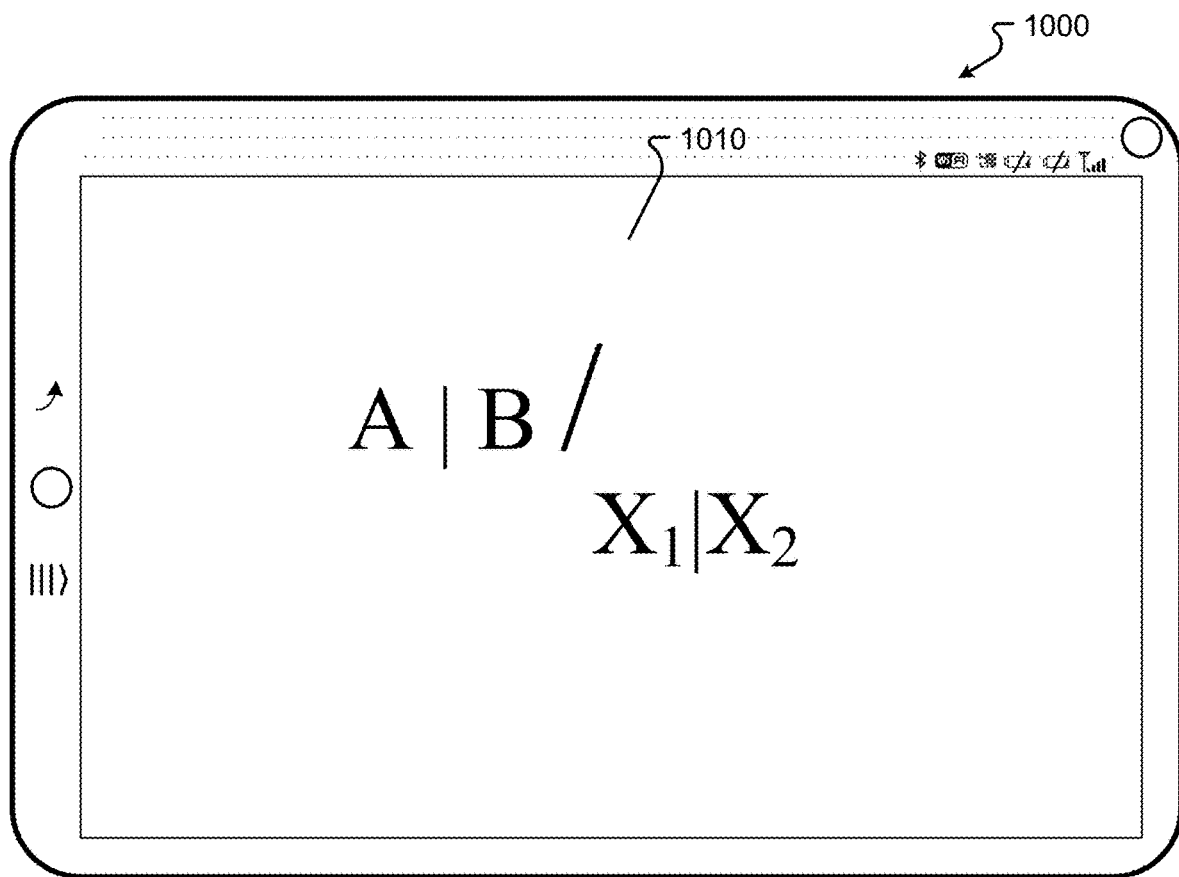

FIG. 89 illustrates an exemplary embodiment where the SP is in a multi-application mode. In the multi-application mode, the device 100 is emulated in its mini-tablet form. This mode can be invoked, for example, by engaging the multi-application button, with, in essence, the SP 1000 emulating the device 100 being opened.

The multi-application mode can inherit, for example, all of the rules that the dual-screen device 100 affords. For instance, all applications can be launched in single screen mode. The only notable exception is that applications that can support max modes can be expanded to this mode, when provided the opportunity.

The multi-application mode can support the following applications:
 1. Single screen market place applications.
 2. Dual screen internal applications.

Each application can itself determine how it appears in each orientation. In accordance with one exemplary embodiment, there are some interaction assumptions that can be made:

Windowing management can navigate full applications.
Windowing management can collapse a dual-screen application into a single screen view.
The application manager can operate in both orientations, and can allow for navigation of open applications.
Two sets of menu buttons may be required, and as such can be placed on screen. This embodiment can use the capacitive button strip to disable the back and menu buttons, but still support the "home" button.
Personal computer type personality is available via a desktop widget.

Figure 88:
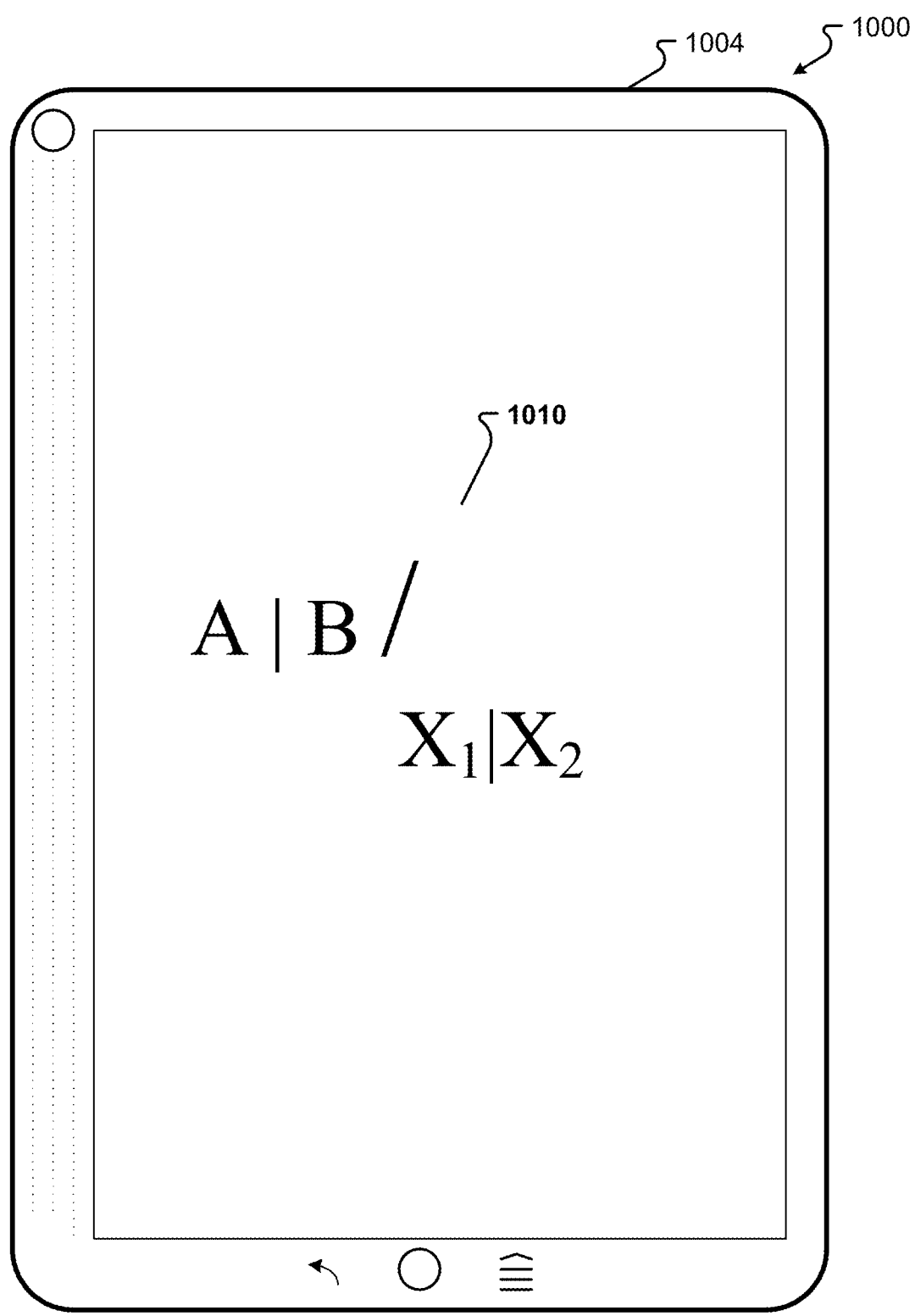

As illustrated in FIG. 88, a portrait-tablet, multi-application mode is shown. More particularly, FIG. 88 illustrates one multi-application mode of the SP 1000. Here, the multi-application mode of the SP 1000 emulates the device 100 in its mini-tablet form, as discussed, with this mode optionally being invoked by selection of a multi-application button. In this mode, and in accordance with an exemplary embodiment, each application has the ability to determine how the application appears in each orientation, e.g., portrait and landscape.

FIG. 89 illustrates another exemplary embodiment, where the SP 1000 is in a landscape, multi-application mode. Operation in this embodiment is similar to that of the SP 1000 in FIG. 88 where the interaction assumptions are comparable, except that the SP 1000 is in landscape tablet, multi-application mode.

Figure 90:
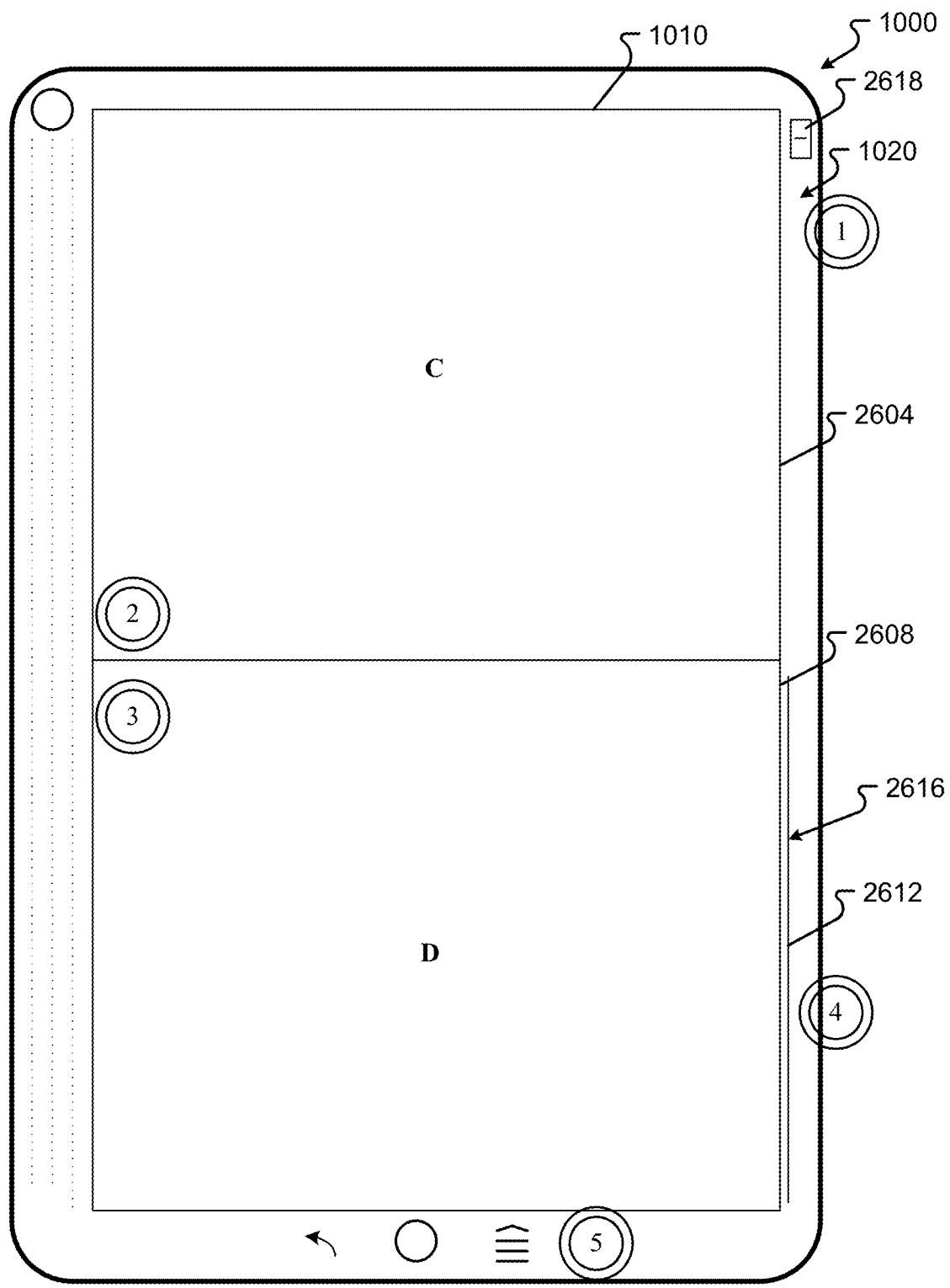

FIG. 90 illustrates another exemplary embodiment, where the SP 1000 is in a portrait orientation, multi-application mode. In this exemplary embodiment, a number of different features are illustrated. First, as noted by step 1, the multi-application mode is enabled. Through this enactment, a first application "C" enabled as well as a second application "D" here represented by tasks 2 and 3, respectively. A focus indicator, such as that represented by 2612, feature 4, can further be indicated as previously discussed. Moreover, back, home, and menu buttons, as illustrated by feature 5, can be provided with each of the windowed applications being individually manageable, manipulatable, and the like, as previously discussed.

Figure 91:
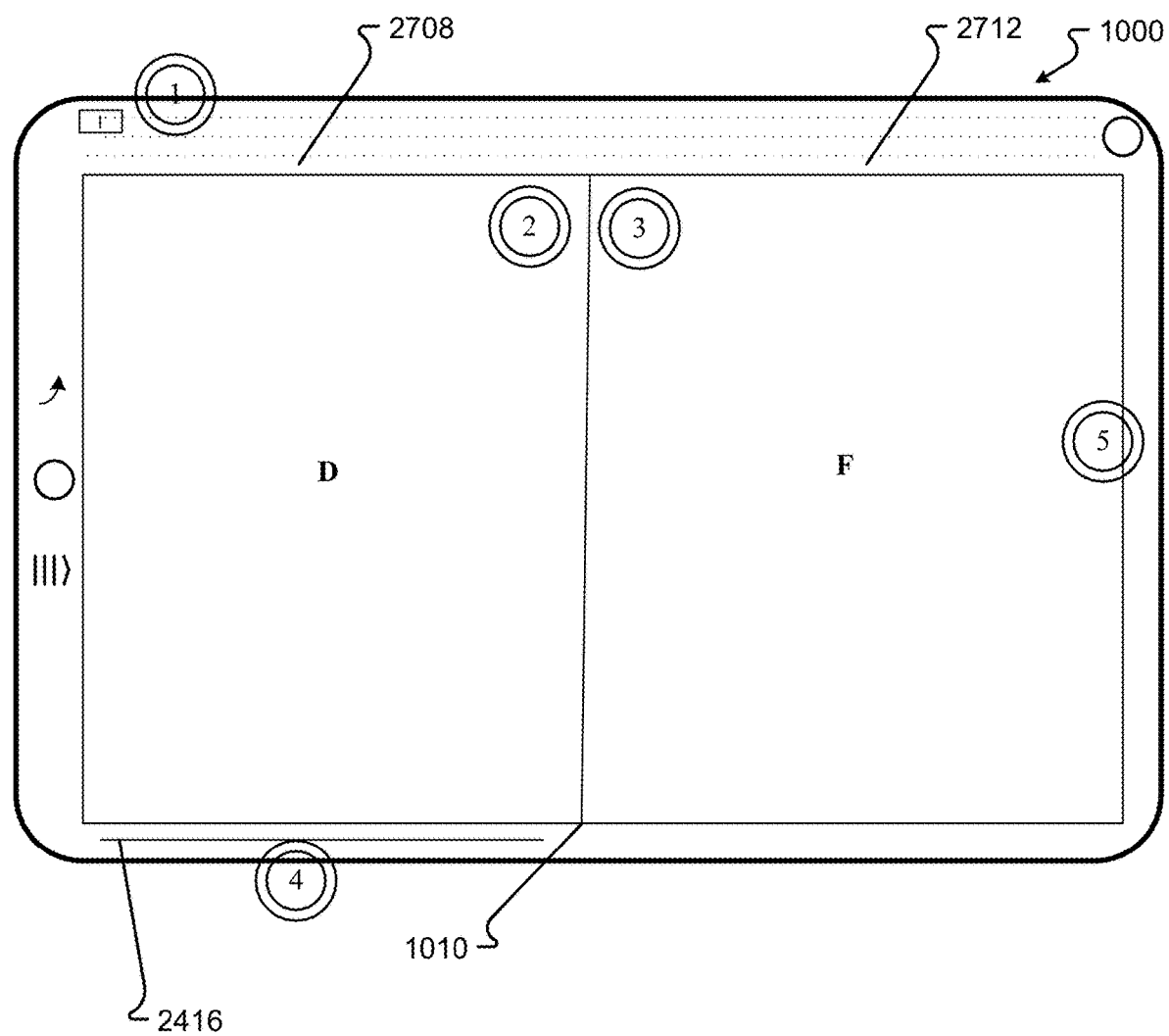

FIG. 91 illustrates an exemplary mode of operation of the SP 1000, in a landscape mode, and further in a multi-application mode. FIG. 91 illustrates, with reference to item 1, that the multi-application mode has been enabled. In accordance with this exemplary embodiment, there are two applications, represented by a first application "D" and a second application, application "F." Furthermore, and in accordance with an optional embodiment, focus indicator 2416 (item 4) can be included as well as the back/home/menu buttons as previously discussed. Again, while the focus indicator in FIG. 91 is illustrated as a bar 2416, it should be appreciated that focus can be illustrated in any number of ways including one or more of illumination, highlighting, dimming, or in general in any manner which can indicate to the user that, in this instance, application "D" is in focus, while application "F" is not in focus.

Figure 92:
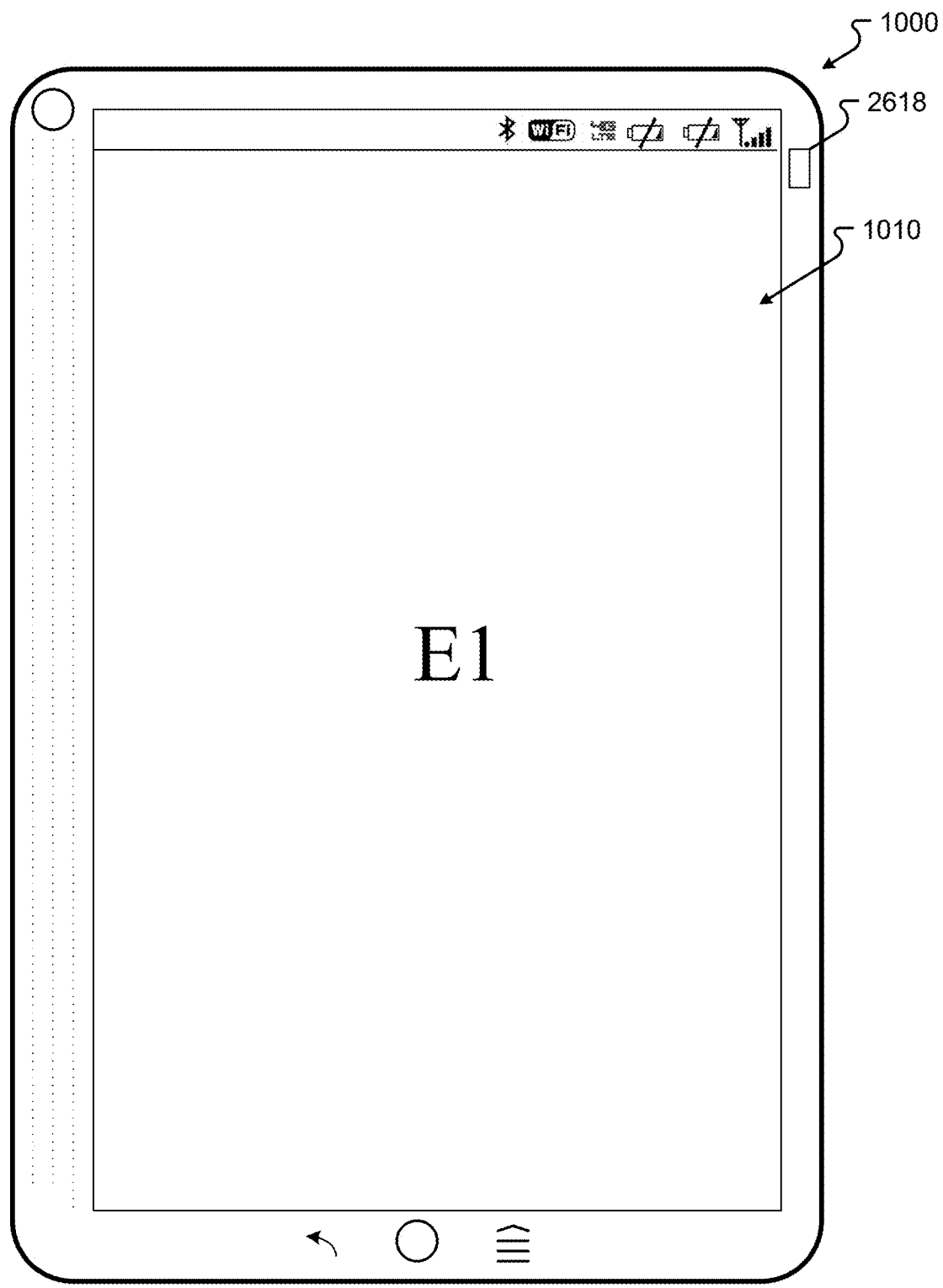

FIG. 92 illustrates an exemplary method of maximizing/minimizing a full-screen application. As illustrated in FIG. 92, applications that can be maximized can expand to either dual screen mode or max mode. Here, application "E1" is expanded to dual screen mode on display 1010. In FIG. 92, and as previously discussed, button 2618 allows the user to toggle between a single screen mode, as previously illustrated, and an emulated dual screen mode, for example, as illustrated in FIGS. 26 and 27. Furthermore, and as previously discussed, button 2618 does not have to include a vertical bar, therefore indicating to the user that the SP 1000 is in a single screen mode. Moreover, the focus indicator is no longer present thereby further providing the user with an indication that they are in a single screen mode.

Figure 93:
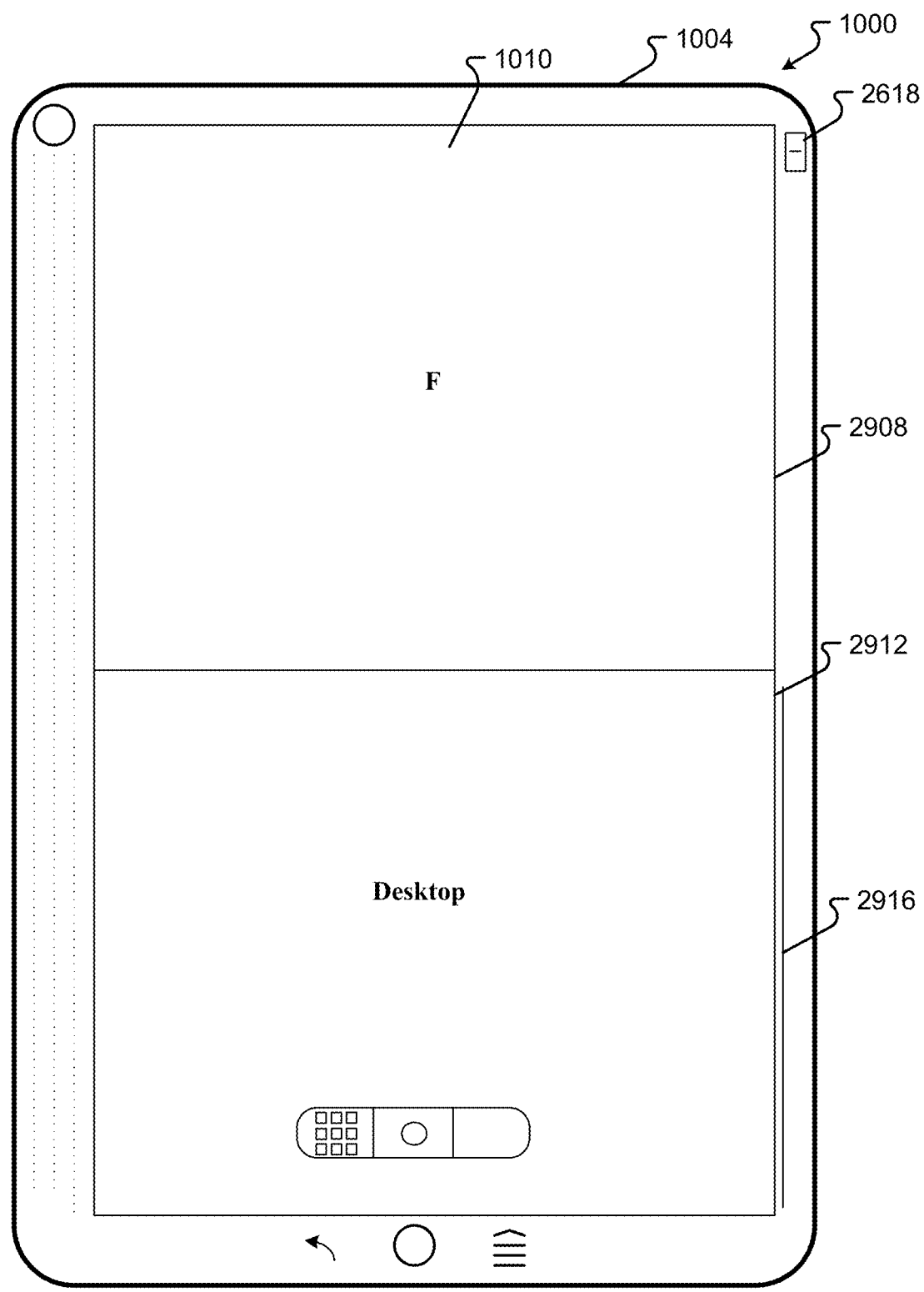

FIG. 93 illustrates an exemplary method for displaying the desktop 2912 on display 1010. As in the device 100, when the last application is moved to the side, via, for example, a gesture or flick type motion, the desktop can be displayed. In FIG. 93, multi-application mode is enabled, application "F" is shown on display 1010 in conjunction with the desktop 2912, and in accordance with this particular embodiment, the desktop is illustrated as being in focus by virtue of the focus indicator 2916. However, as previously discussed, the focus indicator 2916 need not necessarily be a bar located adjacent desktop display, but could be illustrated, for example, by showing the desktop 2912 with brighter luminance than application "F."

Figure 94:
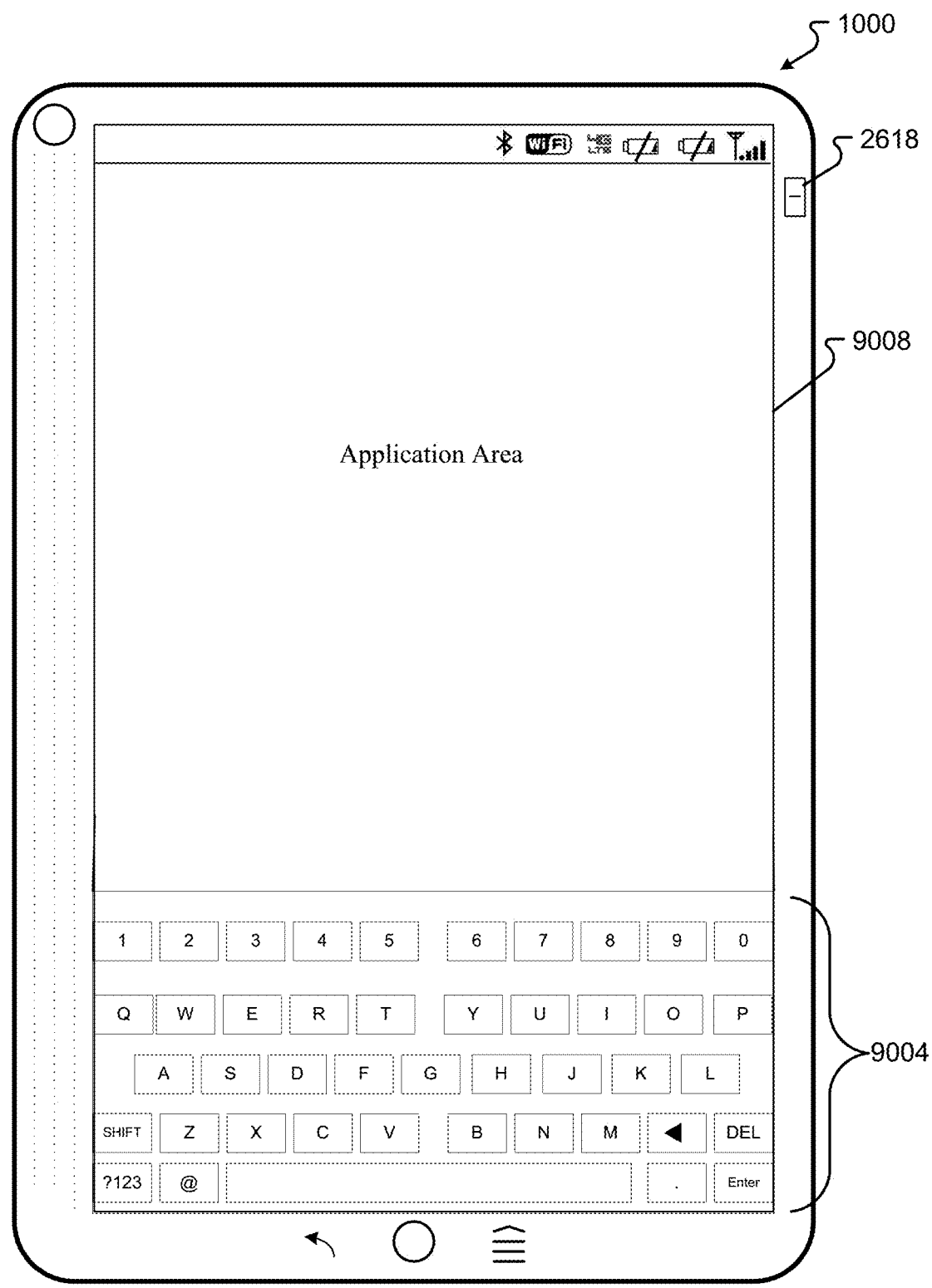

FIG. 94 illustrates the SP 1000 in a portrait-type orientation, with the keyboard 9004 being displayed. When the keyboard is required in this particular orientation, the application, here displayed in application area 9008, will take over the entire screen, minus the keyboard portion. Moreover, as previously discussed, the keyboard area 9004 can be manipulated, via either a gesture or stretching or zooming type function, to change the size thereof, with the application area 9008 being optionally expanded or contracted in unison with the keyboard, as appropriate.

Figure 95:
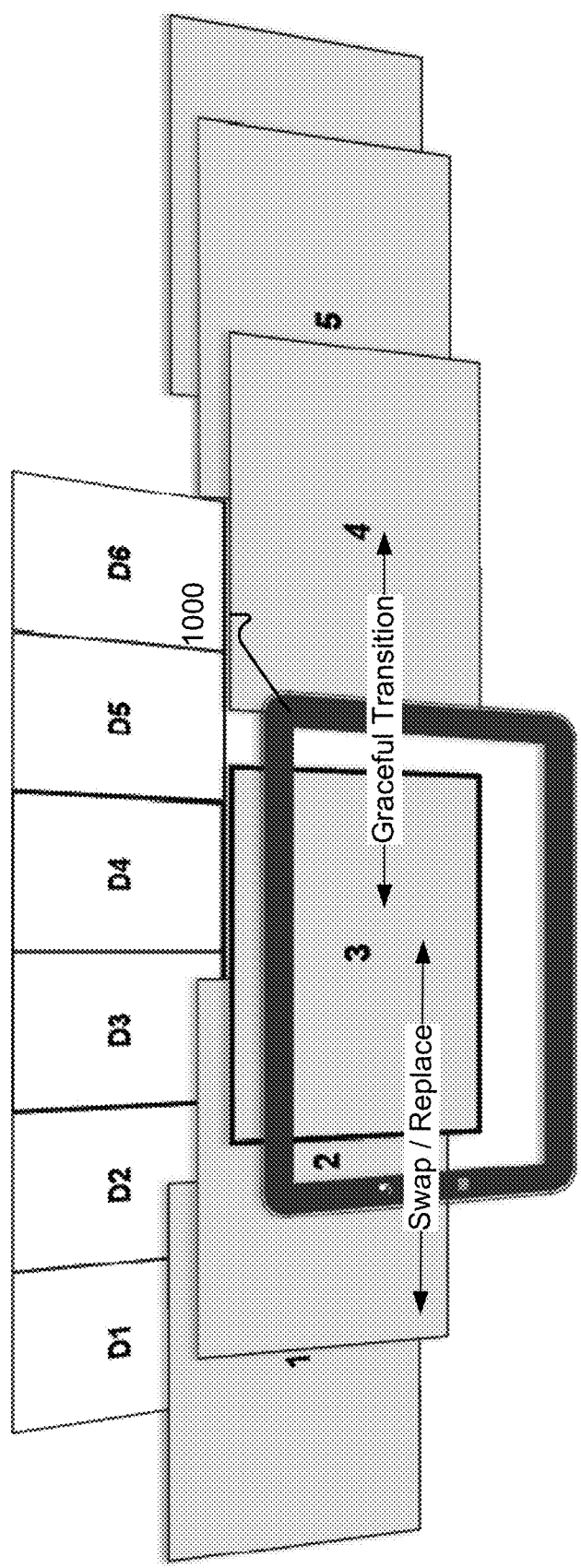

FIG. 95 illustrates an exemplary embodiment of the window stack in dual-application mode. In accordance with this exemplary embodiment, the windowing management acts in a similar manner for the SP 1000 as it does as previously discussed in relation to the device 100, and the concept of the windows stack. This same concept of the windows stack described in relation to the device 100 can be extended and used to explain the behavior of window management on the SP 1000 when the device is in, for example, dual mode.

In accordance with one exemplary embodiment, and when the window stack is in a single application mode, the intuitiveness of the two stacks may be compromised because the user may not necessarily be able to see all relevant information on the screen. This is similar to what happens when a user closes the device 100 and is only able to see a main, or primary screen. Even though the user cannot see the two screens, the two window stacks don't really disappear, the other stack is still there, but it is off-screen. Therefore, when a user enacts a window management gesture away from the buttons (to the right) a user is pushing the active application to the top of the screen stack and revealing the application that is "under" the active one. When a user uses a window management gesture toward the buttons (to the left) the user is bringing in the top "card' from the off-screen stack and sliding it on top of the active window, effectively covering it, when there is no application left on the off-screen stack. This is illustrated in FIG. 95. The two-window stacks are shown as D1 through D6, with the primary, and viewable stack, being illustrated as 1-5 in a grey-shaded color.

Even more specifically, when a gesture is away from the buttons (to the right) and in accordance with this exemplary embodiment, a user pushes the active application "3" to the top of the off-screen stack, and reveals the application that is under the active one, here application "2." In a similar manner, when a user gestures towards the buttons (to the left) the top card (here application 3) is effectively covered by virtue of card 4 sliding on top of the active window. As previously discussed, this can happen in a linear manner, or can happen in a "rolodex" type of fashion where after application "5" is reached, application 1, which would be "next" in the stack, could be brought into view on the SP 1000.

Moreover, and as previously discussed, the transition between "cards" can occur in a fluid manner such that as application 3 leaves the screen, application 4 begins transitioning onto the screen. In accordance with an optional exemplary embodiment, and upon detection of the appropriate gesture, application 3 can be immediately replaced with application 4, application 5, and so on through the sequence, until the end of the stack is reached. The different manners in which applications are scrolled through can be based one or more of application preferences, user preferences, or the like. For example, for a graceful transition one or more of a blend, fade, blur, or comparable effect can be used, such as to replace application "3" with application "4," and with a swap-replace type of action application "3" could be immediately replaced by application "2." Moreover, a "peak" or preview type of gesture can be recognized such that as application "3" is transitioned off of the display 1010, application 2 or 4, depending on the nature of the gesture, could be previewed prior to activation. Once the gesture action is completed the appropriate application could be activated and displayed on the display 1010. However, if the gesture action is not completed, focus could revert back to application "3" which is in display 1010.

Figure 96:
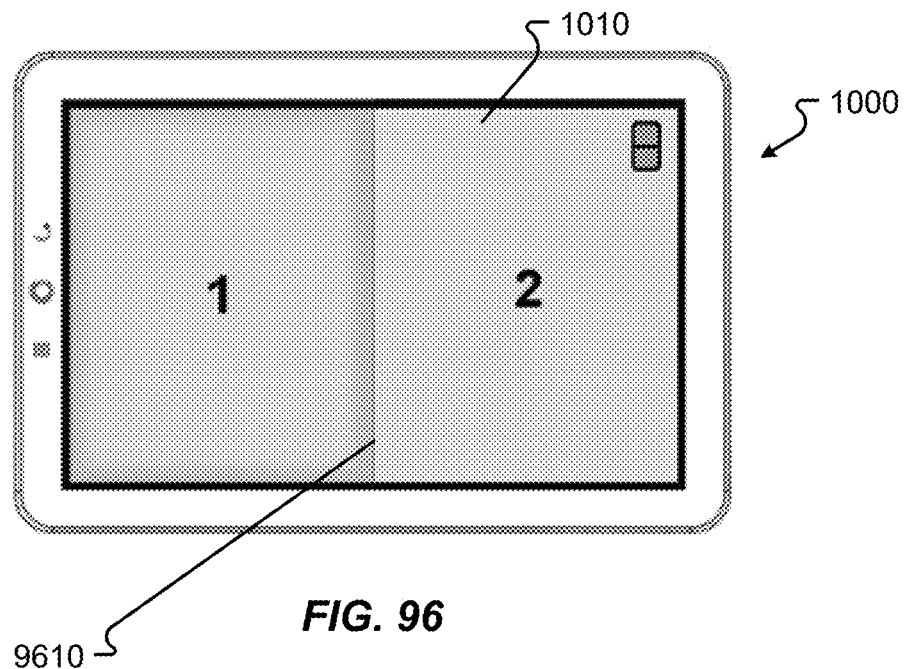
Figure 97:
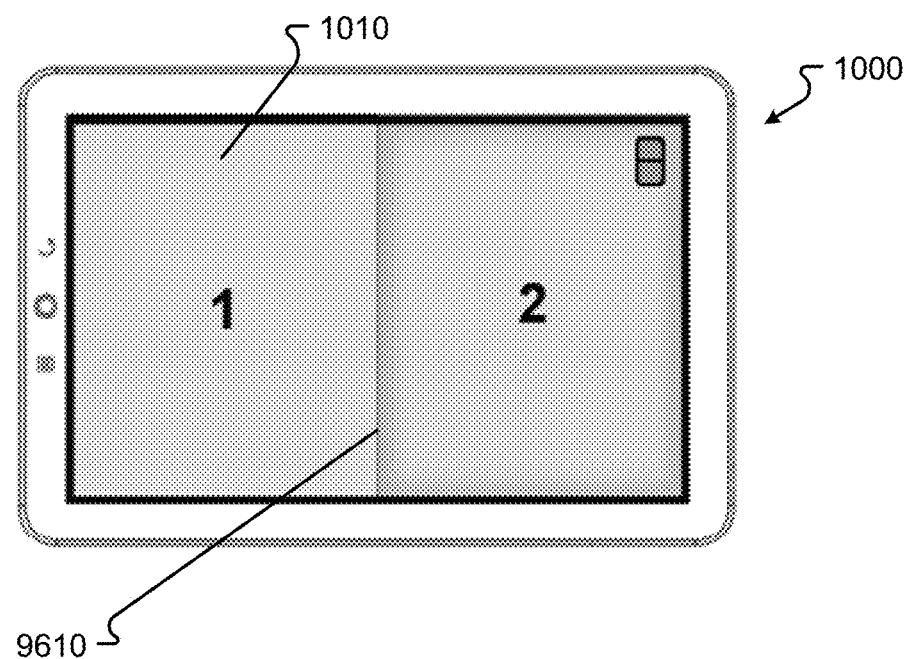

FIGS. 96-99 illustrate an exemplary embodiment that addresses the management of a "seam" on the SP 1000. In accordance with an exemplary embodiment, and in order to separate two separate applications from each other, there can be a visual seam between them. On the device 100, there is no need for a software scene due to the physical seam separating the application views from each other. This of course applies to both the portrait dual and landscape dual orientations of the device 100. However, as illustrated in FIG. 96, the SP 1000 is in a dual-application mode, with two separate applications in view, a system-wide seam can be displayed in the middle of the screen 1010. The seam 9610 is used to not only separate the applications, here application 1, which is in focus, and application 2, which is not in focus, but is also used optionally as the main indication of focus. As illustrated in FIG. 97, the sea can also be shown when application 2 is in focus with the seam dividing, visually, the two applications for the user.

Figure 98:
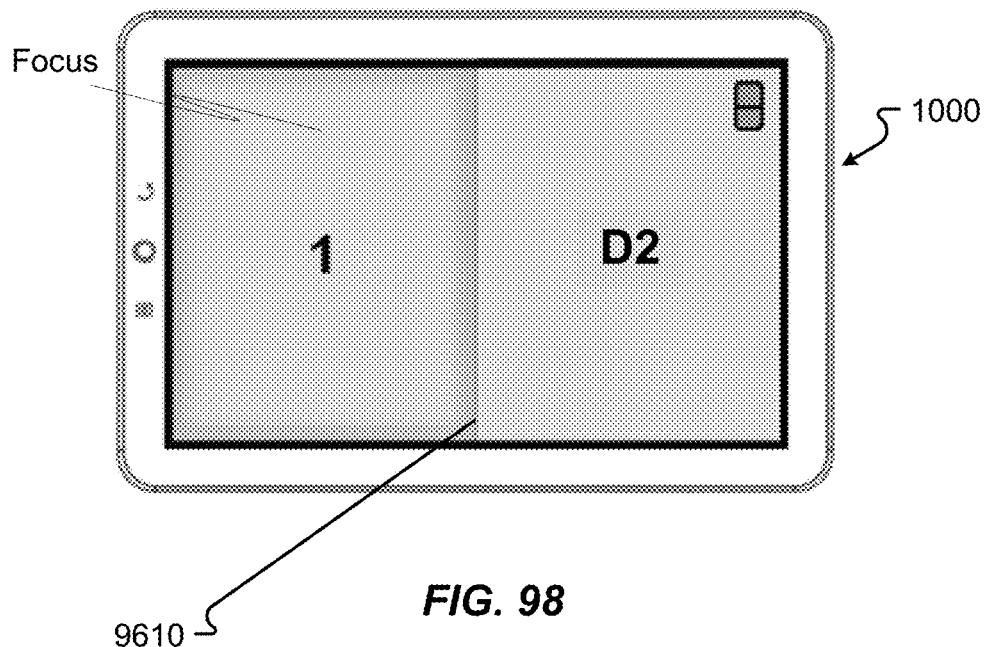
Figure 99:
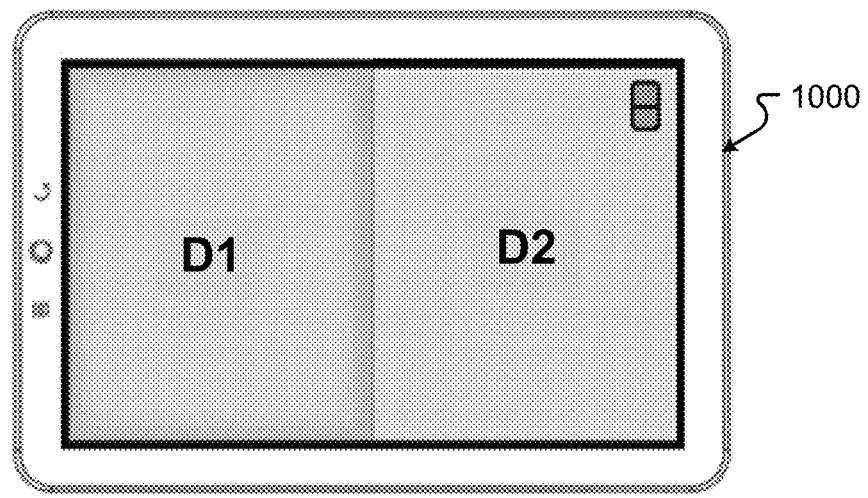

As illustrated in FIG. 98, when the desktop "D2" is revealed, the seam can also be shown if only one application is displayed, in conjunction with the desktop. As illustrated in FIG. 99, when the desktop is revealed, or no applications are running, this seam need not be displayed. Here, the desktop "D1, D2" is displayed on the SP 1000 with no other applications being present.

The following sequence of figures illustrates toggling between single and dual application mode on the SP 1000. One unique feature of the SP 1000 is to allow switching between single and dual application modes. In the following sequence of figures, numerous sequences are displayed illustrating the toggling feature and transitions from a first state to one or more other states. In sequence 1, illustrated in FIGS. 100 and 101, the SP 1000 is in a dual-application mode with two single-screen applications visible. In the sequence in FIG. 100, upon switching to a single-application mode, the application in focus remains visible. In FIG. 101, however, upon switching back to a dual-application mode, the visible application is placed in the left-bottom part of the display on the SP 1000. The SP 1000 can give the user a clear indication of the current application mode "dual or single" through, for example, an icon in the enunciator bar as previously discussed. Switching the SP 1000 between single and dual mode is similar in nature to the opening and closing of the device 100. However, in contrast to the behavior of the device 100, the application in focus always remains on screen when switching mode. Because of this, if the keyboard is present when switching modes, the keyboard can remain visible when the transition is completed.

The behavior of dual-screen applications is slightly different and is described with reference to the sequences illustrated in FIGS. 102-104. As illustrated in FIG. 102, dual-screen applications that are not maximized in dual-application mode go into their max mode when the SP 1000 switches to the single application mode, if the application supports it. As illustrated by sequence 2A in FIG. 102, when switching back, the dual-screen application goes to its non-maximized state.

As illustrated in FIG. 103, dual-screen applications that do not support a max mode will have one of their views laid-out in single mode when the SP 1000 is switched to a single mode. As illustrated in FIG. 104, a transition is shown where a dual-screen application that is maximized in dual-application mode goes to its max mode when the SP 1000 switches to single application mode. As illustrated in 4A in FIG. 104, when switching back, the dual-screen application goes back to its maximized state.

In accordance with this exemplary embodiment, some special transitions may be required where the desktop is visible in dual mode on the SP 1000. FIG. 105 illustrates that, upon switching to a single-application mode, the application in focus (here application 1) remains visible. However, as illustrated in sequence 5A, upon switching back to the dual-application mode, the visible application is placed in the left-bottom part of the SP 1000 (here application 1).

As illustrated in FIG. 106, if the desktop (D2) happens to have focus, as is illustrated, switching to single-application mode will make the visible application take over the screen in single mode. As illustrated by sequence 6A in FIG. 106, upon switching back to dual-application mode, the visible application is placed on the left-bottom part of the display 1010 on SP 1000 and will keep focus (even if the desktop had focus before).

The following exemplary sequence of figures illustrates window management events in single-application mode on the SP 1000. More specifically, window management off-screen gestures in single-application mode on the SP 1000 behave similarly to a closed device 100. As illustrated in FIG. 107, drag and flick type gestures navigate between applications in the stack. In this exemplary embodiment, a drag or flick type gesture transitions from application 1, to application 2, which is in max mode, with a further gesture displaying application 3.

As illustrated in FIG. 108, dual-screen applications are presented in their max mode across the screen, with drag and flick gestures not minimizing or maximizing them. Therefore, a leftward drag or flick gesture in the SP 1000 is focused on application 2 in max mode, would transition to application 3 being displayed.

As illustrated in FIG. 109, drag or flip gesture from FIG. 108 would reveal application 3 being displayed on the SP 1000.

As illustrated in FIG. 110, operations or gestures are ignored on the SP 1000 as, for example, there are no other applications in the stack. As illustrated in FIG. 111, rotation events work in a standard manner on the SP 1000, with max mode orientations rotating to their respective counterparts. Gravity drop rules may also apply here if the application structure calls for them. Therefore, in this exemplary embodiment, when the SP 1000 transitions from a portrait mode to a landscape mode, application 1 is re-rendered in max mode, landscape orientation.

The following exemplary sequence of figures illustrates an exemplary embodiment directed toward initiating a preview on the SP 1000. The desktop preview action mimics that of the device 100, where applications are pushed in the direction of their respective stacks (primary and secondary). The single application mode corresponds with a closed device 100, and a dual application mode corresponds to an open device 100.

In the following sequence of figures, FIG. 112 illustrates an exemplary SP 1000 in a landscape orientation, where, in dual-application mode, the views on the primary and secondary halves of the screen are pushed in the direction of the respective stacks, with the SP 1000 rotated clockwise, primary towards the left, secondary towards the right.

In FIG. 113, and when the SP 1000 is in single application mode, the single mode application slides off the screen of the SP 1000 in a single motion in the direction of the physical buttons. This reveals the desktop (D1) as shown in FIG. 113. In FIG. 114, and in dual application mode, the views on the primary and secondary halves of the screen on the SP 1000 are pushed in the direction of their respective stacks, e.g., primary downwards and secondary upwards. In the single application mode, as illustrated in FIG. 115, the single mode application slides off the screen of the SP 1000 in a single motion in the direction of the physical buttons, thereby revealing the desktop (D1).

FIGS. 116-119 illustrate the handling of incoming calls on the SP 1000. In accordance with one exemplary embodiment, incoming calls on the SP 1000 have an effect on the windows stack, as the incoming call view is considered a "new application." In the following sequence of figures, the handling and displaying of an indication of incoming calls relative to the window stack is illustrated. More specifically, and in FIG. 116, the SP 1000 is running in dual-application mode, here with two single-screen applications in view (1, 2). Upon receipt of an incoming call, the incoming call is launched on the primary screen, replacing the application in that view in accordance with standard application launch rules, user preferences, application priorities, and/or the like.

In FIG. 117, the SP 1000 is running in dual-application mode, with a maximized dual-screen application in view. Here, the incoming call is launched on the primary screen, with the dual-screen application being minimized to the opposite screen again in accordance with standard application launch rules, user preferences, or the like. In FIG. 118, the SP 1000 is running in single-application mode, with a single-screen application in view. First, the incoming call switches the SP 1000 to the dual-application mode. This has an effect on the application, but in this particular case, the standard application launching rules are ignored in the application that was in view prior to the call will be moved to the secondary part of the screen, instead of being pushed out of view.

In FIG. 119, the SP 1000 is running in single-application mode, with a single-screen application in view. First, the incoming call switches the SP 1000 to the dual-application mode. This has an effect on the application, and the application is then minimized. The incoming call application is launched on the primary side of the SP 1000.

FIG. 120 illustrates an exemplary method of displaying application notifications on the SP 1000. As generally discussed above, and whether in the portrait or landscape mode, notifications and status/toggle buttons can be provided on the SP 1000 to allow the user to, for example, toggle on or off Bluetooth, Wi-Fi, screen locking, dual or single screen mode, power options, and the like. These, as well as other options, are generally shown in area 1202. In accordance with this exemplary embodiment, the notifications in the SP 1000 have a behavior similar or identical to that of device 100 in single-screen mode. Here, setting widgets are available via the notifications bar with a setting of widgets including, for example, standard setting widgets such as Wi-Fi toggle, Bluetooth, and the like, the screen lock toggle, where this will lock the screen, and not allow it to rotate, where a lock indicator can optionally be provided in the annunciator bar, a single-dual application toggle, where there can be three states to toggle through, dual application mode, single application mode, and single application lock, and a power toggle mode that includes, toggling between device optimized, smartpad optimized or user preference.

As illustrated in FIGS. 120 and 121, the notifications drawer is illustrated in a similar manner whether the SP 1000 is in tablet mode, as illustrated in FIG. 120, or landscape mode, as illustrated in FIG. 121 with the notifications drawer 1202 containing similar features.

As illustrated in FIG. 122, one or more specific hardware interactions on the SP 1000 can trigger a notification. For example, one or more of the following hardware interactions can trigger a notification, that can be one or more of audible and visual: Pressing of the power button, inserting a headphone jack, inserting or removing of a power adapter, inserting or removing of a memory card, such as an SD card, and pressing of any of the buttons on the device 100, such as the mute button, volume buttons, or the like. As illustrated in FIG. 122, pressing of, for example, the mute button on the device 100 will also activate the muting function on the SP 1000. Similarly, the pressing of the up/down volume button on the device 100 triggers a corresponding up or down volume change on the SP 1000. As will be appreciated, and with the activation/deactivation or manipulation of any of the above-mentioned hardware capabilities of the SP 1000 or device 100 one or more of audible, visual, or tactile feedback can be provided to the user indicating the corresponding activation/deactivation as appropriate.

FIG. 123 illustrates an exemplary embodiment of a device 100 docked with the SP 1000, and interactions between the respective batteries on each device, and corresponding battery measurement modules. In accordance with the exemplary embodiment, each device has its own respective battery measurement module (1234, 1238). It should be appreciated however that battery management can be governed by one or more of the battery measurement modules, with each battery measurement module respectively able to control the charging/discharging of battery in the SP 1000 and/or the battery in the device 100. In accordance with one exemplary embodiment, the SP 1000 has a setting that allows recharging of the device 100's battery using the SP's power. This can be a default behavior when the SP is plugged into AC power. However, when the SP is not plugged in, and as in, for example, an extended pad experience mode, the SP 1000 can automatically manage whether or not it will send power to the device 100. The algorithm to accomplish this can be as follows:

To turn device charging on, if the device charges less than 60% and device charge is less than SP charge, send charge to the device, or else, do nothing. Then, for turning charging off, if the device charges greater than 65% or the device charges greater than and equal to the SP charge plus some percentage, such as 5%, turn off the device charging, otherwise do nothing.

This is illustrated in more detail in FIG. 124. In particular, control begins in step S1244. In step S1248 the handset, or device, charging is turned on. Next, in step S12412, a determination is made as to whether the handset charge is less than 60% and the handset charge is less than the SP charge. If so, control continues to step S1214 where power is sent to the handset with control jumping back to step A. Otherwise, control continues to step S12416 where nothing is done, with control continuing to step S12420 where the control sequence ends.

However, if handset charging is to be turned off, control continues to step S12424. Next, in step S12428, a determination is made whether the handset charge is greater than 65% or the handset charge is greater than or equal to the SP charge plus 5%. If so, control continues to step S12436 where handset charging is turned off, with control continuing to step S12440 where the control sequence ends.

Otherwise, control continues to step S12432 where nothing is done with control continuing to step S12440 where the control sequence ends.

While the above exemplary embodiment has been described in relation to certain percentages of charge of one or more of the device 100 and SP 1000, it should be appreciated that these percentages can be based on one or more of manufacturer specifications, user specifications, or preferences, or the like. They are not limited to the specific embodiment illustrated herein. In general, any percentage value can be used with success, provided the device supplying charge has more power than the device receiving charge.

FIG. 125 outlines an exemplary method of managing one or more windows with suspended applications. Suspended applications can use a screen capture of the application to assist with the visual affordance for navigating the application stack. Between the device 100 and SP 1000, many suspended and oriented application screen captures can exist. Although the screen captures can occur throughout all modes, for the purpose of simplifying the screen capture sizes, the following exemplary embodiment only outlines the individual dimensions to make up the majority of sizes across modes.

In other words, since the dimensions are capable of being flipped between width and height, the rectangular shape of the screen capture remains the same. When using window management to navigate the application stack, the screen captures are revealed. Due to the various screen capture irregular sizes, the screen capture that is suspended entering the active area should follow the following rules: (1) Optionally rotate to match the aspect ratio (wide versus tall), (2) scale direction should be dependent on the device to avoid black bars (pick the shortest dimension), (3) Crop/clip the areas that exceed the aspect ratio requirement, (4) Apply the suspended application screen capture treatment. As discussed hereinafter, various rules and exemplary management operations are discussed relating to the handling of suspended applications, and window management.

As illustrated in FIG. 125, device 100 can be in a plurality of different orientations, portrait single, landscape single, portrait dual, and landscape dual, and the SP-1000 can similarly be a number of different orientations, such as portrait tablet single application mode, landscape tablet single application mode, landscape tablet dual application mode, and portrait tablet dual application mode. As illustrated in FIG. 125, transitioning between a docked and undocked state may require the management of the windows from the device 100 to the SP 1000, or vice versa.

As illustrated in FIG. 126, an exemplary overview of irregular size applications and corresponding screen capture displays is shown. In this exemplary chart, an outline of the window management screenshot sizes is shown which is derived from the device 100 and the SP 1000 orientations and the final display size that can be used. The chart is shown with the original screen capture in the left hand column, and the scaled screen capture orientation size and clipping mask in the rows to the right. In this exemplary chart, six different resolutions are shown, 480×800, 800×480, 640×800, 800×640, 1280×800, and 800×1280.

As illustrated in FIG. 127, to lessen the differences in screen sizes and orientations, some graphical affordance has been created to unite and normalize differences between the screen capture content, sizes, and unfamiliar orientations. More specifically, vignetting is illustrated by item 1 in FIG. 127, screen glare is illustrated by item 2 in FIG. 127, an application label is illustrated by item 3 in FIG. 127, having either, for example, a horizontal alignment in the center or a vertical alignment in the center, and application text is illustrated by item 4 in FIG. 127 including attributes such as font, color, horizontal alignment, and vertical alignment. The combination of one or more of the above features can be used to harmonize and lessen the differences in screen sizes and orientations.

As illustrated in FIG. 128, composited application screen captures are shown in accordance with one exemplary embodiment. Here, for every screen capture being revealed via the window management, the vignette design and label can be applied over the screen capture. Here, with reference to frame 1 in FIG. 128, a device 100 screen capture example is provided in portrait single mode. In capture 2, an SP 1000 screen capture example is provided in landscape tablet dual mode. For item 3, a composited application screen capture is shown that can be used in accordance with an exemplary embodiment.

In FIG. 129, an exemplary embodiment of suspended application screen capture designs are shown. Frame 1 in FIG. 129 shows a SP 1000 capture, with the SP 1000 running in landscape tablet dual mode. In frame 2, the example illustrates a suspended application being brought into the device 100. The application was captured from the SP 1000 in landscape tablet dual mode. With the device 100 being in portrait dual mode, the suspended application can be presented as shown, to then be revealed and awakened.

In frame 3 of FIG. 129, an example is shown of the application having been refreshed and active.

FIG. 130 illustrates suspended applications moving onto the device 100. Here, and in sequence 1, device 100 screen captures are shown revealing within the display 1010. During this orientation, the device 100 captures do not require to be resized or trimmed. This is due to the screen capture being horizontally and vertically equal in both width and height of the live screen.

As illustrated in sequence 2, SP 1000 screen captures are shown revealing within the device 100 display. Due to the SP 1000 screen capture sizes, a percentage in scale may occur followed by cropping of the image for portions that, for example, bleed outside the desired active screen area. In sequence 3, the SP 1000 in single application mode screen capture is shown being revealed within the device 100 screen or display. As shown in captures 2 and 3, there are clipped and scaled areas, respectively, corresponding to how the screen capture will be managed after the transition to the device 100. In sequence 2, the right hand side of the image is arbitrarily clipped to allow undistorted rendering on the device 100. In sequence 3, the green box illustrates an exemplary scaling procedure that is again utilized for appropriate resizing of the image on device 100.

FIG. 131 illustrates two additional sequences showing exemplary methods for suspended applications being moved onto the SP 1000. In sequence 1, the device 100 screen capture is shown revealing within the SP 1000 display. In sequence 2, the SP 1000 screen capture is shown revealing within the SP 1000 display. Again, scaling and clipping are shown in the suspended screen capture sequences with, on the left hand side of FIG. 131 showing the screens within the suspended applications.

As will be appreciated, while FIG. 130 shows the scaling and clipping operations occurring independently of one another, as shown in FIG. 131, the scaling and clipping operations can be performed on the same screen, to again assist with display and rendering from the device being transitioned to.

FIG. 132 outlines an exemplary method for handling and managing charging of one or more of the device and smartpad. In particular, control starts in step S1324 and continues to step S1328. In step S1328, a determination is made as to whether the device is docked. If the device is docked, control jumps to step S13228, with control otherwise continue to step S13212. In step S13212, a determination is made as to whether the smartpad is charging. If the smartpad is charging, control continues to step S13224, with control otherwise continuing to step S13216. In step S13224, one or more of a dock message, battery level indicator, and battery charging indicator can be displayed with control continuing to step S13220 where the control sequence ends.

In step S13216, one or more of a dock message and battery level indicator can be displayed, with control continuing to step S13220.

In step S13228, a determination is made as to whether the device is charged. If the device is charged, control jumps to step S13212 with control otherwise continuing to step S13232. In step S13232, a determination is made as to whether the smartpad is charging. If the smartpad is not charging, control jumps to step S13240. Otherwise, control continues to step S13236. In step S13236, one or more of a dead device message, a battery level indicator on the onscreen display and a charging indicator on the onscreen display is shown, with control continuing to step S13220 where the control sequence ends.

In step S13240, one or more of a dead device message is displayed and a battery level indicator message is displayed with control continuing to step S13220 where the control sequence ends.

FIG. 133 illustrates an exemplary method for managing one or more of the keyboard and slider bar. In particular, control begins in step SK4 and continues to step SK8. In step SK8, a default keyboard can be displayed. As discussed, this default keyboard can be dynamically based, for example, on one or more of user preferences and current application in focus. In a similar manner, in step SK12, a default slider bar can be chosen based on one or more of user preferences and the application currently in focus. As generally discussed, both the keyboard and slider bar can be designed to include characters that are most commonly used for the application in focus. Control than continues to step SK16.

In step SK16, a determination is made if a request for a different keyboard has been detected. If a request for a different keyboard has been detected, for example, based on a user request or based on an application coming into focus, control continues to step SK20 with control otherwise continuing to step SK24. In step SK20, the display on the device or the smartpad is updated with the requested keyboard. Control than continues to step SK24.

In step SK24, a determination is made whether a request for a different slider bar has been detected. If a request for a different slider bar has been detected, for example based on a new application coming into focus and/or user input, control continues to step SK32 where the display is updated on either the device or the smartpad with the requested slider bar. An optional embodiment also updates the slider bar indicator for illustrating to the user which slider bar is currently selected and active. Control then continues to step SK28 where the control sequence ends.

FIG. 134 illustrates an exemplary embodiment of window management. In particular, control begins in step SF4 and continues to step SF8. In step SF8, the device is docked that is running two single-screen applications. Upon docking, to a portrait tablet in dual application mode, focus is maintained on the application on the SP that was in focus on the device. (See SF8-SF12). Controlling continues to step SF16 where the control sequence ends.

FIG. 135 illustrates an exemplary method for window management when a device with one dual-screen application is docked to a portrait tablet SP in dual-application mode. Here, control begins in step SG4 and continues to step SG8. In step SG8, the device with the one dual-screen application is docked to the SP running in dual-application mode. In step SG12 gravity drop is applied to render the dual screen application on the SP. Control than continues to step SG16 where the control sequence ends.

FIG. 136 outlines an exemplary method for window management during docking for a handset with two single-screen applications being docked to a landscape tablet in dual-application mode. Here, control begins in step SH4 and continues to step SH8. In step SH8, a device with two single-screen applications is docked to a landscaped tablet in dual-application mode. In step SH12, focus on the SP is maintained with the application that was in focus with the device. Control than continues to step SH16 where the control sequence ends.

FIG. 137 illustrates an exemplary method of docking a device with one dual-screen application to a landscape tablet in dual-application mode. Control begins in step SI4 and continues to step SI8. In step SI8, a device with one dual-screen application is docked to a landscape tablet in dual application mode. Next, in step SI12, both screens of the dual screen application from the device are displayed on the SP with control continuing to step SI16.

FIG. 138 illustrates an exemplary method for window management during docking of a minimized dual screen application on the device with a SP in single-application made. Control begins in step SJ4 and continues to step SJ8. In step SJ8, a device with a minimized dual screen application is docked to a SP in single application mode. In step SJ12, the application is displayed in max mode on the SP. Control than continues to step SJ16 where the control sequence ends.

FIG. 139 illustrates a method for docking a maximized dual-screen device with a SP in single-application mode. Control begins in step SK4 and continues to step SK8. In step SK8, a device with a maximized dual-screen application is docked to an SP in single application mode. In step SK12, the application is displayed in max mode on the SP with control continuing to step SK16 where the control sequence ends.

While all of the above described methodologies are in relation to docking to an SP in portrait mode, comparable methodologies are used when docking to an SP in landscape mode.

FIG. 140 outlines an exemplary method for providing feedback to a user based on a changed hardware state. In particular, control begins with step SL4 and continues to step SL8. In step SL8, pressing of a hardware button and/or the engagement or disengagement of hardware on the device and/or the SP is detected. For example, these could include pressing of a mute button, the insertion of a head phone jack, the removal of a head phone jack, the insertion of an SD card in the card slot, or the like. Then, in step SL12, one or more of audible, visual, and tactile feedback are provided to the user indicating that the change in hardware state has been detected. As discussed, user can optionally be provided information regarding which hardware change has been detected with feedback provided to the user indicating, for example, an SD card has been inserted. Control then continues to step SL16 where the control sequence ends.

The exemplary systems and methods of this disclosure have been described in relation to a smartpad (SP) and a device, and interaction therebetween. However, to avoid unnecessarily obscuring the present disclosure, the preceding description omits a number of known structures and devices. This omission is not to be construed as a limitation of the scopes of the claims. Specific details are set forth to provide an understanding of the present disclosure. It should however be appreciated that the present disclosure may be practiced in a variety of ways beyond the specific detail set forth herein.

For example, the smartpad could have multiple physical and/or logical screens/displays. Additionally, the smartpad could be used with one or more input devices such as a stylus, mouse, or the like. Moreover, the smartpad could be populated with a processor, memory, communications means and the like that would allow for stand-alone operation. Even further, the smartpad could be associated or docked with other types of communications devices such as a smartphone such that the smartpad could be used as a display and/or I/O interface therefore.

Furthermore, while the exemplary aspects, embodiments, and/or configurations illustrated herein show the various components of the system collocated, certain components of the system can be located remotely, at distant portions of a distributed network, such as a LAN and/or the Internet, or within a dedicated system. Thus, it should be appreciated, that the components of the system can be combined in to one or more devices, such as a tablet-like device, or collocated on a particular node of a distributed network, such as an analog and/or digital telecommunications network, a packet-switch network, or a circuit-switched network. It will be appreciated from the preceding description, and for reasons of computational efficiency, that the components of the system can be arranged at any location within a distributed network of components without affecting the operation of the system. For example, the various components can be located in a switch such as a PBX and media server, gateway, in one or more communications devices, at one or more users' premises, or some combination thereof. Similarly, one or more functional portions of the system could be distributed between a telecommunications device(s) and an associated computing device.

Furthermore, it should be appreciated that the various links connecting the elements can be wired or wireless links, or any combination thereof, or any other known or later developed element(s) that is capable of supplying and/or communicating data to and from the connected elements. These wired or wireless links can also be secure links and may be capable of communicating encrypted information. Transmission media used as links, for example, can be any suitable carrier for electrical signals, including coaxial cables, copper wire and fiber optics, and may take the form of acoustic or light waves, such as those generated during radio-wave and infra-red data communications.

Also, while the flowcharts have been discussed and illustrated in relation to a particular sequence of events, it should be appreciated that changes, additions, and omissions to this sequence can occur without materially affecting the operation of the disclosed embodiments, configuration, and aspects.

In yet another embodiment, the systems and methods of this disclosure can be implemented in conjunction with a special purpose computer, a programmed microprocessor or microcontroller and peripheral integrated circuit element(s), an ASIC or other integrated circuit, a digital signal processor, a hard-wired electronic or logic circuit such as discrete element circuit, a programmable logic device or gate array such as PLD, PLA, FPGA, PAL, special purpose computer, any comparable means, or the like. In general, any device(s) or means capable of implementing the methodology illustrated herein can be used to implement the various aspects of this disclosure. Exemplary hardware that can be used for the disclosed embodiments, configurations and aspects includes computers, handheld devices, telephones (e.g., cellular, Internet enabled, digital, analog, hybrids, and others), and other hardware known in the art. Some of these devices include processors (e.g., a single or multiple microprocessors), memory, nonvolatile storage, input devices, and output devices. Furthermore, alternative software implementations including, but not limited to, distributed processing or component/object distributed processing, parallel processing, or virtual machine processing can also be constructed to implement the methods described herein.

In yet another embodiment, the disclosed methods may be readily implemented in conjunction with software using object or object-oriented software development environments that provide portable source code that can be used on a variety of computer or workstation platforms. Alternatively, the disclosed system may be implemented partially or fully in hardware using standard logic circuits or VLSI design. Whether software or hardware is used to implement the systems in accordance with this disclosure is dependent on the speed and/or efficiency requirements of the system, the particular function, and the particular software or hardware systems or microprocessor or microcomputer systems being utilized.

In yet another embodiment, the disclosed methods may be partially implemented in software that can be stored on a storage medium, executed on programmed general-purpose computer with the cooperation of a controller and memory, a special purpose computer, a microprocessor, or the like. In these instances, the systems and methods of this disclosure can be implemented as program embedded on personal computer such as an applet, JAVA® or CGI script, as a resource residing on a server or computer workstation, as a routine embedded in a dedicated measurement system, system component, or the like. The system can also be implemented by physically incorporating the system and/or method into a software and/or hardware system.

Although the present disclosure describes components and functions implemented in the aspects, embodiments, and/or configurations with reference to particular standards and protocols, the aspects, embodiments, and/or configurations are not limited to such standards and protocols. Other similar standards and protocols not mentioned herein are in existence and are considered to be included in the present disclosure. Moreover, the standards and protocols mentioned herein and other similar standards and protocols not mentioned herein are periodically superseded by faster or more effective equivalents having essentially the same functions. Such replacement standards and protocols having the same functions are considered equivalents included in the present disclosure.

The present disclosure, in various aspects, embodiments, and/or configurations, includes components, methods, processes, systems and/or apparatus substantially as depicted and described herein, including various aspects, embodiments, configurations embodiments, subcombinations, and/or subsets thereof. Those of skill in the art will understand how to make and use the disclosed aspects, embodiments, and/or configurations after understanding the present disclosure. The present disclosure, in various aspects, embodiments, and/or configurations, includes providing devices and processes in the absence of items not depicted and/or described herein or in various aspects, embodiments, and/or configurations hereof, including in the absence of such items as may have been used in previous devices or processes, e.g., for improving performance, achieving ease and\or reducing cost of implementation.

The foregoing discussion has been presented for purposes of illustration and description. The foregoing is not intended to limit the disclosure to the form or forms disclosed herein. In the foregoing Detailed Description for example, various features of the disclosure are grouped together in one or more aspects, embodiments, and/or configurations for the purpose of streamlining the disclosure. The features of the aspects, embodiments, and/or configurations of the disclosure may be combined in alternate aspects, embodiments, and/or configurations other than those discussed above. This method of disclosure is not to be interpreted as reflecting an intention that the claims require more features than are expressly recited in each claim. Rather, as the following claims reflect, inventive aspects lie in less than all features of a single foregoing disclosed aspect, embodiment, and/or configuration. Thus, the following claims are hereby incorporated into this Detailed Description, with each claim standing on its own as a separate preferred embodiment of the disclosure.

Moreover, though the description has included description of one or more aspects, embodiments, and/or configurations and certain variations and modifications, other variations, combinations, and modifications are within the scope of the disclosure, e.g., as may be within the skill and knowledge of those in the art, after understanding the present disclosure. It is intended to obtain rights which include alternative aspects, embodiments, and/or configurations to the extent permitted, including alternate, interchangeable and/or equivalent structures, functions, ranges or steps to those claimed, whether or not such alternate, interchangeable and/or equivalent structures, functions, ranges or steps are disclosed herein, and without intending to publicly dedicate any patentable subject matter.

What is claimed is:

1. A smartpad comprising:
    a touch screen;
    an interface adapted to receive a multi-screen device content from a multi-screen device transitioning from being displayed on the multi-screen device to only being displayed on a display of the smartpad upon a docking event occurring, the transitioning using: focus information from the multi-screen device, a signal from an accelerometer indicating an orientation of the smartpad, and an orientation of the multi-screen device and information as to whether the multi-screen device content is a dual screen application or a single screen application; and
    an interaction module, the interaction module adapted to receive an indication of a hardware input from a user and a device engagement or disengagement from one or more of the smartpad and the multi-screen device and provide an indication to the user of the hardware input and the device engagement or disengagement, the hardware input being capable of controlling a function of both the multi-screen device and the smartpad.

2. The smartpad of claim 1, wherein the hardware input and the device engagement or disengagement include one or more of a power button, a headphone jack, a power adapter, a memory card slot, a volume button, a mute button and a brightness button on the smartpad.

3. The smartpad of claim 1, wherein the hardware input and the device engagement or disengagement include one or more of a power button, a headphone jack, a power adapter, a memory card slot, a volume button, a mute button and a brightness button on the multi-screen device.

4. The smartpad of claim 1, wherein the indication to the user is one or more of a visual, audible and tactile indication.

5. The smartpad of claim 1, wherein at least one of the hardware input and the device engagement or disengagement on the multi-screen device is accessible to a user when the multi-screen device is docked with the smartpad.

6. The smartpad of claim 1, wherein the hardware input and the device engagement or disengagement of a multi-screen device control operation are not supported by the smartpad.

7. The smartpad of claim 1, wherein one or more of the hardware input and the device engagement or disengagement of a multi-screen device control operation the smartpad.

8. The smartpad of claim 1, wherein one or more of the hardware input and the device engagement or disengagement of a multi-screen device control operation are not supported by the smartpad, and one or more of a visual, audible and tactile indication is provided to a user indicating a lack of support.

9. The smartpad of claim 1, further comprising a communications link between the smartpad and the multi-screen device.

10. The smartpad of claim 1, wherein the indication to the user is a graphical presentation on the display.

11. A method for operating a smartpad comprising:
    receiving a multi-screen device;
    triggering a docking event;

transitioning content from the multi-screen device to being displayed only on a display of the smartpad upon the docking event occurring, the transitioning using: focus information from the multi-screen device, a signal from an accelerometer indicating an orientation of the smartpad and an orientation of the multi-screen device, and information as to whether the content is a dual screen application or a single screen application;

receiving an indication of a hardware input from a user and a device engagement or disengagement from one or more of the smartpad and the multi-screen device;

providing an indication to the user of the hardware input and the device engagement or disengagement via an indication on the display of the smartpad, the hardware input being capable of controlling a function of both the multi-screen device and the smartpad.

12. The method of claim 11, wherein the hardware input and the device engagement or disengagement include one or more of a power button, a headphone jack, a power adapter, a memory card slot, a volume button, a mute button and a brightness button on the smartpad.

13. The method of claim 11, wherein the hardware input and the device engagement or disengagement include one or more of a power button, a headphone jack, a power adapter, a memory card slot, a volume button, a mute button and a brightness button on the multi-screen device.

14. The method of claim 11, wherein the indication to the user is one or more of a visual, audible and tactile indication.

15. The method of claim 11, wherein at least one of the hardware input and the device engagement or disengagement on the multi-screen device is accessible to a user when the multi-screen device is docked with the smartpad.

16. The method of claim 11, wherein the hardware input and the device engagement or disengagement of a multi-screen device control operation of the smartpad.

17. The method of claim 11, wherein one or more of the hardware input and the device engagement or disengagement of a multi-screen device control operation are not supported by the smartpad.

18. The method of claim 11, wherein one or more of the hardware input and the device engagement or disengagement of a multi-screen device control operation are not supported by the smartpad, and one or more of a visual, audible and tactile indication is provided to a user indicating a lack of support.

19. The method of claim 11, further comprising establishing a communications link between the smartpad and the multi-screen device.

20. The method of claim 11, wherein the indication to the user is a graphical presentation on the display.

* * * * *